ically coupling the first housing member to the second

(12) United States Patent
Bates et al.

(10) Patent No.: US 11,522,983 B2
(45) Date of Patent: Dec. 6, 2022

(54) HANDHELD ELECTRONIC DEVICE

(71) Applicant: Apple Inc., Cupertino, CA (US)

(72) Inventors: Eric W. Bates, San Jose, CA (US);
Xiao Ying Zhao, Santa Clara, CA (US);
Luman Zhang, Sunnyvale, CA (US);
Christopher R. Xydis, San Francisco, CA (US); Michael Firka, Santa Clara, CA (US); Benjamin J. Kallman, Emerald Hills, CA (US); Ihtesham H. Chowdhury, Sunnyvale, CA (US);
Matthew D. Hill, Santa Clara, CA (US); Hugh J. Jay, Cupertino, CA (US); Trent Canales, Cupertino, CA (US); Lucy E. Browning, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/068,596

(22) Filed: Oct. 12, 2020

(65) Prior Publication Data

US 2021/0168225 A1 Jun. 3, 2021

Related U.S. Application Data

(60) Provisional application No. 63/047,760, filed on Jul. 2, 2020, provisional application No. 62/946,920, filed
(Continued)

(51) Int. Cl.
*H04M 1/02* (2006.01)
*H05K 1/11* (2006.01)
(Continued)

(52) U.S. Cl.
CPC ........ *H04M 1/0206* (2013.01); *G06F 1/1637* (2013.01); *G06F 1/1686* (2013.01);
(Continued)

(58) Field of Classification Search
None
See application file for complete search history.

(56) References Cited

U.S. PATENT DOCUMENTS 4,567,318 A 1/1986 Shu
6,532,152 B1 3/2003 White et al.
(Continued)

FOREIGN PATENT DOCUMENTS

CN 202540623 11/2012
EP 1225652 7/2002
EP 2838157 2/2015

OTHER PUBLICATIONS

Bourchak et al., "Effect of Preheating and Post-Curing Time on the Mechanical Properties of Epoxy Resin,"Advanced Composites Letters, vol. 22, Issue 5, 2013.
(Continued)

*Primary Examiner* — Xanthia C Cunningham
(74) *Attorney, Agent, or Firm* — Brownstein Hyatt Farber Schreck, LLP

(57) ABSTRACT

A portable electronic device includes a front cover, a rear cover, and a housing structure between and coupled to the front cover and the rear cover. The housing structure includes a first housing member defining and a first interlock feature formed along a first end surface. The portable electronic device also includes a second housing member defining a second interlock feature formed along a second end surface. The portable electronic device also includes a nonconductive joining element engaged with the first interlock feature and the second interlock feature, thereby structurally coupling the first housing member to the second housing member.

25 Claims, 80 Drawing Sheets

Related U.S. Application Data on Dec. 11, 2019, provisional application No. 62/943,199, filed on Dec. 3, 2019.

(51) Int. Cl.

| | |
|---|---|
| *H05K 5/00* | (2006.01) |
| *G06F 1/16* | (2006.01) |
| *H05K 1/18* | (2006.01) |
| *H05K 5/02* | (2006.01) |

(52) U.S. Cl.
CPC ......... *H04M 1/026* (2013.01); *H04M 1/0264* (2013.01); *H04M 1/0266* (2013.01); *H05K 1/115* (2013.01); *H05K 1/118* (2013.01); *H05K 1/189* (2013.01); *H05K 5/0047* (2013.01); *H05K 5/0086* (2013.01); *H05K 5/0217* (2013.01); *H04M 2201/38* (2013.01)

(56) References Cited

U.S. PATENT DOCUMENTS

| | | | |
|---|---|---|---|
| 6,625,394 B2 | 9/2003 | Smith et al. | |
| 6,775,133 B2 | 8/2004 | Konishi | |
| 7,377,767 B2 | 5/2008 | Dubuis et al. | |
| 7,436,653 B2 * | 10/2008 | Yang | H04M 1/0202 361/679.01 |
| 7,684,178 B2 | 3/2010 | Hsu et al. | |
| 7,697,281 B2 | 4/2010 | Dabov et al. | |
| 7,713,054 B2 | 5/2010 | Mai | |
| 7,798,804 B2 | 9/2010 | Kmoch et al. | |
| 7,829,786 B2 | 11/2010 | Fuerstenberg et al. | |
| 7,830,317 B2 | 11/2010 | Yamazaki | |
| 8,191,756 B2 | 6/2012 | Coppeta et al. | |
| 8,345,410 B2 | 1/2013 | Ternus et al. | |
| 8,373,980 B2 | 2/2013 | Reber | |
| 8,380,258 B2 | 2/2013 | Kim et al. | |
| 8,506,327 B2 | 8/2013 | Jol | |
| 8,519,286 B1 | 8/2013 | Bloch | |
| 8,537,543 B2 | 9/2013 | Wang et al. | |
| 8,553,907 B2 | 10/2013 | Thomason et al. | |
| 8,620,395 B2 | 12/2013 | Kang et al. | |
| 8,654,029 B2 | 2/2014 | Fan et al. | |
| 8,665,160 B2 | 3/2014 | Uttermann et al. | |
| 8,675,359 B2 * | 3/2014 | Chen | H04B 1/3888 361/679.56 |
| 8,686,297 B2 | 4/2014 | Shiu et al. | |
| 8,773,847 B2 | 7/2014 | Byun et al. | |
| 8,878,060 B2 | 11/2014 | Wright et al. | |
| 8,884,826 B2 | 11/2014 | Wu et al. | |
| 8,947,303 B2 | 2/2015 | Golko et al. | |
| 8,980,026 B2 | 3/2015 | Ely | |
| 9,036,358 B2 | 5/2015 | Shoji et al. | |
| 9,049,801 B2 | 6/2015 | Rothkopf et al. | |
| 9,075,567 B2 | 7/2015 | Mathew et al. | |
| 9,109,093 B2 | 8/2015 | Pilliod et al. | |
| 9,146,588 B2 | 9/2015 | Kole et al. | |
| 9,223,349 B2 | 12/2015 | Franklin et al. | |
| 9,229,675 B2 | 1/2016 | Beeze et al. | |
| 9,282,657 B2 | 3/2016 | Miyaoka et al. | |
| 9,338,909 B2 | 5/2016 | Tanaka | |
| 9,338,910 B2 | 5/2016 | Hattori | |
| 9,360,889 B2 | 6/2016 | Idsinga et al. | |
| 9,408,009 B1 | 8/2016 | Witte et al. | |
| 9,469,469 B2 | 10/2016 | Rayner | |
| 9,516,150 B2 | 12/2016 | Jeon et al. | |
| 9,520,638 B2 | 12/2016 | Baringer et al. | |
| 9,537,526 B2 | 1/2017 | Wilson et al. | |
| 9,564,677 B2 | 2/2017 | Tian et al. | |
| 9,578,145 B2 * | 2/2017 | Chang | H04M 1/0249 |
| 9,591,110 B2 * | 3/2017 | Hill | H04M 1/02 |
| 9,606,579 B2 | 3/2017 | Pakula et al. | |
| 9,629,268 B2 | 4/2017 | Lee et al. | |
| 9,643,349 B2 | 5/2017 | Montevirgen | |
| 9,680,206 B2 | 6/2017 | Youn et al. | |
| 9,791,893 B2 | 10/2017 | Yamaguchi et al. | |
| 9,795,044 B2 | 10/2017 | Lai et al. | |
| 9,871,898 B2 | 1/2018 | Kwong | |
| 9,907,191 B2 | 2/2018 | Shi et al. | |
| 9,977,460 B2 | 5/2018 | Man et al. | |
| 9,985,345 B2 | 5/2018 | Ferretti et al. | |
| 10,129,989 B2 * | 11/2018 | Kim | H05K 5/0226 |
| 10,144,000 B2 | 12/2018 | Goyal et al. | |
| 10,148,000 B2 * | 12/2018 | Hill | H04M 1/0249 |
| 10,158,384 B1 | 12/2018 | Yarga et al. | |
| 10,180,702 B2 | 1/2019 | Dabov et al. | |
| 10,191,519 B2 | 1/2019 | Lilje | |
| 10,218,827 B2 | 2/2019 | Hill et al. | |
| 10,264,685 B2 | 4/2019 | Shi et al. | |
| 10,367,538 B2 | 7/2019 | Lai et al. | |
| 10,368,456 B2 | 7/2019 | Shinn | |
| 10,372,166 B2 | 8/2019 | Gable et al. | |
| 10,559,872 B2 | 2/2020 | Hill et al. | |
| 10,617,016 B2 | 4/2020 | Shi et al. | |
| 10,877,519 B2 * | 12/2020 | Lin | G06F 1/1656 |
| 10,881,015 B2 * | 12/2020 | Jarvis | H05K 7/06 |
| 10,897,825 B2 | 1/2021 | Shi et al. | |
| 2008/0239647 A1 * | 10/2008 | Luo | H04M 1/0252 361/679.58 |
| 2008/0268083 A1 | 10/2008 | Ferenc | |
| 2009/0141436 A1 | 6/2009 | Matsuoka et al. | |
| 2010/0061044 A1 * | 3/2010 | Zou | B32B 3/02 361/679.01 |
| 2010/0103600 A1 * | 4/2010 | Lin | H04M 1/0249 361/679.01 |
| 2010/0203931 A1 * | 8/2010 | Hynecek | A45C 11/00 455/575.8 |
| 2010/0230155 A1 | 9/2010 | Hashizume et al. | |
| 2012/0319907 A1 | 12/2012 | Wu et al. | |
| 2013/0009525 A1 * | 1/2013 | Liao | G06F 1/1656 312/223.1 |
| 2013/0235538 A1 | 9/2013 | Hashimoto et al. | |
| 2013/0329460 A1 * | 12/2013 | Mathew | G06F 1/1616 362/612 |
| 2014/0004294 A1 | 1/2014 | Christophy et al. | |
| 2014/0023430 A1 | 1/2014 | Prest et al. | |
| 2014/0063705 A1 * | 3/2014 | Song | H05K 5/0217 361/679.01 |
| 2014/0206420 A1 * | 7/2014 | Neichi | H04M 1/18 455/575.8 |
| 2014/0333830 A1 * | 11/2014 | Cheon | H04N 5/2254 348/376 |
| 2015/0062807 A1 | 3/2015 | Gwin et al. | |
| 2015/0341072 A1 * | 11/2015 | Lai | H04M 1/026 455/575.8 |
| 2016/0044816 A1 * | 2/2016 | Jarvis | H05K 7/026 361/759 |
| 2016/0352007 A1 * | 12/2016 | Gu | H01Q 1/42 |
| 2017/0196110 A1 * | 7/2017 | Shinn | F16J 15/022 |
| 2017/0347470 A1 | 11/2017 | Seo et al. | |
| 2018/0053989 A1 * | 2/2018 | Ma | H04M 1/0283 |
| 2018/0081400 A1 * | 3/2018 | Pandya | F16J 15/064 |
| 2018/0299924 A1 * | 10/2018 | Seo | G05B 19/18 |
| 2018/0343332 A1 * | 11/2018 | Kim | G06F 1/1637 |
| 2019/0036201 A1 * | 1/2019 | Hill | G06F 1/1656 |
| 2019/0208648 A1 | 7/2019 | Shi et al. | |
| 2020/0153088 A1 | 5/2020 | Hill et al. | |
| 2022/0085843 A1 | 3/2022 | Bloom et al. | |
| 2022/0115770 A1 | 4/2022 | Hill et al. | |

OTHER PUBLICATIONS

Domun et al., "Improving the fracture toughness and the strength of epoxy using nanomaterials—a review of the current status," Royal Society of Chemistry, Nanoscale, 7, pp. 10294-10329, 2015.

* cited by examiner

HANDHELD ELECTRONIC DEVICE

CROSS-REFERENCE TO RELATED APPLICATION(S)

This application is a nonprovisional patent application of and claims the benefit of U.S. Provisional Patent Application No. 62/943,199, filed Dec. 3, 2019 and titled "Handheld Electronic Device," and U.S. Provisional Patent Application No. 62/946,920, filed Dec. 11, 2019 and titled "Handheld Electronic Device," and U.S. Provisional Patent Application No. 63/047,760, filed Jul. 2, 2020 and titled "Handheld Electronic Device," the disclosures of which are hereby incorporated herein by reference in their entireties.

FIELD

The subject matter of this disclosure relates generally to handheld electronic devices, and more particularly, to mobile phones.

BACKGROUND

Modern consumer electronic devices take many shapes and forms, and have numerous uses and functions. Smartphones, for example, provide various ways for users to interact with other people that extend beyond telephone communications. Such devices may include numerous systems to facilitate such interactions. For example, a smartphone may include a touch-sensitive display for providing graphical outputs and for accepting touch inputs, wireless communications systems for connecting with other devices to send and receive voice and data content, cameras for capturing photographs and videos, and so forth. However, integrating these subsystems into a compact and reliable product that is able to withstand daily use presents a variety of technical challenges. The systems and techniques described herein may address many of these challenges while providing a device that offers a wide range of functionality.

SUMMARY

Some example embodiments are directed to a portable electronic device comprising: a front cover, a rear cover, and a housing structure between and coupled to the front cover and the rear cover. The housing structure may define a first housing member, a second housing member and a nonconductive joining element. the first housing member may include a first exterior side; a first interior side opposite the first exterior side; a first end surface extending between the first exterior side and the first interior side; and a first interlock feature formed along the first end surface. The second housing member may define a second exterior side, a second interior side opposite the second exterior side, a second end surface extending between the second exterior side and the second interior side, and a second interlock feature formed along the second end surface. The nonconductive joining element may be engaged with the first interlock feature and the second interlock feature, thereby structurally coupling the first housing member to the second housing member.

In some cases, first interlock feature is a recess having a depth between about 100 microns and about 1000 microns. In some cases, first interlock feature is an elongate recess having a width between about 100 microns and about 500 microns, and having a length between about 750 microns and about 3000 microns. In some cases, the first interlock feature is a recess having a width greater than about 100 microns and a length greater than about 1000 microns.

In some embodiments, the first housing member further defines a third interlock feature extending from the first interior side. The second housing member may further define a fourth interlock feature extending from the second interior side. The nonconductive joining element may be further engaged with the third interlock feature and the fourth interlock feature.

In some cases, the first interlock feature is a recess and the second interlock feature is a protrusion. In some cases, the first interlock feature may be a first protrusion and the second interlock feature is a second protrusion. In some cases, the first interlock feature is a first recess and the second interlock feature is a second recess. The first housing member may define a flange extending from the third interlock feature and positioned along a peripheral side of the front cover. The flange may define a portion of the first end surface. The first interlock feature may be formed in the portion of the first end surface defined by the flange. In some implementations, the flange extends from the second interlock feature along a direction, and the first interlock feature defines an elongate recess defined in part by a longitudinal axis extending along the direction.

Some example embodiments are directed to a portable electronic device comprising a front cover, a rear cover, and a housing structure between and coupled to the front cover and the rear cover. The housing may include a first housing member defining: a first portion of an exterior surface of the housing structure; and a first interlock feature. The housing may also include a second housing member defining: a second portion of the exterior surface of the housing structure; and a second interlock feature, the second housing member set apart from the first housing member by a channel defining: a first region extending inwardly from the exterior surface of the housing structure along a first direction; and a second region extending inwardly from the first region along a second direction that is not parallel to the first direction. The housing may also include a nonconductive joining element at least partially filling the channel and engaged with the first interlock feature and the second interlock feature, thereby structurally coupling the first housing member to the second housing member and defining a third portion of the exterior surface of the housing structure.

In some embodiments, the second region of the channel is at least partially defined by the first interlock feature and the second interlock feature. The first interlock feature may define a first end surface defining a first wall of the second region of the channel, and the second interlock feature may defines a second end surface defining a second wall of the second region of the channel. In some cases, the first end surface is parallel to the second end surface.

In some embodiments, the first interlock feature defines a first lug; the second interlock feature defines a second lug; and a connector assembly is conductively coupled to the first interlock feature via the first lug and conductively coupled to the second interlock feature via the second lug.

In some embodiments, the connector assembly is conductively coupled to the first interlock feature via a first threaded fastener; and the connector assembly is conductively coupled to the second interlock feature via a second threaded fastener.

In some embodiments, the connector assembly conductively couples the first housing member to first antenna circuitry; and the connector assembly conductively couples the second housing member to second antenna circuitry.

In some embodiments, the connector assembly comprises: a first conductor configured to conductively couple the first housing member to the first antenna circuitry; a second conductor configured to conductively couple the second housing member to the second antenna circuitry; and a polymer material at least partially encapsulating the first conductor and the second conductor.

Some example embodiments are directed to a portable electronic device comprising a front cover, a rear cover, and a housing structure between and coupled to the front cover and the rear cover. The housing structure may include a first housing member defining a first sidewall defining: a first portion of an exterior surface of the portable electronic device; and a first end surface. The first housing member may also define a first interlock feature extending from the first sidewall and defining a second end surface extending at a first angle from the first end surface. The housing structure may also include a second housing member defining a second sidewall defining: a second portion of the exterior surface of the portable electronic device; and a third end surface. The second housing member may also define a second interlock feature extending from the second sidewall and defining a fourth end surface extending at a second angle from the third end surface. The housing may also include a nonconductive joining element at least partially filling a channel defined by the first end surface, the second end surface, the third end surface, and the fourth end surface, and engaged with the first interlock feature and the second interlock feature, thereby structurally coupling the first housing member to the second housing member. In some implementations, the first end surface is parallel to the third end surface; and the second end surface is parallel to the fourth end surface.

In some cases, the portable electronic device further comprises a connector assembly conductively coupled to the first interlock feature and the second interlock feature; and a flexible circuit element conductively coupled to the connector assembly. The first housing member may be conductively coupled to first antenna circuitry via the connector assembly and the flexible circuit element. The second housing member may be conductively coupled to second antenna circuitry via the connector assembly and the flexible circuit element. In some embodiments, the portable electronic device further comprises a frame member coupled to the rear cover and configured to receive a camera module. The flexible circuit element may be positioned in a gap defined by the frame member and the first housing member.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Mobile phones as described herein may include complex, sophisticated components and systems that facilitate a multitude of functions. For example, mobile phones according to the instant disclosure may include touch- and/or force-sensitive displays, numerous cameras (including both front- and rear-facing cameras), GPS systems, haptic actuators, wireless charging systems, and all requisite computing components and software to operate these (and other) systems and otherwise provide the functionality of the mobile phones.

Figure 1A:
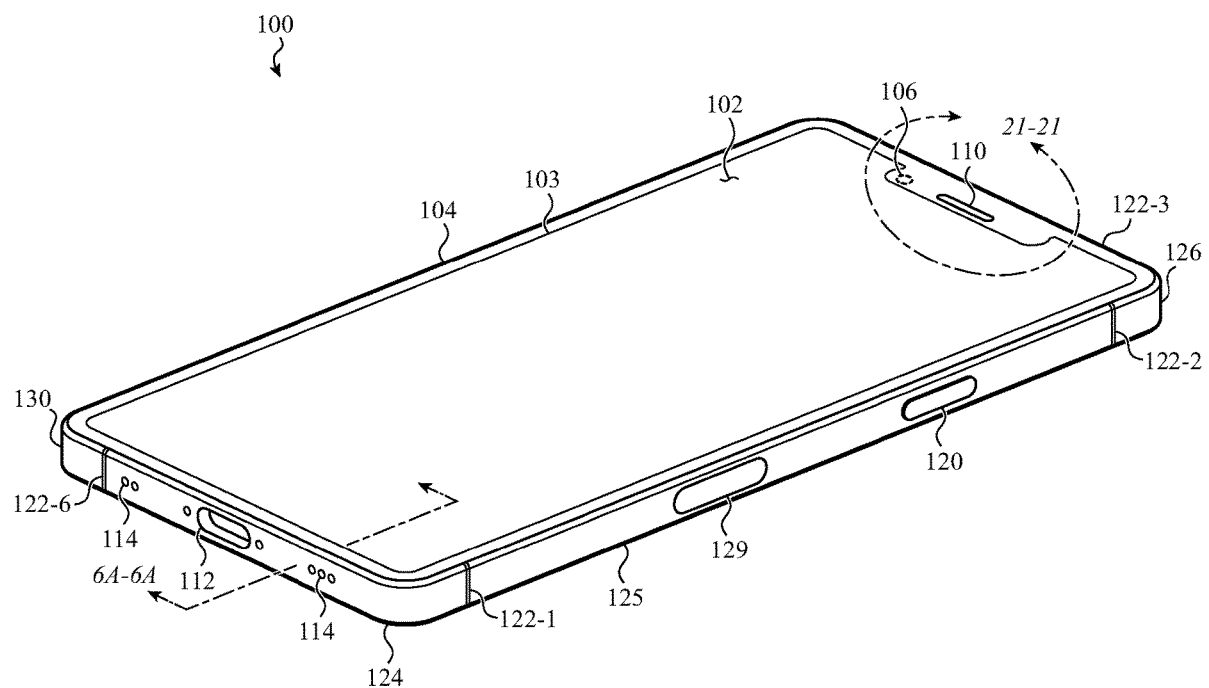
FIGS. 1A-1B depict an example electronic device.

FIG. 1A shows an example electronic device 100 embodied as a mobile phone. While the device 100 is a mobile phone, the concepts presented herein may apply to any appropriate electronic devices, including portable electronic devices, wearable devices (e.g., watches), laptop computers, handheld gaming devices, tablet computers, computing peripherals (e.g., mice, touchpads, keyboards), or any other device. Accordingly, any reference to an "electronic device" encompasses any and all of the foregoing.

The electronic device 100 includes a cover 102 (e.g., a front cover), such as a glass, glass-ceramic, ceramic, plastic, sapphire, or other substantially transparent material, component, or assembly, attached to a housing 104 (which may include a housing structure defined by one or more housing members). The cover 102 may be positioned over a display 103. The cover 102 may be formed from glass (e.g., a chemically strengthened glass), sapphire, ceramic, glass-ceramic, plastic, or another suitable material. The cover 102 may be formed as a monolithic or unitary sheet. The cover 102 may also be formed as a composite of multiple layers of different materials, coatings, and other elements.

The display 103 may be at least partially positioned within the interior volume of the housing 104. The display 103 may be coupled to the cover 102, such as via an adhesive or other coupling scheme. The display 103 may include a liquid-crystal display (LCD), a light-emitting diode, an organic light-emitting diode (OLED) display, an active layer organic light emitting diode (AMOLED) display, an organic electroluminescent (EL) display, an electrophoretic ink display, or the like. The display 103 may be configured to display graphical outputs, such as graphical user interfaces, that the user may view and interact with. The device 100 may also include an ambient light sensor that can determine properties of the ambient light conditions surrounding the device 100. The device 100 may use information from the ambient light sensor to change, modify, adjust, or otherwise control the display 103 (e.g., by changing a hue, brightness, saturation, or other optical aspect of the display based on information from the ambient light sensor).

The display 103 may include or be associated with one or more touch- and/or force-sensing systems. In some cases, components of the touch- and/or force-sensing systems are integrated with the display stack. For example, electrode layers of a touch and/or force sensor may be provided in a stack that includes display components (and is optionally attached to or at least viewable through the cover 102). The touch- and/or force-sensing systems may use any suitable type of sensing technology, including capacitive sensors, resistive sensors, surface acoustic wave sensors, piezoelectric sensors, strain gauges, or the like. The outer or exterior surface of the cover 102 may define an input surface (e.g., a touch- and/or force-sensitive input surface) of the device. While both touch- and force-sensing systems may be included, in some cases the device 100 includes a touch-sensing system and does not include a force-sensing system.

The device 100 may also include a front-facing camera 106. The front-facing camera 106 may be positioned below or otherwise covered and/or protected by the cover 102. The front-facing camera 106 may have any suitable operational parameters. For example, the front-facing camera 106 may include a 12 megapixel sensor (with 1 micron pixel size), and an 80-90° field of view. The front-facing camera 106 may have fixed focus optical elements with an aperture number of f/2.2. Other types of cameras may also be used for the front-facing camera 106.

The device 100 may also include one or more buttons (e.g., buttons 116, 120), switches (e.g., switch 118), and/or other physical input systems. Such input systems may be used to control power states (e.g., the button 120), change speaker volume (e.g., the buttons 116), switch between "ring" and "silent" modes, and the like (e.g., the switch 118).

The device 100 may also include a speaker port 110 to provide audio output to a user, such as to a user's ear during voice calls. The speaker port 110 may also be referred to as an earpiece in the context of a mobile phone. The device 100 may also include a charging port 112 (e.g., for receiving a power cable for providing power to the device 100 and charging the battery of the device 100). The device 100 may also include audio openings 114. The audio openings 114 may allow sound output from an internal speaker system (e.g., the speaker system 224, FIG. 2) to exit the housing 104. The device 100 may also include one or more microphones. In some cases, a microphone within the housing 104 may be acoustically coupled to the surrounding environment through an audio opening 114.

The housing 104 may be a multi-piece housing. For example, the housing 104 may be formed from multiple housing members 124, 125, 126, 127, 128, and 130, which are structurally coupled together via one or more joint structures 122 (e.g., 122-1-122-6). Together, the housing members 124, 125, 126, 127, 128, and 130 and the joint structures 122 may define a band-like housing structure that defines four side walls (and thus four exterior side surfaces) of the device 100. Thus, both the housing members and the joint structures define portions of the exterior side surfaces of the device 100.

The housing members 124, 125, 126, 127, 128, and 130 may be formed of a conductive material (e.g., a metal such as aluminum, stainless steel, or the like), and the joint structures 122 may be formed of one or more polymer materials (e.g., glass-reinforced polymer). The joint structures 122 may include two or more molded elements, which may be formed of different materials. For example, an inner molded element may be formed of a first material (e.g., a polymer material), and an outer molded element may be formed of a second material that is different from the first (e.g., a different polymer material). The materials may have different properties, which may be selected based on the different functions of the inner and outer molded elements. For example, the inner molded element may be configured to make the main structural connection between housing members, and may have a higher mechanical strength and/or toughness than the outer molded element. On the other hand, the outer molded element may be configured to have a particular appearance, surface finish, chemical resistance, water-sealing function, or the like, and its composition may be selected to prioritize those functions over mechanical strength.

Figure 11:
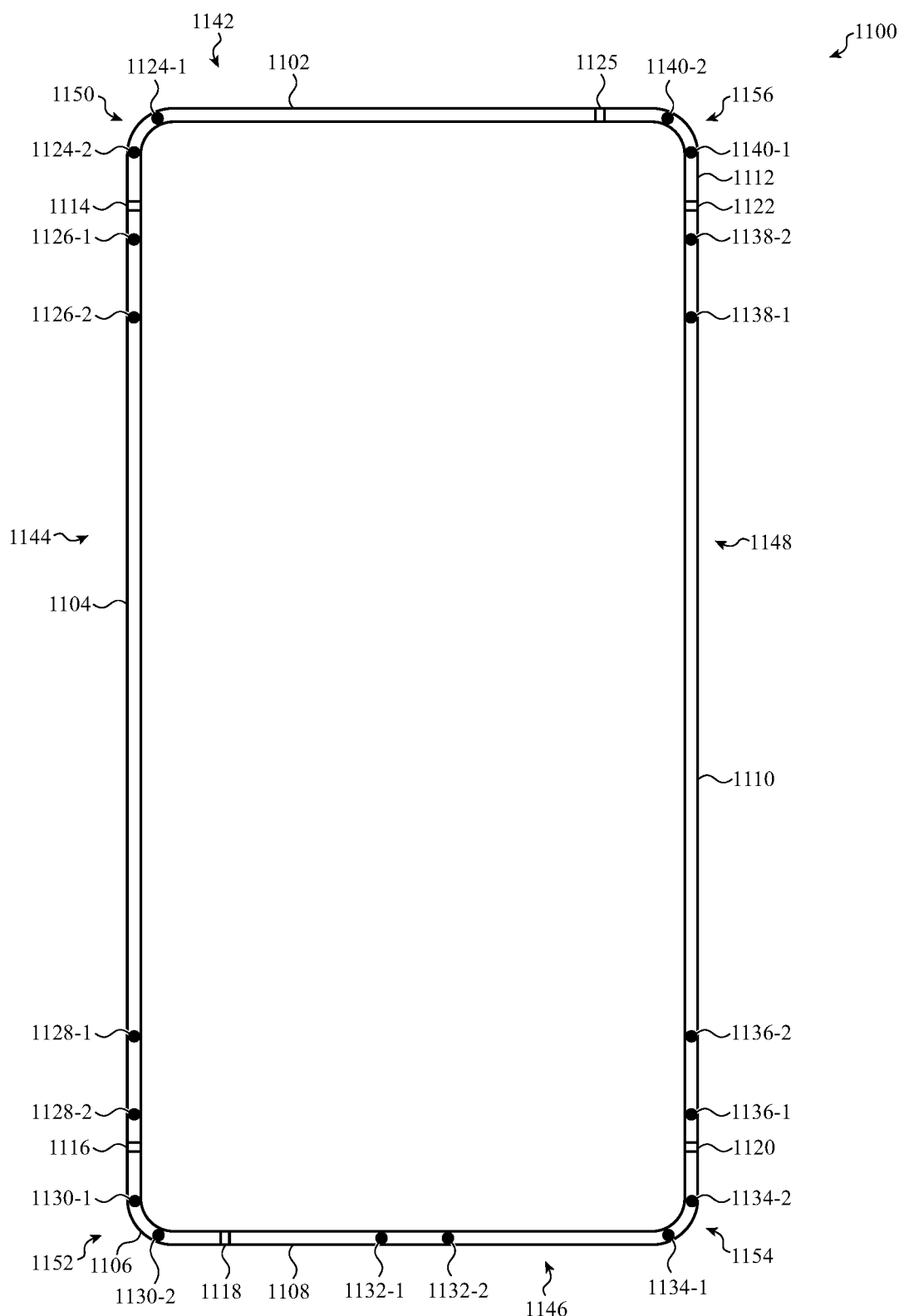
FIG. 11 depicts example antenna feed and ground points for an electronic device.

In some cases, one or more of the housing members 124, 125, 126, 127, 128, and 130 (or portions thereof) are configured to operate as antennas (e.g., members that are configured to transmit and/or receive electromagnetic waves to facilitate wireless communications with other computers and/or devices). To facilitate the use of the housing members as antennas, feed and ground lines may be conductively coupled to the housing members to couple the housing members to other antennas and/or communication circuitry. FIG. 11, described in more detail below, depicts example antenna feed and ground lines for an example device. Further, the joint structures 122 may be substantially non-conductive to provide suitable separation and/or electrical isolation between the housing members (which may be used to tune the radiating portions, reduce capacitive coupling between radiating portions and other structures, and the like). In addition to the housing members 124, 125, 126, 127, 128, and 130, the device 100 may also include various internal antenna elements that are configured to transmit and receive wireless communication signals through various regions of the housing 104. As shown in FIG. 1A, the device 100 may include an antenna window 129 that allows for the passage of radio-frequency communication signals through a corresponding region of the housing 104.

The joint structures 122 may be mechanically interlocked with the housing members to structurally couple the housing members and form a structural housing assembly. Further details about the joint structures 122 and their mechanical integration with the housing members are provided herein.

The exterior surfaces of the housing members 124, 125, 126, 127, 128, and 130 may have substantially a same color, surface texture, and overall appearance as the exterior surfaces of the joint structures 122. In some cases, the exterior surfaces of the housing members 124, 125, 126, 127, 128, and 130 and the exterior surfaces of the joint structures 122 are subjected to at least one common finishing procedure, such as abrasive-blasting, machining, polishing, grinding, or the like. Accordingly, the exterior surfaces of the housing members and the joint structures may have a same or similar surface finish (e.g., surface texture, roughness, pattern, etc.). In some cases, the exterior surfaces of the housing members and the joint structures may be subjected to a two-stage blasting process to produce the target surface finish.

Figure 1B:
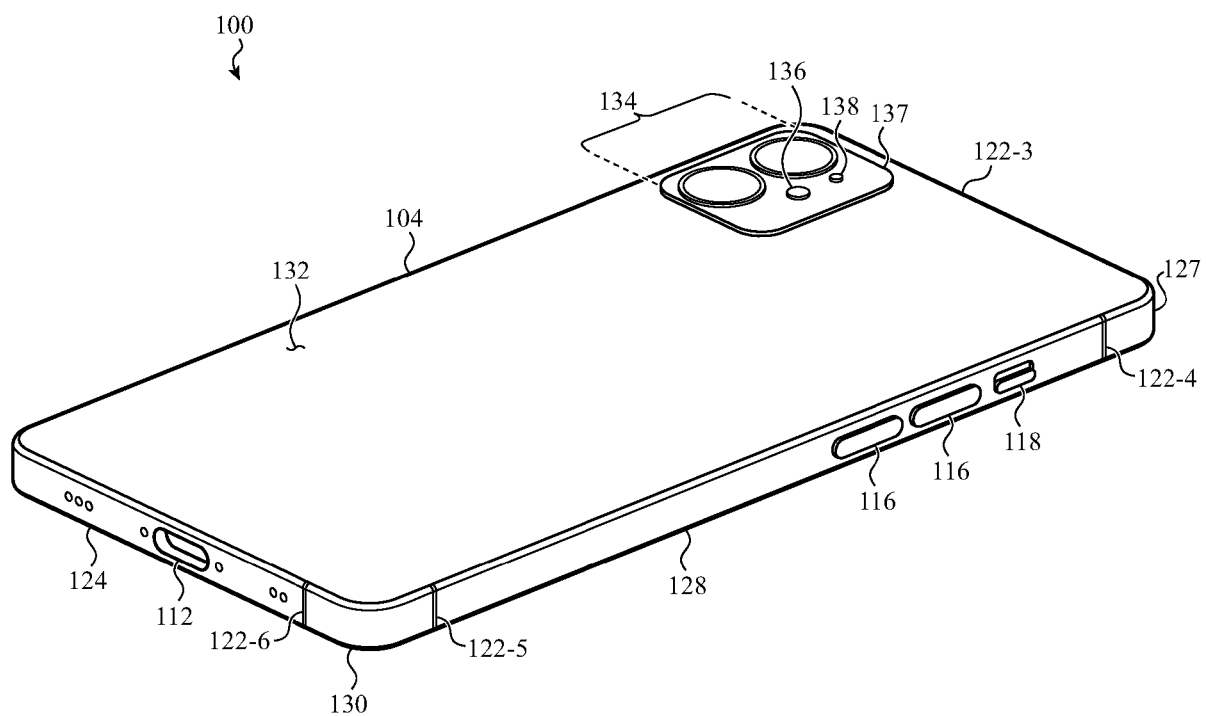

FIG. 1B illustrates a back side of the device 100. The device 100 may include a back or rear cover 132 coupled to the housing 104 and defining at least a portion of the exterior rear surface of the device 100. The rear cover 132 may include a substrate formed of glass, though other suitable materials may alternatively be used (e.g., plastic, sapphire, ceramic, glass-ceramic, etc.). The rear cover 132 may include one or more decorative layers on the exterior or interior surface of the substrate. For example, one or more opaque layers may be applied to the interior surface of the substrate (or otherwise positioned along the interior surface of the substrate) to provide a particular appearance to the back side of the device 100. The opaque layer(s) may include a sheet, ink, dye, or combinations of these (or other) layers, materials, or the like. In some cases the opaque layer(s) have a color that substantially matches a color of the housing 104 (e.g., the exterior surfaces of the housing members and the joint structures). The device 100 may include a wireless charging system, whereby the device 100 can be powered and/or its battery recharged by an inductive (or other electromagnetic) coupling between a charger and a wireless charging system within the device 100. In such cases, the rear cover 132 may be formed of a material that allows and/or facilitates the wireless coupling between the charger and the wireless charging system (e.g., glass).

The device 100 may also include a sensor array 134, which may include various types of sensors, including one or more rear-facing cameras, depth sensing devices, flashes, microphones, and the like. The sensor array 134 may be at least partially defined by a protrusion 137 that extends from the rear of the device 100. The protrusion 137 may define a portion of the rear exterior surface of the device 100. In some cases, the protrusion 137 may be formed by attaching a piece of material (e.g., glass) to another piece of material (e.g., glass). In other cases, the rear cover 132 may include a monolithic structure, and the protrusion 137 may be part of the monolithic structure. For example, the rear cover 132 may include a monolithic glass structure (or glass ceramic structure) that defines the protrusion 137 as well as the surrounding area. In such cases, the protrusion 137 may be an area of increased thickness of the monolithic structure, or it may be molded into a substantially uniform thickness monolithic structure (e.g., and may correspond to a recessed region along an interior side of the monolithic structure).

The device may also include, as part of the sensor array, one or more rear-facing devices 138, which may include an ambient-light sensor (ALS), a microphone, and/or a depth sensing device that is configured to estimate a distance between the device 100 and a separate object or target. The sensor array 134 may include a camera with a 12 megapixel sensor, and a variable-focus lens with an aperture number of f/1.6. The sensor array 134 may also include multiple cameras including: a wide view camera having a 12 megapixel sensor and an aperture number of f/1.6; a super-wide camera having a 12 megapixel sensor and a wide field of view (e.g., 120° FOV) optical stack with an aperture number of f/2.4; and a telephoto lens having a 12 megapixel sensor with a 2× optical zoom optical stack having an aperture number ranging from f/2.0 to f/2.2. One or more of the cameras of the sensor array 134 may also include optical image stabilization, whereby the lens is dynamically moved relative to a fixed structure within the device 100 to reduce the effects of "camera shake" on images captured by the camera. The camera may also perform optical image stabilization by moving the image sensor relative to a fixed lens or optical assembly.

The sensor array 134, along with associated processors and software, may provide several image-capture features. For example, the sensor array 134 may be configured to capture full-resolution video clips of a certain duration each time a user captures a still image. As used herein, capturing full-resolution images (e.g., video images or still images) may refer to capturing images using all or substantially all of the pixels of an image sensor, or otherwise capturing images using the maximum resolution of the camera (regardless of whether the maximum resolution is limited by the hardware or software).

The captured video clips may be associated with the still image. In some cases, users may be able to select individual frames from the video clip as the representative still image associated with the video clip. In this way, when the user takes a snapshot of a scene, the camera will actually record a short video clip (e.g., 1 second, 2 seconds, or the like), and the user can select the exact frame from the video to use as the captured still image (in addition to simply viewing the video clip as a video).

The sensor array 134 may also include one or more cameras having a high-dynamic-range (HDR) mode, in which the camera captures images having a dynamic range of luminosity that is greater than what is captured when the camera is not in the HDR mode. In some cases, the sensor array 134 automatically determines whether to capture images in an HDR or non-HDR mode. Such determination may be based on various factors, such as the ambient light of the scene, detected ranges of luminosity, tone, or other optical parameters in the scene, or the like. HDR images may be produced by capturing multiple images, each using different exposure or other image-capture parameters, and producing a composite image from the multiple captured images.

The sensor array 134 may also include or be configured to operate in an object detection mode, in which a user can select (and/or the device 100 can automatically identify) objects within a scene to facilitate those objects being processed, displayed, or captured differently than other parts of the scene. For example, a user may select (or the device 100 may automatically identify) a person's face in a scene, and the device 100 may focus on the person's face while selectively blurring the portions of the scene other than the person's face. Notably, features such as the HDR mode and the object detection mode may be provided with a single camera (e.g., a single lens and sensor).

The sensor array may include a flash 136 that is configured to illuminate a scene to facilitate capturing images with the sensor array 134. The flash 136 may include one or more light sources, such as one or more light emitting diodes (e.g., 1, 2, 3, 4, or more LEDs). The flash 136, in conjunction with the sensor array 134 or other systems of the device 100, may adjust the color temperature of the light emitted by the light sources in order to match or otherwise adapt to a color temperature within a scene being captured. The device 100 may also be configured to operate the flash 136 and the shutter of the sensor array 134 to avoid consequences of flash "flicker." For example, the device 100 may avoid capturing exposures during moments where the flash 136 is at a period of no or low illumination (e.g., which may be caused by discontinuous or pulsed operation of the LEDs).

Figure 1C:
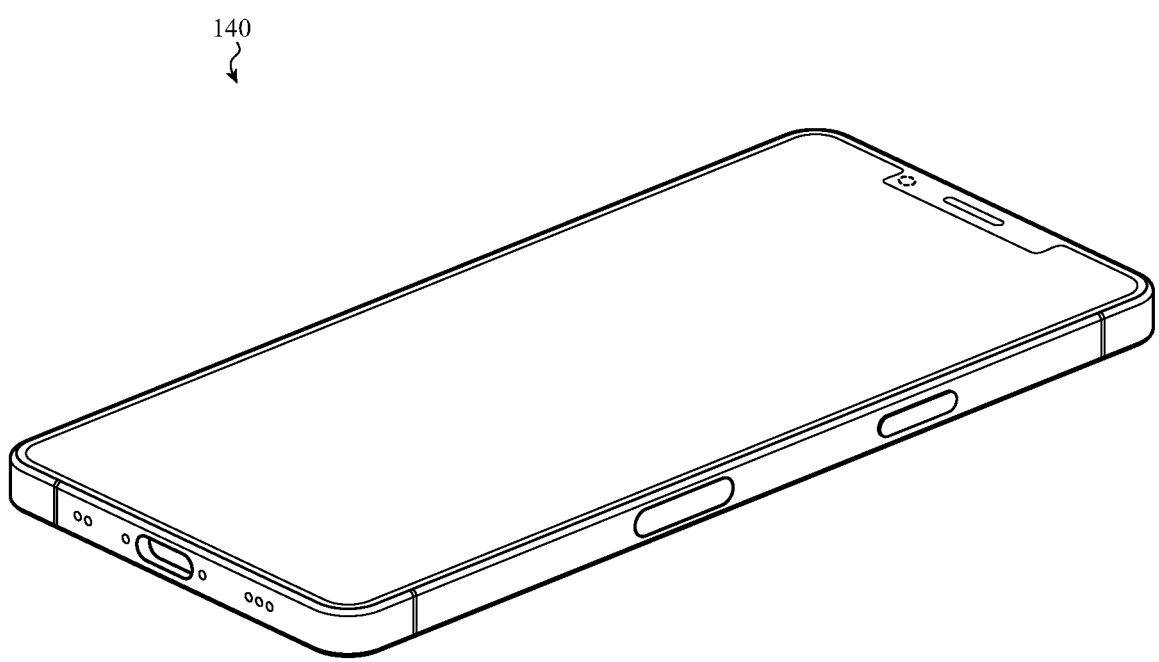
FIGS. 1C-1D depict another example electronic device.
Figure 1D:
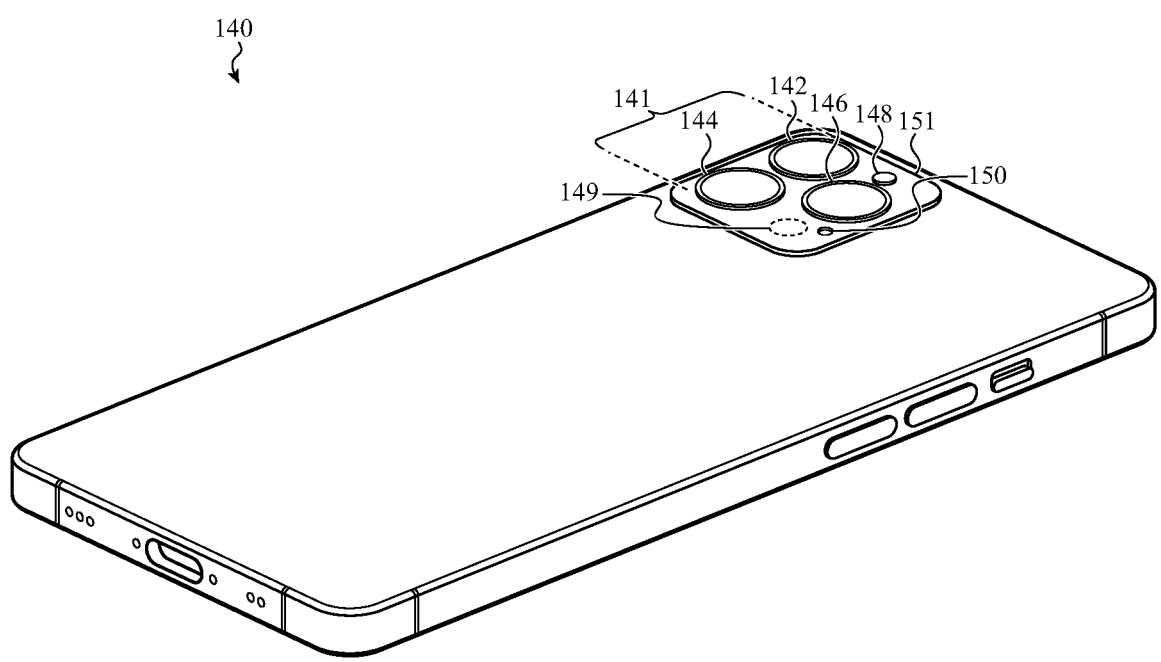

FIGS. 1C and 1D show another example electronic device 140 embodied as a mobile phone. The electronic device 140 may have many of the same or similar outward-facing components as the electronic device 100. Accordingly, descriptions and details of such components from FIGS. 1A-1B (e.g., displays, buttons, switches, housings, covers, charging ports, joint structures, etc.) apply equally to the corresponding components shown in FIGS. 1C and 1D.

Figure 3:
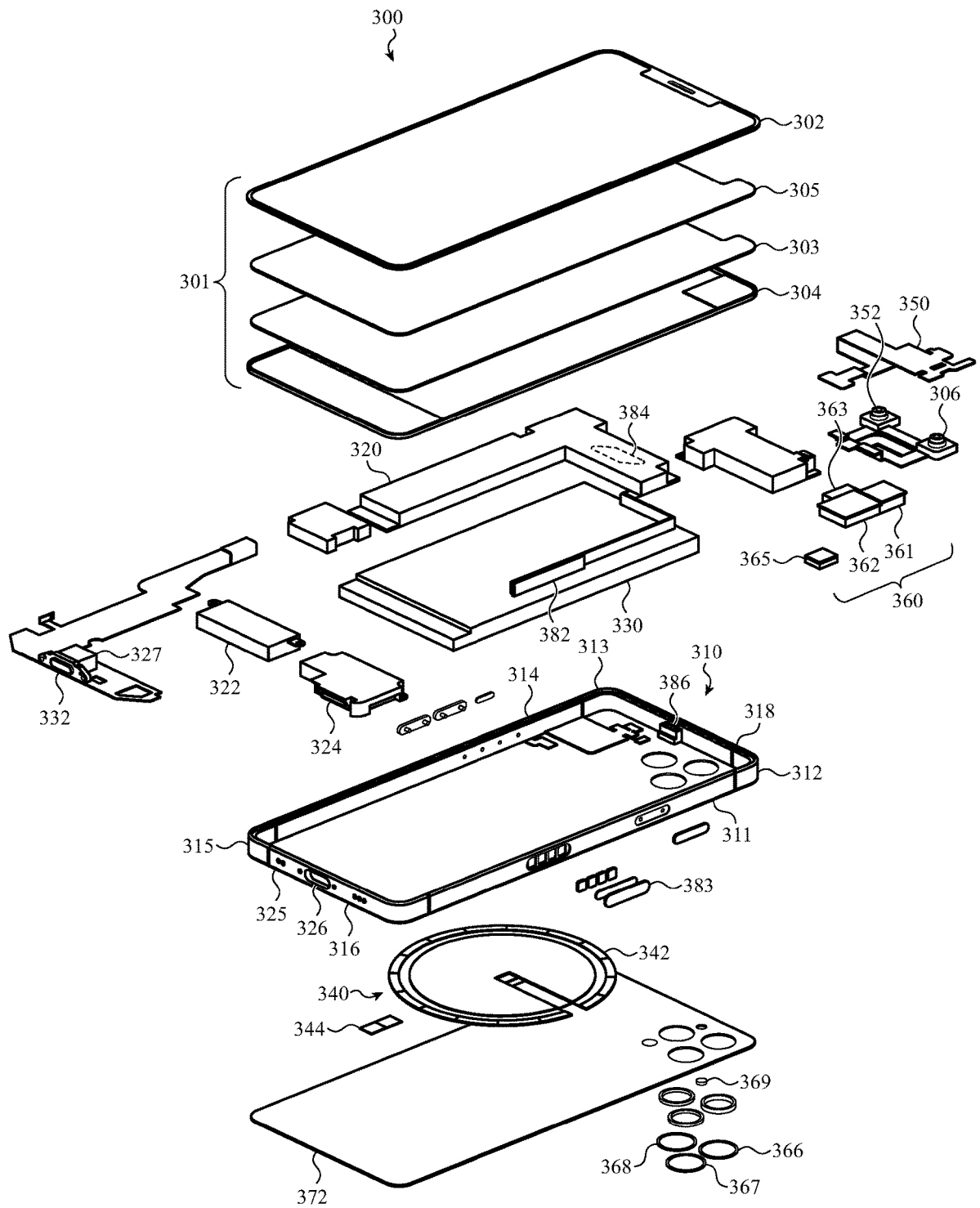
FIG. 3 depicts an exploded view of an example electronic device.
Figure 5:
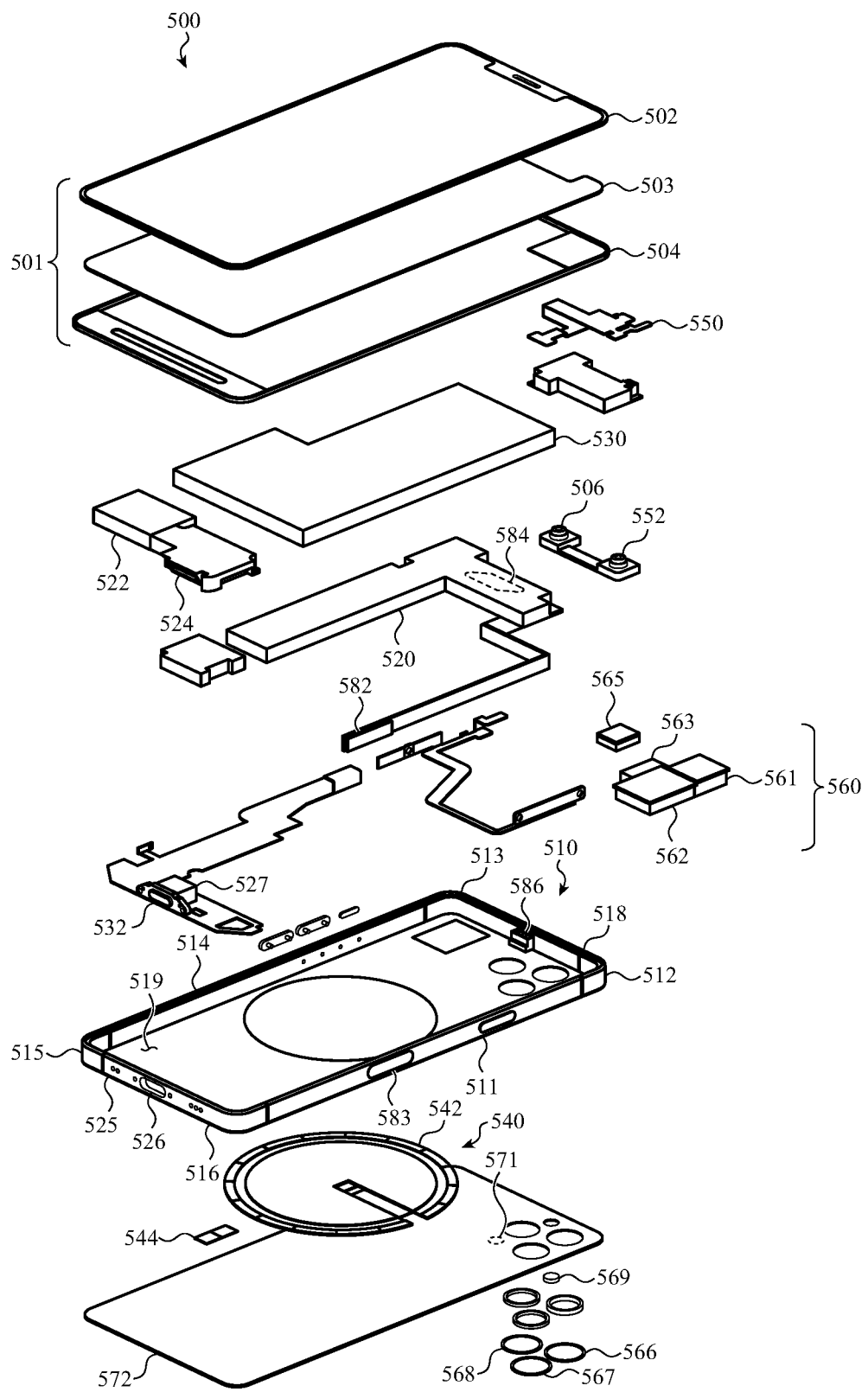
FIG. 5 depicts an exploded view of an example electronic device.

While the device 100 in FIG. 1B is shown as including a sensor array 134 with two cameras, the device 140 as shown in FIG. 1D includes a sensor array 141 that includes three cameras (as shown, for example, in FIGS. 3 and 5, described herein). The sensor array 141 may be in a sensor array region that is defined by a protrusion 151 in a rear cover of the device 140. The protrusion 151 may have the same or similar construction as the protrusion 137 in FIG. 1B.

The sensor array 141 may also include a depth sensing device 149 that is configured to estimate a distance between the device and a separate object or target. For example, a first camera 142 may include a 12 megapixel sensor and a telephoto lens with a 2× or 2.5× optical zoom and an aperture number of f/2.0; a second camera 144 may include a 12 megapixel sensor and a wide angle lens having an aperture number of f/1.6; and a third camera 146 may include a 12 megapixel sensor and a super-wide camera with a wide field of view (e.g., 120° FOV) and an aperture number of f/2.4. The depth sensing device 149 may estimate a distance between the device and a separate object or target using lasers and time-of-flight calculations, or using other types of depth sensing components or techniques. One or more of the cameras of the sensor array 141 may also include optical image stabilization, whereby the lens is dynamically moved relative to a fixed structure within the device 100 to reduce the effects of "camera shake" on images captured by the camera. The camera may also perform optical image stabilization by moving the image sensor relative to a fixed lens or optical assembly.

The device 140 may also include a flash 148 that is configured to illuminate a scene to facilitate capturing images with the cameras of the sensor array 141. The flash 148 is configured to illuminate a scene to facilitate capturing images with the sensor array 141. The flash 148 may include one or more light sources, such as one or more light emitting diodes (e.g., 1, 2, 3, 4, or more LEDs).

The sensor array 141 may also include a microphone 150. The microphone 150 may be acoustically coupled to the exterior environment through a hole defined in the rear cover of the device 140 (e.g., through the portion of the rear cover that defines the protrusion 151).

Other details about the sensor array, the individual cameras of the sensor array, and/or the flash described with respect to the device 100 may be applicable to the sensor array, the individual cameras, and/or the flash of the device 140, and such details will not be repeated here to avoid redundancy.

Figure 2:
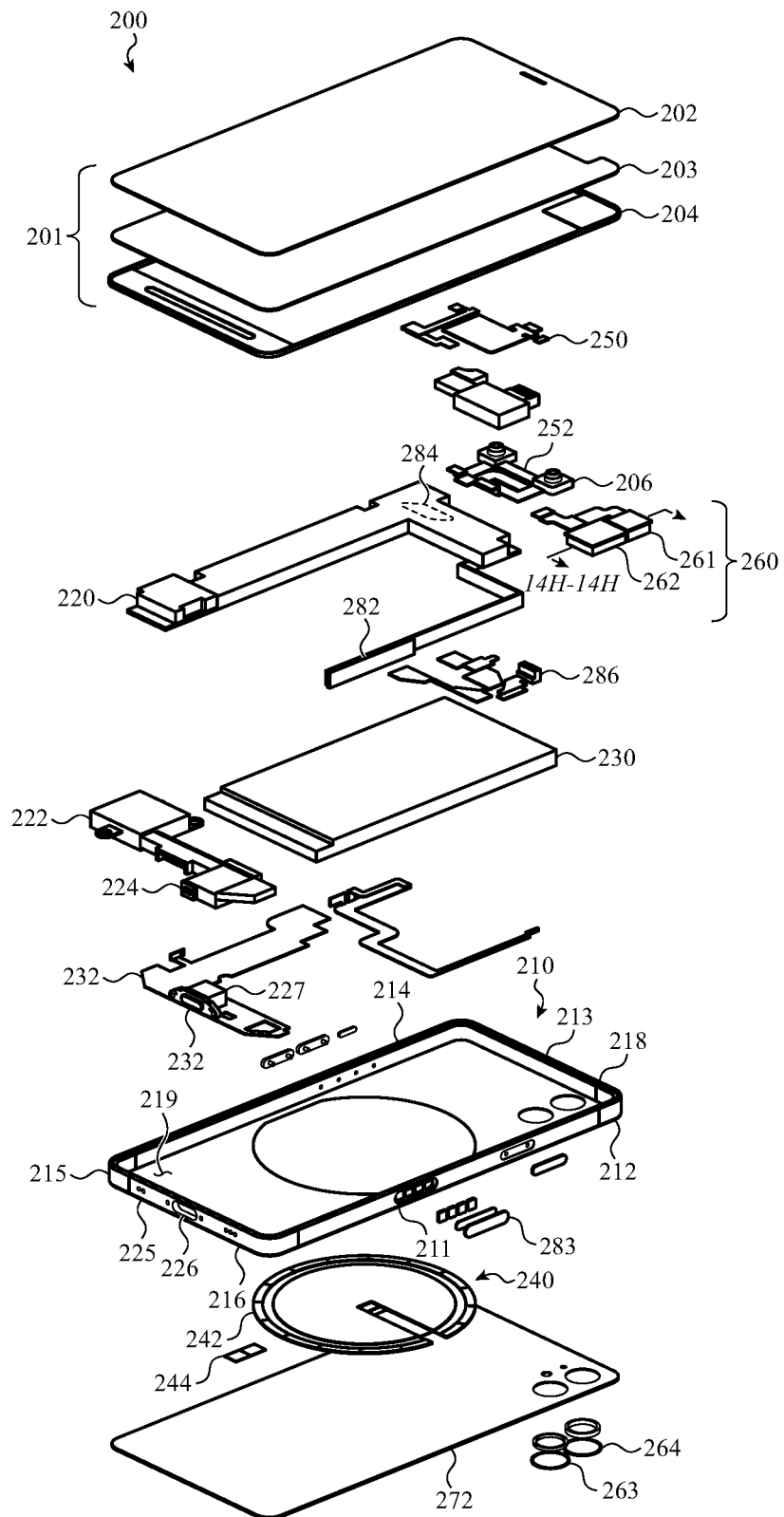
FIG. 2 depicts an exploded view of an example electronic device.

FIG. 2 depicts an exploded view of an example electronic device. In particular, FIG. 2 depicts an exploded view of a device 200, showing various components of the device 200 and example arrangements and configurations of the components. The description of the various components and elements of device 100 of FIGS. 1A and 1B may also be applicable to the device 200 depicted in FIG. 2. A redundant description of some of the components is not repeated herein for clarity.

As shown in FIG. 2, the device 200 includes a cover 202 (e.g., a front cover), which may be formed of glass, ceramic, or other transparent substrate. In this example, the cover 202 may be formed from a glass or glass-ceramic material. A glass-ceramic material may include both amorphous and crystalline or non-amorphous phases of one or more materials and may be formulated to improve strength or other properties of the cover 202. In some cases, the cover 202 may include a sheet of chemically strengthened glass or glass-ceramic having one or more coatings including an anti-reflective (AR) coating, an oleophobic coating, or other type of coating or optical treatment. In some cases, the cover 202 includes a sheet of material that is less than 1 mm thick. In some cases, the sheet of material is less than 0.80 mm. In some cases, the sheet of material is approximately 0.60 mm or less. The cover 202 may be chemically strengthened using an ion exchange process to form a compressive stress layer along exterior surfaces of the cover 202.

The cover 202 extends over a substantial entirety of the front surface of the device and may be positioned within an opening defined by the housing 210. As described in more detail below, the edges or sides of the cover 202 may be surrounded by a protective flange or lip of the housing 210 without an interstitial component between the edges of the cover 202 and the respective flanges of the housing 210. This configuration may allow an impact or force applied to the housing 210 to be transferred to the cover 202 without directly transferring shear stress through the display 203 or frame 204.

As shown in FIG. 2, the display 203 is attached to an internal surface of the cover 202. The display 203 may include an edge-to-edge organic light emitting diode (OLED) display that measures 13.7 cm (5.4 inches) corner-to-corner. The perimeter or non-active area of the display 203 may be reduced to allow for very thin device borders around the active area of the display 203. In some cases, the display 203 allows for border regions of 1.5 mm or less. In some cases, the display 203 allows for border regions of 1 mm or less. In one example implementation, the border region is approximately 0.9 mm. The display 203 may have a relatively high pixel density of approximately 450 pixels per inch (PPI) or greater. In some cases, the display 203 has a pixel density of approximately 475 PPI. The display 203 may have an integrated (on-cell) touch-sensing system. For example, an array of electrodes that are integrated into the OLED display may be time and/or frequency multiplexed in order to provide both display and touch-sensing functionality. The electrodes may be configured to detect a location of a touch, a gesture input, multi-touch input, or other types of touch input along the external surface of the cover 202. In some cases, the display 203 includes another type of display element, such as a liquid-crystal display (LCD) without an integrated touch-sensing system. That is, the device 200 may include one or more touch- and/or force-sensing layers that are positioned between the display 203 and the cover 202.

The display 203, also referred to as a display stack, may include always-on-display (AOD) functionality. For example, the display 203 may be configurable to allow designated regions or subsets of pixels to be displayed when the device 200 is powered on such that graphical content is visible to the user even when the device 200 is in a low-power or sleep mode. This may allow the time, date, battery status, recent notifications, and other graphical content to be displayed in a lower-power or sleep mode. This graphical content may be referred to as persistent or always-on graphical output. While some battery power may be consumed when displaying persistent or always-on graphical output, the power consumption is typically less than during normal or full-power operation of the display 203. This functionality may be enabled by only operating a subset of the display pixels and/or at a reduced resolution in order to reduce power consumption by the display 203.

As shown in FIG. 2, the device 200 may also include a frame member 204, also referred to simply as a frame 204, that is positioned below the cover 202 and that extends around an outer periphery of the display 203. A perimeter of the frame 204 may be attached to a lower or inner surface of the cover 202. A portion of the frame 204 may extend below the display 203 and may attach the cover 202 to the housing 210. Because the display 203 is attached to a lower or inner surface of the cover 202, the frame 204 may also be described as attaching both the display 203 and the cover 202 to the housing 210. The frame 204 may be formed of a polymer material, metal material, or combination of polymer and metal materials. The frame 204 may support elements of the display stack, provide anchor points for flexible circuits, and/or be used to mount other components and device elements. In some cases, the frame 204 includes one or more metal or conductive elements that provide shielding between device components, such as between the display stack (including display components and touch sensor components) and other components like the haptic actuator 222, the speaker system 224, and the like.

The cover 202, display stack 203, and frame member 204 may be part of a top module 201 of the device 200. The top module 201 may be assembled as a subassembly, which may then be attached to a housing member. For example, as described herein, the display 203 may be attached to the cover 202 (e.g., via a transparent adhesive), and the frame member 204 may be attached (e.g., via adhesive) to the cover around a periphery of the display stack 203. The top module 201 may then be attached to a housing member of the device 200 by mounting and adhering the frame member 204 to a ledge defined by the housing member.

As shown in FIG. 2, the device 200 also includes one or more cameras, light emitters, and/or sensing elements that are configured to transmit signals, receive signals, or otherwise operate along the front surface of the device. In this example, the device 200 includes a front camera 206 that includes a high-resolution camera sensor. The front camera 206 may have a 12 megapixel resolution sensor with optical elements that provide a fixed focus and an 85° field of view. The device 200 also includes a facial recognition sensor 252 that may be used to detect or capture a unique signature or bio-identifier (e.g., by projecting a pattern of dots onto a user's face and capturing an image of the user's face with the projected dots), which may be used to identify the user and unlock the device 200 or authorize functionality on the device 200 like the purchase of software apps or the use of payment functionality provided by the device 200.

The device may also include one or more other sensors or elements that are integrated into a front-facing sensor array 250. For example, the front-facing sensor array 250 may include a front light illuminator element for providing a flash or illumination for the front camera 206. The front-facing sensor array 250 may also include an ambient light sensor (ALS) that is used to detect ambient light conditions for setting exposure aspects of the front camera 206. The front-facing sensor array 250 may also include an antenna array that is configured to transmit and receive wireless communications along the front surface of the device 200. The antenna array may include antenna elements that are configured to conduct a 5G wireless protocol that may include mm wave and/or 6 GHz communication signals. The antenna array may include multiple antenna elements and may be configured to use beam-forming and other similar techniques to facilitate 5G wireless communication. As used herein, an antenna element may refer to a component that is configured (e.g., tuned) to resonate at a particular frequency or frequency band. Antenna elements may be formed from any suitable component or material, such as conductors (e.g., wires, metallic traces, metal housing segments), ceramics, or the like.

FIG. 2 also illustrates one or more cameras, light emitters, and/or sensing elements that are configured to transmit signals, receive signals, or otherwise operate along the rear surface of the device. As depicted in FIG. 2, these elements may be part of a sensor array 260. In this example, the sensor array 260 includes a first camera 261 having a 12 megapixel image sensor and a wide angle lens with an aperture number of f/1.6. The first camera 261 also includes a dual photo-diode sensor having an APS+ sensor format. The sensor array 260 also includes a second camera 262 having a 12 megapixel image sensor and a super-wide angle lens (120° FOV) with an aperture number of f/2.4. The sensor array 260 also includes a light illuminator that may be used as a flash for photography or as an auxiliary light source (e.g., a flashlight). The sensor array 260 also features an integrated chassis design that minimizes space while providing the precision alignment required for multiple high-resolution cameras. In some cases, the sensor array 260 also includes a microphone, an ambient light sensor, and other sensors that are adapted to sense along the rear surface of the device 200.

As shown in FIG. 2, the cameras 261 and 262 may be aligned with camera covers 263 and 264, respectively. The covers 263, 264 may be formed from a glass, glass-ceramic, or sapphire material and may provide a clear window through which the cameras 261, 262 are able to capture a photographic image. In other cases, the covers 263, 264 are optical lenses that filter, magnify, or otherwise condition light received by the respective camera 261, 262. The other sensing or transmitting elements of the sensor array 260 may transmit and/or receive signals through a region of the rear cover 272 or through a separate cover that is coupled to the rear cover 272. As shown in FIG. 2, the covers 263, 264 may extend beyond the exterior surface of the cover 272, and may define a recess along the interior side of the cover 272, such that the lens or other element of the cameras 261 and 262 can extend into the respective recesses. In this way, the device 200 may accommodate a larger lens or other elements of the cameras 261 and 262 than would be possible if the recess were not provided.

The device 200 also includes a battery 230. The battery 230 provides electrical power to the device 200 and its various systems and components. The battery 230 may include a 4.45 V lithium ion battery that is encased in a foil or other enclosing element (e.g., a pouch). The battery 230 may be attached to the device 200 (e.g., to the chassis 219) with one or more adhesives and/or other attachment techniques. In one example, the battery 230 may be attached to the chassis 219, or another structure of the device 200, with a two-layer adhesive, where a first adhesive is adhered to the battery 230 and to a second adhesive, and the second adhesive is bonded to the first adhesive and to the chassis 219 (or other structure of the device 200). The first and second adhesives may have different properties, such as different stiffness (e.g., Young's modulus), different adhesive properties, or the like. For example, in some cases, the first adhesive is configured to adhere to the material of the battery 230 (e.g., with a bond strength above a threshold value), while the second adhesive is configured to adhere to the chassis 219 or other structure of the device (e.g., with a bond strength above the threshold value). In such cases, the first adhesive may not form a sufficiently strong bond with the chassis 219, and the second adhesive may not form a sufficiently strong bond with the battery 230, though the first and second adhesives may form a sufficiently strong bond with one another. Accordingly, by using the two different adhesives (e.g., in the layered configuration described) to ultimately secure the battery 230 to the chassis 219, the overall strength and/or security of the attachment may be greater than if a single adhesive were used.

The battery 230 may be recharged via the charging port 232 (e.g., from a power cable plugged into the charging port 232), and/or via a wireless charging system 240. The battery 230 may be coupled to the charging port 232 and/or the wireless charging system 240 via battery control circuitry that controls the power provided to the battery and the power provided by the battery to the device 200. The battery 230 may include one or more lithium ion battery cells or any other suitable type of rechargeable battery element.

The charging system 240 may include a coil that inductively couples to an output or transmitting coil of a wireless charger. The coil may provide current to the device 200 to charge the battery 230 and/or power the device. In this example, the charging system 240 includes a coil assembly 242 that includes multiple wraps of a conductive wire or other conduit that is configured to produce a (charging) current in response to being placed in an inductive charging electromagnetic field produced by a separate wireless charging device or accessory. The coil assembly 242 also includes an array of magnetic elements that are arranged in a circular or radial pattern. The magnetic elements may help to locate the device 200 with respect to a separate wireless charging device or other accessory. In some implementations, the array of magnets also help to radially locate, orient, or "clock" the device 200 with respect to the separate wireless charging device or other accessory. For example, the array of magnets may include multiple magnetic elements having alternating magnetic polarity that are arranged in a radial pattern. The magnetic elements may be arranged to provide a magnetic coupling to the separate charging device in a particular orientation or set of discrete orientations to help locate the device 200 with respect to the separate charging device or other accessory. This functionality may be described as self-aligning or self-locating wireless charging. As shown in FIG. 2, the device 200 also includes a magnetic fiducial 244 for helping to locate the separate wireless charging device or accessory. In one example, the magnetic fiducial 244 is adapted to magnetically couple to a cable or power cord of the separate wireless charging device or other accessory. By coupling to the cable or power cord, the rotational alignment of the device 200 and the separate wireless charging device or other accessory may be maintained with respect to an absolute or single position. Also, by magnetically coupling the cable or cord to the rear surface of the device 200, the charging device or other accessory may be more securely coupled to the device 200.

The device 200 may also include a speaker system 224. The speaker system 224 may be positioned in the device 200 so that a respective speaker port 225 is aligned with or otherwise proximate an audio output of the speaker system 224. Accordingly, sound that is output by the speaker system 224 exits the housing 210 via the respective speaker port 225. The speaker system 224 may include a speaker positioned in a housing that defines a speaker volume (e.g., an empty space in front of or behind a speaker diaphragm). The speaker volume may be used to tune the audio output from the speaker and optionally mitigate destructive interference of the sound produced by the speaker. The speaker system 224 may include left and right speakers that are aligned with left and right speaker ports 225, respectively, in order to produce stereo sound.

The device 200 may also include a haptic actuator 222. The haptic actuator 222 may include a movable mass and an actuation system that is configured to move the mass to produce a haptic output. The actuation system may include one or more coils and one or more magnets (e.g., permanent and/or electromagnets) that interact to produce motion. The magnets may be or may include recycled magnetic material. As described herein, the haptic actuator 222 may have a profile or enclosure shape that facilitates physical integration with the battery 230 and other components of the device 200 in order to minimize space and/or maximize the size of the battery.

When the coil(s) are energized, the coil(s) may cause the mass to move, which results in a force being imparted on the device 200. The motion of the mass may be configured to cause a vibration, pulse, tap, or other tactile output detectable via an exterior surface of the device 200. The haptic actuator 222 may be configured to move the mass linearly, though other movements (e.g., rotational) are also contemplated. Other types of haptic actuators may be used instead of or in addition to the haptic actuator 222.

The device 200 also includes a logic board 220 (also referred to herein as a circuit board assembly). The logic board 220 may include a substrate, and processors, memory, and other circuit elements coupled to the substrate. The logic board 220 may include multiple circuit substrates that are stacked and coupled together in order to maximize the area available for electronic components and circuitry in a compact form factor. The logic board 220 may include provisions for a subscriber identity module (SIM). The logic board 220 may include electrical contacts and/or a SIM tray assembly for receiving a physical SIM card and/or the logic board 220 may include provisions for an electronic SIM. The logic board 220 may be wholly or partially encapsulated to reduce the chance of damage due to an ingress of water or other fluid.

The logic board 220 may also include a liquid detection circuit 227 that is located proximate to the charging opening 226 or other opening in the housing 210. The liquid detection circuit 227 may include a resistive or conductive sensor that is configured to electrically detect moisture above a given threshold and transmit a signal to the processor in order to record a liquid exposure event. The liquid detection circuit 227 may also include a visual element that changes color or provides some other visual indicia when exposed to moisture above a certain threshold. In some cases, the liquid detection circuit 227 is positioned within a sealed internal volume of a waterproof or water resistant device and is configured to detect liquid ingress due to a mechanical breach of the housing 210 or physical damage to the device 200.

The logic board 220 may also include wireless communications circuitry, which may be coupled to and/or otherwise use the housing members 211, 212, 213, 214, 215, or 216 (or portions thereof) as radiating members to provide wireless communications. The logic board 220 may also include components such as accelerometers, gyroscopes, near-field-communications circuitry and/or antennas, compasses, and the like.

The housing 210 may also include a chassis 219, which may be attached to the housing 210. The chassis 219 may be formed of metal, and may act as a structural mounting point for components of the device 200. The chassis 219 may define an opening that corresponds to the size of the coil assembly 242 of the wireless charging system 240, such that the chassis 219 does not shield the wireless coil assembly 242 or otherwise negatively affect the inductive coupling between the coil of the charging system 240 and an external wireless charger or accessory.

As shown in FIG. 2, the housing may include a cover 272 (e.g., rear or back cover) that may define a substantial entirety of the rear surface of the device 200. The cover 272 may be formed from a glass (or glass-ceramic) substrate having portions that are less than 1 mm thick. In some cases, the sheet substrate has portions that are less than 0.80 mm. In some cases, the glass substrate has portions that are approximately 0.60 mm or less. The cover 272 may have a uniform thickness or, in some cases, may have a thickened or raised portion that surrounds the camera covers 263, 264. The cover 272 may be machined (e.g., ground) into a final shape before being polished and/or textured to provide the desired surface finish. The texture may be specially configured to provide a matte appearance while also being resistant to collecting a buildup of skin, lint, or other debris. A series of cosmetic layers may be formed along the inner surface of the cover 272 to provide a desired optical effect and final color of the device 200.

Similar to as described above with respect to cover 202, the cover 272 may be positioned at least partially within an opening defined in the housing 210. Also similar to as described above with respect to cover 202, the edges or sides of the cover 272 may be surrounded by a protective flange or lip of the housing 210 without an interstitial component between the edges of the cover 272 and the respective flanges of the housing 210. The cover 272 is typically chemically strengthened using an ion exchange process to form a compressive stress layer along exterior surfaces of the cover 272.

As described above, the housing 210 may include housing members 211, 212, 213, 214, 215, and 216 structurally joined together via joint structures 218. FIG. 2 illustrates how the joint structures 218 may extend over inner surfaces of the housing members. More particularly, a portion of the joint structures 218 may contact, cover, encapsulate, and/or engage with retention features of the housing members that extend from the inner surfaces of the housing members.

Housing members 211, 212, 213, 214, 215, and 216 may also be referred to herein as housing segments and may be formed from aluminum, stainless steel, or other metal or metal alloy material. As described herein, the housing members 211, 212, 213, 214, 215, and 216 may provide a robust and impact resistant sidewall for the device 200. In the present example, the housing members 211, 212, 213, 214, 215, and 216 define a flat sidewall that extends around the perimeter of the device 200. The flat sidewall may include rounded or chamfered edges that define the upper and lower edges of the sidewall of the housing 210. The housing members 211, 212, 213, 214, 215, and 216 may each have a flange portion or lip that extends around and at least partially covers a respective side of the front and rear covers 202, 272. There may be no interstitial material or elements between the flange portion or lip and the respective side surface of the front and rear covers 202, 272. This may allow forces or impacts that are applied to the housing 210 to be transferred to the front and rear covers 202, 272 without affecting the display or other internal structural elements, which may improve the drop performance of the device 200.

As shown in FIG. 2, the device 200 includes multiple antennas that may be adapted to conduct wireless communication using a 5G communication protocol. In particular, the device 200 may include a (front-fired) antenna array 286 that is positioned near the earpiece of the device 200 and configured to transmit and receive wireless communication signals through the cover 202. The device 200 may also include a (side-fired) antenna array 282 that is configured to transmit and receive wireless communication signals through an antenna window 283 or waveguide formed along or otherwise integrated with the sidewall of the housing 210. The side-fired antenna array 282 may be coupled to the logic board 220 via a flexible circuit element or other conductive connection, as described herein. The device 200 may also include a (rear-fired) antenna array 284 that may be configured to transmit and receive wireless communication signals through the cover 272. The antenna array 284 may be attached to a back or bottom surface of the logic board 220. Each of the antenna arrays 282, 284, 286 may be adapted to conduct millimeter wave 5G communications and may be adapted to use or be used with beam-forming or other techniques to adapt signal reception depending on the use case. The device 200 may also include multiple antennas for conducting multiple-in multiple-out (MIMO) wireless communications schemes, including 4G, 4G LTE, and/or 5G MIMO communication protocols. As described herein, one or more of the housing members 211, 212, 213, 214, 215, and 216 may be adapted to operate as antennas for a MIMO wireless communication scheme (or other wireless communication scheme).

FIG. 3 depicts an exploded view of an example electronic device. In particular, FIG. 3 depicts an exploded view of a device 300, showing various components of the device 300 and example arrangements and configurations of the components. The description of the various components and elements of device 100 of FIGS. 1A and 1B may also be applicable to the device 300 depicted in FIG. 3. A redundant description of some of the components is not repeated herein for clarity.

As shown in FIG. 3, the device 300 includes a cover 302 (e.g., a front cover), which may be formed of glass, ceramic, or other transparent substrate. In this example, the cover 302 may be formed from a glass or glass-ceramic material. A glass-ceramic material may include both amorphous and crystalline or non-amorphous phases of one or more materials and may be formulated to improve strength or other properties of the cover 302. In some cases, the cover 302 may include a sheet of chemically strengthened material having one or more coatings including an anti-reflective (AR) coating, an oleophobic coating, or other type of coating or optical treatment. In some cases, the cover 302 includes a sheet of material that is less than 1 mm thick. In some cases, the sheet of material is less than 0.80 mm. In some cases, the sheet of material is approximately 0.60 mm or less. The cover 302 may be chemically strengthened using an ion exchange process to form a compressive stress layer along exterior surfaces of the cover 302.

The cover 302 extends over a substantial entirety of the front surface of the device and may be positioned within an opening defined by the housing 310. As described in more detail below, the edges or sides of the cover 302 may be surrounded by a protective flange or lip of the housing 310 without an interstitial component between the edges of the cover 302 and the respective flanges of the housing 310. This configuration may allow an impact or force applied to the housing 310 to be transferred to the cover 302 without directly transferring shear stress through the display 303 or frame 304.

As shown in FIG. 3, the display 303 is coupled to an internal surface of the cover 302. In this example, the display stack includes a display 303 (also referred to as a display element) and a touch-sensing layer 305, which is positioned between the display 303 and the cover 302. The display 303 may include an edge-to-edge organic light emitting diode (OLED) display that measures 15.4 cm (6.1 inches) corner-to-corner. The perimeter or non-active area of the display 303 may be reduced to allow for very thin device borders around the active area of the display 303. In some cases, the display 303 allows for border regions of 1.5 mm or less. In some cases, the display 303 allows for border regions of 1 mm or less. In one example implementation, the border region is approximately 0.9 mm. The display 303 may have a relatively high pixel density of approximately 450 pixels per inch (PPI) or greater. In some cases, the display 303 has a pixel density of approximately 460 PPI.

As shown in FIG. 3, the display stack includes both a display (element) 303 and a separate touch-sensing layer 305, and includes an array of capacitive electrodes that are configured to sense the presence and location of one or more touches along the external surface of the cover 302. The electrodes of the touch-sensing layer 305 may be configured to detect a location of a touch, a gesture input, multi-touch input, or other types of touch input along the external surface of the cover 302. In some cases, the touch-sensing layer 305 is coupled to or has an integrated flex circuit that extends from one or more of the long sides of the touch-sensing layer 305, which may reduce the border around the display 303. As with the previous example described above with respect to FIG. 2, the display 303 may have an integrated (on-cell) touch-sensing system. For example, an array of electrodes that are integrated into the OLED display may be time and/or frequency multiplexed in order to provide both display and touch-sensing functionality. In some cases, the display 303 includes another type of display element, such as a liquid-crystal display (LCD).

The display 303 may include always-on-display (AOD) functionality. For example, the display 303 may be configurable to allow designated regions or subsets of pixels to be displayed when the device 300 is powered on such that graphical content is visible to the user even when the device 300 is in a low-power or sleep mode. This may allow the time, date, battery status, recent notifications, and other graphical content to be displayed in a lower-power or sleep mode. This graphical content may be referred to as persistent or always-on graphical output. While some battery power may be consumed when displaying persistent or always-on graphical output, the power consumption is typically less than during normal or full-power operation of the display 303. This functionality may be enabled by only operating a subset of the display pixels and/or at a reduced resolution in order to reduce power consumption by the display 303.

As shown in FIG. 3, the device 300 may also include a frame 304 that is positioned below the cover 302 and that extends around an outer periphery of the display 303. A perimeter of the frame 304 may be attached to a lower or inner surface of the cover 302. A portion of the frame 304 may extend below the display 303 and may attach the cover 302 to the housing 310. Because the display 303 is attached to a lower or inner surface of the cover 302, the frame 304 may also be described as attaching both the display 303 and the cover 302 to the housing 310. The frame 304 may be formed of a polymer material, metal material, or combination of polymer and metal materials. The frame 304 may support elements of the display stack, provide anchor points for flexible circuits, and/or be used to mount other components and device elements. In some cases, the frame 304 includes one or more metal or conductive elements that provide shielding between device components, such as between the display stack (including display components and touch sensor components) and other components like the haptic actuator 322, the speaker system 324, and the like.

The cover 302, touch-sensing layer 305, display 303, and frame member 304 may be part of a top module 301 of the device 300. The top module 301 may be assembled as a subassembly, which may then be attached to a housing member. For example, as described herein, the display 303 and touch-sensing layer 305 may be attached to the cover 302 (e.g., via a transparent adhesive), and the frame member 304 may be attached (e.g., via adhesive) to the cover around a periphery of the display 303. The top module 301 may then be attached to a housing member of the device 300 by mounting and adhering the frame member 304 to a ledge defined by the housing member.

As shown in FIG. 3, the device 300 also includes one or more cameras, light emitters, and/or sensing elements that are configured to transmit signals, receive signals, or otherwise operate along the front surface of the device. In this example, the device 300 includes a front camera 306 that includes a high-resolution camera sensor. The front camera 306 may have a 12 megapixel resolution sensor with optical elements that provide a fixed focus and an 85° field of view. The front camera 306 may have an aperture number of f/2.2. The device 300 also includes a facial recognition sensor 352 that includes a depth sensor that includes an infrared light projector and an infrared light sensor that are configured to sense an array of depth points or regions along the face of the user. The array of depth points may be characterized as a unique signature or bio-identifier, which may be used to identify the user and unlock the device 300 or authorize functionality on the device 300 like the purchase of software apps or the use of payment functionality provided by the device 300.

The device may also include one or more other sensors or elements that are integrated into a front-facing sensor array 350. For example, the front-facing sensor array 350 may include a front light illuminator element for providing a flash or illumination for the front camera 306. The front-facing sensor array 350 may also include an ambient light sensor (ALS) that is used to detect ambient light conditions for setting exposure aspects of the front camera 306. The front-facing sensor array 350 may also include an antenna array that is configured to transmit and receive wireless communications along the front surface of the device 300. The antenna array may include elements that are configured to conduct a 5G wireless protocol that may include mm wave and/or 6 GHz communication signals. The antenna array may include multiple elements and may be configured to use or be used with beam-forming and other similar techniques to facilitate 5G wireless communication.

FIG. 3 also illustrates one or more cameras, light emitters, and/or sensing elements that are configured to transmit signals, receive signals, or otherwise operate along the rear surface of the device. As depicted in FIG. 3, these elements may be integrated in a sensor array 360. In this example, the sensor array 360 includes a first camera 361 having a 12 megapixel image sensor and a wide angle lens with an aperture number of f/1.6. The first camera 361 also includes a dual photodiode sensor having an APS+ sensor format. The sensor array 360 also includes a second camera 362 having a 12 megapixel image sensor and a super-wide angle lens (120° FOV) with an aperture number of f/2.4. The sensor array 360 may also include a third camera 363 having a 12 megapixel image sensor and a telephoto optical lens assembly that enables 2× optical zoom. The third camera 363 may also have an aperture number of f/2.0.

The sensor array 360 also includes a light illuminator that may be used as a flash for photography or as an auxiliary light source (e.g., a flashlight). The sensor array 360 also features an integrated chassis design that minimizes space while providing the precision alignment required for multiple high-resolution cameras. In some cases, the sensor array 360 also includes a microphone, an ambient light sensor, and other sensors that are adapted to sense along the rear surface of the device 300.

The sensor array 360 may also include a depth sensor 365 that is able to estimate a distance to objects positioned behind the device 300. The depth sensor 365 may include an optical sensor that uses time-of-flight or other optical effect to measure a distance between the device 300 and an external object. The depth sensor 365 may include one or more optical emitters that are adapted to emit one or more beams of light, which may be used to estimate the distance. In some cases, the one or more beams of light are coherent light beams having a substantially uniform wavelength/frequency (e.g., laser beams). A coherent light source may facilitate depth measurements using a time of flight, phase shift, or other optical effect. In some cases, the depth sensor 365 uses a sonic output, a radio output, or other type of output that may be used to measure the distance between the device 300 and one or more external objects.

As shown in FIG. 3, the cameras 361, 362, 363 may be aligned with camera covers 366, 367, 368, respectively. The covers 366, 367, 368 may be formed from a glass or sapphire material and may provide a clear window through which the cameras 361, 362, 363 are able to capture a photographic image. In other cases, the covers 366, 367, 368 are optical lenses that filter, magnify, or otherwise condition light received by the respective camera 361, 362, 363. The other sensing or transmitting elements of the sensor array 360 may transmit and/or receive signals through a region of the rear cover 372 or through a separate cover (e.g., 369) that is coupled to the rear cover 372. As shown in FIG. 3, the covers 366, 367, 368 may extend beyond the exterior surface of the cover 372, and may define a recess along the interior side of the cover 372, such that the lens or other element of the cameras 361, 362, 363 can extend into the respective recesses. In this way, the device 300 may accommodate a larger lens or other elements of the cameras 361, 362, 363 than would be possible if the recess were not provided.

The device 300 also includes a battery 330. The battery 330 provides electrical power to the device 300 and its various systems and components. The battery 330 may include a 4.45 V lithium ion battery that is encased in a foil or other enclosing element. The battery 330 may include a rolled electrode configuration, sometimes referred to as "jelly roll" or folded electrode configuration. The battery 330 may be recharged via the charging port 332 (e.g., from a power cable plugged into the charging port 332), and/or via a wireless charging system 340. The battery 330 may be coupled to the charging port 332 and/or the wireless charging system 340 via battery control circuitry that controls the power provided to the battery and the power provided by the battery to the device 300. The battery 330 may include one or more lithium ion battery cells or any other suitable type of rechargeable battery element.

The charging system 340 may include a coil that inductively couples to an output or transmitting coil of a wireless charger. The coil may provide current to the device 300 to charge the battery 330 and/or power the device. In this example, the charging system 340 includes a coil assembly 342 that includes multiple wraps of a conductive wire or other conduit that is configured to produce a (charging) current in response to being placed in an inductive charging electromagnetic field produced by a separate wireless charging device or accessory. The coil assembly 342 also includes an array of magnetic elements that are arranged in a circular or radial pattern. The magnetic elements may help to locate the device 300 with respect to a separate wireless charging device or other accessory. In some implementations, the array of magnets also help to radially locate, orient, or "clock" the device 300 with respect to the separate wireless charging device or other accessory. For example, the array of magnets may include multiple magnetic elements having alternating magnetic polarity that are arranged in a radial pattern. The magnetic elements may be arranged to provide a magnetic coupling to the separate charging device in a particular orientation or set of discrete orientations to help locate the device 300 with respect to the separate charging device or other accessory. This functionality may be described as self-aligning or self-locating wireless charging. As shown in FIG. 3, the device 300 also includes a magnetic fiducial 344 for helping to locate the separate wireless charging device or accessory. In one example, the magnetic fiducial 344 is adapted to magnetically couple to a cable or power cord of the separate wireless charging device or other accessory. By coupling to the cable or power cord, the rotational alignment of the device 300 and the separate wireless charging device or other accessory may be maintained with respect to an absolute or single position. Also, by magnetically coupling the cable or cord to the rear surface of the device 300, the charging device or other accessory may be more securely coupled to the device 300.

In some implementations, the charging system 340 includes an antenna or other element that detects the presence of a charging device or other accessory. In some cases, the charging system includes a near-field communications (NFC) antenna that is adapted to receive and/or send wireless communications between the device 300 and the wireless charger or other accessory. In some cases, the device 300 is adapted to perform wireless communications to detect or sense the presence of the wireless charger or other accessory without using a dedicated NFC antenna. The communications may also include information regarding the status of the device, the amount of charge held by the battery 330, and/or control signals to increase charging, decrease charging, start charging and/or stop charging for a wireless charging operation.

The device 300 may also include a speaker system 324. The speaker system 324 may be positioned in the device 300 so that a respective speaker port 325 is aligned with or otherwise proximate an audio output of the speaker system 324. Accordingly, sound that is output by the speaker system 324 exits the housing 310 via the respective speaker port 325. The speaker system 324 may include a speaker positioned in a housing that defines a speaker volume (e.g., an empty space in front of or behind a speaker diaphragm). The speaker volume may be used to tune the audio output from the speaker and optionally mitigate destructive interference of the sound produced by the speaker. The speaker system 324 may include left and right speakers that are aligned with left and right speaker ports 325, respectively, in order to produce stereo sound.

The device 300 may also include a haptic actuator 322. The haptic actuator 322 may include a movable mass and an actuation system that is configured to move the mass to produce a haptic output. The actuation system may include one or more coils and one or more magnets (e.g., permanent and/or electromagnets) that interact to produce motion. The magnets may be or may include recycled magnetic material. As described herein, the haptic actuator 322 may have a profile or enclosure shape that facilitates physical integration with the battery 330 and other components of the device 300 in order to minimize space and/or maximize the size of the battery.

When the coil(s) are energized, the coil(s) may cause the mass to move, which results in a force being imparted on the device 300. The motion of the mass may be configured to cause a vibration, pulse, tap, or other tactile output detectable via an exterior surface of the device 300. The haptic actuator 322 may be configured to move the mass linearly, though other movements (e.g., rotational) are also contemplated. Other types of haptic actuators may be used instead of or in addition to the haptic actuator 322.

The device 300 also includes a logic board 320. The logic board 320 may include a substrate, and processors, memory, and other circuit elements coupled to the substrate. The logic board 320 may include multiple circuit substrates that are stacked and coupled together in order to maximize the area available for electronic components and circuitry in a compact form factor. The logic board 320 may include provisions for a subscriber identity module (SIM). The logic board 320 may include electrical contacts and/or a SIM tray assembly for receiving a physical SIM card and/or the logic board 320 may include provisions for an electronic SIM. The logic board 320 may be wholly or partially encapsulated to reduce the chance of damage due to an ingress of water or other fluid.

The logic board 320 may also include a liquid detection circuit 327 that is located proximate to the charging opening 326 or other opening in the housing 310. The liquid detection circuit 327 may include a resistive or conductive sensor that is configured to electrically detect moisture above a given threshold and transmit a signal to the processor in order to record a liquid exposure event. The liquid detection circuit 327 may also include a visual element that changes color or provides some other visual indicia when exposed to moisture above a certain threshold. In some cases, the liquid detection circuit 327 is positioned within a sealed internal volume of a waterproof or water resistant device and is configured to detect liquid ingress due to a mechanical breach of the housing 310 or physical damage to the device 300.

The logic board 320 may also include wireless communications circuitry, which may be coupled to and/or otherwise use the housing members 311, 312, 313, 314, 315, or 316 (or portions thereof) as radiating members or structures to provide wireless communications. The logic board 320 may also include components such as accelerometers, gyroscopes, near-field communications circuitry and/or antennas, compasses, and the like. In some implementations, the logic board 320 may include a magnetometer that is adapted to detect and/or locate an accessory. For example, the magnetometer may be adapted to detect a magnetic (or non-magnetic) signal produced by an accessory of the device 300 or other device. The output of the magnetometer may include a direction output that may be used to display a directional indicia or other navigational guidance on the display 303 in order to guide the user toward a location of the accessory or other device.

The logic board 320 may also include one or more pressure transducers that may be operable to detect changes in external pressure in order to determine changes in altitude or height. The pressure sensors may be externally ported and/or positioned within a water-sealed internal volume of the housing 310. The output of the pressure sensors may be used to track flights of stairs climbed, a location (e.g., a floor) of a multi-story structure, movement performed during an activity in order to estimate physical effort or calories burned, or other relative movement of the device 300.

The logic board 320 may also include global position system (GPS) electronics that may be used to determine the location of the device 300 with respect to one or more satellites (e.g., a Global Navigation Satellite System (SNSS)) in order to estimate an absolution location of the device 300. In some implementations, the GPS electronics are operable to utilize dual frequency bands. For example, the GPS electronics may use L1 (L1C), L2 (L2C), L5, L1+L5, and other GPS signal bands in order to estimate the location of the device 300.

As shown in FIG. 3, the housing may include a cover 372 (e.g., rear or back cover) that may define a substantial entirety of the rear surface of the device 300. The cover 372 may be formed from a glass substrate having portions that are less than 1 mm thick. In some cases, the sheet substrate has portions that are less than 0.80 mm. In some cases, the glass substrate has portions that are approximately 0.60 mm or less. The cover 372 may have a uniform thickness or, in some cases, may have a thickened or raised portion that surrounds the camera covers 366, 367, 368. The cover 372 may be machined (e.g., ground) into a final shape before being polished and/or textured to provide the desired surface finish. The texture may be specially configured to provide a matte appearance while also being resistant to collecting a buildup of skin, lint, or other debris. A series of cosmetic layers may be formed along the inner surface of the cover 372 to provide a desired optical effect and final color of the device 300.

Similar to as described above with respect to cover 302, the cover 372 may be positioned at least partially within an opening defined in the housing 310. Also similar to as described above with respect to cover 302, the edges or sides of the cover 372 may be surrounded by a protective flange or lip of the housing 310 without an interstitial component between the edges of the cover 372 and the respective flanges of the housing 310. The cover 372 is typically chemically strengthened using an ion exchange process to form a compressive stress layer along exterior surfaces of the cover 372.

As described above, the housing 310 may include housing members 311, 312, 313, 314, 315, and 316 structurally joined together via joint structures 318. FIG. 3 illustrates how the joint structures 318 may extend over inner surfaces of the housing members. More particularly, a portion of the joint structures 318 may contact, cover, encapsulate, and/or engage with retention features of the housing members that extend from the inner surfaces of the housing members.

Housing members 311, 312, 313, 314, 315, and 316 may also be referred to herein as housing segments and may be formed from aluminum, stainless steel, or other metal or metal alloy material. As described herein, the housing members 311, 312, 313, 314, 315, and 316 may provide a robust and impact resistant sidewall for the device 300. In the present example, the housing members 311, 312, 313, 314, 315, and 316 define a flat sidewall that extends around the perimeter of the device 300. The flat sidewall may include rounded or chamfered edges that define the upper and lower edges of the sidewall of the housing 310. The housing members 311, 312, 313, 314, 315, and 316 may each have a flange portion or lip that extends around and at least partially covers a respective side of the front and rear covers 302, 372. There may be no interstitial material or elements between the flange portion or lip and the respective side surface of the front and rear covers 302, 372. This may allow forces or impacts that are applied to the housing 310 to be transferred to the front and rear covers 302, 372 without affecting the display or other internal structural elements, which may improve the drop performance of the device 300.

As shown in FIG. 3, the device 300 includes multiple antennas that may be adapted to conduct wireless communication using a 5G communication protocol. In particular, the device 300 may include a (front-fired) antenna array 386 that is positioned near the earpiece of the device 300 and configured to transmit and receive wireless communication signals through the cover 302. The device 300 may also include a (side-fired) antenna array 382 that is configured to transmit and receive wireless communication signals through an antenna window 383 or waveguide formed along or otherwise integrated with the side wall of the housing 310. The side-fired antenna array 382 may be coupled to the logic board 320 via a flexible circuit element or other conductive connection, as described herein. The device 300 may also include a (rear-fired) antenna array 384 that may be configured to transmit and receive wireless communication signals through the cover 372. The (rear-fired) antenna array 384 may be attached to a back or bottom surface of the logic board 320. Each of the antenna arrays 382, 384, 386 may be adapted to conduct millimeter wave 5G communications and may be adapted to use or be used with beam-forming or other techniques to adapt signal reception depending on the use case. The device 300 may also include multiple antennas for conducting multiple-in multiple-out (MIMO) wireless communications schemes, including 4G, 4G LTE, and/or 5G MIMO communication protocols. As described herein, one or more of the housing members 311, 312, 313, 314, 315, and 316 may be adapted to operate as antennas for a MIMO wireless communication scheme (or other wireless communication scheme).

Figure 4:
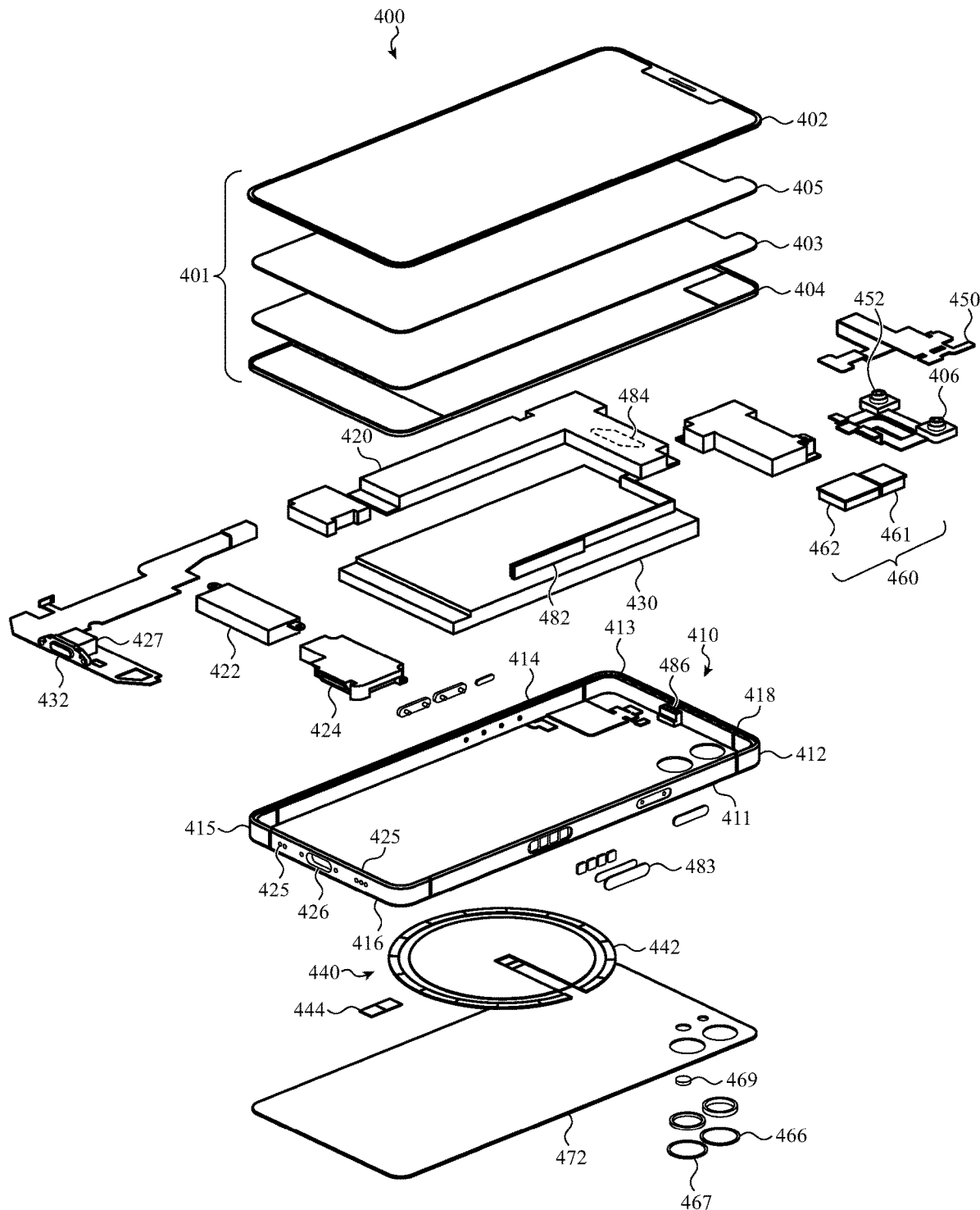
FIG. 4 depicts an exploded view of an example electronic device.

FIG. 4 depicts an exploded view of an example electronic device. In particular, FIG. 4 depicts an exploded view of a device 400, showing various components of the device 400 and example arrangements and configurations of the components. The description of the various components and elements of device 100 of FIGS. 1A and 1B may also be applicable to the device 400 depicted in FIG. 4. A redundant description of some of the components is not repeated herein for clarity.

As shown in FIG. 4, the device 400 includes a cover 402 (e.g., a front cover), which may be formed of glass, ceramic, or other transparent substrate. In this example, the cover 402 may be formed from a glass or glass-ceramic material. A glass-ceramic material may include both amorphous and crystalline or non-amorphous phases of one or more materials and may be formulated to improve strength or other properties of the cover 402. In some cases, the cover 402 may include a sheet of chemically strengthened material having one or more coatings including an anti-reflective (AR) coating, an oleophobic coating, or other type of coating or optical treatment. In some cases, the cover 402 includes a sheet of material that is less than 1 mm thick. In some cases, the sheet of material is less than 0.80 mm. In some cases, the sheet of material is approximately 0.60 mm or less. The cover 402 may be chemically strengthened using an ion exchange process to form a compressive stress layer along exterior surfaces of the cover 402.

The cover 402 extends over a substantial entirety of the front surface of the device and may be positioned within an opening defined by the housing 410. As described in more detail below, the edges or sides of the cover 402 may be surrounded by a protective flange or lip of the housing 410 without an interstitial component between the edges of the cover 402 and the respective flanges of the housing 410. This configuration may allow an impact or force applied to the housing 410 to be transferred to the cover 402 without directly transferring shear stress through the display 403 or frame 404.

As shown in FIG. 4, the display 403 is coupled to an internal surface of the cover 402. In this example, the display stack includes a display 403 (also referred to as a display element) and a touch-sensing layer 405, which is positioned between the display 403 and the cover 402. The display 403 may include an edge-to-edge organic light emitting diode (OLED) display that measures 15.4 cm (6.1 inches) corner-to-corner. The perimeter or non-active area of the display 403 may be reduced to allow for very thin device borders around the active area of the display 403. In some cases, the display 403 allows for border regions of 1.5 mm or less. In some cases, the display 403 allows for border regions of 1 mm or less. In one example implementation, the border region is approximately 0.9 mm. The display 403 may have a relatively high pixel density of approximately 450 pixels per inch (PPI) or greater. In some cases, the display 403 has a pixel density of approximately 460 PPI.

As shown in FIG. 4, the display stack includes both a display (element) 403 and a separate touch-sensing layer 405, and includes an array of capacitive electrodes that are configured to sense the presence and location of one or more touches along the external surface of the cover 402. The electrodes of the touch-sensing layer 405 may be configured to detect a location of a touch, a gesture input, multi-touch input, or other types of touch input along the external surface of the cover 402. In some cases, the touch-sensing layer 405 is coupled to or has an integrated flex circuit that extends from one or more of the long sides of the touch-sensing layer 405, which may reduce the border around the display 403. As with the previous example described above with respect to FIG. 2, the display 403 may have an integrated (on-cell) touch-sensing system. For example, an array of electrodes that are integrated into the OLED display may be time and/or frequency multiplexed in order to provide both display and touch-sensing functionality. In some cases, the display 403 includes another type of display element, such as a liquid-crystal display (LCD).

The display 403 may include always-on-display (AOD) functionality. For example, the display 403 may be configurable to allow designated regions or subsets of pixels to be displayed when the device 400 is powered on such that graphical content is visible to the user even when the device 400 is in a low-power or sleep mode. This may allow the time, date, battery status, recent notifications, and other graphical content to be displayed in a lower-power or sleep mode. This graphical content may be referred to as persistent or always-on graphical output. While some battery power may be consumed when displaying persistent or always-on graphical output, the power consumption is typically less than during normal or full-power operation of the display 403. This functionality may be enabled by only operating a subset of the display pixels and/or at a reduced resolution in order to reduce power consumption by the display 403.

As shown in FIG. 4, the device 400 may also include a frame 404 that is positioned below the cover 402 and that extends around an outer periphery of the display 403. A perimeter of the frame 404 may be attached to a lower or inner surface of the cover 402. A portion of the frame 404 may extend below the display 403 and may attach the cover 402 to the housing 410. Because the display 403 is attached to a lower or inner surface of the cover 402, the frame 404 may also be described as attaching both the display 403 and the cover 402 to the housing 410. The frame 404 may be formed of a polymer material, metal material, or combination of polymer and metal materials. The frame 404 may support elements of the display stack, provide anchor points for flexible circuits, and/or be used to mount other components and device elements. In some cases, the frame 404 includes one or more metal or conductive elements that provide shielding between device components, such as between the display stack (including display components and touch sensor components) and other components like the haptic actuator 422, the speaker system 424, and the like.

The cover 402, touch-sensing layer 405, display 403, and frame member 404 may be part of a top module 401 of the device 400. The top module 401 may be assembled as a subassembly, which may then be attached to a housing member. For example, as described herein, the display 403 and touch-sensing layer 405 may be attached to the cover 402 (e.g., via a transparent adhesive), and the frame member 404 may be attached (e.g., via adhesive) to the cover around a periphery of the display 403. The top module 401 may then be attached to a housing member of the device 400 by mounting and adhering the frame member 404 to a ledge defined by the housing member.

As shown in FIG. 4, the device 400 also includes one or more cameras, light emitters, and/or sensing elements that are configured to transmit signals, receive signals, or otherwise operate along the front surface of the device. In this example, the device 400 includes a front camera 406 that includes a high-resolution camera sensor. The front camera 406 may have a 12 megapixel resolution sensor with optical elements that provide a fixed focus and an 85° field of view. The front camera 406 may have an aperture number of f/2.2. The device 400 also includes a facial recognition sensor 452 that includes a depth sensor that includes an infrared light projector and an infrared light sensor that are configured to sense an array of depth points or regions along the face of the user. The array of depth points may be characterized as a unique signature or bio-identifier, which may be used to identify the user and unlock the device 400 or authorize functionality on the device 400 like the purchase of software apps or the use of payment functionality provided by the device 400.

The device may also include one or more other sensors or elements that are integrated into a front-facing sensor array 450. For example, the front-facing sensor array 450 may include a front light illuminator element for providing a flash or illumination for the front camera 406. The front-facing sensor array 450 may also include an ambient light sensor (ALS) that is used to detect ambient light conditions for setting exposure aspects of the front camera 406. The front-facing sensor array 450 may also include an antenna array that is configured to transmit and receive wireless communications along the front surface of the device 400. The antenna array may include elements that are configured to conduct a 5G wireless protocol that may include mm wave and/or 6 GHz communication signals. The antenna array may include multiple elements and may be configured to use or be used with beam-forming and other similar techniques to facilitate 5G wireless communication.

FIG. 4 also illustrates one or more cameras, light emitters, and/or sensing elements that are configured to transmit signals, receive signals, or otherwise operate along the rear surface of the device. As depicted in FIG. 4, these elements may be integrated in a sensor array 460. In this example, the sensor array 460 includes a first camera 461 having a 12 megapixel image sensor and a wide angle lens with an aperture number of f/1.6. The first camera 461 also includes a dual photodiode sensor having an APS+ sensor format. The sensor array 460 also includes a second camera 462 having a 12 megapixel image sensor and a super-wide angle lens (120° FOV) with an aperture number of f/2.4.

The sensor array 460 also includes a light illuminator that may be used as a flash for photography or as an auxiliary light source (e.g., a flashlight). The sensor array 460 also features an integrated chassis design that minimizes space while providing the precision alignment required for multiple high-resolution cameras. In some cases, the sensor array 460 also includes a microphone, an ambient light sensor, and other sensors that are adapted to sense along the rear surface of the device 400.

The sensor array 460 may also include a depth sensor that is able to estimate a distance to objects positioned behind the device 400. The depth sensor may include an optical sensor that uses time-of-flight or other optical effect to measure a distance between the device 400 and an external object. The depth sensor may include one or more optical emitters that are adapted to emit one or more beams of light, which may be used to estimate the distance. In some cases, the one or more beams of light are coherent light beams having a substantially uniform wavelength/frequency. A coherent light source may facilitate depth measurements using a time of flight, phase shift, or other optical effect. In some cases, the depth sensor uses a sonic output, radio output, or other type of output that may be used to measure the distance between the device 400 and one or more external objects.

As shown in FIG. 4, the cameras 461, 462 may be aligned with camera covers 466, 467 respectively. The covers 466, 467 may be formed from a glass or sapphire material and may provide a clear window through which the cameras 461, 462 are able to capture a photographic image. In other cases, the covers 466, 467 are optical lenses that filter, magnify or otherwise condition light received by the respective camera 461, 462. The other sensing or transmitting elements of the sensor array 460 may transmit and/or receive signals through a region of the rear cover 472 or through a separate cover (e.g., 469) that is coupled to the rear cover 472. As shown in FIG. 4, the covers 466, 467 may extend beyond the exterior surface of the cover 472, and may define a recess along the interior side of the cover 472, such that the lens or other element of the cameras 461, 462 can extend into the respective recesses. In this way, the device 400 may accommodate a larger lens or other elements of the cameras 461, 462 than would be possible if the recess were not provided.

The device 400 also includes a battery 430. The battery 430 provides electrical power to the device 400 and its various systems and components. The battery 430 may include a 4.45 V lithium ion battery that is encased in a foil or other enclosing element. The battery 430 may include a rolled electrode configuration, sometimes referred to as "jelly roll" or folded electrode configuration. The battery 430 may be recharged via the charging port 432 (e.g., from a power cable plugged into the charging port 432), and/or via a wireless charging system 440. The battery 430 may be coupled to the charging port 432 and/or the wireless charging system 440 via battery control circuitry that controls the power provided to the battery and the power provided by the battery to the device 400. The battery 430 may include one or more lithium ion battery cells or any other suitable type of rechargeable battery element.

The charging system 440 may include a coil that inductively couples to an output or transmitting coil of a wireless charger. The coil may provide current to the device 400 to charge the battery 430 and/or power the device. In this example, the charging system 440 includes a coil assembly 442 that includes multiple wraps of a conductive wire or other conduit that is configured to produce a (charging) current in response to being placed in an inductive charging electromagnetic field produced by a separate wireless charging device or accessory. The coil assembly 442 also includes an array of magnetic elements that are arranged in a circular or radial pattern. The magnetic elements may help to locate the device 400 with respect to a separate wireless charging device or other accessory. In some implementations, the array of magnets also help to radially locate, orient, or "clock" the device 400 with respect to the separate wireless charging device or other accessory. For example, the array of magnets may include multiple magnetic elements having alternating magnetic polarity that are arranged in a radial pattern. The magnetic elements may be arranged to provide a magnetic coupling to the separate charging device in a particular orientation or set of discrete orientations to help locate the device 400 with respect to the separate charging device or other accessory. This functionality may be described as self-aligning or self-locating wireless charging. As shown in FIG. 4, the device 400 also includes a magnetic fiducial 444 for helping to locate the separate wireless charging device or accessory. In one example, the magnetic fiducial 444 is adapted to magnetically couple to a cable or power cord of the separate wireless charging device or other accessory. By coupling to the cable or power cord, the rotational alignment of the device 400 and the separate wireless charging device or other accessory may be maintained with respect to an absolute or single position. Also, by magnetically coupling the cable or cord to the rear surface of the device 400, the charging device or other accessory may be more securely coupled to the device 400.

In some implementations, the charging system 440 includes an antenna or other element that detects the presence of a charging device or other accessory. In some cases, the charging system includes a near-field communications (NFC) antenna that is adapted to receive and/or send wireless communications between the device 400 and the wireless charger or other accessory. In some cases, the device 400 is adapted to perform wireless communications to detect or sense the presence of the wireless charger or other accessory without using a dedicated NFC antenna. The communications may also include information regarding the status of the device, the amount of charge held by the battery 430, and/or control signals to increase charging, decrease charging, start charging and/or stop charging for a wireless charging operation.

The device 400 may also include a speaker system 424. The speaker system 424 may be positioned in the device 400 so that a respective speaker port 425 is aligned with or otherwise proximate an audio output of the speaker system 424. Accordingly, sound that is output by the speaker system 424 exits the housing 410 via the respective speaker port 425. The speaker system 424 may include a speaker positioned in a housing that defines a speaker volume (e.g., an empty space in front of or behind a speaker diaphragm). The speaker volume may be used to tune the audio output from the speaker and optionally mitigate destructive interference of the sound produced by the speaker. The speaker system 424 may include left and right speakers that are aligned with left and right speaker ports 425, respectively, in order to produce stereo sound.

The device 400 may also include a haptic actuator 422. The haptic actuator 422 may include a movable mass and an actuation system that is configured to move the mass to produce a haptic output. The actuation system may include one or more coils and one or more magnets (e.g., permanent and/or electromagnets) that interact to produce motion. The magnets may be or may include recycled magnetic material. As described herein, the haptic actuator 422 may have a profile or enclosure shape that facilitates physical integration with the battery 430 and other components of the device 400 in order to minimize space and/or maximize the size of the battery.

When the coil(s) are energized, the coil(s) may cause the mass to move, which results in a force being imparted on the device 400. The motion of the mass may be configured to cause a vibration, pulse, tap, or other tactile output detectable via an exterior surface of the device 400. The haptic actuator 422 may be configured to move the mass linearly, though other movements (e.g., rotational) are also contemplated. Other types of haptic actuators may be used instead of or in addition to the haptic actuator 422.

The device 400 also includes a logic board 420. The logic board 420 may include a substrate, and processors, memory, and other circuit elements coupled to the substrate. The logic board 420 may include multiple circuit substrates that are stacked and coupled together in order to maximize the area available for electronic components and circuitry in a compact form factor. The logic board 420 may include provisions for a subscriber identity module (SIM). The logic board 420 may include electrical contacts and/or a SIM tray assembly for receiving a physical SIM card and/or the logic board 420 may include provisions for an electronic SIM. The logic board 420 may be wholly or partially encapsulated to reduce the chance of damage due to an ingress of water or other fluid.

The logic board 420 may also include a liquid detection circuit 427 that is located proximate to the charging opening 426 or other opening in the housing 410. The liquid detection circuit 427 may include a resistive or conductive sensor that is configured to electrically detect moisture above a given threshold and transmit a signal to the processor in order to record a liquid exposure event. The liquid detection circuit 427 may also include a visual element that changes color or provides some other visual indicia when exposed to moisture above a certain threshold. In some cases, the liquid detection circuit 427 is positioned within a sealed internal volume of a waterproof or water resistant device and is configured to detect liquid ingress due to a mechanical breach of the housing 410 or physical damage to the device 400.

The logic board 420 may also include wireless communications circuitry, which may be coupled to and/or otherwise use the housing members 411, 412, 413, 414, 415, or 416 (or portions thereof) as radiating members or structures to provide wireless communications. The logic board 420 may also include components such as accelerometers, gyroscopes, near-field communications circuitry and/or antennas, compasses, and the like. In some implementations, the logic board 420 may include a magnetometer that is adapted to detect and/or locate an accessory. For example, the magnetometer may be adapted to detect a magnetic (or non-magnetic) signal produced by an accessory of the device 400 or other device. The output of the magnetometer may include a direction output that may be used to display a directional indicia or other navigational guidance on the display 403 in order to guide the user toward a location of the accessory or other device.

The logic board 420 may also include one or more pressure transducers that may be operable to detect changes in external pressure in order to determine changes in altitude or height. The pressure sensors may be externally ported and/or positioned within a water-sealed internal volume of the housing 410. The output of the pressure sensors may be used to track flights of stairs climbed, a location (e.g., a floor) of a multi-story structure, movement performed during an activity in order to estimate physical effort or calories burned, or other relative movement of the device 400.

The logic board 420 may also include global position system (GPS) electronics that may be used to determine the location of the device 400 with respect to one or more satellites (e.g., a Global Navigation Satellite System (SNSS)) in order to estimate an absolution location of the device 400. In some implementations, the GPS electronics are operable to utilize dual frequency bands. For example, the GPS electronics may use L1 (L1C), L2 (L2C), L5, L1+L5, and other GPS signal bands in order to estimate the location of the device 400.

As shown in FIG. 4, the housing may include a cover 472 (e.g., rear or back cover) that may define a substantial entirety of the rear surface of the device 400. The cover 472 may be formed from a glass, glass ceramic, ceramic, or other material substrate having portions that are less than 1 mm thick. In some cases, the substrate has portions that are less than 0.80 mm. In some cases, the substrate has portions that are approximately 0.60 mm or less. The cover 472 may have a uniform thickness or, in some cases, may have a thickened or raised portion that surrounds the camera covers 466, 467. The cover 472 may be machined (e.g., ground) into a final shape before being polished and/or textured to provide the desired surface finish. The texture may be specially configured to provide a matte appearance while also being resistant to collecting a buildup of skin, lint, or other debris. A series of cosmetic layers may be formed along the inner surface of the cover 472 to provide a desired optical effect and final color of the device 400.

Similar to as described above with respect to cover 402, the cover 472 may be positioned at least partially within an opening defined in the housing 410. Also similar to as described above with respect to cover 402, the edges or sides of the cover 472 may be surrounded by a protective flange or lip of the housing 410 without an interstitial component between the edges of the cover 472 and the respective flanges of the housing 410. The cover 472 may be chemically strengthened using an ion exchange process to form a compressive stress layer along exterior surfaces of the cover 472.

As described above, the housing 410 may include housing members 411, 412, 413, 414, 415, and 416 structurally joined together via joint structures 418. FIG. 4 illustrates how the joint structures 418 may extend over inner surfaces of the housing members. More particularly, a portion of the joint structures 418 may contact, cover, encapsulate, and/or engage with retention features of the housing members that extend from the inner surfaces of the housing members.

Housing members 411, 412, 413, 414, 415, and 416 may also be referred to herein as housing segments and may be formed from aluminum, stainless steel, or other metal or metal alloy material. As described herein, the housing members 411, 412, 413, 414, 415, and 416 may provide a robust and impact resistant sidewall for the device 400. In the present example, the housing members 411, 412, 413, 414, 415, and 416 define a flat sidewall that extends around the perimeter of the device 400. The flat sidewall may include rounded or chamfered edges that define the upper and lower edges of the sidewall of the housing 410. The housing members 411, 412, 413, 414, 415, and 416 may each have a flange portion or lip that extends around and at least partially covers a respective side of the front and rear covers 402, 472. There may be no interstitial material or elements between the flange portion or lip and the respective side surface of the front and rear covers 402, 472. This may allow forces or impacts that are applied to the housing 410 to be transferred to the front and rear covers 402, 472 without affecting the display or other internal structural elements, which may improve the drop performance of the device 400.

As shown in FIG. 4, the device 400 includes multiple antennas that may be adapted to conduct wireless communication using a 5G communication protocol. In particular, the device 400 may include a (front-fired) antenna array 486 that is positioned near the earpiece of the device 400 and configured to transmit and receive wireless communication signals through the cover 402. The device 400 may also include a (side-fired) antenna array 482 that is configured to transmit and receive wireless communication signals through an antenna window 483 or waveguide formed along or otherwise integrated with the side wall of the housing 410. The side-fired antenna array 482 may be coupled to the logic board 420 via a flexible circuit element or other conductive connection, as described herein. The device 400 may also include a (rear-fired) antenna array 484 that may be configured to transmit and receive wireless communication signals through the cover 472. The antenna array 484 may be attached to a back or bottom surface of the logic board 420. Each of the antenna arrays 482, 484, 486 may be adapted to conduct millimeter wave 5G communications and may be adapted to use or be used with beam-forming or other techniques to adapt signal reception depending on the use case. The device 400 may also include multiple antennas for conducting multiple-in multiple-out (MIMO) wireless communications schemes, including 4G, 4G LTE, and/or 5G MIMO communication protocols. As described herein, one or more of the housing members 411, 412, 413, 414, 415, and 416 may be adapted to operate as antennas for a MIMO wireless communication scheme (or other wireless communication scheme).

FIG. 5 depicts an exploded view of an example electronic device. In particular, FIG. 5 depicts an exploded view of a device 500, showing various components of the device 500 and example arrangements and configurations of the components. The description of the various components and elements of device 100 of FIGS. 1A and 1B may also be applicable to the device 500 depicted in FIG. 5. A redundant description of some of the components is not repeated herein for clarity.

As shown in FIG. 5, the device 500 includes a cover 502 (e.g., a front cover), which may be formed of glass, ceramic, or other transparent substrate. In this example, the cover 502 may be formed from a glass or glass-ceramic material. A glass-ceramic material may include both amorphous and crystalline or non-amorphous phases of one or more materials and may be formulated to improve strength or other properties of the cover 502. In some cases, the cover 502 may include a sheet of chemically strengthened material having one or more coatings including an anti-reflective (AR) coating, an oleophobic coating, or other type of coating or optical treatment. In some cases, the cover 502 includes a sheet of material that is less than 1 mm thick. In some cases, the sheet of material is less than 0.80 mm. In some cases, the sheet of material is approximately 0.60 mm or less. The cover 502 may be chemically strengthened using an ion exchange process to form a compressive stress layer along exterior surfaces of the cover 502.

The cover 502 extends over a substantial entirety of the front surface of the device and may be positioned within an opening defined by the housing 510. As described in more detail below, the edges or sides of the cover 502 may be surrounded by a protective flange or lip of the housing 510 without an interstitial component between the edges of the cover 502 and the respective flanges of the housing 510. This configuration may allow an impact or force applied to the housing 510 to be transferred to the cover 502 without directly transferring shear stress through the display 503 or frame 504.

As shown in FIG. 5, the display 503 is coupled to an internal surface of the cover 502. The display 503 may include an edge-to-edge organic light emitting diode (OLED) display that measures 16.97 cm (6.68 inches) corner-to-corner. The perimeter or non-active area of the display 503 may be reduced to allow for very thin device borders around the active area of the display 503. In some cases, the display 503 allows for border regions of 1.5 mm or less. In some cases, the display 503 allows for border regions of 1 mm or less. In one example implementation, the border region is approximately 0.9 mm. The display 503 may have a relatively high pixel density of approximately 450 pixels per inch (PPI) or greater. In some cases, the display 503 has a pixel density of approximately 458 PPI. The display 503 may have an integrated (on-cell) touch-sensing system. For example, an array of electrodes that are integrated into the OLED display may be time and/or frequency multiplexed in order to provide both display and touch-sensing functionality. The electrodes may be configured to detect a location of a touch, a gesture input, multi-touch input, or other types of touch input along the external surface of the cover 502. In some cases, the display 503 includes another type of display element, such as a liquid-crystal display (LCD) without an integrated touch-sensing system. That is, the device 500 may include one or more touch- and/or force-sensing layers that are positioned between the display 503 and the cover 502.

The display 503 may include always-on-display (AOD) functionality. For example, the display 503 may be configurable to allow designated regions or subsets of pixels to be displayed when the device 500 is powered on such that graphical content is visible to the user even when the device 500 is in a low-power or sleep mode. This may allow the time, date, battery status, recent notifications, and other graphical content to be displayed in a lower-power or sleep mode. This graphical content may be referred to as persistent or always-on graphical output. While some battery power may be consumed when displaying persistent or always-on graphical output, the power consumption is typically less than during normal or full-power operation of the display 503. This functionality may be enabled by only operating a subset of the display pixels and/or at a reduced resolution in order to reduce power consumption by the display 503.

As shown in FIG. 5, the device 500 may also include a frame 504 that is positioned below the cover 502 and that extends around an outer periphery of the display 503. A perimeter of the frame 504 may be attached to a lower or inner surface of the cover 502. A portion of the frame 504 may extend below the display 503 and may attach the cover 502 to the housing 510. Because the display 503 is attached to a lower or inner surface of the cover 502, the frame 504 may also be described as attaching both the display 503 and the cover 502 to the housing 510. The frame 504 may be formed of a polymer material, a metal material, or a combination of polymer and metal materials. The frame 504 may support elements of the display stack, provide anchor points for flexible circuits, and/or be used to mount other components and device elements. In some cases, the frame 504 includes one or more metal or conductive elements that provide shielding between device components, such as between the display stack (including display components and touch sensor components) and other components like the haptic actuator 522, the speaker system 524, and the like.

The cover 502, display stack 503, and frame member 504 may be part of a top module 501 of the device 500. The top module 501 may be assembled as a subassembly, which may then be attached to a housing member. For example, as described herein, the display 503 may be attached to the cover 502 (e.g., via a transparent adhesive), and the frame member 504 may be attached (e.g., via adhesive) to the cover around a periphery of the display stack 503. The top module 501 may then be attached to a housing member of the device 500 by mounting and adhering the frame member 504 to a ledge defined by the housing member.

As shown in FIG. 5, the device 500 also includes one or more cameras, light emitters, and/or sensing elements that are configured to transmit signals, receive signals, or otherwise operate along the front surface of the device. In this example, the device 500 includes a front camera 506 that includes a high-resolution camera sensor. The front camera 506 may have a 12 megapixel resolution sensor with optical elements that provide a fixed focus and an 85° field of view. The front camera 506 may have an aperture number of f/2.2. The device 500 also includes a facial recognition sensor 552 that includes a depth sensor that includes an infrared light projector and infrared light sensor that are configured to sense an array of depth points or regions along the face of the user. The array of depth points may be characterized as a unique signature or bio-identifier, which may be used to identify the user and unlock the device 500 or authorize functionality on the device 500 like the purchase of software apps or the use of payment functionality provided by the device 500.

The device may also include one or more other sensors or elements that are integrated into a front-facing sensor array 550. For example, the front-facing sensor array 550 may include a front light illuminator element for providing a flash or illumination for the front camera 506. The front-facing sensor array 550 may also include an ambient light sensor (ALS) that is used to detect ambient light conditions for setting exposure aspects of the front camera 506. The front-facing sensor array 550 may also include an antenna array that is configured to transmit and receive wireless communications along the front surface of the device 500. The antenna array may include elements that are configured to conduct a 5G wireless protocol that may include mm wave and/or 6 GHz communication signals. The antenna array may include multiple elements and may be configured to use or be used with beam-forming and other similar techniques to facilitate 5G wireless communication.

FIG. 5 also illustrates one or more cameras, light emitters, and/or sensing elements that are configured to transmit signals, receive signals, or otherwise operate along the rear surface of the device. As depicted in FIG. 5, these elements may be integrated in a sensor array 560. In this example, the sensor array 560 includes a first camera 561 having a 12 megapixel image sensor and a wide angle lens with an aperture number of f/1.6. The first camera 561 may also include a sensor-shifting mechanism that allows for image stabilization and/or optical focusing. In some cases, the image sensor is moved with respect to one or more fixed elements of the optical lens assembly. The sensor array 560 also includes a second camera 562 having a 12 megapixel image sensor and a super-wide angle lens (120° FOV) with an aperture number of f/2.2. The sensor array 560 may also include a third camera 563 having a 12 megapixel image sensor and a telephoto optical lens assembly that enables 2.5× optical zoom. The third camera 563 may also have an aperture number of f/2.4.

The sensor array 560 also includes a light illuminator that may be used as a flash for photography or as an auxiliary light source (e.g., a flashlight). The sensor array 560 also features an integrated chassis design that minimizes space while providing the precision alignment required for multiple high-resolution cameras. In some cases, the sensor array 560 also includes a microphone, an ambient light sensor, and other sensors that are adapted to sense along the rear surface of the device 500.

The sensor array 560 may also include a depth sensor 565 that is able to estimate a distance to objects positioned behind the device 500. The depth sensor 565 may include an optical sensor that uses time-of-flight or other optical effect to measure a distance between the device 500 and an external object. The depth sensor 565 may include one or more optical emitters that are adapted to emit one or more beams of light, which may be used to estimate the distance. In some cases, the one or more beams of light are coherent light beams having a substantially uniform wavelength/frequency. A coherent light source may facilitate depth measurements using a time of flight, phase shift, or other optical effect. In some cases, the depth sensor 565 uses a sonic output, radio output, or other type of output that may be used to measure the distance between the device 500 and one or more external objects. The depth sensor 565 may be positioned proximate a window 571 through which the depth sensor 565 may send and/or receive signals (e.g., laser light, infrared light, visible light, etc.).

As shown in FIG. 5, the cameras 561, 562, 563 may be aligned with camera covers 566, 567, 568, respectively. The covers 566, 567, 568 may be formed from a glass or sapphire material and may provide a clear window through which the cameras 561, 562, 563 are able to capture a photographic image. In other cases, the covers 566, 567, 568 are optical lenses that filter, magnify, or otherwise condition light received by the respective camera 561, 562, 563. The other sensing or transmitting elements of the sensor array 560 may transmit and/or receive signals through a region of the rear cover 572 or through a separate cover (e.g., 569) that is coupled to the rear cover 572. As shown in FIG. 5, the covers 566, 567, 568 may extend beyond the exterior surface of the cover 572, and may define a recess along the interior side of the cover 572, such that the lens or other element of the cameras 561, 562, 563 can extend into the respective recesses. In this way, the device 500 may accommodate a larger lens or other elements of the cameras 561, 562, 563 than would be possible if the recess were not provided.

The device 500 also includes a battery 530. The battery 530 provides electrical power to the device 500 and its various systems and components. The battery 530 may include a 4.40 V lithium ion battery that is encased in a foil or other enclosing element. The battery 530 may include a rolled electrode configuration, sometimes referred to as "jelly roll" or folded electrode configuration. The battery 530 may be recharged via the charging port 532 (e.g., from a power cable plugged into the charging port 532), and/or via a wireless charging system 540. The battery 530 may be coupled to the charging port 532 and/or the wireless charging system 540 via battery control circuitry that controls the power provided to the battery and the power provided by the battery to the device 500. The battery 530 may include one or more lithium ion battery cells or any other suitable type of rechargeable battery element.

The wireless charging system 540 may include a coil that inductively couples to an output or transmitting coil of a wireless charger. The coil may provide current to the device 500 to charge the battery 530 and/or power the device. In this example, the wireless charging system 540 includes a coil assembly 542 that includes multiple wraps of a conductive wire or other conduit that is configured to produce a (charging) current in response to being placed in an inductive charging electromagnetic field produced by a separate wireless charging device or accessory. The coil assembly 542 also includes an array of magnetic elements that are arranged in a circular or radial pattern. The magnetic elements may help to locate the device 500 with respect to a separate wireless charging device or other accessory. In some implementations, the array of magnets also help to radially locate, orient, or "clock" the device 500 with respect to the separate wireless charging device or other accessory. For example, the array of magnets may include multiple magnetic elements having alternating magnetic polarity that are arranged in a radial pattern. The magnetic elements may be arranged to provide a magnetic coupling to the separate charging device in a particular orientation or set of discrete orientations to help locate the device 500 with respect to the separate charging device or other accessory. This functionality may be described as self-aligning or self-locating wireless charging. As shown in FIG. 5, the device 500 also includes a magnetic fiducial 544 for helping to locate the separate wireless charging device or accessory. In one example, the magnetic fiducial 544 is adapted to magnetically couple to a cable or power cord of the separate wireless charging device or other accessory. By coupling to the cable or power cord, the rotational alignment of the device 500 and the separate wireless charging device or other accessory may be maintained with respect to an absolute or single position. Also, by magnetically coupling the cable or cord to the rear surface of the device 500, the charging device or other accessory may be more securely coupled to the device 500.

In some implementations, the wireless charging system 540 includes an antenna or other element that detects the presence of a charging device or other accessory. In some cases, the charging system includes a near-field communications (NFC) antenna that is adapted to receive and/or send wireless communications between the device 500 and the wireless charger or other accessory. In some cases, the device 500 is adapted to perform wireless communications to detect or sense the presence of the wireless charger or other accessory without using a dedicated NFC antenna. The communications may also include information regarding the status of the device, the amount of charge held by the battery 530, and/or control signals to increase charging, decrease charging, start charging and/or stop charging for a wireless charging operation.

The device 500 may also include a speaker system 524. The speaker system 524 may be positioned in the device 500 so that a respective speaker port 525 is aligned with or otherwise proximate an audio output of the speaker system 524. Accordingly, sound that is output by the speaker system 524 exits the housing 510 via the respective speaker port 525. The speaker system 524 may include a speaker positioned in a housing that defines a speaker volume (e.g., an empty space in front of or behind a speaker diaphragm). The speaker volume may be used to tune the audio output from the speaker and optionally mitigate destructive interference of the sound produced by the speaker. The speaker system 524 may include left and right speakers that are aligned with left and right speaker ports 525, respectively, in order to produce stereo sound.

The device 500 may also include a haptic actuator 522. The haptic actuator 522 may include a movable mass and an actuation system that is configured to move the mass to produce a haptic output. The actuation system may include one or more coils and one or more magnets (e.g., permanent and/or electromagnets) that interact to produce motion. The magnets may be or may include recycled magnetic material. As described herein, the haptic actuator 522 may have a profile or enclosure shape that facilitates physical integration with the battery 530 and other components of the device 500 in order to minimize space and/or maximize the size of the battery.

When the coil(s) are energized, the coil(s) may cause the mass to move, which results in a force being imparted on the device 500. The motion of the mass may be configured to cause a vibration, pulse, tap, or other tactile output detectable via an exterior surface of the device 500. The haptic actuator 522 may be configured to move the mass linearly, though other movements (e.g., rotational) are also contemplated. Other types of haptic actuators may be used instead of or in addition to the haptic actuator 522.

The device 500 also includes a logic board 520. The logic board 520 may include a substrate, and processors, memory, and other circuit elements coupled to the substrate. The logic board 520 may include multiple circuit substrates that are stacked and coupled together in order to maximize the area available for electronic components and circuitry in a compact form factor. The logic board 520 may include provisions for a subscriber identity module (SIM). The logic board 520 may include electrical contacts and/or a SIM tray assembly for receiving a physical SIM card and/or the logic board 520 may include provisions for an electronic SIM. The logic board 520 may be wholly or partially encapsulated to reduce the chance of damage due to an ingress of water or other fluid.

The logic board 520 may also include a liquid detection circuit 527 that is located proximate to the charging opening 526 or other opening in the housing 510. The liquid detection circuit 527 may include a resistive or conductive sensor that is configured to electrically detect moisture above a given threshold and transmit a signal to the processor in order to record a liquid exposure event. The liquid detection circuit 527 may also include a visual element that changes color or provides some other visual indicia when exposed to moisture above a certain threshold. In some cases, the liquid detection circuit 527 is positioned within a sealed internal volume of a waterproof or water resistant device and is configured to detect liquid ingress due to a mechanical breach of the housing 510 or physical damage to the device 500.

The logic board 520 may also include wireless communications circuitry, which may be coupled to and/or otherwise use the housing members 511, 512, 513, 514, 515, or 516 (or portions thereof) as radiating members or structures to provide wireless communications. The logic board 520 may also include components such as accelerometers, gyroscopes, near-field communications circuitry and/or antennas, compasses, and the like. In some implementations, the logic board 520 may include a magnetometer that is adapted to detect and/or locate an accessory. For example, the magnetometer may be adapted to detect a magnetic (or non-magnetic) signal produced by an accessory of the device 500 or other device. The output of the magnetometer may include a direction output that may be used to display a directional indicia or other navigational guidance on the display 503 in order to guide the user toward a location of the accessory or other device.

The logic board 520 may also include one or more pressure transducers that may be operable to detect changes in external pressure in order to determine changes in altitude or height. The pressure sensors may be externally ported and/or positioned within a water-sealed internal volume of the housing 510. The output of the pressure sensors may be used to track flights of stairs climbed, a location (e.g., a floor) of a multi-story structure, movement performed during an activity in order to estimate physical effort or calories burned, or other relative movement of the device 500.

The logic board 520 may also include global position system (GPS) electronics that may be used to determine the location of the device 500 with respect to one or more satellites (e.g., a Global Navigation Satellite System (SNSS)) in order to estimate an absolution location of the device 500. In some implementations, the GPS electronics are operable to utilize dual frequency bands. For example, the GPS electronics may use L1 (L1C), L2 (L2C), L5, L1+L5, and other GPS signal bands in order to estimate the location of the device 500.

The housing 510 may also include a chassis 519, which may be attached to the housing 510. The chassis 519 may be formed of metal, and may act as a structural mounting point for components of the device 500. The chassis 519 may define an opening that corresponds to size of the coil assembly 542 of the wireless charging system 540, such that the chassis 519 does not shield the wireless coil assembly 542 or otherwise negatively affect the inductive coupling between the coil of the wireless charging system 540 and an external wireless charger or accessory.

As shown in FIG. 5, the housing may include a cover 572 (e.g., rear or back cover) that may define a substantial entirety of the rear surface of the device 500. The cover 572 may be formed from a glass, glass-ceramic, or other material having portions that are less than 1 mm thick. In some cases, the substrate has portions that are less than 0.80 mm. In some cases, the substrate has portions that are approximately 0.60 mm or less. The cover 572 may have a uniform thickness or, in some cases, may have a thickened or raised portion that surrounds the camera covers 566, 567, 568. The cover 572 may be machined (e.g., ground) into a final shape before being polished and/or textured to provide the desired surface finish. The texture may be specially configured to provide a matte appearance while also being resistant to collecting a buildup of skin, lint, or other debris. A series of cosmetic layers may be formed along the inner surface of the cover 572 to provide a desired optical effect and final color of the device 500.

Similar to as described above with respect to cover 502, the cover 572 may be positioned at least partially within an opening defined in the housing 510. Also similar to as described above with respect to cover 502, the edges or sides of the cover 572 may be surrounded by a protective flange or lip of the housing 510 without an interstitial component between the edges of the cover 572 and the respective flanges of the housing 510. The cover 572 may be chemically strengthened using an ion exchange process to form a compressive stress layer along exterior surfaces of the cover 572. In some cases, the (rear) cover 572 is formed from the same or a similar material as (front) cover 502.

As described above, the housing 510 may include housing members 511, 512, 513, 514, 515, and 516 structurally joined together via joint structures 518. FIG. 5 illustrates how the joint structures 518 may extend over inner surfaces of the housing members. More particularly, a portion of the joint structures 518 may contact, cover, encapsulate, and/or engage with retention features of the housing members that extend from the inner surfaces of the housing members.

Housing members 511, 512, 513, 514, 515, and 516 may also be referred to herein as housing segments and may be formed from aluminum, stainless steel, or other metal or metal alloy material. As described herein, the housing members 511, 512, 513, 514, 515, and 516 may provide a robust and impact resistant sidewall for the device 500. In the present example, the housing members 511, 512, 513, 514, 515, and 516 define a flat sidewall that extends around the perimeter of the device 500. The flat sidewall may include rounded or chamfered edges that define the upper and lower edges of the sidewall of the housing 510. The housing members 511, 512, 513, 514, 515, and 516 may each have a flange portion or lip that extends around and at least partially covers a respective side of the front and rear covers 502, 572. There may be no interstitial material or elements between the flange portion or lip and the respective side surface of the front and rear covers 502, 572. This may allow forces or impacts that are applied to the housing 510 to be transferred to the front and rear covers 502, 572 without affecting the display or other internal structural elements, which may improve the drop performance of the device 500.

As shown in FIG. 5, the device 500 includes multiple antennas that may be adapted to conduct wireless communication using a 5G communication protocol. In particular, the device 500 may include a (front-fired) antenna array 586 that is positioned near the earpiece of the device 500 and configured to transmit and receive wireless communication signals through the cover 502. The device 500 may also include a (side-fired) antenna array 582 that is configured to transmit and receive wireless communication signals through an antenna window or waveguide formed along or otherwise integrated with the side wall of the housing 510. The side-fired antenna array 582 may be coupled to the logic board 520 via a flexible circuit element or other conductive connection, as described herein. The device 500 may also include a (rear-fired) antenna array 584 that may be configured to transmit and receive wireless communication signals through the cover 572. The antenna array 584 may be attached to a back or bottom surface of the logic board 520. Each of the antenna arrays 582, 584, 586 may be adapted to conduct millimeter wave 5G communications and may be adapted to use or be used with beam-forming or other techniques to adapt signal reception depending on the use case. The device 500 may also include multiple antennas for conducting multiple-in multiple-out (MIMO) wireless communications schemes, including 4G, 4G LTE, and/or 5G MIMO communication protocols. As described herein, one or more of the housing members 511, 512, 513, 514, 515, and 516 may be adapted to operate as antennas for a MIMO wireless communication scheme (or other wireless communication scheme).

Figure 6A:
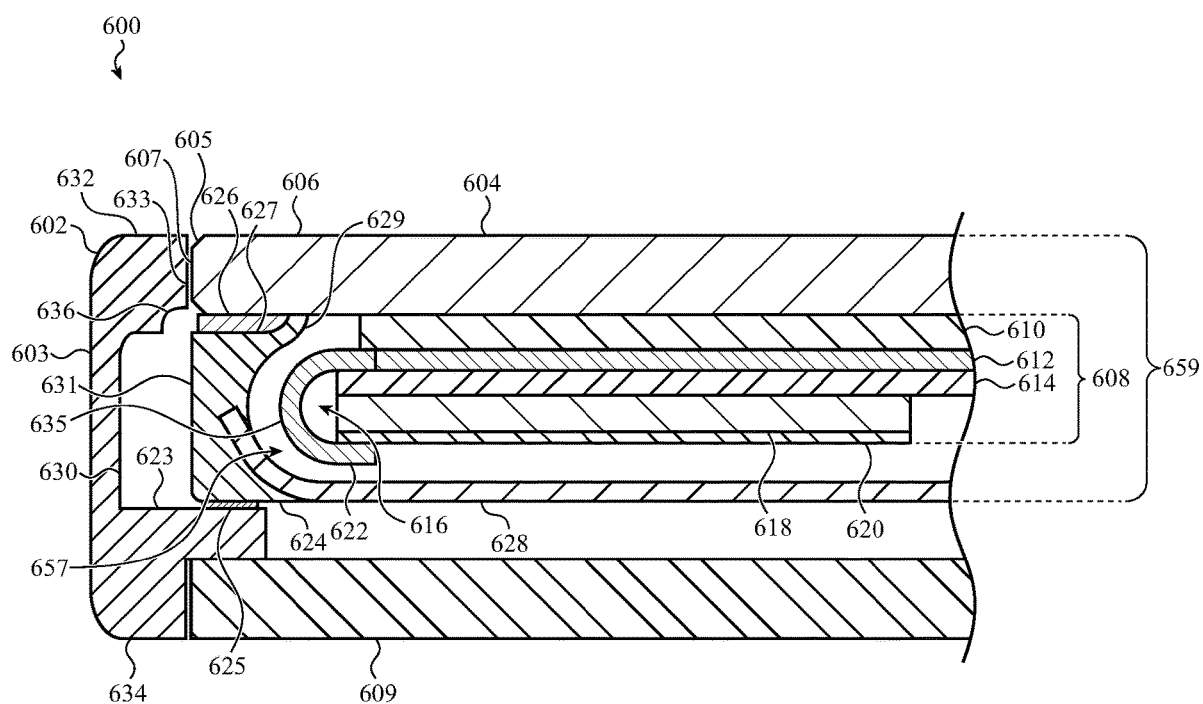
FIG. 6A depicts a cross-sectional view of a portion of an example electronic device.

FIG. 6A depicts a partial cross-sectional view of an example electronic device 600, viewed along line 6A-6A in FIG. 1A. The electronic device 600 may correspond to or be an embodiment of the electronic devices 100, 200, 300, 400, 500, or any other device described herein.

The device 600 may include a housing member 602, which may correspond to or be an embodiment of the housing member 130. The housing member 602 may also represent other housing members of the devices described herein, such as the housing members 124, 125, 126, 127, and 128. The housing member 602 may define an exterior side surface 603 of the device 600. The device 600 may also include a cover 604, which may correspond to or be an embodiment of the cover 102 of FIGS. 1A-1B (or any other cover described herein). The cover 604 may define a front exterior surface 606 of the device 600, which may be planar. In some cases, the cover 604 defines a chamfer 605 that extends around the periphery of the planar front exterior surface 606 and extends between an edge of the front exterior surface 606 and an edge of a side surface 607 of the cover 604. The device 600 may also include a rear cover 609, which may correspond to or be an embodiment of the rear cover 132 (or any other rear cover described herein).

The cover 604 may be positioned over a display stack 608, which may correspond to or be an embodiment of the display 103 of FIGS. 1A-1B (or any other display described herein). The display stack 608 may be coupled to the cover 604 along an interior surface of the cover 604 via an adhesive 610, which may be a transparent adhesive. The adhesive 610 may have a thickness, such as about 200 microns, about 300 microns, about 400 microns, or the like.

The display stack 608 may include a display element 612, which may be configured to produce graphical outputs. The display element 612 may be an OLED display, and may include multiple layers and/or other components that facilitate the production of graphical outputs, including, for example, substrates, an anode, a cathode, one or more organic layers, an emissive layer, adhesives, and the like. In some cases, the display element 612 may include an integrated (on-cell) touch-sensing system, as described above. For example, an array of electrodes that are integrated into the OLED display may be time and/or frequency multiplexed in order to provide both display and touch-sensing functionality. In other cases, separate touch- and/or force-sensing systems may be included above or below the display element 612 (each of which may include, for example, capacitive electrode layers, compliant layers, and the like). While an OLED display is described, the display element may be any suitable type of display, such as an LCD display, an active layer organic light emitting diode (AMOLED) display, an organic electroluminescent (EL) display, an electrophoretic ink display, or the like.

The display stack 608 may include various electrically active layers and components that need to be electrically interconnected to other electrical components, processors, circuit elements, and the like. Because such layers (e.g., anode and cathode layers of an OLED display) may be sandwiched between other layers of the display stack 608, a flexible circuit element 622 (e.g., a flexible circuit board) may wrap around a side of the display stack 608 (forming a loop) to electrically couple the electrically active layers of the display stack 608 to a more accessible circuit element 620 of the display stack 608. More particularly, the flexible circuit element 622 may include conductive traces that interconnect electrical components within the display element 612 (e.g., cathode and anode layers, electrode layers of touch and/or force sensors, on-cell touch-sensing layers, etc.) to other electrical traces, connectors, processors, or other electrical components that are mounted on the circuit element 620. The circuit element 620 may be a rigid or flexible circuit board. In some cases, a potting material (e.g., an epoxy, foam, or other material or component) may be provided in the loop area 616 between the side of the display stack 608 and the flexible circuit element 622 to help provide structure to the flexible circuit element 622 and to help prevent deformation of the flexible circuit element 622 due to impacts or other damage. Additional details about the potting material are shown and described with respect to FIGS. 13C-13D.

The display stack 608 may include other components in addition to the display element 612 and touch- and/or force-sensing components, such as support and shielding layers, and adhesive layers to hold the various components of the display stack 608 together. For example, the display stack 608 may include a first metal plate 614 that supports the display element 612 and imparts structural support, rigidity, and flatness to the display element 612. The first metal plate 614 may have the same or substantially the same front-facing area as the display element 612 (e.g., the first metal plate 614 may have a front-facing area that is greater than 90% of the display element 612). The display stack may also include a second metal plate 618 that supports the circuit element 620. The second metal plate 618 may have a smaller frontal area than the first metal plate 614, and may have a size that is similar to the circuit element 620. Both the circuit element 620 and the second metal plate 618 may have a front-facing area that is less than 50% of the front-facing area of the display element 612, and optionally less than 30% of the front-facing area of the display element 612.

The display stack 608 may include other layers and components, as well. For example, the display stack 608 may include adhesives between various layers and elements in the display stack 608. More specifically, the display stack 608 may include an adhesive between the display element 612 and the first metal plate 614, an adhesive between the first metal plate 614 and the second metal plate 618, and an adhesive between the second metal plate 618 and the circuit element 620. Of course, other layers, sheets, substrates, adhesives, and/or other components may also be included in the display stack 608.

The cover 604 may be attached to a frame member 624. The frame member 624 may be formed from or include a polymer material, and may extend around all or substantially all of a perimeter of the cover 604. The frame member 624 may at least partially encapsulate and/or otherwise be coupled to a back plate 628. The back plate 628 may be formed of or include metal, plastic, or any other suitable material. The back plate 628 may provide shielding and structural support to the device, and may protect the display stack 608 by forming an at least partially enclosed area in which the display stack 608 is positioned. The back plate 628 may be at least partially encapsulated in the frame member 624, or it may be attached to the frame member 624 in any other suitable manner.

The frame member 624 may be attached to the housing member 602. For example, the frame member 624 may be attached to a ledge 623 or other feature defined by the housing member, as depicted in FIG. 6A. The ledge 623 may extend from an interior side of the housing member 602. The ledge 623 may be part of a monolithic structure of the housing member 602 (e.g., the housing member may be molded, machined, or otherwise formed from a single piece of material to define the ledge 623 as well as the other features and/or surfaces of the housing member 602). The frame member 624 may be attached to the housing member 602 via an adhesive 625, which may be between and in contact with the ledge 623 and the frame member 624. The adhesive 625 may be any suitable adhesive, such as a pressure sensitive adhesive (PSA), heat sensitive adhesive (HSA), adhesive film, epoxy, or the like. In some cases, the ledge or other feature to which the frame member 624 is attached acts as a datum surface for the frame member 624. Thus, the alignment (e.g., flushness) of the front exterior surface 606 of the cover 604 and the upper portion 632 of the housing member 602 may be defined or established by the location of the ledge (relative to the upper portion 632), as well as the location of the bottom surface of the frame member 624 (relative to the front exterior surface 606 of the cover 604).

The cover 604 may be attached to the frame member 624 via an adhesive 626. The frame member 624 may define a recessed region 627 (which defines a bonding surface), and the adhesive 626 may be placed in the recessed region 627. The recessed region 627 may provide a trough-like volume for the adhesive 626, while also allowing a flange portion 629 of the frame member 624 to contact the underside of the cover 604. The direct contact between the flange portion 629 of the frame member 624 and the cover 604 may provide a rigid connection between the cover 604 and the frame member 624 and may ensure that forces applied to the cover 604 are transferred to the structural frame member 624. While the recessed region 627 is defined by a single flange portion 629 (e.g., on the right side of the recessed region 627), other configurations are also possible, such as a recessed region defined by two flange portions or other sidewall-like features (e.g., a channel defined by two walls).

The housing member 602 may be specifically configured to allow a close coupling between it and the assembly that includes the cover 604, the display stack 608, and the frame member 624. In particular, the housing member 602 may define a recessed region 630 (also referred to simply as a recess) along an interior surface of the housing member 602 that is adjacent or proximate the frame member 624. The recessed region 630 may be formed into the housing member 602 in any suitable way. For example, the recessed region 630 may be machined into the housing member 602, or the housing member 602 may be molded or cast and the recessed region 630 may be formed as part of the casting or molding process.

The recessed region 630 may correspond to a portion of the housing member 602 that is thinner than other portions of the housing member 602. For example, the housing member 602 may define an upper portion 632 and a lower portion 634 that have a greater thickness (in the left-to-right direction as depicted in FIG. 6A) than the portion of the housing member 602 that defines the recessed region 630.

The recessed region 630 may be configured so that the interior surface of the housing member 602 that is directly opposite the frame member 624 is set apart from the frame member 624 by a target distance. The target distance may be selected so that deformations or deflections of the housing member 602 along the side wall (e.g., due to the device 600 being dropped or otherwise subjected to predictable misuse or damage) do not contact the frame member 624 and/or the display stack 608. More particularly, the recessed region 630 allows the device 600 to accommodate a certain amount of deformation of the side wall of the housing member 602 without the housing member 602 contacting the frame member 624. For example, the inner surface of the recessed region 630 may be spaced apart from the outer peripheral surface 631 of the frame member 624 by about 0.3 mm, 0.5 mm, 0.7 mm, 1.0 mm, or any other suitable distance. In some cases, the distance between the inner surface of the recessed region 630 and the outer surface of the frame member 624 is greater than a housing deformation that is produced as a result of a standard test, such as a side impact test (e.g., in which the device 600 is dropped from a certain height (e.g., 1 m, 2 m, or 3 m) onto a certain surface (e.g., an edge of a triangular prism).

In some cases, the height (e.g., the vertical direction as depicted in FIG. 6A) of the recessed region 630 (and optionally the height of the recessed region 630 and the additional recessed region 636 combined) is equal to or greater than a height of the frame member 624. In this way, the recessed region 630 (optionally with the additional recessed region 636) is large enough so that the frame member 624 could extend at least partially into the recessed region 630 in the event of an impact or drop (e.g., causing the housing member 602 to deform or deflect), without the frame member 624 contacting the housing member 602. This may help prevent damage to the frame-cover interface and help prevent separation of the cover 604 from the frame member 624 (e.g., by preventing or reducing the magnitude of forces applied to the frame member 624 by the housing member 602 in the event of an impact, drop, or the like). In some cases, the height of the recessed region 630 (and optionally the recessed region 630 combined with the additional recessed region 636) extends from the ledge 623 to a height or location that is at or above the bottom surface of the cover 604.

In some cases, the distance between the inner surface of the recessed region 630 and the outer surface of the frame member 624 is greater than a distance between a side surface 607 of the cover 604 and an inner side surface 633. Thus, for example, a deformation or deflection of the housing member 602 towards the cover 604 and the frame member 624 may result in the side surface 607 of the cover 604 contacting the inner side surface 633 of the frame member 624 before the housing member 602 (and in particular the inner surface of the recessed region 630) contacts the frame member 624. Thus, by forming a recessed region 630 that establishes a greater distance between the housing member 602 and the frame member 624 than the distance between the housing member 602 and the cover 604, the risk of contact between the housing member 602 and the frame member 624 during deformation or deflection of the housing member 602 may be reduced.

The side surface 607 of the cover 604 may abut an inner side surface 633 of the housing member 602 (or be adjacent the inner side surface 633 without interstitial components, as described herein). In some cases, there is no interstitial component or other material between the side surface 607 of the cover 604 and the inner side surface 633 of the housing member 602. This construction provides several structural and cosmetic advantages. For example, the lack of a bezel or other interstitial component or material between these surfaces provides a clean, frameless appearance to the front of the device 600. In particular, the front-facing surfaces of the device 600 may be defined only by the upper portion 632 of the housing member 602 and the front exterior surface 606 of the cover 604. While the side surface 607 of the cover 604 may abut an inner side surface 633 of the housing member 602, in some cases an air gap may exist between these surfaces. In some cases, an adhesive or sealing material may be positioned between the side surface 607 of the cover 604 and the inner side surface 633 of the housing member 602. In such cases, the adhesive or sealing material may be the only material between these surfaces, may be in contact with both surfaces, and may have a thickness less than about 0.5 mm, 0.3 mm, 0.1 mm, 0.05 mm, or any other suitable thickness.

The proximity between the side surface 607 of the cover 604 and the inner side surface 633 of the housing member 602 may define a load path through the upper portion 632 of the housing member 602 and into the cover 604. For example, forces applied to the exterior side surface 603 of the housing member 602 may be directed into the cover 604 at the interface between the side surface 607 of the cover 604 and the inner side surface 633 of the housing member 602. (In cases where the inner side surface 633 abuts the side surface 607 of the cover 604, loads may be directly transferred or directed into the cover 604, while in cases where there is an air gap between the inner side surface 633 and the side surface 607 of the cover 604, the forces may initially cause the gap to close such that the inner side surface 633 comes into contact with the side surface 607.) The rigidity and structural integrity of the cover 604 may help prevent or reduce deformation of the housing member 602 in the event of a drop or other impact on the exterior side surface 603, thereby protecting internal components of the device 600 from damage due to the housing member 602 contacting them. By defining the load path through the cover 604 and by configuring the housing member 602 to include the recessed region 630, the device 600 may be designed to omit the frame member 624 from the load path during many impact events (e.g., the device 600 being dropped). For example, as shown in FIG. 6A, the recessed region 630 ensures that the frame member 624 is set apart from the housing member 602 by a suitable distance. Also, no portion of the frame member 624 is between the housing member 602 and the cover 604. Accordingly, the frame member 624 may be positioned so that it is not contacted or impacted by the housing member 602, even if the housing member 602 is subjected to an impact, deformed, deflected, or otherwise damaged (up to a certain amount of deformation or deflection).

In some cases, the rear cover 609 interfaces with the lower portion 634 of the housing member 602, in that the lower portion 634 may contact a side surface of the rear cover 609, thereby defining a load path through the lower portion 634 and into the rear cover 609.

In some cases, the housing member 602 may include an additional recessed region 636. The additional recessed region 636 may be configured so that the housing member 602 in that region is set a distance away from components in the display stack 608, touch- and/or force-sensing components, antennas, or other electrical components of the device 600. In particular, as the housing member 602 may be formed of metal, the metal may capacitively couple to other electronic components. By increasing the distance between the metal of the housing member 602 and the electrical components, the capacitive coupling may be reduced to an acceptable level. Accordingly, the additional recessed region 636 may be configured so that the distance between the additional recessed region 636 and another electrical component is greater than about 0.5 mm, 1.0 mm, 1.5 mm, 2.0 mm, or any other suitable distance. In some cases, the recessed region 630 may be recessed further (and thus correspond to a thinner portion of the housing member 602) than the additional recessed region 636.

The frame member 624 may also define a recess 657. The recess 657 may be defined at least partially by the flange portion 629, and may be configured to accommodate or receive at least part of the display stack 608. For example, a loop 635 defined by the flexible circuit element 622 may extend at least partially into the recess 657, as shown in FIG. 6A (as well as 6B-6E). In some cases, in order to facilitate the attachment of the cover 604 to the frame member 624, the frame member 624 may be deflected so that the loop 635 can clear the frame member 624 without contacting the flange portion 629. For example, the cover 604 and the display stack 608 may be attached together, and then the cover and display stack may be lowered onto the frame member 624. Without deflecting the frame member 624, the loop 635 may contact the flange portion 629 or another portion of the frame member 624. By deflecting the frame member 624 (e.g., pulling the frame member 624 to the left, relative to the orientation shown in FIG. 6A, with a fixture or tool), the loop 635 may be positioned in the recess (and at least partially overlapping the flange portion 629) without the loop 635 contacting the frame member 624. By positioning the loop 635 at least partially in the recess 657, greater packing efficiency may be achieved, as the frame member can be positioned closer to the active area of the display, thus reducing display borders and other unused space in the device.

As noted above with respect to FIG. 6A, a display stack 608 may be attached to a cover 604 via an adhesive 610, which may be a transparent adhesive to allow the graphical outputs that are produced by the display stack 608 to be visible through the cover 604. In order to increase the amount of internal space in a device, it may be advantageous to use a thin adhesive to attach the display stack 608 to the cover 604. However, the structure of the frame member 624 and the display stack 608 (and/or other device components) may limit the minimum thickness of the adhesive 610. For example, if the thickness of the adhesive 610 in FIG. 6A is reduced, the flexible circuit element 622 may contact or be too close to the flange portion 629 of the frame member 624.

Figure 6B:
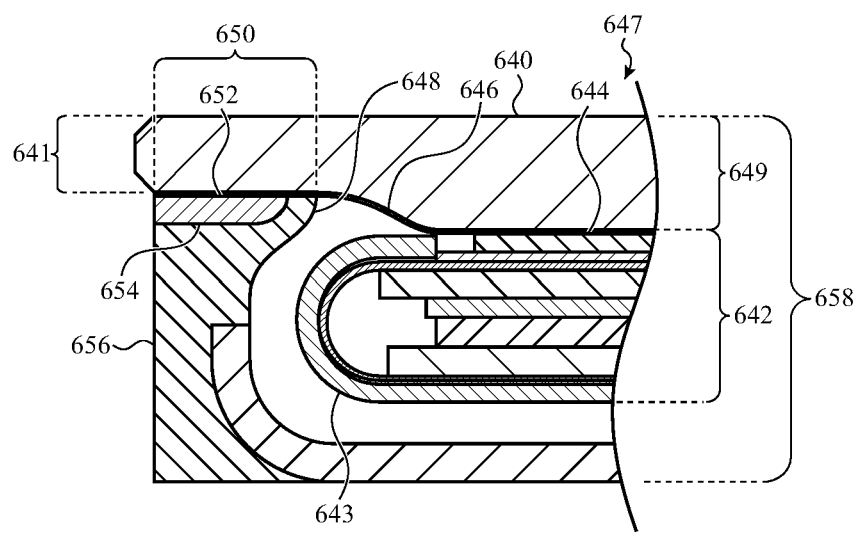
FIGS. 6B-6D depict a cross-sectional view of a portion of an example electronic device.

FIG. 6B illustrates another example configuration of a frame member and cover that may enable the use of a thinner adhesive to attach a display stack to a cover. For example, FIG. 6B illustrates a cover 640 with a thinned outer region 650. Except for the thinned outer region 650, the cover 640 may be the same as or similar to the cover 604, and for brevity those details are not repeated here. The cover 640 may be attached to a frame member 656 via an adhesive 652 that is positioned in a recessed region 654 (which defines a bonding surface) of the frame member 656. The frame member 656, adhesive 652, and recessed region 654 may be the same as or similar to the frame member 624, adhesive 626, and recessed region 627, and for brevity those details are not repeated here.

The thinned outer region 650 may extend along one or more edges of the cover 640. For example, the thinned outer region 650 may extend along one edge of the cover 640, and in particular, an edge of the cover 640 that is proximate a flexible circuit element 643 of the display stack 642. In some cases, the thinned outer region 650 may extend along two, three, or four sides of the cover 640. For example, in the case of a substantially rectangular cover, the thinned outer region 650 may extend around the entire outer periphery of the cover 640 (e.g., the thinned outer region 650 may extend around a display region of the cover 640, where the display region corresponds to a central region of the cover 640 through which the display is visible and/or produces graphical outputs). The display stack 642 and the flexible circuit element 643 may be the same as or similar to the display stack 608 and the flexible circuit element 622, and for brevity those details are not repeated here.

The thinned outer region 650 may facilitate the use of a thinner layer of adhesive 644 (e.g., optically clear or transparent adhesive) to attach the display stack 642 to the cover 640. More particularly, the thinned outer region 650 may allow a flange portion 648 (similar to the flange portion 629, FIG. 6A) to be positioned further towards the exterior surface of the cover 640 (e.g., higher in a vertical direction, as depicted in FIG. 6B), the display stack 642, and thus the flexible circuit element 643, may likewise be positioned further towards the exterior surface of the cover 640 without causing the flexible circuit element 643 to contact or otherwise interfere with the flange portion 648. Accordingly, the thickness of the adhesive 644 may be made thinner (e.g., relative to the adhesive 610), resulting in an overall height 658 of the display stack 642 and cover 640 that is less than a height of a device that does not include a cover with a thinned outer region (e.g., the overall height 658 may be less than the overall height 659 in FIG. 6A). In some cases, the adhesive 644 has a thickness of about 150 microns, about 125 microns, about 100 microns, or about 75 microns.

The thinned outer region 650 of the cover 640 may have a thickness 641 of about 400 microns, and the main portion 647 of the cover 640 (e.g., the portion to which the display stack 642 is attached and that includes the graphically active area of the device) may have a thickness 649 of about 600 microns. In some cases, the thinned outer region 650 is about 100 microns, about 200 microns, or about 300 microns thinner than the main portion 647 of the cover 640. The thickness 641 may be between about 375 microns to about 425 microns, and the thickness 649 may be between about 575 microns to about 625 microns.

The cover 640 may define a transition region 646 that extends from the thinned outer region 650 to the main portion 647 of the cover 640. The transition region 646 may define a curved portion of the bottom surface of the cover 640 that extends from the thinned outer region 650 to the main portion 647 of the cover 640. The transition surface may have a continuous curve (as shown), or it may have another shape or configuration. For example, the transition surface may be fully or partially planar, and may resemble a chamfered surface.

The cover 640 may be formed in various ways. For example, the cover 640, including its thinned outer region 650, may be formed by molding (e.g., heating glass or another transparent material and applying a mold or press to produce the desired shape), machining (e.g., grinding, lapping, or otherwise removing material from a sheet to form the desired shape), and/or by additive manufacturing (e.g., adhering, bonding, or otherwise attaching a first glass sheet to a second glass sheet to form the desired shape). Combinations of these processes may also be used to form the cover 640 and produce the thinned outer region 650.

Covers of the electronic devices described herein may be attached to frame members via an adhesive. As described with respect to FIG. 6A, and shown in FIGS. 6A and 6B, a frame member may define a recessed region (e.g., the recessed regions 627, 654), and an adhesive may be placed in the recessed region. The recessed region may provide a trough-like volume for the adhesive, while also allowing a flange portion of the frame member to contact the underside of the cover.

Figure 6C:
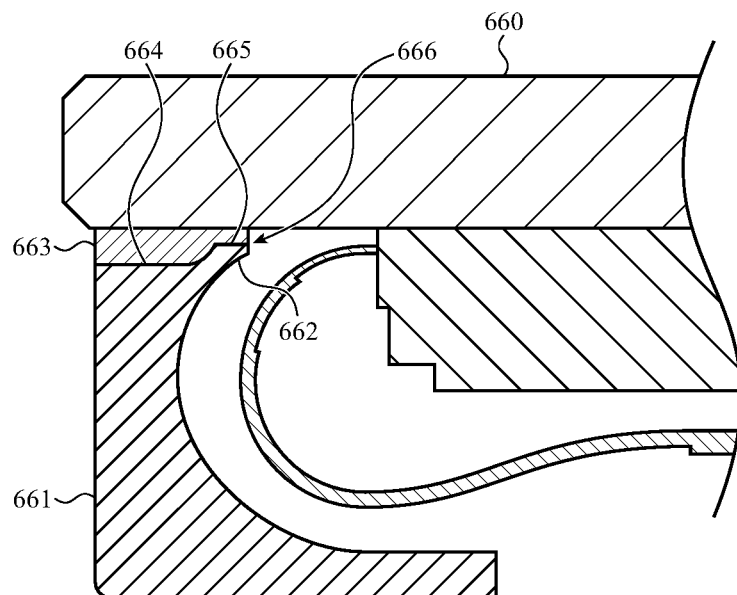

FIG. 6C illustrates an example cover and frame member configuration in which a flange portion of the frame member does not contact the cover. In particular, FIG. 6C illustrates a cover 660 (which may be the same as or similar to the cover 604) and a frame member 661. The frame member 661 defines a recessed region 664 (which defines a bonding surface) defined by a flange portion 662. An adhesive 663 is positioned in the recessed region 664 and bonds the cover 660 to the frame member 661. In this configuration, the interior surface of the cover 660 does not contact a surface 665 of the flange portion 662. Rather, a portion of the adhesive 663 is positioned between the surface 665 and the interior surface of the cover 660 (e.g., in a gap or space 666 between the surfaces). By positioning some of the adhesive 663 between the surfaces, the adhesive 663 may provide a compliance or flexibility in the coupling between the cover 660 and the frame member 661, which may provide additional resilience and/or resistance to breaking or other damage in the event of a drop or other impact event. Further, positioning some of the adhesive 663 between the surfaces may allow a greater degree of control over the positioning of the cover 660 relative to the frame member 661. For example, differences in the thickness of the cover 660 or the size or shape of the frame member 661 (e.g., due to manufacturing tolerance) may be accommodated by changing the distance between the interior surface of the cover 660 and the surface 665 of the frame member 661. In some cases, the adhesive 663 may be deposited on the cover 660 and/or in the recessed region 664 in a flowable state, and the cover 660 and the frame member 661 are attached together using a fixture that establishes the target relative positions of the cover 660 and frame member 661. Accordingly, the adhesive 663 may flow to fill and accommodate whatever gap results when the cover 660 and frame member 661 are positioned as intended.

Figure 6D:
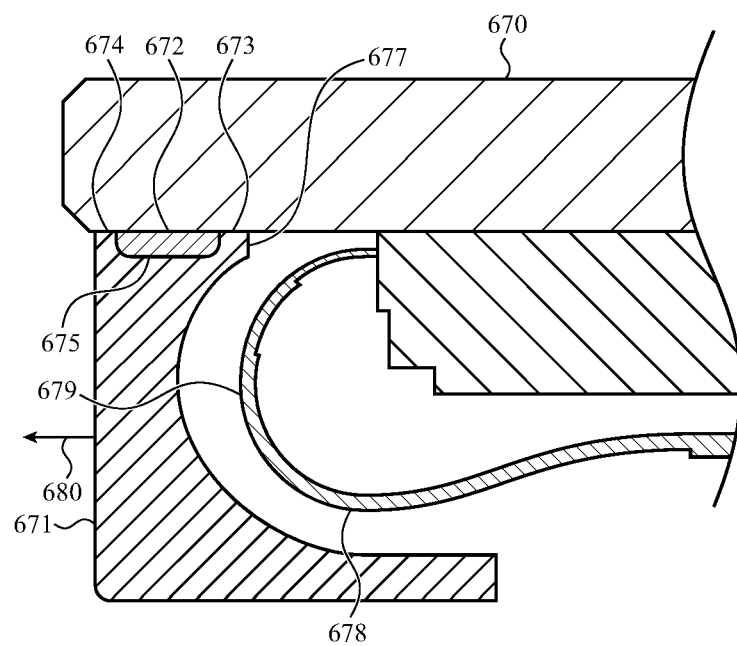

FIG. 6D illustrates an example cover and frame member configuration in which a frame member defines two flange portions that contact the cover and define two sides or walls of a trough for receiving and containing an adhesive. In particular, FIG. 6D illustrates a cover 670 (which may be the same as or similar to the cover 604) and a frame member 671. The frame member 671 defines a recessed region 675 (which defines a bonding surface) defined by a first flange portion 673 and a second flange portion 674. The first and second flange portions 673, 674 define a trough or channel that retains an adhesive 672. By using two flange portions as shown in FIG. 6D, the adhesive may be prevented or inhibited from spilling or flowing out of the recessed region, and may provide an improved bond between the adhesive 672 and the cover 670 and frame member 671. In some cases, the use of two flange portions may allow the use of a less viscous adhesive due to the additional containment/retention ability of the trough. Further, using two flange portions may increase the surface area of the contact between the cover 670 and the frame member 671, which may reduce stress concentrations between the frame member 671 and the cover 670 and/or provide other structural advantages.

Figure 6E:
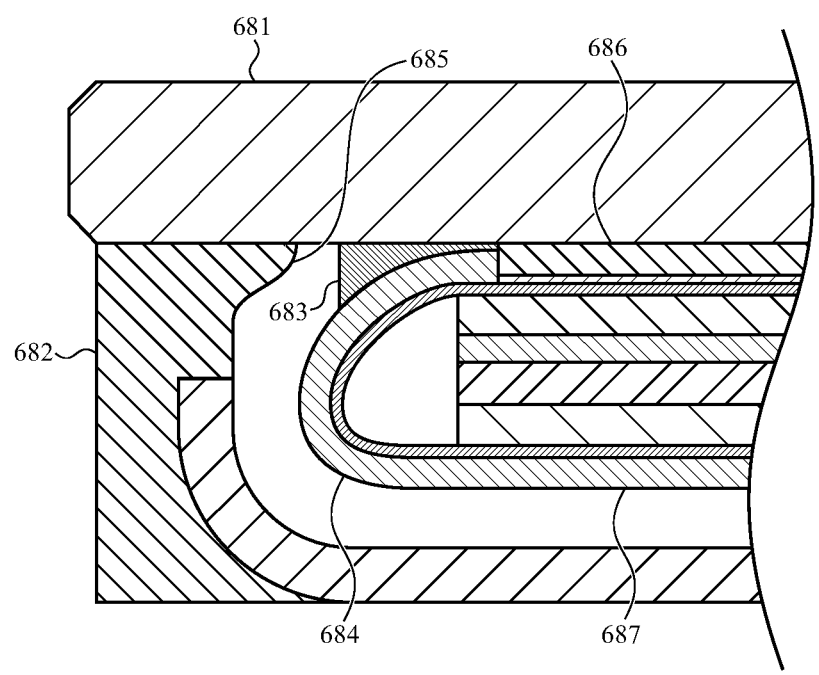
FIG. 6E depicts a cross-sectional view of a portion of an example electronic device.

FIG. 6E illustrates an example cover and frame member configuration in which a ramp structure is used along the bottom surface of the front cover to deflect a portion of the display stack downwards (e.g., away from the front cover) to help prevent or reduce the risk of contact between the display stack and the frame member. For example, FIG. 6E illustrates a front cover 681 (which may be the same as or similar to the cover 604), to which a frame member 682 may be attached (as described above). A display stack 687 may be attached to the cover 604 via a transparent adhesive 686.

A ramp structure 683 may be positioned between the bottom surface of the front cover 681 and the display stack 687, and more particularly, between the front cover 681 and a loop 684 of the display stack (which may be defined at least in part by a flexible circuit element of the display stack 687). The ramp structure 683 is configured to deflect the loop 684 away from the front cover 681 (e.g., downward as shown in FIG. 6E). The ramp structure 683 may have a curved or flat ramp surface (e.g., the surface that contacts the loop 684) and may have a maximum thickness of between about 100 microns and about 200 microns. The maximum thickness of the ramp structure 683 may equate to a reduction in thickness of the adhesive 686 that adheres the display stack 687 to the front cover 681. For example, if the adhesive 686 is reduced by about 150 microns (and the dimensions of the frame member and front cover remain the same), a ramp structure having a maximum thickness of about 150 microns (e.g., the same amount that the adhesive thickness was reduced) may be used to deflect the loop in order to maintain the same or similar distance between the loop and the frame member (e.g., the same distance that was present with the thicker adhesive and no ramp structure). Accordingly, the ramp structure 683 may facilitate the use of thinner adhesives, resulting in thinner devices and/or more space inside devices for other components (e.g., larger batteries).

Figure 6F:
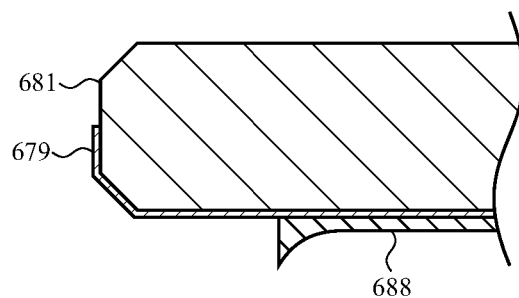
FIGS. 6F-6I depict cross-sectional views of example front covers for an electronic device.

A ramp structure, such as the ramp structure 683, may be formed of various materials and have various configurations. FIGS. 6F-6I illustrate various example ramp structures. FIG. 6F illustrates the front cover 681. The front cover 681 may have a mask layer 679 applied to the bottom surface, a chamfered edge of the front cover 681, and at least a portion of a side surface of the front cover 681. In FIG. 6F, the ramp structure is defined by a thickened region of the adhesive 688, which is the same adhesive that attaches the display stack to the front cover 681. The adhesive 688 may be a multi-layer adhesive structure such as a transparent polymer (with a thicker region defining the ramp structure) with adhesive on the top and bottom surfaces. In some cases, the adhesive 688 may be a monolithic structure, such as an epoxy, liquid, or gel that is formed or molded to include the ramp structure as shown in FIG. 6F. An additional adhesive layer may be used to attach the monolithic structure to the front cover and/or attach the display stack to the monolithic structure.

Figure 6G:
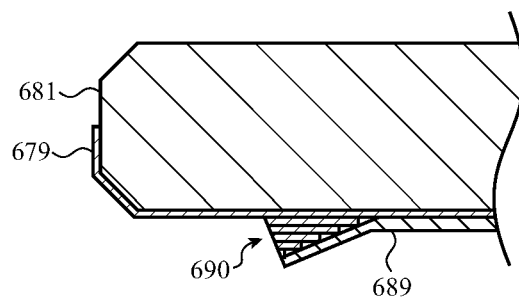

FIG. 6G illustrates another example ramp structure 690. In this example, the ramp structure 690 may be formed by a stack of layers. The layers that define the ramp structure 690 may be formed from any suitable material, such as a plurality of ink layers, adhesive film layers, dye layers, or other masking material layers (e.g., the same material as the mask layer 679). In some cases, the ramp structure 690 is formed as part of the masking process, where the mask layer 679 is applied, and then additional layers of the masking material are added to form the ramp structure 690. In some cases, the multi-layer mask structure is fabricated separately, and then applied (e.g., with an adhesive) to the mask layer 679. The adhesive 689 (e.g., a transparent adhesive, which may be the same as or similar to the adhesive 686) may be applied to the front cover 681 and the ramp structure 690, as shown in FIG. 6G.

Figure 6H:
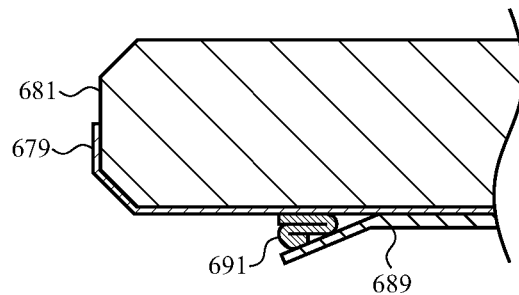

FIG. 6H illustrates another example ramp structure 691. In this example, the ramp structure 691 may be formed by a folded structure. The folded structure that defines the ramp structure 691 may be formed from any suitable material, such as adhesive films, layers of ink, dye, or other masking material (e.g., the same material as the mask layer 679). In some cases, the ramp structure 691 is formed as part of the masking process, where the mask layer 679 is applied, and then additional layers of the masking material are added to form the ramp structure 691. In some cases, the multi-layer mask structure is fabricated separately, and then applied (e.g., with an adhesive) to the mask layer 679. The adhesive 689 (e.g., a transparent adhesive, which may be the same as or similar to the adhesive 686) may be applied to the front cover 681 and the ramp structure 691, as shown in FIG. 6H.

Figure 6I:
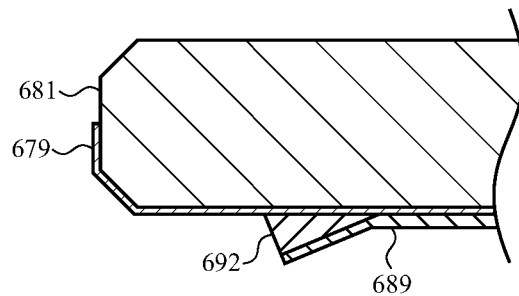

FIG. 6I illustrates another example ramp structure 692. In this example, the ramp structure 692 may be formed by a monolithic ramp component that is attached to the front cover 681 (e.g., below the mask layer 679). The ramp component may be formed from any suitable material, such as a polymer, foam, or the like. An adhesive (e.g., an adhesive film, a liquid or gel adhesive, or the like) may attach the ramp structure 692 to the front cover 681 (e.g., to the mask layer 679). The adhesive 689 (e.g., a transparent adhesive, which may be the same as or similar to the adhesive 686) may be applied to the front cover 681 and the ramp structure 692, as shown in FIG. 6I. In some cases, the adhesive 686 does not extend over the ramp structure 692. In such cases, a different adhesive layer may be applied to the ramp structure 692 to secure the loop of the display stack to the front cover 681. In other cases, an anti-stick coating may be applied to the surface of the ramp structure 692 that contacts the display stack. For example, a polyimide, polyethylene terephthalate, polytetrafluoroethylene, or other suitable polymer material may be adhered to the surface of the ramp structure 692 that contacts and deflects the display stack.

Figure 7:
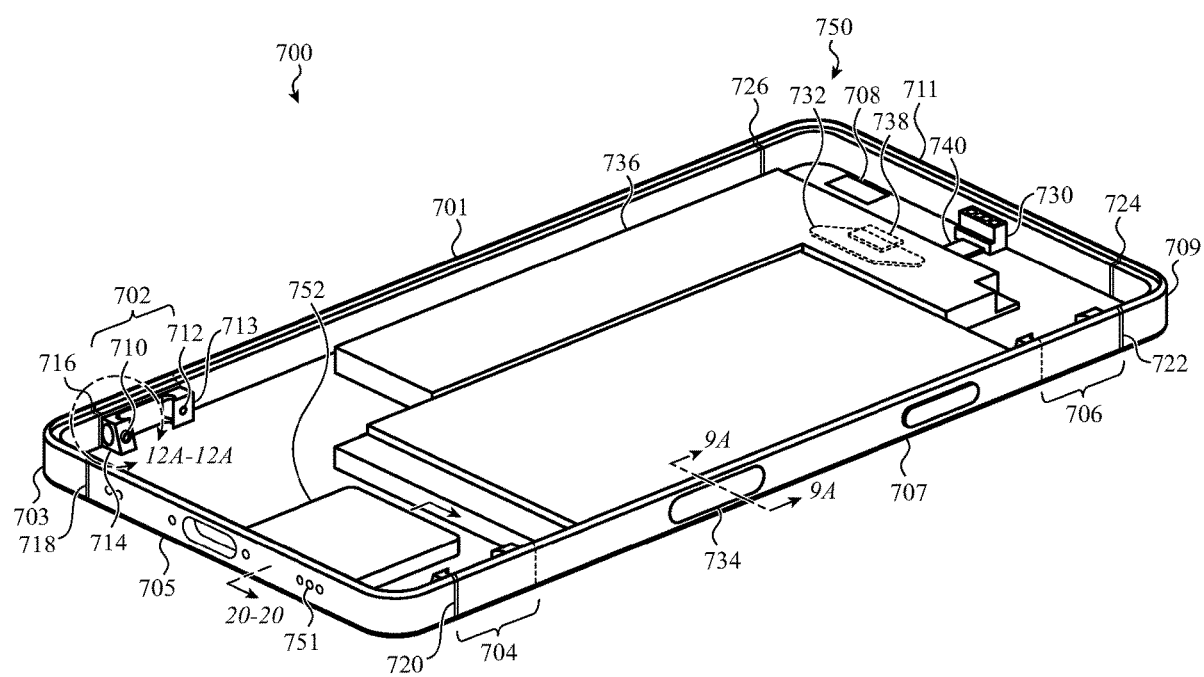
FIG. 7 depicts a partial view of an example electronic device.

As noted above, devices as described herein may include one or more groups of antennas that include elements that are configured to communicate via a 5G wireless protocol (including millimeter wave and/or 6 GHz communication signals). FIG. 7 depicts a portion of an electronic device 700, with components removed to better illustrate example antenna groups for 5G wireless communications. 5G communications may be achieved using various different communications protocols. For example, 5G communications may use a communications protocol that uses a frequency band below 6 GHz (also referred to as the sub-6 GHz spectrum). As another example, 5G communications may use a communications protocol that uses a frequency band above 24 GHz (also referred to as the millimeter-wave spectrum). Further, the particular frequency band of any given 5G implementation may differ from others. For example, different wireless communications providers may use different frequency bands in the millimeter-wave spectrum (e.g., one provider may implement a 5G communications network using frequencies around 28 GHz, while another may use frequencies around 39 GHz). The particular antenna group(s) implemented in a device as described herein may be configured to allow communications via one or multiple of the frequency bands that implement 5G communications.

The device 700 in FIG. 7 includes at least two groups of antennas, each configured to operate to provide 5G communications using a different communications protocol. For example, the first antenna group includes multiple antennas to communicate via the sub-6 GHz spectrum, and the second antenna group includes multiple antennas to communicate via the millimeter-wave spectrum.

As noted above, the housing members of a device, such as a mobile phone, may be adapted for use as antennas. In the device 700, for example, the housing 750 may include housing members 701, 703, 705, 707, 709, and 711. These housing members may be formed from metal or another conductive material, and may be electrically coupled to communications circuitry (as described in greater detail herein) in order to cause portions of the housing members to send and/or receive wireless communications. The housing members 701, 703, 705, 707, 709, and 711 may be coupled together with joining elements 716, 718, 720, 722, 724, and 726 to form the housing members into a single structural housing component. For simplicity, the joining elements 716, 718, 720, 722, 724, and 726 are shown as being separate components, though some of the joining elements may be contiguous (e.g., the joining elements 716 and 718 may be parts of a contiguous molded polymer structure).

The joining elements may both mechanically and/or structurally couple the housing members together, and provide electrical isolation between adjacent housing members to facilitate the use of the housing members as radiating antennas. More particularly, with respect to the mechanical coupling, a joining element may securely attach to adjacent housing members (e.g., via mechanical interlocks between the joining element and the housing members and/or via adhesive or chemical bonds between the joining element and the housing members). With respect to the electrical isolation functions, a joining element may provide a requisite electrical isolation between an antenna and another conductive component (e.g., another conductive housing member, whether acting as an antenna or a non-radiating structural member) to reduce attenuation of the antenna performance (e.g., due to capacitive coupling between the antenna and the other conductive component). The joining elements may be formed form or include a nonconductive and/or dielectric material, such as a polymer, fiber-reinforced nylon, epoxy, or the like. Thus, the joining elements may be referred to herein as nonconductive joining elements.

The joining elements may be formed by a molding process. For example, the housing members may be placed into a mold or otherwise maintained in a fixed position relative to one another such that gaps are defined between adjacent housing members. One or more polymer materials may then be injected into the gaps (and optionally into engagement with retention structures and/or interlock features defined in the housing members), such that the polymer materials at least partially fill the gaps, and allowed to cure or otherwise harden to form the joining elements. In some cases, joining elements may be formed from multiple different materials. For example, an inner portion of the joining element may be formed of a first material (e.g., a polymer material), and an outer portion of the joining element (e.g., that defines part of the exterior surface of the housing) may be formed of a second material that is different from the first (e.g., a different polymer material). The materials may have different properties, which may be selected based on the different functions of the inner and outer portions of the joining elements. For example, the inner material may be configured to make the main structural connection between housing members, and may have a higher mechanical strength and/or toughness than the outer material. On the other hand, the outer material may be configured to have a particular appearance, surface finish, chemical resistance, water-sealing function, or the like, and its composition may be selected to prioritize those functions over mechanical strength. The joining elements may be formed from fiber-reinforced polymer, epoxy, or any other suitable material(s).

In the device 700, at least three segments of the housing are adapted for use as antennas for communicating via the sub-6 GHz spectrum. More particularly, the housing members may be adapted for use as antennas by conductively coupling ground lines and feed lines to particular locations on the housing members (which are conductive and may be formed of or include metal). The particular location of the ground and feed lines on a housing member may in part define the particular wavelengths for which the antennas are tuned.

The device 700 includes one example configuration of a first group of antennas for communicating via the sub-6 GHz spectrum. The first group of antennas includes a first sub-6 GHz antenna 702, a second sub-6 GHz antenna 704, a third sub-6 GHz antenna 706, and a fourth sub-6 GHz antenna 708. In this example configuration, the first, second, and third sub-6 GHz antennas 702, 704, 706 are defined by segments of housing members, while the fourth sub-6 GHz antenna 708 is a conductive trace (e.g., on a circuit board) or other radiating element that is positioned within the device. The four antennas of the first group of antennas may be configured to operate according to a 4×4 MIMO (multiple input, multiple output) scheme.

The antennas that are defined by segments of the housing members may be similar to one another in structure and function. Accordingly, to avoid redundancy, only the first sub-6 GHz antenna 702 will be described in detail. However, it will be understood that the description applies equally to the second sub-6 GHz antenna 704 and the third sub-6 GHz antenna 706 as well.

The first sub-6 GHz antenna 702 may be defined by a portion of the housing member 701, and more particularly, a portion of the housing member 701 that is proximate the joining element 716. In order to send and receive electromagnetic signals from the first sub-6 GHz antenna 702, ground and feed lines may be conductively coupled to the housing member 701. For example, a ground line may be conductively coupled to location 712 and a feed line may be conductively coupled to location 710.

The portion of the housing member 701 that acts as the first sub-6 GHz antenna 702 may define structural features 713 and 714. These features may extend from the interior side of the housing member 701 and towards the interior volume of the device 700. The features 713, 714 may have several functions, including defining physical mounting locations for the ground and feed lines, and defining interlock features with which the material of the joining elements engage and/or encapsulate to form the structural coupling between the housing members. While the features 713, 714 are shown in FIG. 7 without being encapsulated by or otherwise engaged with the material of the joining element 716, it will be understood that in some cases the material of the joining element 716 contacts, engages, and/or at least partially encapsulates the features 713 and/or the features 714. Further, while such features are only shown on the housing members 701 and 707, the other housing members may include similar features proximate the joining elements.

As noted above, the second sub-6 GHz antenna 704 and the third sub-6 GHz antenna 706 may have the same or similar structures as the first sub-6 GHz antenna 702. In some cases, first, second, and third sub-6 GHz antennas are each configured to communicate via a different frequency band. Accordingly, the exact shape, length, or other physical characteristic of each of these antennas may differ from one another.

As noted above, the fourth sub-6 GHz antenna 708, which is part of the first group of antennas that operates according to a 4×4 MIMO scheme, is a conductive trace or other radiating element that is positioned within the device. In some cases, however, a portion of the first housing member 701 that is proximate the joining element 726 may be configured to act as the fourth sub-6 GHz antenna. In such case the first housing member 701 may include structural features similar to those of the first sub-6 GHz antenna 702 (e.g., the features 713, 714), and ground and feed lines may be similarly coupled to that region of the first housing member 701 to facilitate transmitting and receiving electromagnetic signals.

While the sub-6 GHz antennas 702, 704, 706, and 708 may be used to communicate via the sub-6 GHz spectrum, the device 700 may also (or instead) include antennas for communicating via the millimeter-wave spectrum. The device 700 may include, for example, a first millimeter-wave antenna 730, a second millimeter-wave antenna 732, and a third millimeter-wave antenna 734. Millimeter-wave antennas may be more directional and more susceptible to attenuation from occlusion than antennas for other spectra. For example, with respect to attenuation, if a user places his or her hand over a millimeter-wave antenna, communications via that antenna may suffer or be completely ceased. With respect to directionality, if the millimeter-wave antenna is pointed more than a certain angle away from a cell tower, the antenna may cease being able to effectively communicate with that cell tower. In order to mitigate these effects, the device may include multiple millimeter-wave antennas strategically positioned to enable wireless communications in a number of different positions, locations, orientations, or the like. For example, in the device 700, the first millimeter-wave antenna 730 may be configured as a front-fired antenna (e.g., sending and receiving electromagnetic signals primarily along a direction that is perpendicular to the front surface of the device). The second millimeter-wave antenna 732 may be configured as a rear-fired antenna (e.g., sending and receiving electromagnetic signals primarily along a direction that is perpendicular to the rear surface of the device). The third millimeter-wave antenna 734 may be configured as a side-fired antenna (e.g., sending and receiving electromagnetic signals primarily along a direction that is perpendicular to a side surface of the device). It will be understood that the directional millimeter-wave antennas need not be oriented directly at another antenna in order to communicate, but may tolerate slight misalignments (e.g., +/−15 degrees, +/−30 degrees, or another value).

Figure 8A:
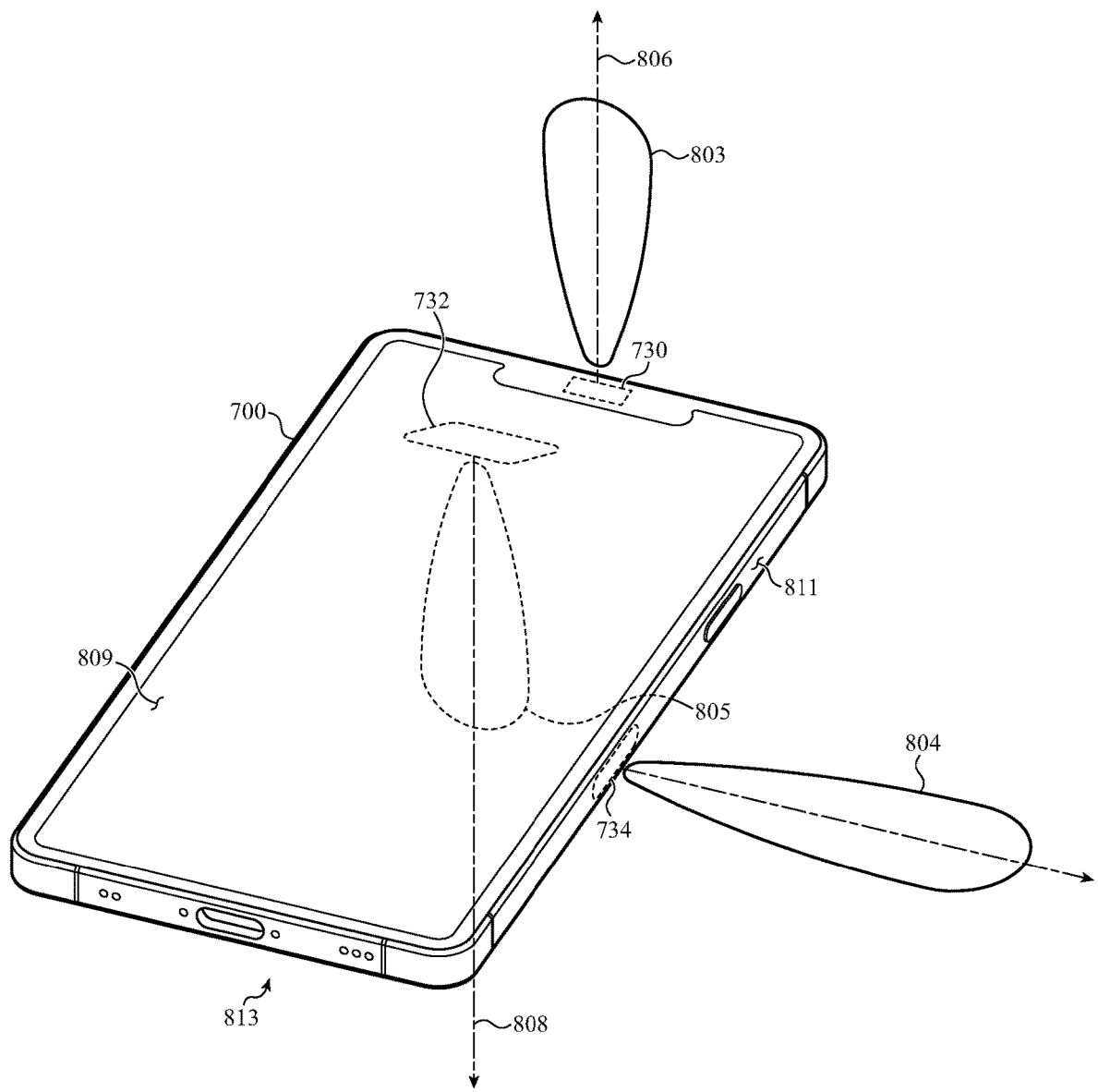
FIG. 8A depicts an example antenna arrangement for an example electronic device.

FIG. 8A illustrates the device 700, showing example radiation patterns of the millimeter-wave antennas, and how those radiation patterns are oriented relative to the device 700. For example, the first millimeter-wave antenna 730 defines a first radiation pattern 803 extending through the front surface 809 of the mobile phone 700, the second millimeter-wave antenna 732 defines a second radiation pattern 805 extending through the rear surface 813 of the mobile phone, and the third millimeter-wave antenna 734 defines a third radiation pattern 804 extending through the side surface 811 of the mobile phone. As noted above, the millimeter-wave antennas may be directional antennas (or high gain antennas). Accordingly, the antenna gains of the millimeter-wave antennas may be highest along particular directions. For example, as shown in FIG. 8A and corresponding to the shapes and orientations of the radiation patterns (or lobes) of the millimeter-wave antennas, a first antenna gain of the first millimeter-wave antenna 730 is highest along a first primary transmission direction 806 (e.g., perpendicular to the front surface 809), a second antenna gain of the second millimeter-wave antenna 732 is highest along a second primary transmission direction 808 (e.g., perpendicular to the rear surface 813), and a third antenna gain of the third millimeter-wave antenna 734 is highest along a third primary transmission direction (e.g., perpendicular to the side surface 811). In this case, the primary transmission directions of the first and second millimeter-wave antennas 730, 732 are orthogonal (or substantially orthogonal) to the third millimeter-wave antenna 734. As described below with respect to FIGS. 8B-8D, the radiation patterns and their associated transmission directions may provide millimeter-wave reception when the device is being held or used in different orientations and/or under different use conditions. While the radiation patterns and/or antenna gains are described with respect to a primary transmission direction, it will be understood that the transmission direction does not exclusively refer to transmission operations (e.g., sending information to another device, antenna, system, or the like), and instead may encompass and/or relate to both transmitting and receiving operations. Further, while FIG. 8A shows a single radiation pattern for each of the first, second, and third millimeter-wave antennas, each of the millimeter-wave antennas may include multiple antenna elements, each associated with its own radiation pattern. Thus, for example, the third millimeter-wave antenna 734 may include four antenna elements, each having a radiation pattern that is similar to the third radiation pattern 804 in size, shape, gain, and/or primary transmission direction.

Figure 8B:
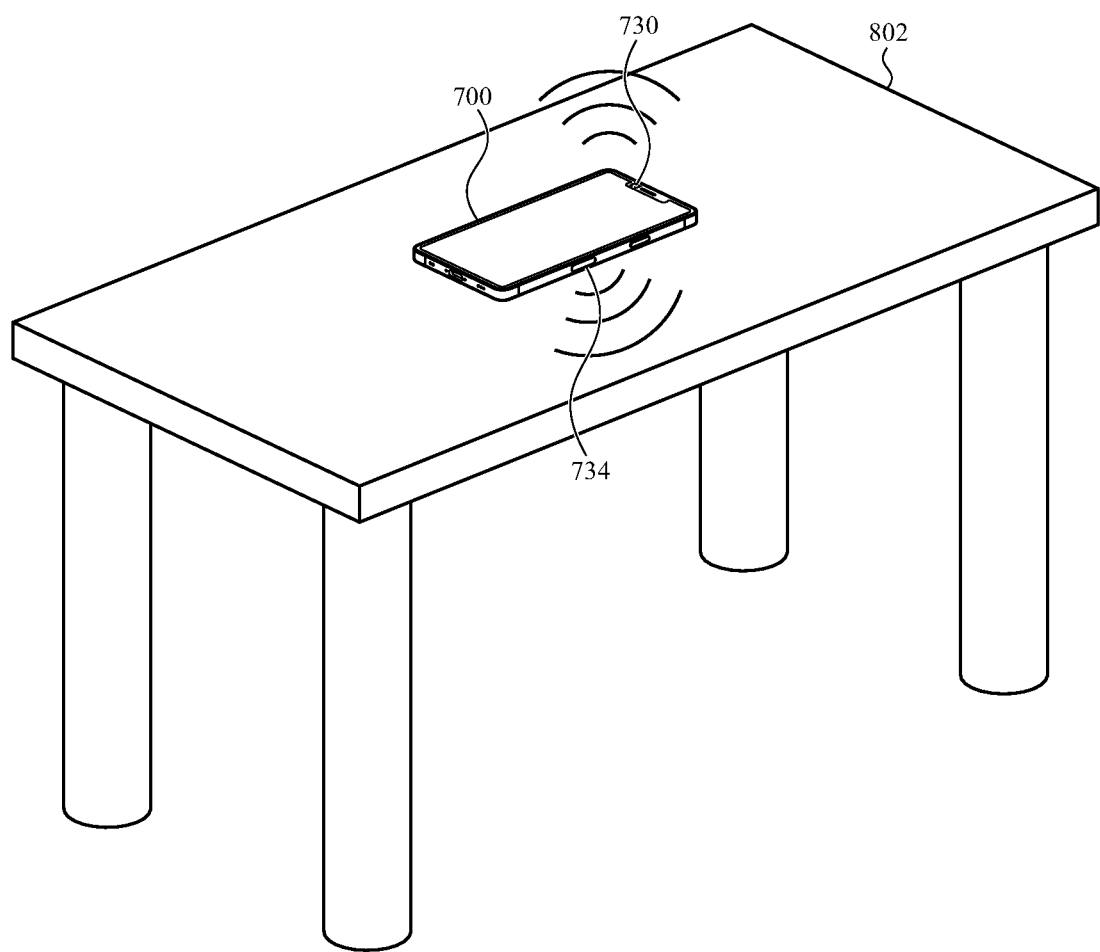
FIGS. 8B-8D depict example antenna use cases for an example electronic device.
Figure 8C:
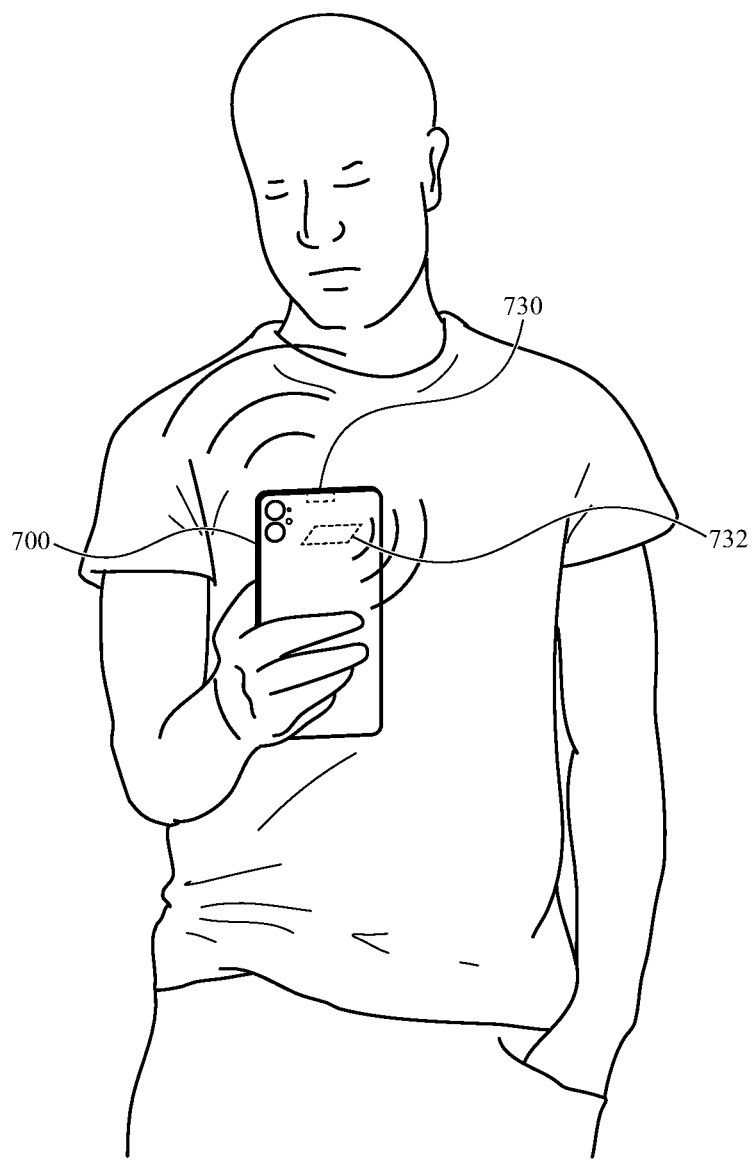
Figure 8D:
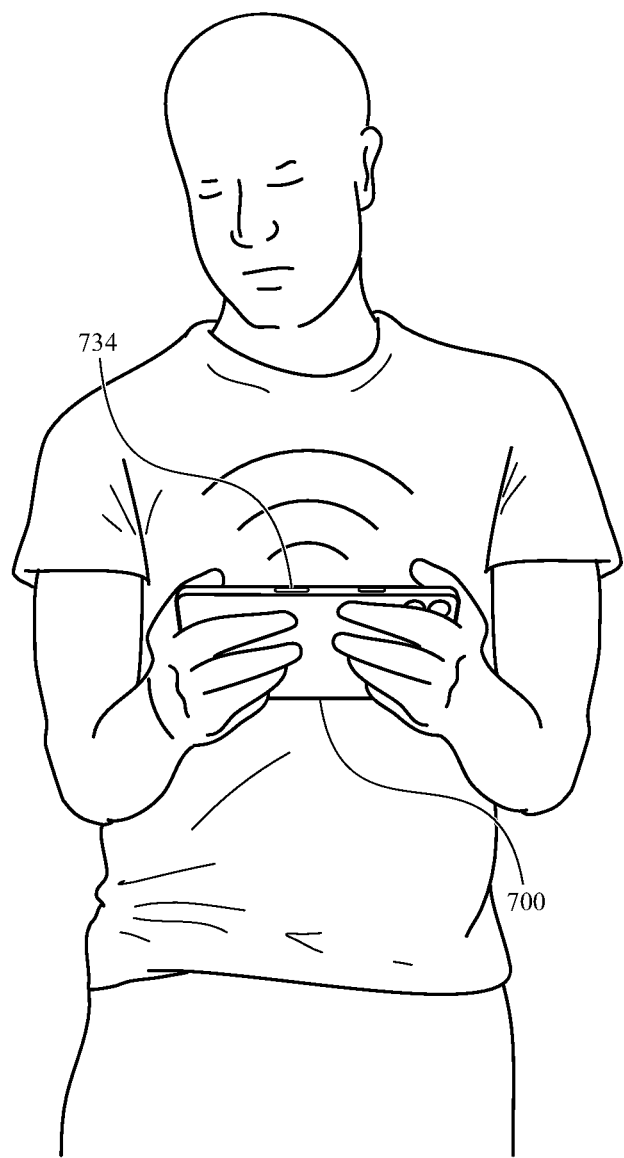

FIGS. 8B-8D illustrate how the millimeter-wave antennas may cooperate to provide millimeter-wave communications in various different use cases. FIG. 8B illustrates the device 700 in a face-up position on a table 802 (which is merely representative of many surfaces that the device 700 may be placed on). In this condition, the back-fired (or rear-fired) millimeter-wave antenna 732 is facing the table surface, and thus may be occluded by the table and not oriented towards a cell tower or other remote antenna. However, the front-fired millimeter-wave antenna 730 and the side-fired millimeter-wave antenna 734 may be unobstructed (at least by the table surface). Further, because the front- and side-fired antennas are oriented in different directions (e.g., the front-fired antenna radiating generally perpendicular to the table top and the side-fired antenna radiating generally parallel to the table top), there is a greater likelihood that at least one of these antennas will be sufficiently directed at a cell tower or other remote antenna to enable wireless communications.

FIG. 8C illustrates the device 700 being held in a user's hand in an upright or "portrait" orientation (e.g., with the long axis of the device 700 parallel to the height-axis of the user). In this condition, the side-fired millimeter-wave antenna 734 is occluded by the user's hand, and may thus be rendered temporarily ineffective or otherwise insufficient. However, the front-fired millimeter-wave antenna 730 and the rear-fired millimeter-wave antenna 732 may be unobstructed (at least by the user's hand). Further, because the front- and rear-fired antennas are oriented in different directions (e.g., the front-fired antenna radiating generally towards the user and possibly over the user's shoulder and/or around his or her body, and the rear-fired antenna radiating away from the user), there is a greater likelihood that at least one of these antennas will be sufficiently directed at a cell tower or other remote antenna to enable wireless communications.

FIG. 8D illustrates the device 700 being held in a user's hand in a "landscape" orientation (e.g., with the long axis of the device 700 perpendicular to the height-axis of the user and/or parallel to the ground). In this condition, the rear-fired millimeter-wave antenna 732 may be occluded by the user's hand, and may thus be rendered temporarily ineffective or otherwise insufficient. However, the side-fired millimeter-wave antenna 734, and optionally the front-fired millimeter-wave antenna 730, may be unobstructed (at least by the user's hands). Further, because the front- and side-fired antennas are oriented in different directions (e.g., the front-fired antenna radiating generally towards the user and possibly over the user's shoulder and/or around his or her body, and the side-fired antenna radiating away from the user), there is a greater likelihood that at least one of these antennas will be sufficiently directed at a cell tower or other remote antenna to enable wireless communications.

Returning to FIG. 7, the second (rear-fired) millimeter-wave antenna 732 may be coupled to a logic board 736 (which may be an embodiment of the logic boards 220, 320, 420, 520, or any other logic board described herein). In some cases, the second millimeter-wave antenna 732 (which may be or may include a passive antenna board) is surface mounted directly to the logic board 736. The second millimeter-wave antenna 732 may include antenna arrays for two different frequencies (e.g., 28 GHz and 39 GHz, though other frequencies are also possible). Each antenna array may include four antenna elements, and each antenna element may have two different polarizations. By including two different antenna arrays, rather than using the same antenna elements for two different bands, the second millimeter-wave antenna 732 may have a greater overall bandwidth than an antenna that uses the same antenna elements to communicate over two (or more) frequency bands. The greater bandwidth of the second millimeter-wave antenna 732 may allow for greater tolerances in the positioning of the antenna 732 in the device 700 while still providing adequate antenna performance.

The device 700 may also include antenna circuitry in a system-in-package (SiP) component 738. The SiP component 738, referred to herein as the SiP 738, may include components such as one or more processors, memory, analog-to-digital converters, filters, amplifiers, power control circuitry, or the like. The SiP 738 may be coupled to the logic board 736, and may be positioned above the second millimeter-wave antenna 732. The antenna elements in the second millimeter-wave antenna 732 may be conductively coupled to the SiP 738 so that the SiP 738 can process signals received via the second millimeter-wave antenna 732 and cause the second millimeter-wave antenna 732 to send signals.

The SiP 738 may include antenna circuitry for other antennas as well. For example, the first millimeter-wave antenna 730 may be conductively coupled to the SiP 738 via a circuit board 740 (which may be a flexible circuit element with conductive traces or other suitable conductor or set of conductors).

Figure 9A:
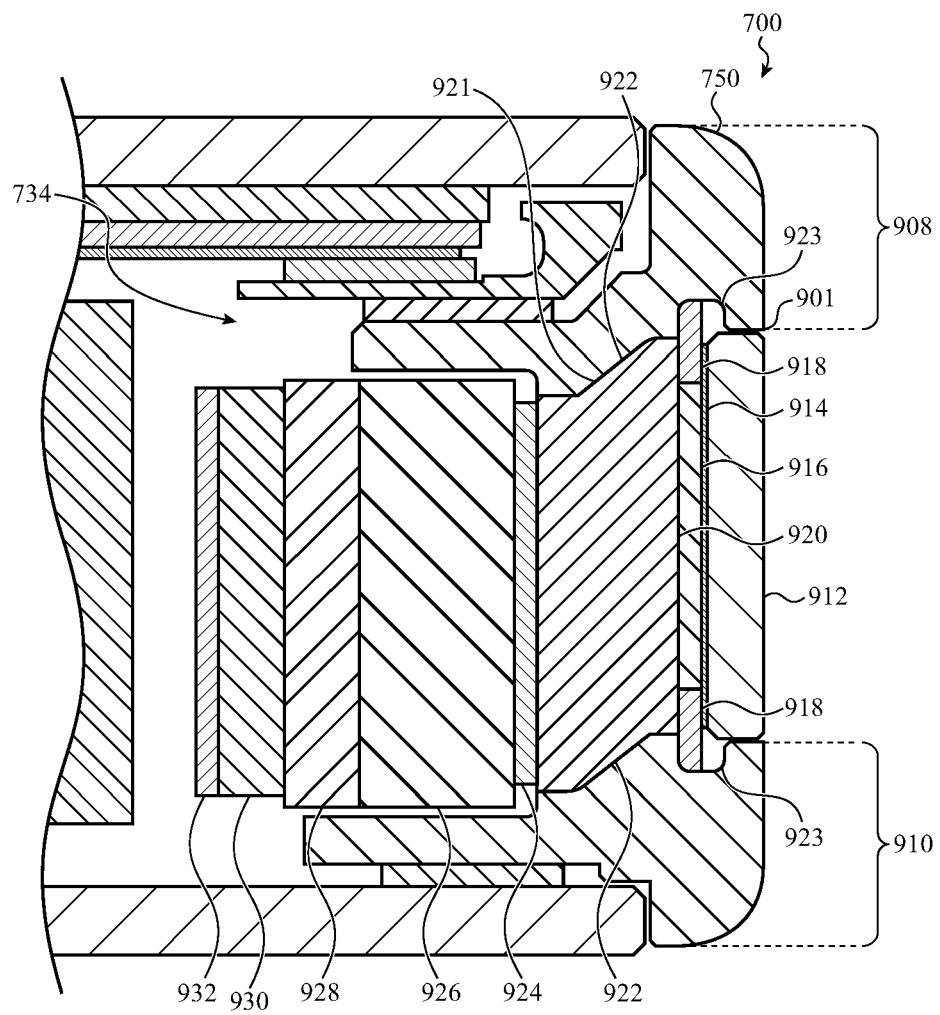
FIGS. 9A-9B depict an example side-fired antenna window for an electronic device.

FIG. 9A is a partial cross-sectional view of the device 700, viewed along line 9A-9A in FIG. 7. The cross-sectional view illustrates example details of the third (side-fired) millimeter-wave antenna 734 of the device 700. The side-fired antenna 734 (also referred to as an antenna module) is secured to an interior of the housing 750 of the device 700, and is configured to transmit and receive electromagnetic signals through one or more openings 901 in the side wall of the housing 750. The openings 901 may extend through the side wall of the housing 750 and may at least partially define an antenna window for the side-fired antenna 734.

The side-fired antenna 734 includes an antenna array 926, which includes a plurality of directional antenna elements. The antenna array 926 may include antenna elements for two different frequencies (e.g., 28 GHz and 39 GHz, though other frequencies are also possible). For example, two antenna elements may be provided for each frequency, and each antenna element may have two different polarizations. Of course, other configurations of antenna elements are also possible. For example, the antenna array 926 may include four antenna elements for each frequency.

The side-fired antenna 734 may also include antenna circuitry in a SiP component 928. The SiP component 928, referred to herein as the SiP 928, may include components such as one or more processors, memory, analog-to-digital converters, filters, amplifiers, power control circuitry, or the like. The SiP 928 may be conductively coupled to the logic board 736 (e.g., via a flexible circuit element 934, FIG. 9B). The antenna elements in the antenna array 926 may be conductively coupled to the SiP 928 so that the SiP 928 can process signals received via the antenna array 926 and cause the antenna array 926 to send signals.

A spacer 930 may be positioned between the SiP component 928 and a bracket 932. The bracket 932 may secure components of the side-fired antenna 734 to the housing 750, as shown and described in greater detail with respect to FIG. 9B.

The side wall of the housing 750 (shown in FIG. 9B) may be configured to function as a waveguide for guiding electromagnetic signals to and from the antenna array 926. The waveguide may be defined by a passage or hole 921 through the side wall of the housing 750. The passage 921 may be defined in part by walls 922 that extend from an exterior side surface of the side wall of the housing 750 to an interior surface of the housing 750. As shown, the walls 922 are angled such that the opening on the exterior side surface is offset from the opening on the interior surface of the housing. More particularly, the center of the opening in the exterior side surface of the side wall may be vertically offset from the center of the opening in the interior side of the housing 750.

The vertical offset of the openings defines a generally non-horizontally aligned passage (relative to the orientation shown in FIG. 9A), which allows the internal components of the side-fired antenna 734 to be offset from a central axis of the device 700 while also allowing the opening 901 in the exterior side surface to be vertically centered in the exterior side surface. For example, the height 908 of the housing 750 above the opening 901 may be the same as the height 910 of the housing 750 below the opening 901. By aligning the opening 901 with the middle of the side surface (e.g., the middle along the vertical direction), the structural integrity (e.g., stiffness, strength, etc.) of the housing 750 may be higher than if the opening 901 were offset vertically from the center of the side surface (e.g., because the amount of housing material above the opening 901 would be different from the amount below, leading to one side being weaker than the other). Further, the central alignment of the opening 901 provides an overall symmetrical and balanced appearance to the device 700.

The side-fired antenna 734 may include a cover element 920 (also referred to as an insert) within part of the passage 921. The insert 920 may be a plastic, glass, or other material (e.g., a nonconductive material) insert, and may be adhered to the antenna array 926 via an adhesive 924. Notably, there may be no air gap between the antenna array 926 and the insert 920. The ability to construct the side-fired antenna 734 without an air gap between the antenna array 926 and the insert 920 may be due at least in part to the particular materials and other properties of the adhesive 924 and the insert 920. The insert 920 may be placed into the passage 921, or it may be formed in place by, for example, injecting a polymer material into the passage 921 and allowing the polymer material to cure or otherwise harden.

The device 700 may also include a cover element 912 positioned in the passage 921 and defining part of the exterior side surface of the device 700 (e.g., in conjunction with the exterior side surface of the housing 750). The cover element 912 may be formed of glass, sapphire, glass-ceramic, plastic, or any other suitable material (e.g., nonconductive material). The thickness of the cover element 912 may be determined at least in part on the material being used and the effect of the material (and the dimensions) on the electromagnetic signals passing through the passage 921. For example, in order to achieve the same or similar electromagnetic performance, the thickness of the cover element 912 may be greater if it is formed of glass than if it is formed from sapphire. If the cover element 912 is formed of sapphire, a spacer layer (e.g., a plastic, epoxy, or other suitable material) may be included between the cover element 912 and an adhesive (e.g., the adhesive 924) that secures the cover to the device 700.

The cover element 912 may include a mask layer 914, which may be applied to the back or front surface of the cover element 912. As shown, the mask layer 914 is applied to the back surface of the cover element 912. The mask layer 914 may be an ink, dye, film, paint, coating, or other material, and may be visible through the cover element 912. The mask layer 914 may be opaque. The mask layer 914 may also be a single layer, or it may include multiple sub-layers.

The cover element 912 may be secured to the housing 750 via an adhesive 916, and a sealing material 918 may be positioned over the seam between the insert 920 and the walls of the passage 921. The adhesive 916 may also adhere the cover element 912 to the insert 920.

The sealing material 918 may be a polyurethane or any other suitable sealing material, and may be configured to prevent or limit ingress of liquids (e.g., water, sweat, etc.) and/or other contaminants into the device 700 through the seam. The sealing material 918 may be applied as a continuous sheet over the insert 920 and the surfaces of the housing that surround the insert 920. A central portion of the sealing material 918 may then be removed (e.g., by laser ablation or another suitable technique) to reveal a surface of the insert 920 to which the adhesive 916 may be applied. The adhesive 916 may be a film, a liquid, or any other suitable adhesive.

The passage 921 may include a recess 923 that accommodates part of the sealing material 918. In particular, the recess 923 may be configured so that the seam between the insert 920 and the housing material is substantially flat or planar, thus defining a flat surface on which to apply the sealing material 918. The recess 923 may be formed by machining, using a T-slot bit.

Figure 9B:
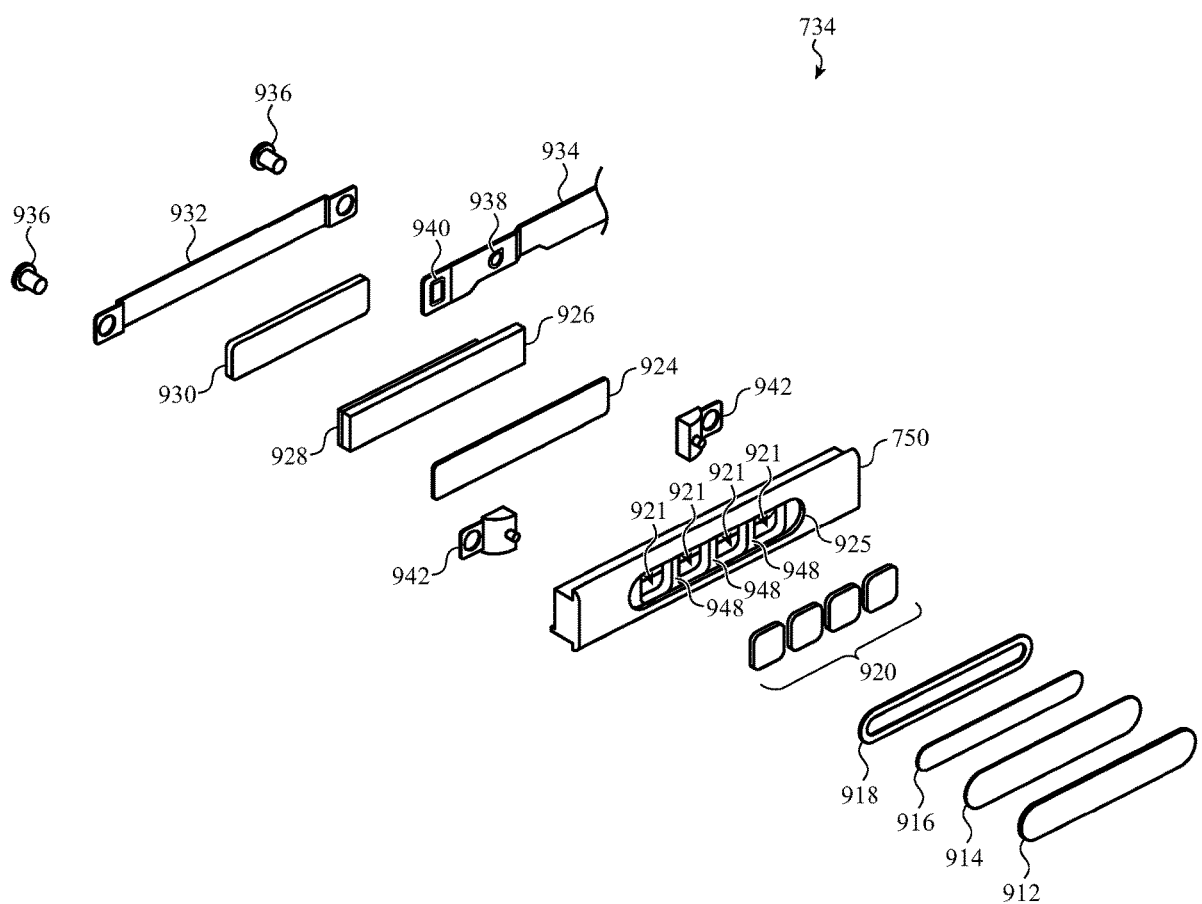

FIG. 9B is an exploded view of the side-fired antenna 734, illustrating additional details of the configuration of the antenna 734 and its components and the antenna window formed in the side wall of the housing 750. As described above, the side-fired antenna 734 includes a cover element 912, a mask layer 914 (which may be applied to the cover), an adhesive 916, a sealing material 918, an additional cover element 920 (or insert), an adhesive 924, an antenna array 926, a SiP 928, a flexible circuit element 934 (coupled to the antenna array 926 and/or SiP 928 via an electrical connector 940), a spacer 930, and a bracket 932.

In some cases, the housing includes multiple passages or holes 921 extending through the side wall of the housing 750 and at least partially defining the antenna window for the side-fired antenna. The holes 921 may be formed along a bottom surface of a recessed region 925, as shown. For example, the cover element 912, mask layer 914, adhesive 916, and sealing material 918 may be positioned within the recessed region 925.

Each passage or hole 921 may include its own insert 920, and may be associated with a single antenna element in the antenna array 926. More particularly, for each respective passage 921, the antenna array 926 may include a respective antenna element aligned with that passage. In this way, the passages, which act as waveguides for the antenna elements, may direct electromagnetic signals to and from individual antenna elements. The passages 921 may be separated from adjacent passages by ribs 948. The ribs 948 may be formed by removing material from the housing 750 to define the passages and the ribs. Accordingly, the ribs 948 may be integral with (e.g., formed from the same block of material as) the rest of the housing member in which the passages are formed. In other cases, the ribs may be separate components that are attached to the housing 750. In some cases, the ribs may be omitted, and a single hole or passage may be defined through the side wall to facilitate antenna operation (e.g., transmitting and receiving electromagnetic signals through the side wall of the housing 750).

The device 700 may also include a set of anchor members 942. The anchor members 942 may include alignment features (e.g., posts) that are configured to engage with corresponding alignment features (e.g., blind holes) in the housing 750. When engaged with the housing 750, the anchor members 942 may provide surfaces and/or other features that guide or align the components of the side-fired antenna 734 in a target location and/or position.

A ground path may be defined from the housing 750 to the electrical components of the side-fired antenna 734, such as the antenna array 926 and SiP 928, to provide an electrical ground to the side-fired antenna 734. For example, a fastener 936, which may be conductive, may be threaded into the housing 750, thereby conductively coupling the fastener 936 to the housing 750 (which may define an electrical ground plane of the device 700). The flexible circuit element 934 may include a grounding and attachment lug 938, which may include a hole through the flexible circuit element and a conductive material that surrounds or is proximate the hole. The fastener 936 extends through the hole of the grounding and attachment lug 938 and contacts the conductive material of the grounding and attachment lug 938 when the fastener 936 is installed, thereby conductively coupling the conductive material of the grounding and attachment lug 938 (which may be conductively coupled to or otherwise define an electrical ground of the flexible circuit element 934) to the housing 750. In this way, a ground path may be established between the flexible circuit element 934 and the housing 750. The conductive material of the grounding and attachment lug 938 may also contact one of the anchor members 942, which is in turn conductively coupled to the housing 750. Thus, the ground path from the flexible circuit element 934 to the housing may also be defined by or via the anchor member 942.

The fasteners 936 may be any suitable fasteners, such as screws, and may also retain the components of the side-fired antenna 734 in position. More particularly, the bracket 932, which is held in place by the fasteners 936, may capture and retain components of the antenna 734 between itself and the housing 750. The bracket 932 may also act as a heat sink or otherwise serve to spread and/or dissipate heat from the antenna components.

Figure 10A:
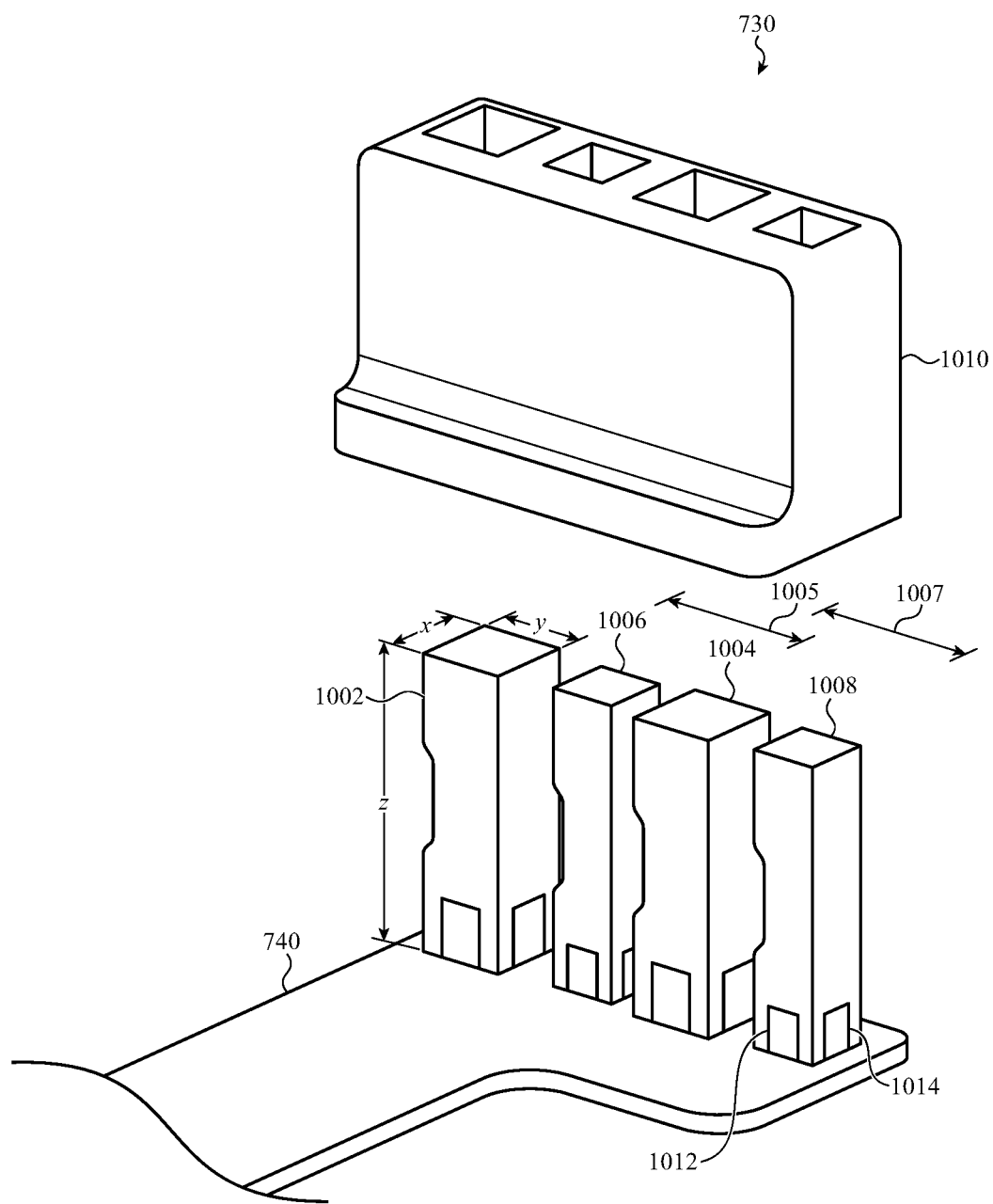
FIG. 10A depicts an example front-fired antenna for an electronic device.

FIG. 10A is a partially exploded view of the first (front-fired) millimeter-wave antenna 730 (also referred to as an antenna module). The front-fired antenna 730 may include four antenna elements 1002, 1004, 1006, and 1008. The antenna elements 1002, 1004, 1006, and 1008 may be directional antenna elements that define radiation patterns with their highest gains along primary transmission directions, as described with respect to FIG. 8A. The primary transmission directions of the antenna elements 1002, 1004, 1006, and 1008 may be parallel to one another, and may extend through the front cover of a device (or any cover or wall of the device that they are positioned below).

The antenna elements 1002, 1004, 1006, and 1008 may be formed from a dielectric material such as zirconia (or another suitable ceramic or other material). In some cases, the antenna elements may be formed of a material having a dielectric constant (also referred to as relative permittivity) higher than about 20. In some cases, the dielectric constant is between about 21 and about 24, or between about 27 and about 30. In cases where the antenna elements 1002, 1004, 1006, and 1008 are ceramic, they may be referred to as ceramic posts.

The four directional antenna elements of the front-fired antenna 730 may include two first directional antenna elements 1002, 1004 configured to operate at a first frequency band (e.g., 28 GHz), and two second directional antenna elements 1006, 1008 configured to operate at a second frequency band (e.g., 39 GHz). The size and shape of the antenna elements may define the resonant frequency or frequency band for the antenna elements. Thus, for example, the first antenna elements 1002, 1004 may have a different (e.g., greater) size in the x-dimension and in the y-dimension than the second antenna elements 1006, 1008, thus causing the first and second antenna elements to have different resonant frequencies and thereby communicate on different frequency bands. In some cases, the x- and y-dimensions of the first antenna elements 1002, 1004 are about 1.1 mm by about 1.1 mm, and the x- and y-dimensions of the second antenna elements 1006, 1008 are about 0.8 mm by about 0.8 mm.

The antenna elements of the front-fired antenna 730 may include conductive contact pads, such as the conductive contact pads 1012, 1014 on the antenna element 1008. (While not separately labeled, similar conductive contact pads may be provided on the other antenna elements 1002, 1004, and 1006 as well.) The conductive contact pads may be configured to conductively couple the antenna elements to other antenna circuitry (e.g., via conductors in the circuit board 740). For example, the conductive contact pads may be soldered to the circuit board 740.

The conductive contact pads may be formed by metallizing the antenna elements, such as with electroplating, metal deposition (e.g., plasma vapor deposition, chemical vapor deposition), or any other suitable technique. In some cases, a metal or conductive film is applied to the antenna elements to form the conductive contact pads. In some cases, the height of the conductive contact pads in the z-dimension may affect the tuning of the antenna elements (e.g., the resonant frequency of the antenna element, the efficiency of the antenna element, etc.). In some cases, the other dimensions of the conductive contact pads (e.g., a thickness, a width) may differ between the antenna elements as well. While only two conductive contact pads are visible on each antenna element, the non-visible sides of the antenna elements may also include conductive contact pads (e.g., opposite the visible conductive contact pads). In some cases where four conductive contact pads are provided, only two conductive contact pads (e.g., two non-parallel contact pads) are used to conductively couple the antenna element to other antenna circuitry.

Each antenna element may have two polarizations, with the conductive contact pads providing the signals to and from the antenna elements for the different polarizations. For example, a first conductive contact pad 1012 may be configured to excite the second antenna element 1008 according to a first polarization, while the second conductive contact pad 1014 may be configured to excite the second antenna element 1008 according to a second polarization (e.g., orthogonal to the first polarization). This configuration may allow each antenna element to simultaneously send and/or receive two separate electromagnetic signals.

As noted above, the first antenna elements 1002, 1004 may operate at different frequencies than the second antenna elements 1006, 1008. The use of multiple antenna elements for each frequency may facilitate techniques such as beam-forming. To facilitate beam-forming operations, the antenna elements that share the same frequency may be separated from one another by a particular distance. For example, the first antenna elements 1002, 1004 may be separated by a distance 1005, and the second antenna elements 1006, 1008 may be separated by a distance 1007, which may be different than the distance 1005 (e.g., less than or greater than the distance 1005). In some cases, the distances (e.g., the gaps) between the antenna elements is not uniform. The particular distances may be defined at least in part on the frequencies on which the antenna elements operate, operational parameters of a wireless communication protocol, or the like.

The antenna elements 1002, 1004, 1006, and 1008 may be at least partially encapsulated or encased in a cover structure 1010. The cover structure 1010 may be a molded polymer material (e.g., a fiber-reinforced polymer), and it may provide structural support to the antenna elements. The cover structure 1010 may be molded around the antenna elements after they are attached to the circuit board 740, or it may be formed separately and then attached to the circuit board 740 (either before or after the antenna elements are connected to the circuit board 740). In some cases, the cover structure 1010 contacts substantially all of the surfaces of the antenna elements. In some cases, the cover structure 1010 defines air gaps between adjacent antenna elements, such as by defining one or more cavities within the cover structure 1010. FIG. 10C illustrates an example front-firing antenna with a cover structure 1010 that defines air gaps between adjacent antenna elements.

Figure 10B:
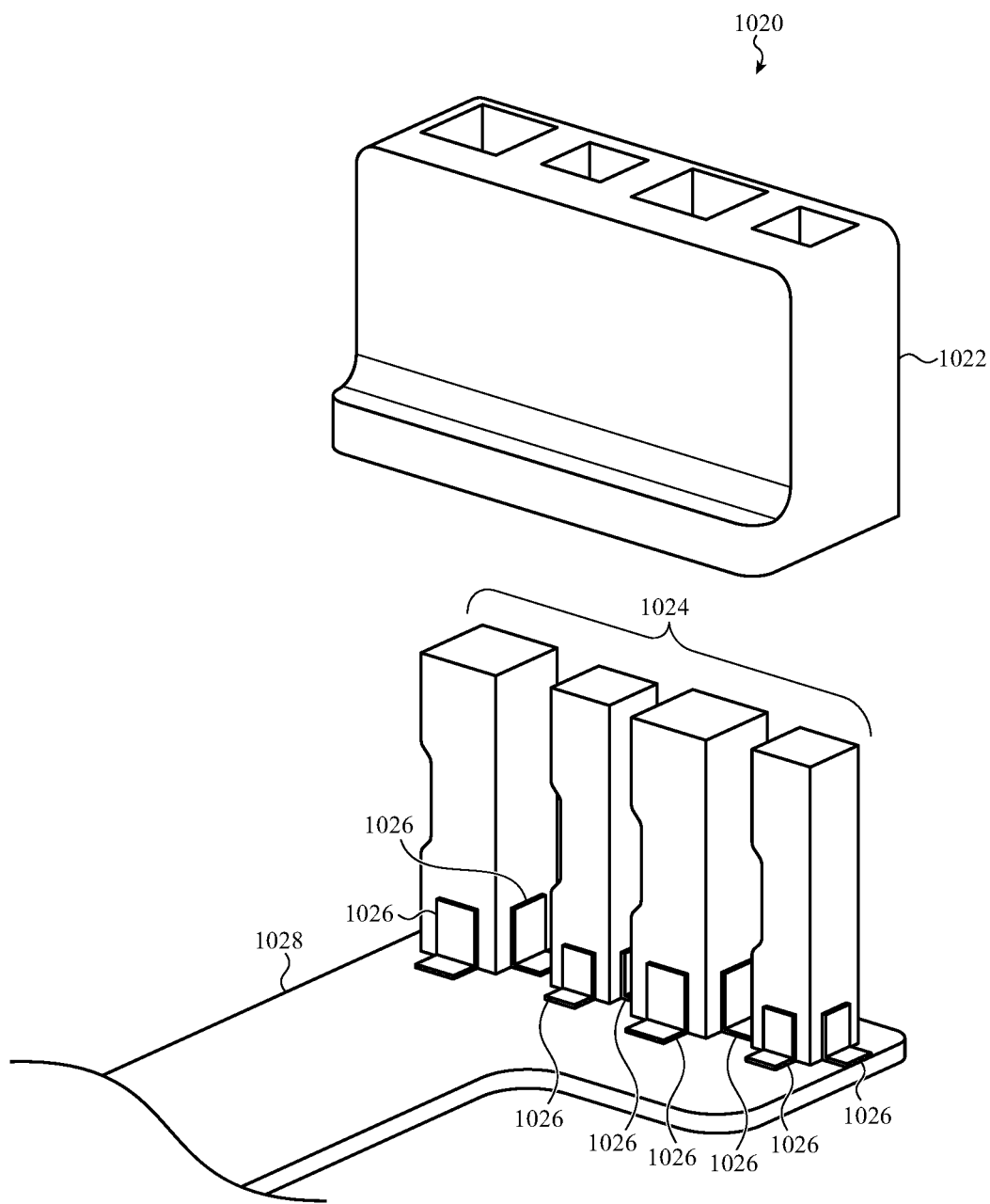
FIG. 10B depicts another example front-fired antenna for an electronic device.
Figure 10C:
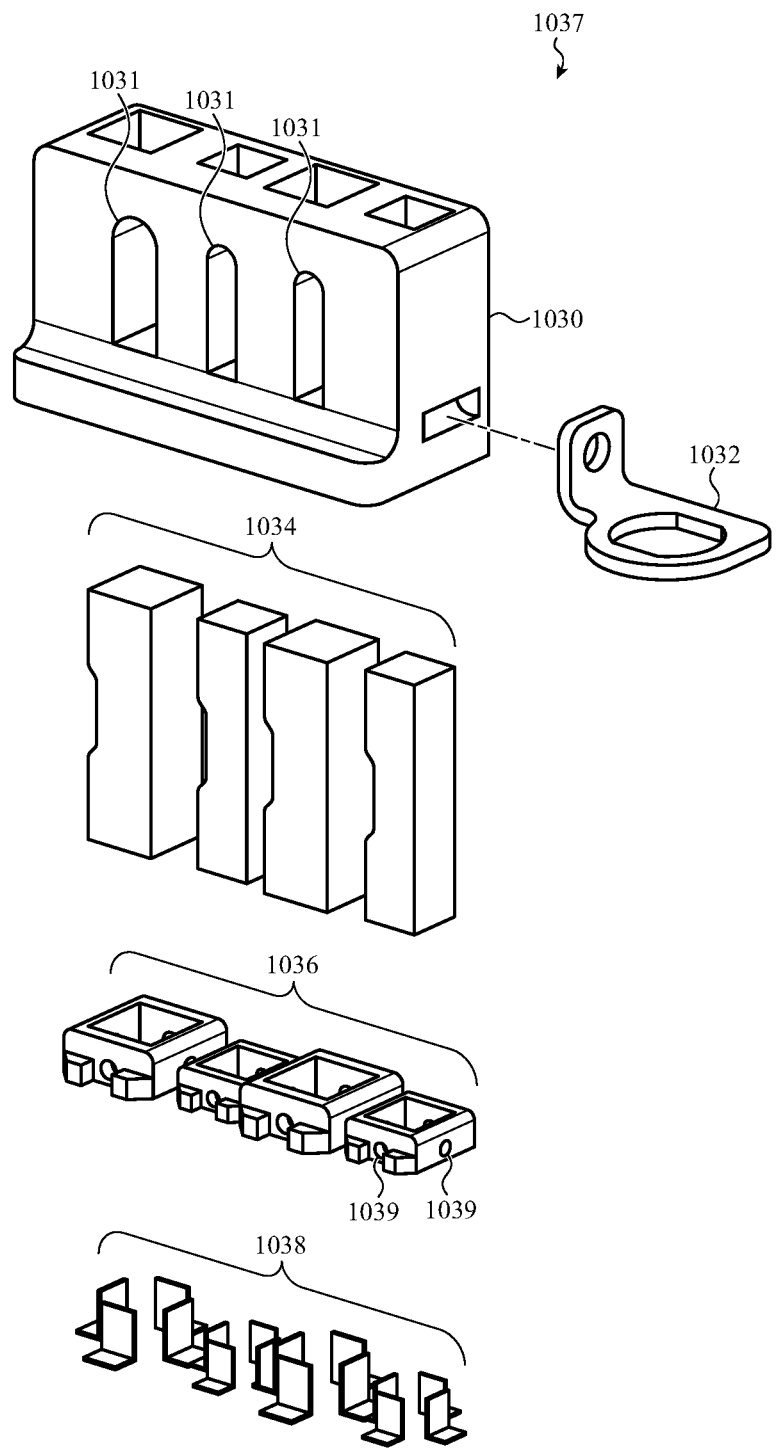
FIG. 10C depicts another example front-fired antenna for an electronic device.

FIG. 10B illustrates another example of a front-firing antenna 1020. In this example, instead of metallizing the antenna elements to produce the conductive contact pads, conductive contacts 1026 may be attached to the circuit substrate 1028 (which may be similar to the circuit board 740, and may be a flexible circuit element with conductive traces or other suitable conductor or set of conductors). The antenna elements 1024, which may lack the conductive contact pads but be otherwise similar to the antenna elements 1002, 1004, 1006, and 1008, may be coupled to the circuit substrate 1028 after the conductive contacts 1026 are attached. The conductive contacts 1026 may be attached to the circuit substrate 1028 prior to the antenna elements 1024 being attached and prior to the cover structure 1022 (which may be similar to the cover structure 1010) being attached or formed around the antenna elements 1024. Alternatively, the conductive contacts 1026 may be integrated with the cover structure 1022 (e.g., by insert molding the cover structure 1022 around the conductive contacts 1026 to at least partially encapsulate the conductive contacts 1026), and then the cover structure 1022 with the conductive contacts 1026 may be attached to the circuit substrate 1028. The conductive contacts 1026 may have different sizes, and the sizes may at least partially define or affect the tuning of the antenna elements. For example, the height of the conductive contacts 1026 in the z-dimension (e.g., the height of the portion of the conductive contacts 1026 that is in contact with the side of the antenna element) may affect the tuning of the antenna elements (e.g., the resonant frequency of the antenna element, the efficiency of the antenna element, etc.). Accordingly, the conductive contacts 1026 on the antenna elements that are configured to operate at one frequency may have different dimensions than those on the antenna elements that are configured to operate at a different frequency. In some cases, the other dimensions of the conductive contacts 1026 (e.g., a thickness, a width) may differ between the antenna elements as well.

FIG. 10C is a partially exploded view of another example (front-fired) millimeter-wave antenna 1037. The front-fired antenna 1037 may include antenna elements 1034 (which may be embodiments of other antenna elements described herein, such as the antenna elements 1002, 1004, 1006, and 1008. The front-fired antenna 1037 may also include a cover structure 1030, which may be similar in materials and function to other cover structures described herein, such as the cover structures 1010, 1022. The cover structure 1030 may define air gaps 1031 between adjacent antenna elements 1034. Because air has a lower dielectric constant than many materials, such as a plastic from which the cover structure 1030 may be formed, the air gaps 1031 may help reduce the average or effective dielectric constant between the antenna elements. In some cases, the presence of, as well as the sizes and shapes of, the air gaps 1031 may improve the operation of the antenna as compared to a cover structure without air gaps. The air gaps 1031 may also allow the spacing between the antenna elements 1034 to be reduced, relative to a solid cover structure, resulting in a smaller overall size of the antenna 1037 as compared to other constructions.

The antenna 1037 may be formed by a molding process. For example, an antenna element subassembly may be formed by a process in which conductive contacts 1038 (which may be embodiments of the conductive contacts 1026) and the antenna elements 1034 are placed in a first mold such that the conductive contacts 1038 are in contact with the antenna elements 1034 at a target location and position (e.g., as shown in FIGS. 10A and/or 10B). A first polymer material may then be introduced into the first mold to partially encapsulate the conductive contacts 1038 and at least partially surround the antenna elements 1034. The first polymer material may be allowed to cure or otherwise harden to form retention structures 1036. The retention structures may secure the conductive contacts 1038 in position and in contact with the antenna elements 1034.

The antenna element subassemblies may then be placed into a second mold, along with a mounting tab 1032, and a second polymer material (which may be different from the first polymer material and may be injected at a temperature that is lower than a melting or softening temperature of the first polymer material) may be injected into the second mold to form the cover structure 1030. The second polymer material may be allowed to cure or otherwise harden, thereby retaining the antenna element subassemblies together and in their target orientations and positions (e.g., with the appropriate spaces between the antenna elements 1034). The mounting tab 1032 may be configured to engage a screw or other fastener to assist in retaining the antenna 1037 in an intended position in a device.

As shown in FIG. 10C, the retention structures 1036 may define holes 1039 that extend through the retention structures 1036 and expose the conductive contacts 1038. While only two holes are labeled in FIG. 10C, each retention structure 1036 may define one hole for each conductive contact 1038 that it at least partially encapsulates. The holes may result from the presence, during the first molding operation, of tools that apply a force to the conductive contacts 1038 to retain the conductive contacts 1038 in contact with the antenna elements 1034 during the molding operation. After the first polymer material is introduced into the first mold (and optionally after the first polymer material is cured and/or hardened), the tools may be removed to reveal the holes 1039. The holes may be used to inspect the antenna element subassemblies. For example, a measuring tool (e.g., a laser) may be directed onto the conductive contacts 1038 through the holes, as well as onto the exposed surfaces of the antenna elements 1034, to determine a position differential. If the position differential for a given conductive member is greater than a thickness of the conductive member, it may be assumed that there is an air gap between the conductive member and the surface of the antenna element 1034 to which the conductive member is intended to contact. If the position differential is too great (e.g., if an air gap is likely to exist), the antenna element subassembly may be rejected.

Figure 10D:
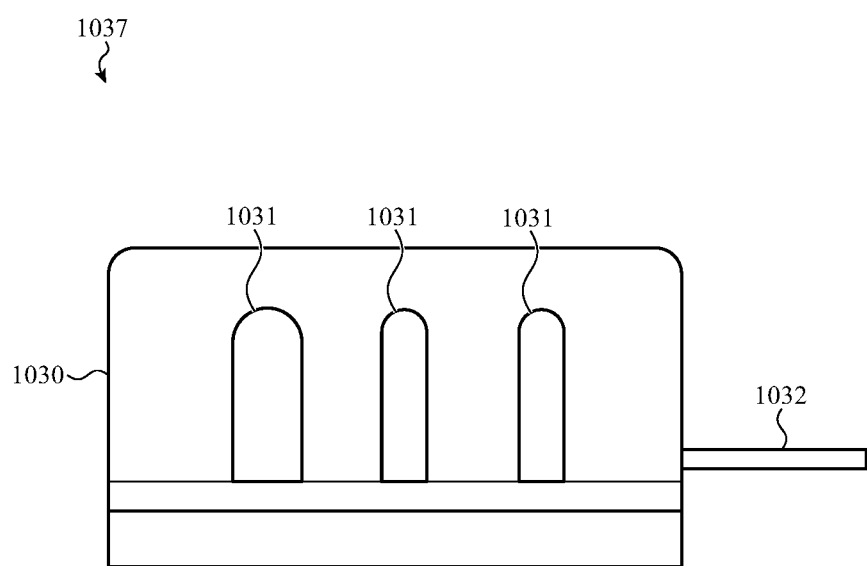
FIG. 10D depicts a side view of the front-fired antenna of FIG. 10C.

FIG. 10D is a side view of the antenna 1037. As shown in FIG. 10D, the widths of the air gaps 1031 are not uniform, and their sizes may be selected based on their effect on antenna performance, tuning, and/or other properties. For example, as the dielectric properties of the materials between antenna elements may affect the operation of the antenna, the sizes of the air gaps 1031 may be selected in order to produce a desired dielectric performance (e.g., average or effective dielectric constant) between the antenna elements.

Figure 10E:
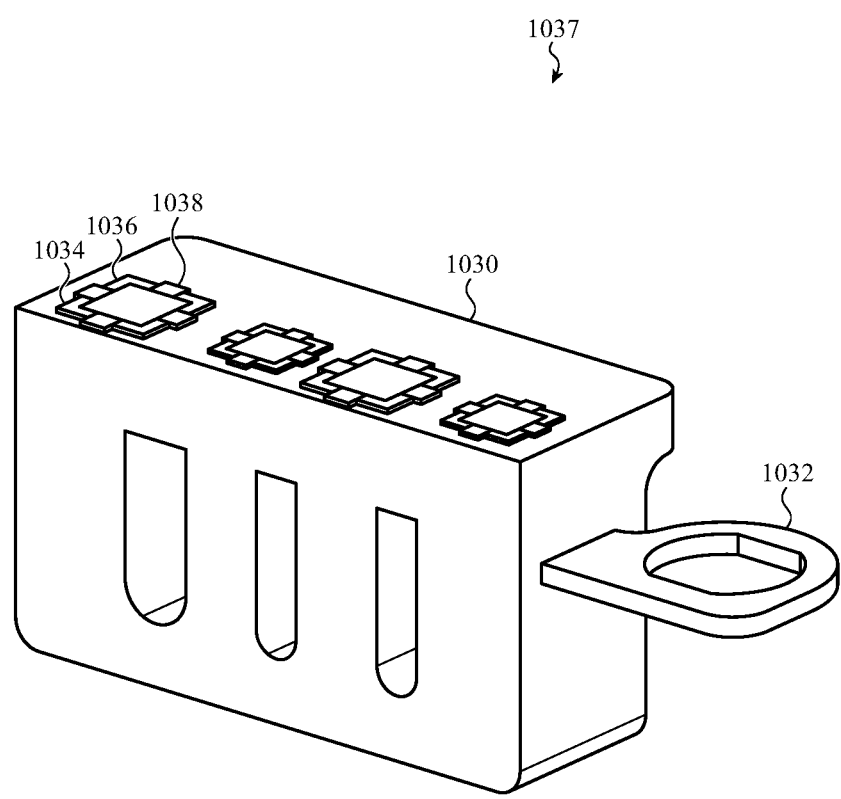
FIG. 10E depicts a perspective view of the front-fired antenna of FIG. 10C.

FIG. 10E shows a bottom view of the antenna 1037. As shown in FIG. 10E, the retention structures 1036 extend around the antenna elements 1034 and hold the conductive contacts 1038 in place against the antenna elements 1034. Further, the conductive contacts 1038 are exposed along the bottom of the antenna 1037 so that they can be conductively coupled to another component, such as the circuit substrate 1028.

Other techniques may also be used to produce millimeter wave antennas such as those described with respect to FIGS. 10A-10E. For example, a clamshell-like cover structure may be formed prior to insertion of the antenna elements. The antenna elements (or antenna element subassemblies) may thereafter be introduced into position and the clamshell cover structure may be closed to at least partially encapsulate the antenna elements (or antenna element subassemblies). As another example, the conductive contacts and the cover structure (and optionally retention structures and a mounting tab) may be formed together into a cover structure subassembly (e.g., by insert molding), and the antenna elements may thereafter be introduced (e.g., press-fit) into openings defined in the cover structure subassembly.

As noted above, portions of a metal or conductive housing of a device may be used as antenna elements to send and receive wireless signals. More particularly, the portions of the metal or conductive housing may act as the radiating elements of antennas. FIG. 7, for example, shows an example device 700 that uses metal housing members to define antenna elements for the sub-6 GHz spectrum. Metal housing members may be used to define antenna elements for other frequencies and/or protocols in addition to the sub-6 GHz antennas described with respect to FIG. 7. FIG. 11 is a schematic representation of a portion of a housing 1100 formed of multiple conductive housing members joined together with joining elements. FIG. 11 also schematically represents example connection points on the housing members where feed and/or ground lines may be conductively coupled to the housing members to carry electromagnetic signals from the housing member to other antenna circuitry (and from the antenna circuitry to the housing member).

As shown in FIG. 11, the housing 1100 may include a first housing member 1102 that defines a portion of a first side surface 1142 as well as a first corner surface 1150 and part of a second side surface 1144. The first housing member 1102 is structurally coupled to a second housing member 1104 via a first joining element 1114. As noted above, joining elements, such as the joining element 1114, may be formed from a polymer material (e.g., a fiber-reinforced polymer) that can structurally join housing members while also providing sufficient electrical isolation between the housing members to allow them to act as antenna elements.

The housing 1100 also includes a second housing member 1104 that defines a portion of the second side surface 1144 and is structurally coupled to a third housing member 1106 via a second joining element 1116. The third housing member 1106 defines part of the second side surface 1144 as well as a second corner surface 1152.

The third housing member 1106 also defines part of a third side surface 1146 of the housing and is structurally connected to a fourth housing member 1108 via a third joining element 1118. The fourth housing member 1108 also defines a portion of the third side surface 1146, a third corner surface 1154, and part of the fourth side surface 1148.

The fourth housing member 1108 is coupled to a fifth housing member 1110 via a fourth joining element 1120. The fifth housing member 1110 defines a portion of the fourth side surface 1148 and is coupled to a sixth housing member 1112 via a fifth joining element 1122. The sixth housing member 1112 defines a portion of the fourth side surface 1148, a fourth corner surface 1156, and a portion of the first side surface 1142. The sixth housing member 1112 is structurally connected to the first housing member 1102 via a sixth joining element 1125.

Each of the joining elements of the housing 1100 may define a portion of an exterior surface of the housing 1100. Thus, the exterior side surfaces of the housing 1100 may be defined entirely or substantially entirely by the housing members and the joining elements.

In order to operate as antenna elements, the housing members of the housing 1100 may be conductively coupled to antenna circuitry, electrical ground planes, and the like. The particular locations of the connection points on the housing members, as well as the sizes and shapes of the housing members, may at least partially define parameters of the antenna elements. Example antenna parameters may include resonant frequency, range, radiation pattern, efficiency, bandwidth, directivity, gain, or the like.

FIG. 11 illustrates example positions for the connection points of feed and ground lines to the housing members. For example, feed and ground lines may be conductively coupled to the first housing member 1102 at connection points 1124-1, 1124-2, thereby facilitating wireless communication via the first housing member 1102.

Feed and ground lines may be conductively coupled to the second housing member 1104 at connection points 1128-1, 1128-2 and optionally at connection points 1126-1, 1126-2. The portion of the second housing member 1104 between or proximate the connection points 1126-1, 1126-2 may act as one antenna element, while the portion of the second housing member 1104 between or proximate the connection points 1128-1, 1128-2 may act as another, independent antenna element (e.g., it may send and receive electromagnetic signals independently of the antenna element between the connection points 1126-1, 1126-2, despite being defined by the same housing member 1102). While FIG. 11 illustrates connection points 1126-1, 1126-2, these may be omitted in some implementations, such as in the device 700 of FIG. 7, which uses a conductive element on a circuit board as an antenna element in that corner of the device instead of using a housing member.

Feed and ground lines may be conductively coupled to the third housing member 1106 at connection points 1130-1, 1130-2, and to the fourth housing member 1108 at connection points 1132-1, 1132-2 and connection points 1134-1, 1134-2. The fourth housing member 1108 may define different antenna element configurations depending on which feed and ground lines are used at a given time. For example, in a first mode, the connection points 1132-1, 1132-2 are used, such that the fourth housing member 1108 is configured to communicate via a first communications protocol (or frequency), and in a second mode, the connection points 1134-1, 1134-2 are used, such that the fourth housing member 1108 is configured to communicate via a second communications protocol (of frequency) that differs from the first.

Feed and ground lines may be conductively coupled to the fifth housing member 1110 at connection points 1136-1, 1136-2, and at connection points 1138-1, 1138-2. Similar to the configuration of the second housing member 1104, the portion of the fifth housing member 1110 between or proximate the connection points 1136-1, 1136-2 may act as one antenna element, while the portion of the fifth housing member 1110 between or proximate the connection points 1138-1, 1138-2 may act as another, independent antenna element (e.g., it may send and receive electromagnetic signals independently of the antenna element between the connection points 1136-1, 1136-2, despite being defined by the same housing member 1110). Feed and ground lines may also be conductively coupled to the sixth housing member 1112 at connection points 1140-1, 1140-2.

As noted above, the housing members of the herein described device housings may be used to form multiple groups or sets of antennas, with each group or set communicating via a different communication protocol or frequency band. For example, the housing may define multiple antennas of a first MIMO antenna array or group (e.g., for a 4G communication protocol) as well as multiple antennas of a second MIMO antenna array (e.g., for a 5G communication protocol). In one non-limiting example configuration, the antenna elements defined by the connection points 1124, 1130, 1132, 1134, and 1140 may be configured to operate as part of a first MIMO antenna array (e.g., for a 4G communication protocol), while the antenna elements defined by the connection points 1126 (if provided), 1128, 1136, and 1138 may be configured to operate as part of a second MIMO antenna array (e.g., for a 5G communication protocol). For any given antenna group, the antenna elements of that group do not all need to be housing members. For example, the second MIMO antenna array or group may use an internal antenna (e.g., the antenna 708, FIG. 7) as one of the antennas in a 4×4 MIMO array.

As described above, conductive housing members, which may act as a radiating structure of an antenna or antenna system, may be structurally coupled together via joining elements. The joining elements may be formed from a polymer material or other dielectric material that can provide sufficient electrical isolation between housing members to facilitate the use of the housing members as radiating structures for antennas. In some cases, the joining elements include one, two, or more molded elements, which are molded into a gap between the housing members and into engagement with the housing members. Because the joining elements structurally retain housing members together, a strong engagement between the joining elements and the housing members may be preferred. Accordingly, the housing members may include or define structures and/or features that a joining element engages in order to retain the joining element to the housing members, and thereby retain the housing members together.

Figure 12A:
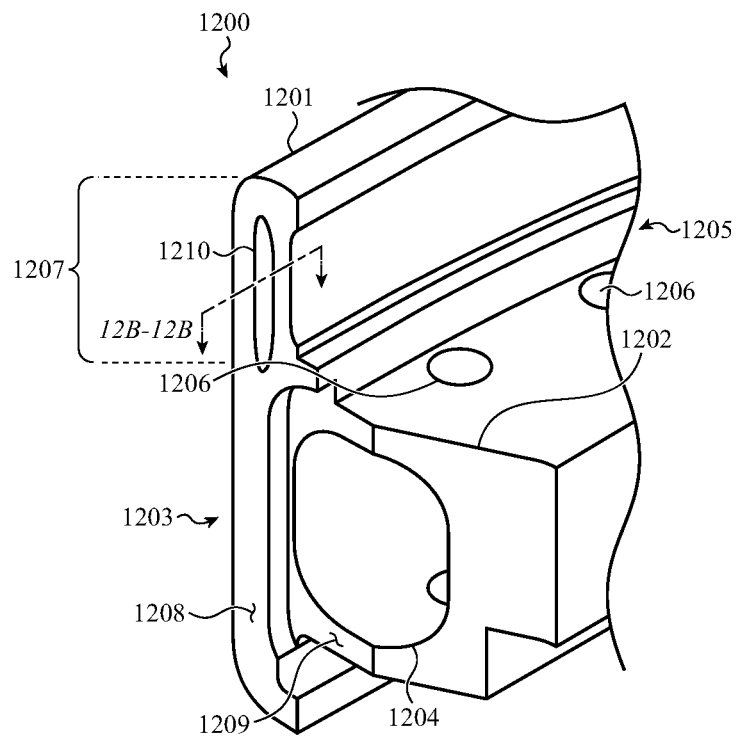
FIG. 12A depicts a partial view of a housing member for an electronic device.

FIG. 12A illustrates an example housing member 1200 that includes features with which a joining element may engage. The portion of the housing member shown in FIG. 12A may correspond generally to the area 12A-12A in FIG. 7.

Figure 12B:
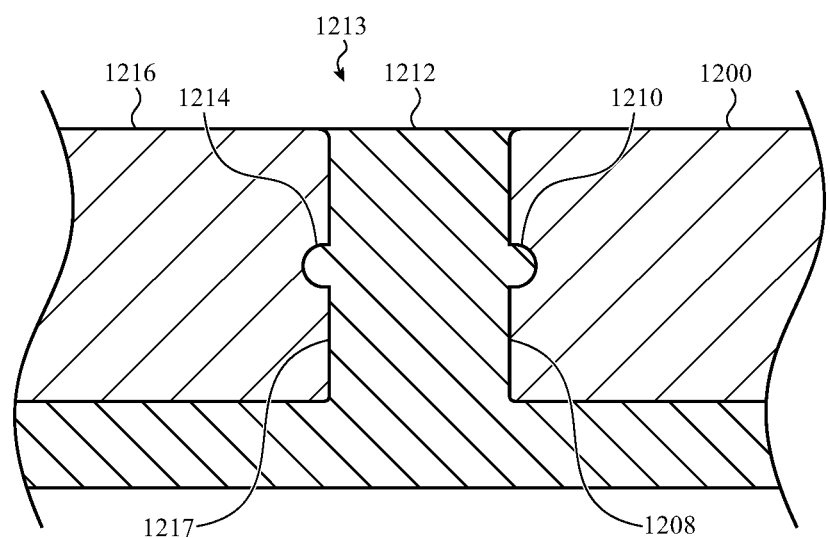
FIG. 12B depicts a partial cross-sectional view of a housing of an electronic device including the housing member of FIG. 12A.

The housing member 1200 may be formed from or include a conductive material, such as stainless steel, aluminum, a metal alloy or the like, and may be conductively coupled to an antenna circuit (e.g., via feed and/or ground lines, as described above) to act as a radiating structure for a device. The portion of the housing member 1200 shown in FIG. 12A may abut and/or engage with a joining element, as shown in FIG. 12B.

The housing member 1200 defines a first interlock feature 1202 that extends inwardly (e.g., towards an interior of the device) from a sidewall 1201 defined by the housing member 1200. The first interlock feature 1202 may extend from an interior side 1205 of the housing member 1200, where the interior side 1205 is opposite an exterior side 1203.

The sidewall 1201 may define an exterior surface of the device of which the housing member 1200 is a part. The first interlock feature 1202 may define a first hole 1204 and one or more second holes 1206. When a joining element is formed by injecting or otherwise molding a moldable material against the housing member 1200, the moldable material may at least partially surround and/or encapsulate the first interlock feature 1202, and may flow into and optionally through the first and second holes 1204, 1206. By at least partially encapsulating the interlock feature 1202 and flowing into and/or through the first and second holes 1204, 1206, the joining elements may be structurally interlocked with the housing member 1200, thereby securely retaining the joining element to the housing member 1200.

The housing member 1200 may also define a second interlock feature, such as a recess 1210, which may be an indentation, cavity, or other similar feature that is recessed relative to an end surface 1208 of the housing member 1200. The end surface 1208 of the housing member 1200 may be the portion of the housing member 1200 that extends closest to another housing member to which the housing member 1200 is coupled via a joining element. The end surface 1208 may be offset from an end surface 1209 defined by the first interlock feature 1202. More particularly, the end surface 1209 may be recessed relative to the end surface 1208 (e.g., along a direction that is perpendicular to the end surfaces 1208, 1209).

The recess 1210 may have a depth between about 100 microns and about 1000 microns, and may have a width (e.g., the left-to-right dimension as depicted in FIG. 12A) between about 100 microns and about 400 microns, and a length (e.g., the top-to-bottom dimension as depicted in FIG. 12A) between about 750 microns and about 3000 microns. In some cases, the housing member 1200 may also define pores along the end surface 1208 and/or the end surface 1209. The pores may be formed on the end surfaces 1208 and/or 1209, and may also be formed on the surface of the recess 1210. The pores may be a distinct structure than the recess 1210. For example, the recess 1210 may have a length dimension greater than about 1000 microns and a width dimension greater than about 100 microns, while the pores may have length and/or width dimensions less than about 10 microns. Similarly, the recess 1210 may have a depth greater than about 100 microns, while the pores may have a depth less than about 10 microns. In some cases, the pores are formed by chemical etching, abrasive blasting, laser or plasma etching, or the like. The material of the joining element may extend or flow into the pores during formation of the joining element and engage and/or interlock with the pores to secure the joining element to the housing member 1200. In some cases, the pores are formed after the recess 1210 is formed, such that the pores are present on the surface of the recess 1210. In other cases, the pores are formed prior to formation of the recess 1210, such that the surface of the recess 1210 lacks the pores, or has a different surface morphology and/or topography than the end surface on which the pores are formed (e.g., the end surface 1208 may have pores from a chemical etching, while the recess 1210 may have machine marks from a machining process). In some cases, the largest dimension (e.g., length, width, depth) of the pores is at least an order of magnitude smaller than the largest dimension (e.g., length, width, depth) of the recess 1210.

The housing member 1200 may define a flange portion 1207 that is adjacent to and/or extends along a peripheral side of a top module (which may include a cover member, a display, touch-sensing components, and the like). In some cases, the second interlock feature 1210 (e.g., the recess, as shown) is positioned in the flange portion 1207, thereby reinforcing the portion of the joint that is along the side of the top module. More particularly, the flange portion 1207 may define a cantilever that extends away from the first interlock feature 1202, and the second interlock feature 1210 may provide a supplemental interlocking engagement with a joining element to help prevent or limit separation or detachment of the flange portion 1207 from the joining element (e.g., the joining element 1212, FIG. 12B). The flange may extend along a direction (e.g., the vertical direction in FIG. 12A, which may be parallel to an exterior side surface defined by the housing member 1200 and/or perpendicular to the front surface defined by a cover member of the device), and the second interlock feature 1210 may be an elongate recess or channel with a longitudinal axis that extends parallel to the exterior side surface of the housing member (e.g., along the same direction that the flange extends from the first interlock feature 1202).

When a moldable material is flowed into place (e.g., between the housing member 1200 and another housing member) to form a joining element, the moldable material may flow into and at least partially fill the recess 1210, thereby forming a corresponding protrusion in the moldable material. When the moldable material is then cured or otherwise hardened, the protrusion of the joining element and the recess 1210 interlock with one another. The interlock between the recess 1210 and the protrusion may help prevent separation of the joining element and the housing member 1200. Further, the position of the recess 1210 relative to the exterior surface defined by the sidewall 1201 may help improve the structural rigidity of the joint and help maintain the alignment (and mechanical coupling) between the housing member 1200, the joining element, and the adjoining housing member in the event of a drop or other impact event. For example, while the first interlock feature 1202 may provide substantial structural strength to the interface between the joining element and the housing member 1200, its position is further inboard (e.g., relatively nearer the internal volume of a housing) than the recess 1210. By contrast, the further outboard position of the recess 1210 (e.g., relatively nearer the external surface of the housing member 1200) may improve the strength and stability of the alignment between the exterior surfaces of the housing members and the joining element.

FIG. 12B is a partial cross-sectional view of the housing member 1200 (joined to another housing member 1216 via a joining element 1212), viewed along line 12B-12B in FIG. 12A. The joining element 1212 may be positioned between and in contact with the end surface 1208 of the housing member 1200 and a corresponding end surface 1217 of the housing member 1216. The joining element 1212 may also extend into and interlock with the recess 1210 of the housing member 1200, as well as a recess 1214 defined by the housing member 1216. In addition to the mechanical interlocking between the joining element 1212 and the recesses 1210, 1214 (and/or other retention structures and/or interlock features), the moldable material of the joining element 1212 may form a chemical or other adhesive bond with the material of the housing members 1200, 1216.

The exterior surfaces of the joining element 1212 and the housing members 1200, 1216 may define a smooth continuous exterior surface 1213 of the housing. For example, any gaps, seams, or other discontinuities between the joining element 1212 and the housing members 1200, 1216 along the exterior surface 1213 of the housing may be undetectable to the touch and/or to the unaided eye. For example, a fingernail sliding along the exterior surface 1213 may not catch on the seam between the joining element 1212 and the housing members 1200, 1216. In some cases, any gap, seam, or other discontinuity between the joining element 1212 and the housing members 1200, 1216 may be less than about 200 microns, less than about 100 microns, less than about 50 microns, less than about 20 microns, or less than about 10 microns (in depth, length, offset, and/or other dimension). The interlock between the joining element 1212 and the recesses 1210, 1214 may help prevent or inhibit relative motion between the housing members 1200, 1216 and the joining element 1212, such as relative motion of these components along a vertical direction (as oriented in FIG. 12B). Accordingly, the recesses 1210, 1214 may help maintain the substantially seamless texture and appearance between the joining element 1212 and the housing members 1200, 1216.

Figure 12C:
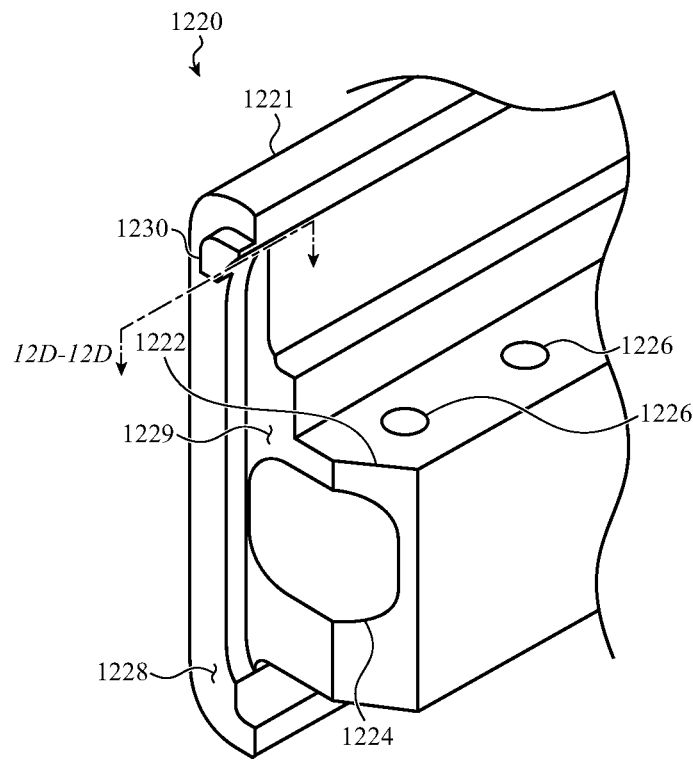
FIG. 12C depicts a partial view of a housing member for an electronic device.
Figure 12D:
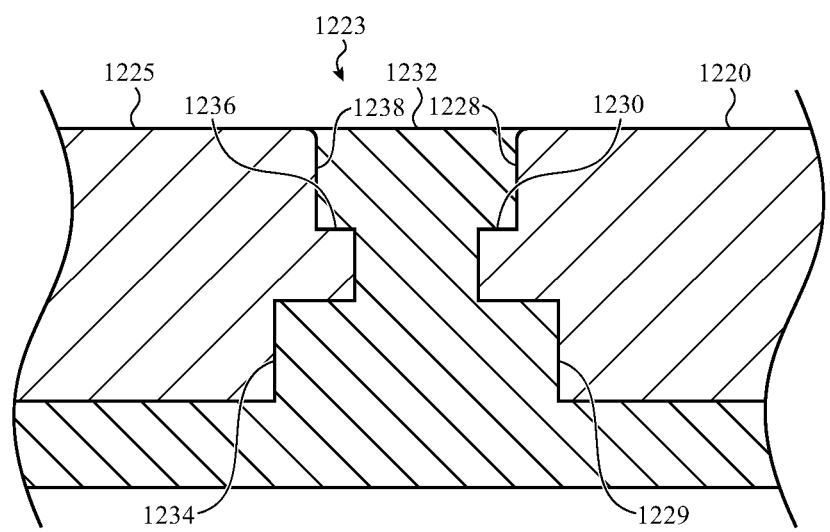
FIG. 12D depicts a partial cross-sectional view of a housing of an electronic device including the housing member of FIG. 12C.

FIG. 12C illustrates another example housing member 1220 that includes features with which a joining element may engage. The housing member 1220 may be formed from or include a conductive material, such as stainless steel, aluminum, a metal alloy or the like, and may be conductively coupled to an antenna circuit (e.g., via feed and/or ground lines, as described above) to act as a radiating structure for a device. The portion of the housing member 1220 shown in FIG. 12C may abut and/or engage with a joining element, as shown in FIG. 12D.

The housing member 1220 defines a first interlock feature 1222 that extends inwardly (e.g., towards an interior of the device) from a sidewall 1221 defined by the housing member 1220. The first interlock feature 1222 may extend from an interior side of the housing member 1220 (e.g., analogous to the interior side 1205, FIG. 12A), where the interior side is opposite an exterior side (e.g., analogous to the exterior side 1203, FIG. 12A).

The sidewall 1221 may define an exterior surface of the device of which the housing member 1220 is a part. The first interlock feature 1222 may define a first hole 1224 and one or more second holes 1226. When a joining element is formed by injecting or otherwise molding a moldable material against the housing member 1220, the moldable material may at least partially surround and/or encapsulate the first interlock feature 1222, and may flow into and optionally through the first and second holes 1224, 1226. By at least partially encapsulating the interlock feature 1222 and flowing into and/or through the first and second holes 1224, 1226, the joining elements may be structurally interlocked with the housing member 1220, thereby securely retaining the joining element to the housing member 1220.

The housing member 1220 may also define a protruding feature 1230, which may be a post, pin, or have any other suitable shape or configuration that protrudes or extends from an end surface 1228 of the housing member 1220. The end surface 1228 of the housing member 1220 may be the portion of the housing member 1220 that, with the exception of the protruding feature 1230, extends closest to another housing member to which the housing member 1220 is coupled via a joining element.

The protruding feature 1230 may operate in a similar manner as the recess 1210 in FIGS. 12A-12B. For example, when a moldable material is flowed into place (e.g., between the housing member 1220 and another housing member) to form a joining element, the moldable material may flow around the protruding feature 1230 to at least partially encapsulate the protruding feature 1230. When the moldable material is then cured or otherwise hardened, the protruding feature 1230 and the recess in the moldable material that is formed around the protruding feature 1230 interlock with one another. The interlock between the protruding feature 1230 and the moldable material may help prevent separation of the joining element and the housing member 1220. Further, the position of the protruding feature 1230 relative to the exterior surface defined by the sidewall 1221 may help improve the structural rigidity of the joint and help maintain the alignment (and mechanical coupling) between the housing member 1220, the joining element, and the adjoining housing member in the event of a drop or other impact event. For example, while the first interlock feature 1222 may provide substantial structural strength to the interface between the joining element and the housing member 1220, its position is further inboard (e.g., relatively nearer the internal volume of a housing) than the protruding feature 1230. By contrast, the further outboard position of the protruding feature 1230 (e.g., relatively nearer the external surface of the housing member 1220) may improve the strength and stability of the alignment between the exterior surfaces of the housing members and the joining element.

In some cases, the housing member 1220 may also define pores along the end surface 1228 and/or the end surface 1229. The pores may be formed on the end surfaces 1228 and/or 1229, and may also be formed on the surface of the protruding feature 1230. The pores may be a distinct structure than the protruding feature 1230. For example, the protruding feature 1230 protrudes by a distance greater than about 100 microns, and may have a length and width dimension greater than about 100 microns, while the pores may have depth, length and/or width dimensions less than about 10 microns. In some cases, the pores are formed by chemical etching, abrasive blasting, laser or plasma etching, or the like. The material of the joining element may extend or flow into the pores during formation of the joining element and engage and/or interlock with the pores to secure the joining element to the housing member 1220. In some cases, the pores are formed after the protruding feature 1230 is formed, such that the pores are present on the surfaces of the protruding feature 1230. In other cases, the surfaces of the protruding feature 1230 lack the pores, or have a different surface morphology and/or topography than the end surface on which the pores are formed. In some cases, the largest dimension (e.g., length, width, depth) of the pores is at least an order of magnitude smaller than the largest dimension (e.g., length, width, depth) of the protruding feature 1230.

FIG. 12D is a partial cross-sectional view of the housing member 1220 (joined to another housing member 1225 via a joining element 1232), viewed along line 12D-12D in FIG. 12C. The joining element 1232 may be positioned between and in contact with the housing members 1220, 1225. The joining element 1232 may also at least partially (and optionally fully) encapsulate the protruding feature 1230. As can be seen in FIG. 12D, the protruding feature 1230 may extend and/or be adjacent to two offset surfaces. For example, with respect to the housing member 1220, the two offset surfaces include the end surface 1228 and an additional end surface 1229. The protruding feature 1230 may extend a first distance from the end surface 1228, and a second (greater) distance from the additional end surface 1229. A similar structure may be used on the housing member 1225 (e.g., a protruding feature 1236 extending a first distance from an end surface 1238 and a second (greater) distance from an additional surface 1234). Thus, as shown in FIG. 12D, the end surfaces 1228, 1238 may be closer together than the additional end surfaces 1229, 1234 (and the ends of the protruding features 1230, 1236 may be the portions of the housing members 1220, 1225 that are closest together). In addition to the mechanical interlocking between the joining element 1232 and the protruding features 1230, 1236 (and any other retention structures and/or interlock features), the moldable material of the joining element 1232 may form a chemical or other adhesive bond with the material of the housing members 1220, 1225.

The exterior surfaces of the joining element 1232 and the housing members 1220, 1225 may define a smooth continuous exterior surface 1223 of the housing. For example, any gaps, seams, or other discontinuities between the joining element 1232 and the housing members 1220, 1225 along the exterior surface 1223 of the housing may be undetectable to the touch and/or to the unaided eye. For example, a fingernail sliding along the exterior surface 1223 may not catch on the seam between the joining element 1232 and the housing members 1220, 1225. In some cases, any gap, seam, or other discontinuity between the joining element 1232 and the housing members 1220, 1225 may be less than about 200 microns, less than about 100 microns, less than about 50 microns, less than about 20 microns, or less than about 10 microns (in depth, length, offset, and/or other dimension). The interlock between the joining element 1232 and the housing members 1220, 1225 may help prevent or inhibit relative motion between the housing members 1220, 1225 and the joining element 1232, such as relative motion of these components along a vertical direction (as oriented in FIG. 12D). Accordingly, the protruding features 1230, 1236 may help maintain the substantially seamless texture and appearance between the joining element 1232 and the housing members 1220, 1225.

Figure 12E:
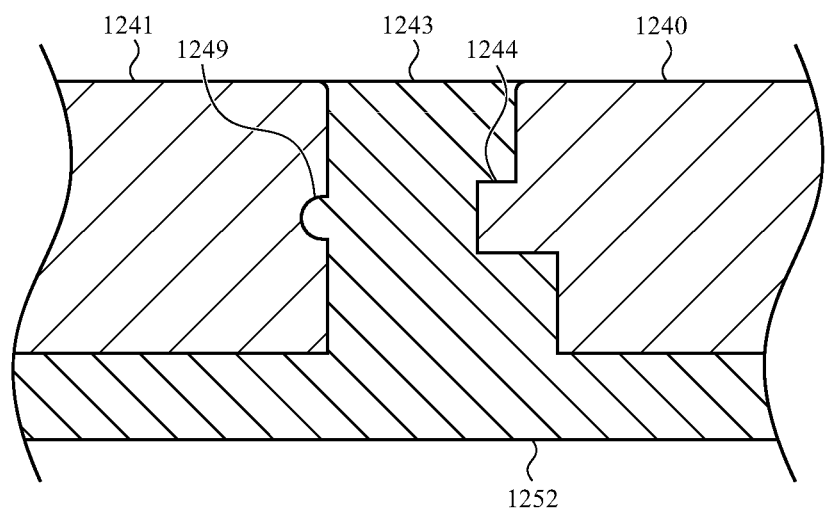
FIG. 12E depicts a partial cross-sectional view of a housing of an electronic device including the housing members of FIG. 12A and FIG. 12C.

In some cases, different types of structures may be used to reinforce or otherwise increase the strength and/or structural integrity of the coupling between housing members and joining elements. FIG. 12E, for example, illustrates an example cross-sectional view of a housing that includes a joining element 1243 and a first housing member 1240 that defines a protruding feature 1244 (as shown in FIGS. 12C-12D) and a second housing member 1241 that defines a recess 1249 (as shown in FIGS. 12A-12B). Using a protruding feature 1244 and a recess 1249 may help increase the average or overall distance between the nearest portions of the first and second housing members 1240, 1241. In particular, because one or both of the housing members 1240, 1241 may be used as a radiating component of an antenna system, it may be desirable to increase the distance between them to reduce capacitive coupling or other electromagnetic effects due to proximity of the two conductive components. By positioning a recess opposite a protrusion, the structural benefits of the protrusion (and the recess) may be achieved while also providing a greater distance between the closest surfaces of the housing members 1240, 1241 (as compared to a configuration with two protruding features, for example).

Figure 12F:
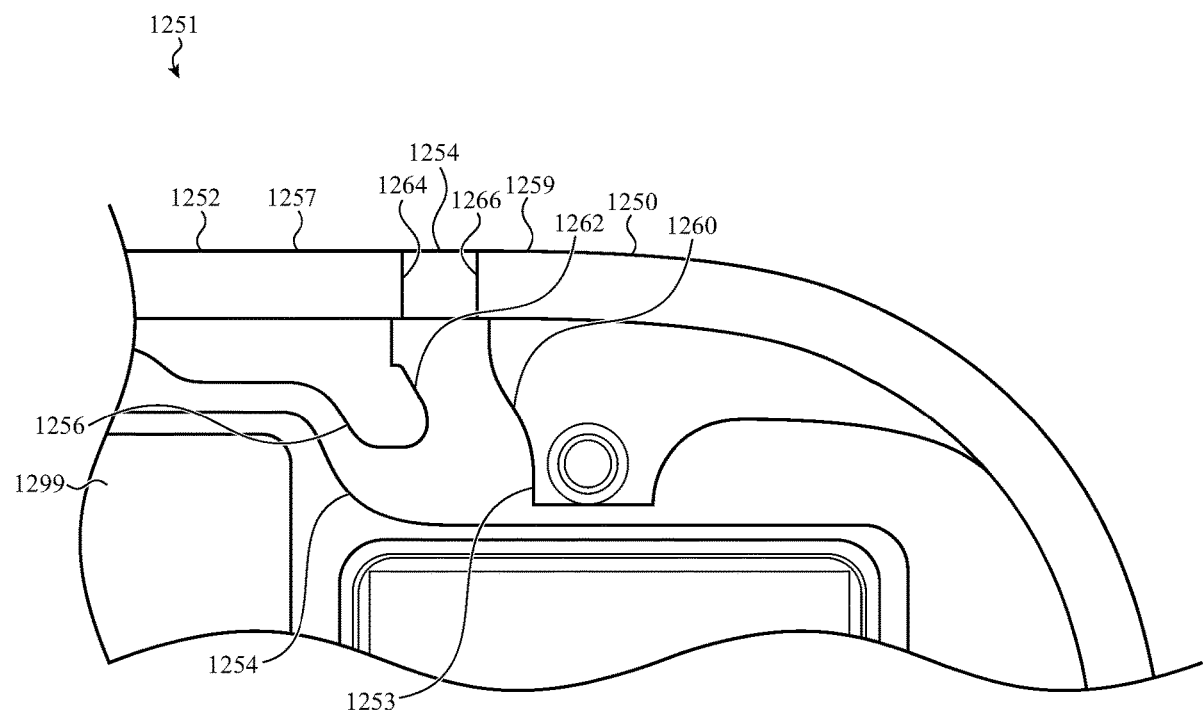
FIG. 12F depicts a partial view of an electronic device showing a coupling structure for housing members.

FIG. 12F depicts a portion of an example device 1251, showing another example configuration of housing components and a joining element that may be used to structurally couple the housing components. For example, a first housing member 1250 may be coupled to a second housing member 1252 via a joining element 1254. Like other joining elements described herein, the joining element 1254 may be formed by injecting or otherwise introducing a moldable material (e.g., a polymer material) into a gap between the first and second housing members 1250, 1252. The first housing member 1250 may define a first interlock feature 1253 that extends inwardly (e.g., towards an interior of the device) from a sidewall 1259 of the first housing member 1250, and the second housing member 1252 may define a second interlock feature 1256 that extends inwardly (e.g., towards an interior of the device) from a sidewall 1257 of the second housing member 1252. The first and second interlock features 1253, 1256 may be at least partially encapsulated by the joining element 1254. For example, when a moldable material is injected or otherwise introduced into a gap between the first and second housing members 1250, 1252, the moldable material may at least partially encapsulate the first and second interlock features 1253, 1256 (including flowing into any recesses or holes, and flowing around any protrusions defined by or on the first and second interlock features 1253, 1256). In some cases, the moldable material (e.g., which forms the joining element 1254) may cover the top surfaces of the first and second interlock features 1253, 1256, such that the moldable material extends up to the interior surface of the sidewalls 1257, 1259.

After the moldable material is cured or otherwise hardened to form the joining element, the joining element is physically interlocked to the first and second interlock features 1253, 1256, thereby securing the first and second housing members 1250, 1252 together.

As shown in FIG. 12F, the first housing member 1250 defines a first end surface 1266 and the second housing member 1252 defines a second end surface 1264. The first and second end surfaces 1266, 1264 may be substantially parallel to one another, and may be substantially perpendicular to the exterior surfaces of the sidewalls 1257, 1259. The first interlock feature 1253, which extends inwardly from the sidewall 1259 (e.g., generally towards an interior of the device), may define a first angled surface 1260. The angled surface 1260 may be angled generally away from the gap between the first and second housing members 1250, 1252. The second interlock feature 1256 may define a second angled surface 1262, which may extend generally towards the gap between the first and second housing members 1250, 1252. Thus, the first and second angled surfaces 1260, 1262 may be nonparallel to the first and second end surfaces 1266, 1264. Further, the first and second angled surfaces 1260, 1262 may be contiguous with the first and second end surfaces 1266, 1264. The first and second end surfaces 1266, 1264 and the angled surfaces 1260, 1262 may define a channel between the first and second housing members 1250, 1252, and the joining element 1254 may at least partially (and optionally completely) fill the channel defined by the first and second end surfaces 1266, 1264 and the angled surfaces 1260, 1262.

The angled configurations of the first and second interlock features 1253, 1256 reposition structural components within the device to make room for other components. For example, by having the second interlock feature 1256 angle to the right (as shown in FIG. 12F), additional space may be provided on the left side of the second interlock feature 1256 for another component 1299 (e.g., a logic board, a processor, or the like). The other component 1299 may therefore be positioned closer to the sidewall 1257 (and further to the right) than would be possible if the second interlock feature 1256 extended perpendicularly from the housing member 1252.

The first and second angled surfaces 1260, 1262 may also improve the strength, stiffness, or other structural property of the interlock between the first and second housing members 1250, 1252 by providing a more complex geometry with which the joining element ultimately engages and interlocks. Further, because the first and second angled surfaces 1260, 1262 extend at a similar (or identical) angle (relative to the end surfaces 1266, 1264, for example), a greater distance may be maintained between the first and second housing members 1250, 1252 (as compared to angled surfaces that angled towards one another, or that had a greater difference in angle relative to the end surfaces). Stated another way, the substantially parallel angled surfaces 1260, 1262 may improve the strength and/or stability of the housing structure without reducing the minimum distance between the housing members. Because having the housing elements closer together may increase capacitive coupling between the housing members, and thus could negatively impact antenna performance, larger distances between the housing components may be advantageous. The angled surfaces of the interlock features therefore may achieve improved strength while maintaining adequate antenna performance.

Figure 12G:
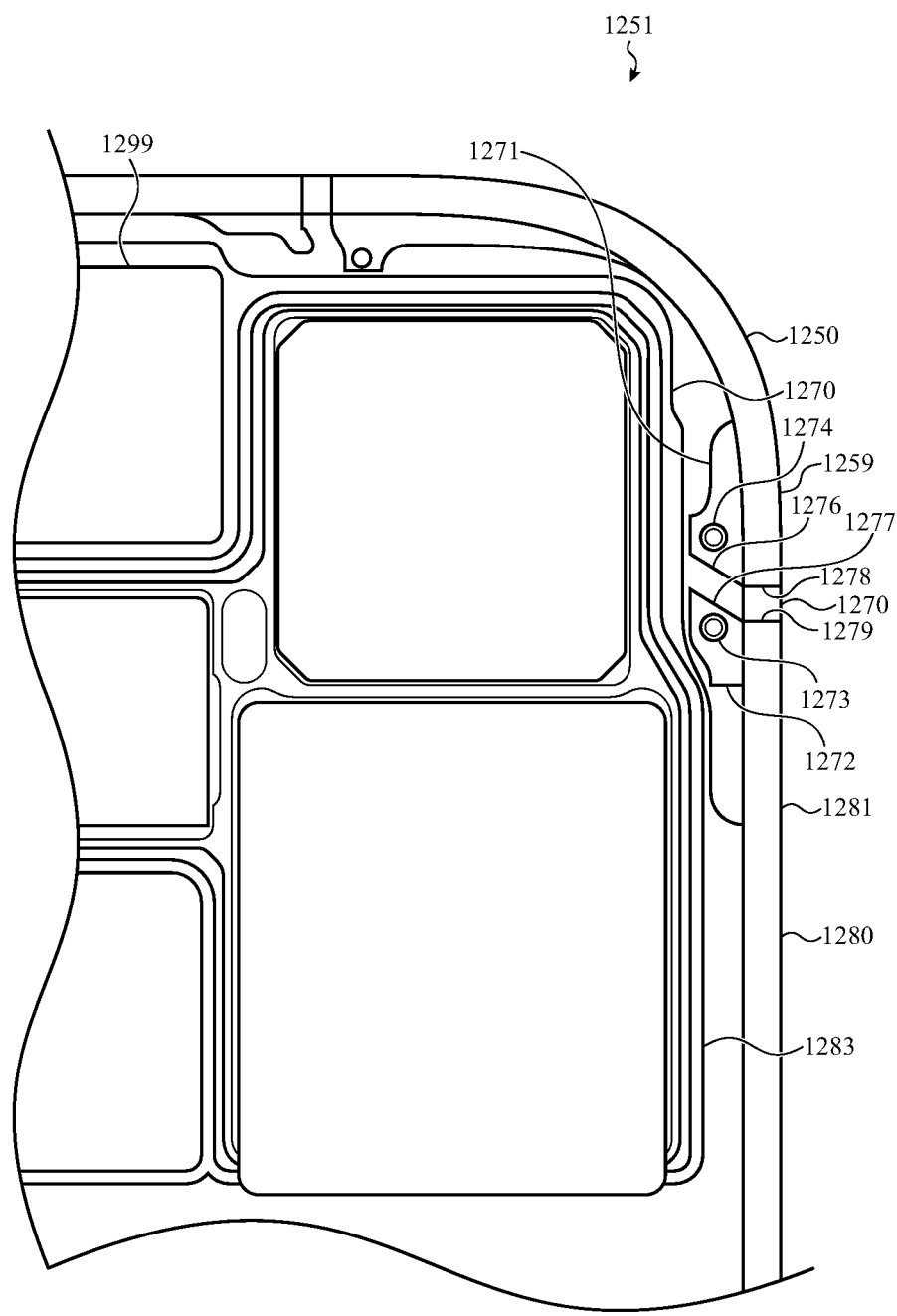
FIG. 12G depicts a partial view of an electronic device showing another coupling structure for housing members.

FIG. 12G depicts another portion of the example device 1251, showing another example configuration of housing components and a joining element that may be used to structurally couple the housing components. For example, the first housing member 1250 may be coupled to a third housing member 1280 via a joining element 1270. Like other joining elements described herein, the joining element 1270 may be formed by injecting or otherwise introducing a moldable material (e.g., a polymer material) into a gap between the first and third housing members 1250, 1280. The first housing member 1250 may define a first interlock feature 1271 that extends inwardly (e.g., towards an interior of the device) from a sidewall 1259 of the first housing member 1250, and the third housing member 1280 may define a second interlock feature 1272 that extends inwardly (e.g., towards an interior of the device) from a sidewall 1281 of the third housing member 1280. The first and second interlock features 1271, 1272 may be at least partially encapsulated by the joining element 1270. For example, when a moldable material is injected or otherwise introduced into a gap between the first and third housing members 1250, 1280, the moldable material may at least partially encapsulate the first and second interlock features 1271, 1272 (including flowing into any recesses or holes, and flowing around any protrusions defined by or on the first and second interlock features 1271, 1272). In some cases, the moldable material (e.g., which forms the joining element 1270) may cover the top surfaces of the first and second interlock features 1271, 1272, such that the moldable material extends up to the interior surface of the sidewalls 1259, 1281.

Similar to the configuration shown in FIG. 12F, the first housing member 1250 may define a first end surface 1278 and the third housing member 1280 may define a second end surface 1279, with the end surfaces defining a gap between the first and third housing members. The first and second end surfaces 1278, 1279 may be substantially parallel to one another, and may be substantially perpendicular to the exterior surfaces of the sidewalls 1259, 1281. The first interlock feature 1271, which extends inwardly from the sidewall 1259 (e.g., generally towards an interior of the device), may define a first angled surface 1276. The angled surface 1276 may be angled generally away from the gap between the first and third housing members 1250, 1280. The second interlock feature 1272 may define a second angled surface 1277, which may extend generally towards the gap between the first and third housing members 1250, 1280. Thus, the first and second angled surfaces 1276, 1277 may be nonparallel to the first and second end surfaces 1278, 1279. Further, the first and second angled surfaces 1276, 1277 may be contiguous with the first and second end surfaces 1278, 1279. The first and second end surfaces 1278, 1279 and the angled surfaces 1276, 1277 may define a channel between the first and third housing members 1250, 1280, and the joining element 1270 may at least partially (and optionally completely) fill the channel defined by the first and second end surfaces 1278, 1279 and the angled surfaces 1276, 1277.

The first and second interlock features 1271, 1272 may also include lugs 1273, 1274, which may remain exposed or otherwise accessible through the joining element 1270 even after the interlock features are at least partially encapsulated by the joining element 1270. Electrical components, such as an antenna circuitry, may be conductively coupled to the housing members 1250, 1280 (which may be conductive), such that the housing members 1250, 1280 can operate as radiating members of an antenna system.

The angled configurations of the first and second interlock features 1271, 1272 reposition structural components within the device to make room for other components. For example, by having the second interlock feature 1272 angle upwards (as shown in FIG. 12G), additional space may be provided below the second interlock feature 1272 for another component (e.g., a camera module). For example, FIG. 12G shows an example frame member 1283, to which camera modules may be attached. The upward angle of the second interlock feature 1272 provides space where a shoulder region of the frame member 1283 may be positioned. If the second interlock feature 1272 were to extend horizontally into the interior of the device (relative to the orientation shown in FIG. 12G), the frame member 1283 would have to be positioned lower in the device, which may lead to wasted space. Thus, by configuring the first and second interlock features 1271, 1272 with angled surfaces (and, more generally, protruding at a non-perpendicular angle from the sidewalls), other components may be able to be positioned in desired locations, and there may be more flexibility in where other components can be located within the housing.

Figure 12H:
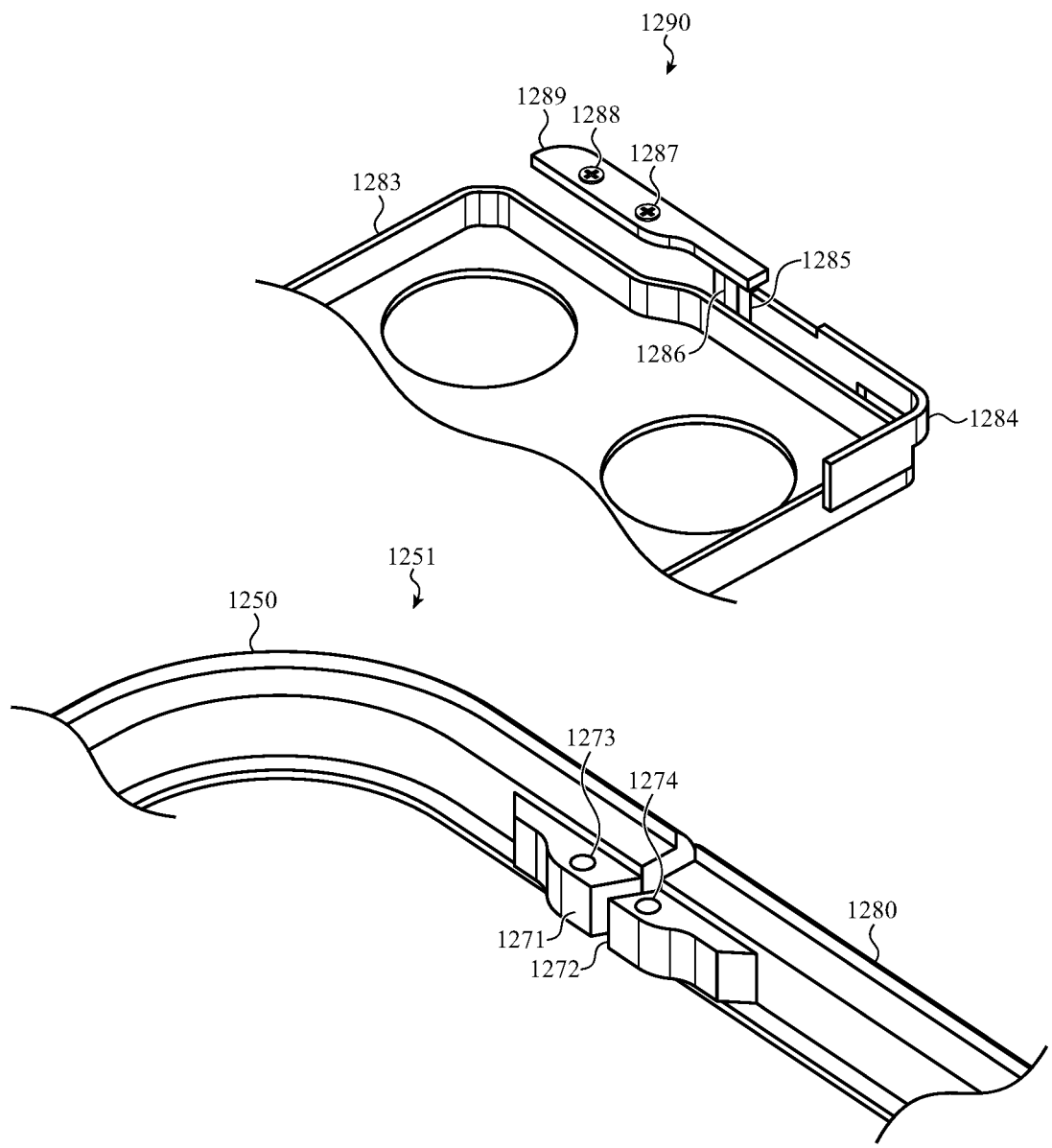
FIG. 12H depicts a partial view of an electronic device showing another coupling structure for housing members.

As noted above, interlock features, such as the first and second interlock features 1271, 1272, may be used to facilitate a conductive coupling between conductive housing members and antenna circuitry. For example, as described with respect to FIG. 12G, antenna circuitry may be conductively coupled to the housing members 1250, 1280 via lugs 1273, 1274 (which may be or may include threaded holes). FIG. 12H illustrates a portion of the device 1251, illustrating how antenna circuitry may be conductively coupled to the lugs 1273, 1274, and in particular, how a flexible circuit element may be conductively coupled to the lugs 1273, 1274 despite the complex geometries and small available space in the corner of the device. FIG. 12H illustrates the housing of the device 1251 without the joining element in place.

As shown in FIG. 12H, an antenna connection assembly 1290 may be used to conductively couple the housing members 1250, 1280 to antenna circuitry. The antenna connection assembly 1290 may include a flexible circuit element 1284, and a connector assembly 1289. The connector assembly 1289 may include conductors 1286, 1285 which are at least partially encapsulated in a polymer frame. For example, the conductors 1286, 1285 may be insert molded with the polymer material of the frame to form the connector assembly 1289. The connector assembly 1289 may be structurally and conductively coupled to the first and second interlock features 1271, 1272 via conductive fasteners 1287, 1288 (e.g., screws, bolts, threaded fasteners, posts, rivets, welds, solders, etc.). The conductive fasteners 1287, 1288 may be conductively coupled to the conductors 1286, 1285, which in turn are conductively coupled (e.g., soldered) to conductive traces of the flexible circuit element 1284. The conductive traces of the flexible circuit element 1284 may also be conductively coupled to antenna circuitry of the device. Accordingly, a conductive path may be defined from the interlock features 1271, 1272, through the conductors 1286, 1285 in the connector assembly 1289, and through the flexible circuit element 1284, to the antenna circuitry elsewhere in the device. The connector assembly 1289 may be configured so that a conductive coupling to the lugs 1273, 1274, which are on top of the interlock features and are in a plane that is generally perpendicular to the sidewall of the device, can be made to the flexible circuit, which is generally flat and in a plane that is parallel to the sidewall of the device (and slotted into a narrow gap between the frame member 1283 and the housing member 1280). Without the connector assembly, interconnecting the flexible circuit element to the lugs may require bending the flexible circuit into a different plane, which may stress the flexible circuit and potentially damage it. Further, there may not be room in the device for the bend radiuses necessary to facilitate a bent or curved flexible circuit element. Accordingly, the connector assembly 1289 may facilitate the connection between components that lie in or along perpendicular planes (or otherwise face different directions).

Figure 13A:
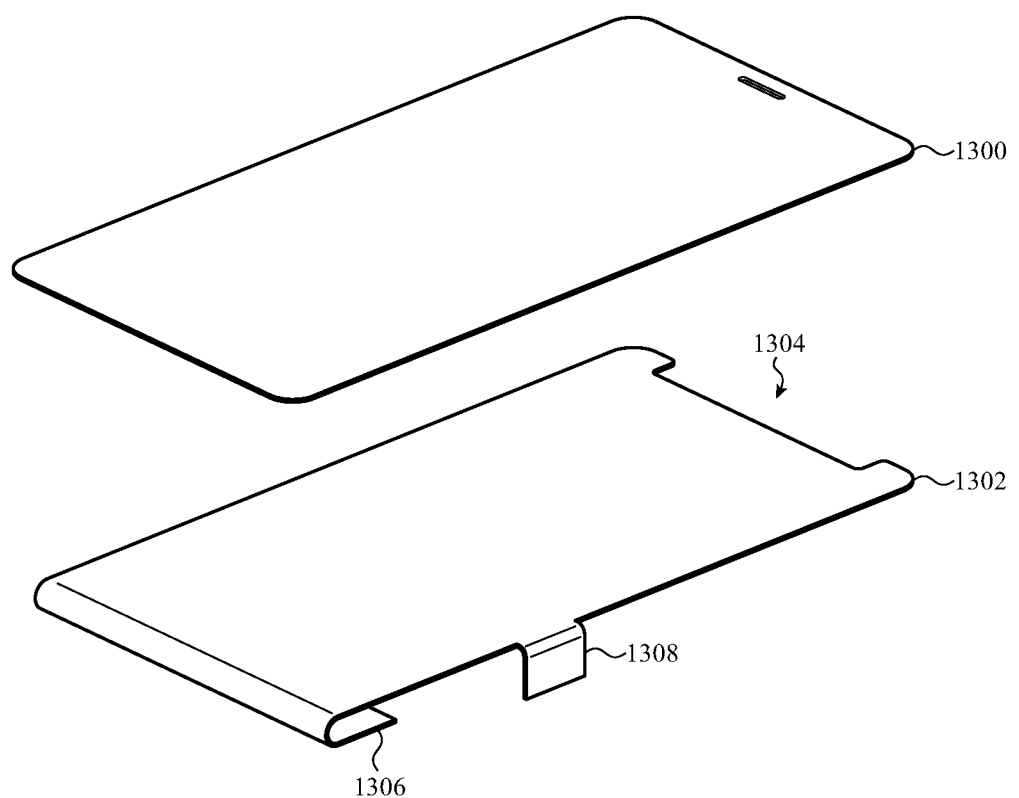
FIG. 13A depicts an exploded view of an example cover and display stack of an electronic device.
Figure 13B:
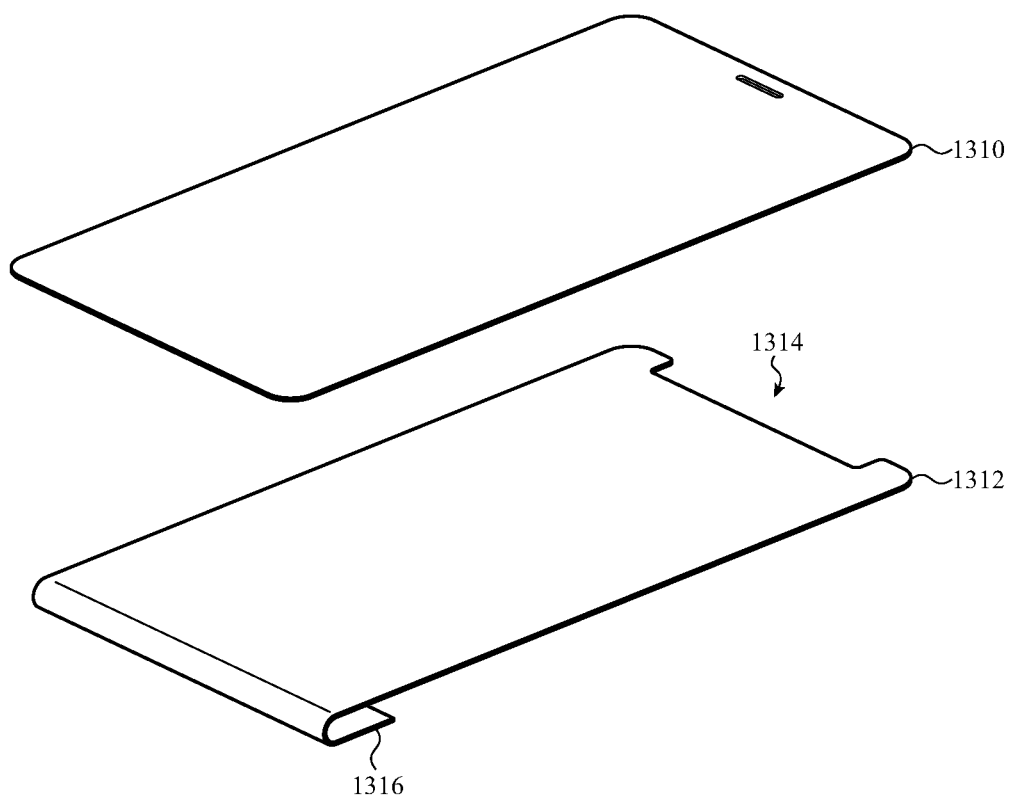
FIG. 13B depicts an exploded view of another example cover and display stack of an electronic device.
Figure 13C:
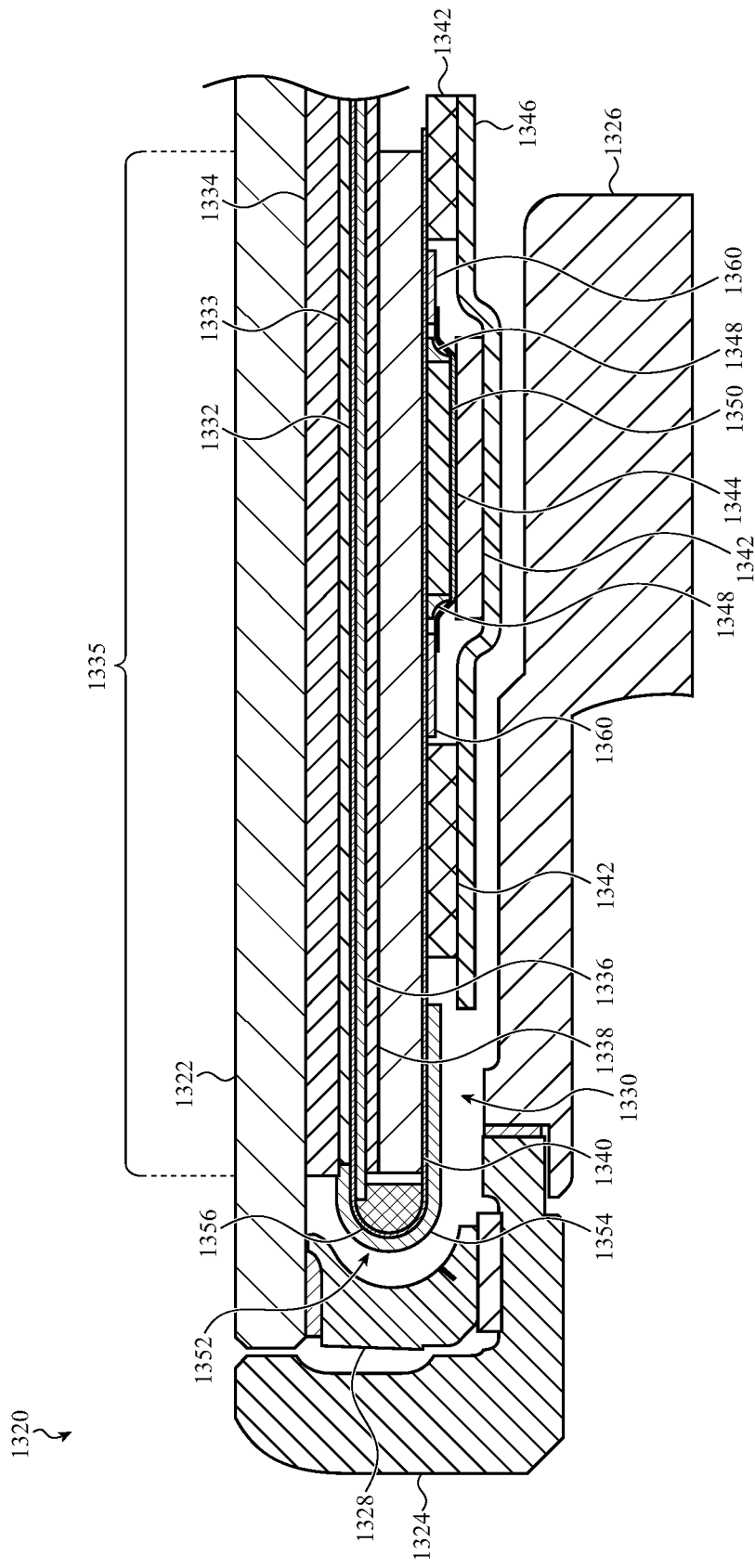
FIG. 13C depicts a partial cross-sectional view of an electronic device.

The devices described herein include touch-sensitive displays, also referred to as touchscreen displays. In such cases, display components and touch sensor components may be layered or otherwise integrated to form an assembly that may be positioned below a transparent cover. In order to facilitate the display and touch-sensing functionality, electrical signals must be passed to and from the display and touch-sensing layers to other components such as processors and other circuitry (which may not be suitably sized and/or shaped to fit into the layered structure of the display stack). Accordingly, flexible circuit elements with flexible conductive traces or other conductors may be used to interconnect the layers of the display stack with processors and other circuitry. FIGS. 13A and 13B illustrate example configurations of flexible circuit elements for interconnecting to layers in the display stack. FIG. 13C illustrates an example integration of a display stack (which may include touch-sensor components) in a device.

FIG. 13A, for example, illustrates a cover 1300 (which may be an embodiment of the cover 102, 202, 302, 402, 502, or any other cover described herein) and a display stack 1302. The display stack 1302 may include display layers (e.g., LED layers, OLED layers, electrode layers, polarizers, etc.) and touch sensor layers (e.g., capacitive electrode layers, spacer layers, etc.). The display stack 1302 may define a recessed region 1304, which may define an area where input/output devices are positioned so that they are not covered or otherwise interfered with by the display stack 1302.

Because the display stack 1302 includes display layers and touch sensor layers that need to be interconnected with other circuitry, each set of layers includes a flexible circuit element that extends from a side of the display stack 1302. In particular, the display layers may include or be coupled to a flexible circuit element 1306 that extends from a first side of the display stack 1302 (e.g., a short side), and the touch sensor layers may include a flexible circuit element 1308 that extends from a second side of the display stack 1302 (e.g., a long side). By having the two flexible circuit elements 1306, 1308 extend from different sides of the display stack 1302, the overall size of the display stack 1302 may be reduced relative to having them extend from the same side. For example, if both flexible circuit elements extended from the same side (e.g., the short side), one may have to loop over the other, thus extending the size of the display stack 1302 along that side. Further, the flexible circuit elements may require physical distance from each other, requiring the outer loop to be set apart from the inner loop by an air gap or other space, which may further increase the size of the display stack 1302 along that side.

Whereas the display stack 1302 included touch sensor layers on a different substrate than the display layers (e.g., thereby requiring different flexible circuit elements in order to conductively couple to the different layers), the display stack 1312 of FIG. 13B may have an integrated (on-cell) touch-sensing system. For example, an array of electrodes that are integrated into an OLED display may be time and/or frequency multiplexed in order to provide both display and touch-sensing functionality. The electrodes may be configured to detect a location of a touch, a gesture input, multi-touch input, or other types of touch input along the external surface of the cover 1310. Accordingly, instead of providing separate flexible circuit elements extending from different sides of the display stack, the display stack 1312 may include a shared flexible circuit element 1316, which includes conductive traces for both display and touch-sensing functions (in some cases, some or all of the conductive traces may be used for both display and touch-sensing functions).

FIG. 13C illustrates a partial cross-sectional view of a device 1320. The device 1320 may include a housing member 1324, a rear cover 1326, and a cover 1322 coupled to a frame member 1328. The device 1320, housing member 1324, cover 1322, rear cover 1326, and frame member 1328 may be embodiments of or otherwise correspond to other instances of those devices and components described herein. Details of those devices and/or components may be equally applicable to those shown in FIG. 13C, and will not be repeated here for brevity.

The device 1320 includes a display stack 1330 coupled to the cover 1322 via an adhesive stack 1334. The display stack 1330 may be attached to the cover 1322 prior to the cover 1322 being attached to the frame member 1328. In some cases, the frame member 1328 may be bent or otherwise deflected during the assembly process so that a loop area 1352 of the display stack 1330 can pass the frame member 1328 (e.g., a flange portion such as the flange portion 629, FIG. 6A) without contacting the frame member 1328. The frame member 1328 may be manually deflected by a tool, and allowed to return to an undeflected state after the cover 1322 is secured to the frame member 1328 via an adhesive, as described herein. The frame member 1328 may be configured so that the deflection of the frame member 1328 during assembly is less than the elastic limit of the frame member 1328. The frame member 1328 may be metal (e.g., stainless steel, aluminum, or another suitable metal). The frame member 1328 may be a continuous, generally rectangular loop of metal that extends around the periphery of the display stack 1330. In some cases, the continuous loop includes polymer members or sections that structurally couple to one or more metal members. For example, a frame member 1328 may include a metal member that defines a first portion of the substantially rectangular loop (e.g., at least a portion of each of three sides of the rectangle), and a polymer member that is structurally coupled to the ends of the metal member and defines the remaining portion of the substantially rectangular loop.

The display stack 1330 may include a display element 1333 for producing graphical outputs. In some cases, the display element 1333 may include components of an OLED display. For example, the display element 1333 may include a cathode layer, an electron transport layer, a blocking layer, an emissive layer, a hole transport layer, a hole injection layer, an anode, and a substrate. The display element 1333 may also include filters, polarizers, thin film transistors, or the like. The display element 1333 may be coupled to a flexible circuit element 1332 or other suitable substrate. While an OLED display is described, the display element may be any suitable type of display, such as an LCD display, an active layer organic light emitting diode (AMOLED) display, an organic electroluminescent (EL) display, an electrophoretic ink display, or the like.

The adhesive stack 1334 may be or may include an optically clear adhesive that adheres the display stack 1330 (or a component thereof) to the cover 1322. The adhesive stack 1334 may be a single, substantially homogenous layer of adhesive, or it may include multiple layers and/or materials. For example, the adhesive stack 1334 may include a light-transmissive polymer layer positioned between two adhesive layers (e.g., a top adhesive layer adhering to the cover 1322 and a bottom adhesive layer adhering to the display stack 1330). In some cases, a multi-layer adhesive stack 1334 (e.g., with two adhesive layers on opposite sides of a polymer layer) may have an increased stiffness as compared to a single-layer adhesive stack of the same size. As such, a multi-layer adhesive stack 1334 may be made thinner than a single-layer adhesive stack while maintaining the same or similar stiffness as the single-layer adhesive stack.

The image quality of a display may be affected by the flatness of the display stack and/or the layers of a display element. For example, warped display layers may produce wavy patterns or other visible effects, which may reduce the functionality of the display (e.g., making it unable to effectively produce images or other graphical outputs). In order to provide a dimensionally stable structure and to help maintain flatness of display components, the display stack 1330 may include stiffening structures in the display stack. For example, the display stack 1330 may include a first stiffening structure 1336 which may include a metal layer (also referred to as a metal plate). The metal layer may support the display element 1333 and/or the flexible circuit element 1332 and impart structural support, rigidity, and flatness to the display element 1333 and/or the flexible circuit element 1332. The first stiffening structure 1336 may have the same or substantially the same front-facing area as the display element 1333 (e.g., the first stiffening structure 1336 may have a front-facing area that is greater than 90% of the front-facing area of the display element 1333). The first stiffening structure 1336 may also include one or more additional layers, such as one or more foam layers, one or more adhesive layers, and/or one or more polymer layers.

The display stack 1330 may also include a second stiffening structure 1340, which may include a metal layer (also referred to as a metal plate). The metal layer of the second stiffening structure 1340 may support the display element 1333 and/or the flexible circuit element 1332 and impart structural support, rigidity, and flatness to the display element 1333 and/or the flexible circuit element 1332. The second stiffening structure 1340 may have a smaller frontal area than the first stiffening structure 1336. For example, the second stiffening structure 1340 may be positioned only (or substantially only) in the area where the flexible circuit element 1332 is doubled over (e.g., overlapping area 1335).

Both the overlapping area 1335 and the second stiffening structure 1340 may have a front-facing area that is less than 50% of the front-facing area of the display element 1333, and optionally less than 30% of the front-facing area of the display element 1333.

The display stack 1330 may include a compliant structure 1338 between the first and second stiffening structures 1336, 1340. The compliant structure 1338 may be or may include a layer of foam, one or more adhesives, or the like. The compliant structure 1338 may be configured to absorb energy due to impacts, drop events, or the like, thereby reducing the likelihood of damage to components of the display stack 1330.

The display stack 1330 may also include a third stiffening structure 1360. The third stiffening structure may be positioned on the same side of the flexible circuit element 1332 as a processor 1350, which may be a display integrated circuit that interfaces with another processor of the device 1320 and controls the display stack 1330 so as to produce graphical outputs via the display stack 1330. The processor 1350 may also receive and/or process signals from touch-sensing components integrated with the display stack 1330 (such as electrodes that facilitate capacitive-based touch-sensing functions). In some cases, the processor 1350 may be a different type of circuit element, such as a memory module. The third stiffening structure 1360 may be or may include a metal layer (also referred to as a metal plate). The third stiffening structure 1360 may reinforce the area of the flexible circuit element 1332 around the processor 1350, where small and potentially fragile electrical interconnects may be positioned. The third stiffening structure 1360 may help inhibit bending or other deformations in the area near the electrical interconnects and may therefore help prevent damage and improve reliability of the device.

The first, second, and third stiffening structures 1336, 1340, and 1360 are described as including metal layers. The metal layers may be formed from stainless steel, aluminum, or the like. The metal layers may have a thickness of about 120 microns, about 100 microns, about 70 microns, or any other suitable dimension. In some cases the metal layers may have a thickness of between about 120 microns and about 60 microns, or between about 65 microns and about 95 microns. In some cases, the stiffening members may be formed from or include polymers, composites (e.g., carbon fiber), or other suitable materials.

The display stack 1330 may also include a shroud 1346 that covers the processor 1350. The shroud 1346 may be or may be formed from or include metal or another suitable material (e.g., a polymer material, a composite material, etc.). The shroud 1346 may protect (and optionally shield) the processor 1350 from contacting other components inside the device 1320 in the event of a drop, impact, or other type of event that may cause the components of the device 1320 to shift, deflect, bend, or otherwise move relative to one another. Compliant members 1342 may be positioned between the shroud 1346 and the flexible circuit element 1332 and the processor 1350 and may be configured to absorb energy resulting from the device 1320 being dropped or otherwise subjected to an impact or other high-energy event. The compliant members 1342 may be attached to the shroud 1346 and the flexible circuit element 1332 and the processor 1350 via adhesives.

A potting material 1348 may be applied to the flexible circuit element 1332 and the processor 1350 along the periphery of the processor 1350. The potting material 1348 may be an epoxy, adhesive, or another suitable material that may be applied to the flexible circuit element 1332 and the processor 1350 in a flowable state and then allowed to at least partially cure or harden. When cured, the potting material 1348 may contact and be bonded to both the flexible circuit element 1332 and at least a portion of a side (and optionally at least a portion of each of the peripheral sides) of the processor 1350. In some cases, the potting material 1348 surrounds the outer periphery of the processor 1350

The potting material 1348 may help prevent the electrical interconnections (e.g., solder joints, wires, traces, or the like) between the flexible circuit element 1332 and the processor 1350 from breaking or becoming damaged during drops, impacts, or other potentially damaging events. The potting material 1348 may also locally increase the stiffness of the flexible circuit element 1332, further helping to inhibit damage to the processor 1350 and/or the electrical interconnects. A cover 1344 (e.g., a metal foil, a polymer sheet, etc.) may at least partially cover the processor 1350 and the potting material 1348 and may provide an additional layer of protection to the processor 1350.

As described above, a display element may include various electrically active layers and components that need to be electrically interconnected to other electrical components, processors, circuit elements, and the like. Because such layers (e.g., anode and cathode layers of an OLED display) may be sandwiched between other layers, the flexible circuit element 1332 (e.g., a flexible circuit board) may wrap around a side of the display stack 1330 at bend or loop area 1352 to electrically couple electrically active layers of the display element (e.g., TFT layers, electrode layers, etc.) and/or touch-sensing layers (such as one or more electrode layers that facilitate capacitive touch sensing, and which may be integrated with the display element 1333) to a processor 1350 of the display stack 1330. More particularly, the flexible circuit element 1332 may include conductive traces that interconnect electrical components of the display layers (e.g., cathode and anode layers, electrode layers of touch and/or force sensors, on-cell touch-sensing layers, etc.) to other electrical traces, connectors, processors, or other electrical components that are mounted on the flexible circuit element 1332.

In some cases, a potting material 1356 (e.g., an epoxy, foam, or other material or component) may be provided in the inside of the loop area 1352 to help provide structure to the flexible circuit element 1332 at the loop area 1352 and to help prevent deformation of the flexible circuit element 1332 due to drops, impacts, or the like. For example, if the device 1320 is dropped on the housing member 1324, the housing member 1324 could force the frame member 1328 against the loop area 1352 of the flexible circuit element 1332. The potting material 1356 may help prevent such impacts from breaking, pinching, bending, deforming, or otherwise damaging the flexible circuit element 1332 at the loop area 1352.

The display stack 1330 may also include a strain reduction layer 1354, which may be applied to the flexible circuit element 1332 along the outside of the loop area 1352. The strain reduction layer 1354 may be an epoxy, adhesive, polymer, or other suitable material. The strain reduction layer 1354 may increase the stiffness of the flexible circuit element 1332 along the loop area 1352 and may maintain or form the flexible circuit element 1332 into a desired bend radius (e.g., a maximum possible bend radius given the length of the loop area 1352 and the geometry of the display stack 1330). The strain reduction layer 1354 may also help provide structure to the flexible circuit element 1332 at the loop area 1352 and help prevent deformation of the flexible circuit element 1332 due to drops, impacts, or the like.

The potting material 1356 may be applied to the display stack 1330 after the flexible circuit element 1332 is folded over to form the loop area 1352. For example, a flowable material, such as a curable epoxy, may be injected into the loop area 1352 after the circuit element 1332 is folded over and the second stiffening structure 1340 is attached to the first stiffening structure 1336 (e.g., via a compliant structure and one or more adhesive layers). The flowable material may at least partially harden to provide the structural reinforcement described above.

Figure 13D:
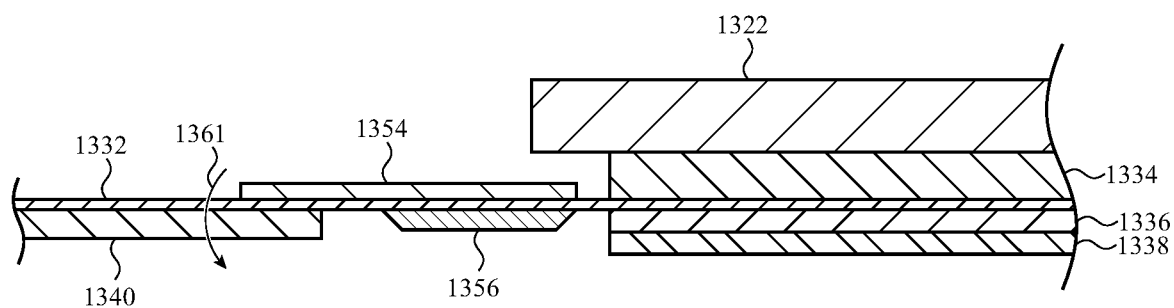
FIG. 13D depicts a partial cross-sectional view of a portion of the electronic device of FIG. 13C.

In some cases, the potting material 1356 may be applied to the display stack 1330 prior to folding the flexible circuit element 1332. FIG. 13D illustrates a portion of the device 1320 with the flexible circuit element 1332 in an unfolded configuration and with the potting material 1356 positioned on the flexible circuit element 1332 in a location that will define the loop area 1352 once the flexible circuit element 1332 is folded over into the configuration shown in FIG. 13C. The potting material 1356 may be applied in a flowable state and the flexible circuit element 1332 may be folded over (e.g., along an axis) to define the loop area 1352 (e.g., as illustrated by arrow 1361) while the potting material 1356 is still in an at least partially flowable state. The potting material 1356 may then at least partially harden after the loop area 1352 is formed. As shown in FIG. 13D, the strain reduction layer 1354 may be positioned on the flexible circuit element 1332 prior to the flexible circuit element 1332 being folded to form the loop area 1352.

Figure 14A:
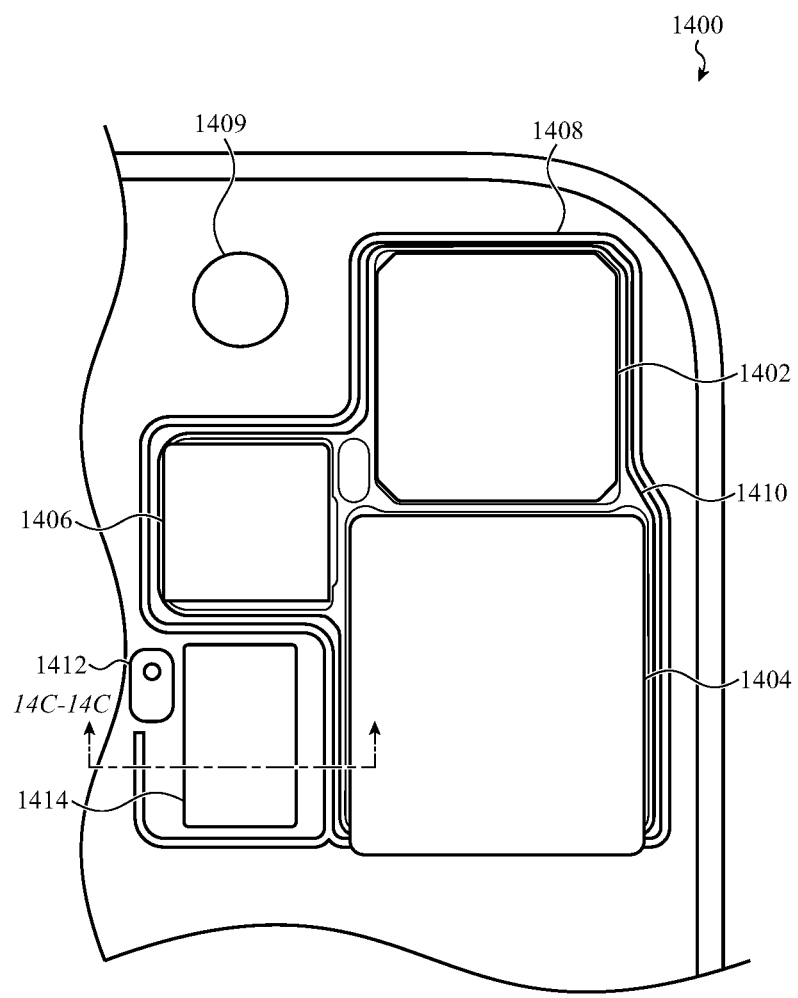
FIG. 14A depicts a portion of an electronic device illustrating an example sensor array.

FIG. 14A illustrates an example arrangement of cameras in a device 1400. FIG. 14A may correspond to a corner of a device (e.g., the device 300), viewed with the cover and display (and optionally other components) removed to show the arrangement of the cameras. The device 1400 may include a first camera module 1402 (which may be an embodiment of or otherwise correspond to the first camera 361, FIG. 3), a second camera module 1404 (which may be an embodiment of or otherwise correspond to the second camera 362, FIG. 3), and a third camera module 1406 (which may be an embodiment of or otherwise correspond to the third camera 363, FIG. 3). Any of the cameras shown in FIG. 14A (or elsewhere herein) may include an image stabilization system that helps maintain a sharp image (e.g., reducing the effects of camera shake on the image) by sensing movement of the device and moving one or more components of the camera in a manner that at least partially compensates for (and/or counteracts) the movement of the device.

FIG. 14A also illustrates a depth sensor 1414 (which may be an embodiment of or otherwise correspond to the depth sensor 365, FIG. 3, or the depth sensor 565, FIG. 5), and a microphone module 1412. The microphone module 1412 may be positioned over or otherwise acoustically coupled to an opening in the housing of the device 1400 to allow sound to be captured by the microphone module 1412.

The device 1400 may also include a bracket member 1410 (also referred to herein as a camera bracket) to which the first, second, and third camera modules 1402, 1404, 1406 may be coupled. The bracket member (or camera bracket) 1410 may define respective receptacles for each respective camera module. Each receptacle may define openings for the optical components of the camera modules. The receptacles may be defined by flanges or side walls that at least partially surround the camera modules. The bracket member 1410 may be configured to fix the relative positions of the camera modules.

The device 1400 may also include a frame member 1408 to which the bracket member 1410 and the depth sensor 1414 may be attached. The frame member 1408 may define a wall structure 1407, which in turn defines a first container region 1411 and a second container region 1413. As described herein, one or more cameras (which may be mounted to the bracket member 1410) may be positioned in the first container region, and the depth sensor module 1414 may be positioned in the second container region 1413. The wall structure 1407 may define the second container region 1413 by extending completely around the second container region 1413, or partially around the second container region 1413 (as shown). For example, the wall structure 1407 may define a wall segment 1439 that defines a free end. The free end may be set apart from other portions of the wall structure 1407 to define a gap or opening in the wall structure 1407.

The frame member 1408 may be configured to fix the relative positions of the camera modules (which are in turn coupled to and held in alignment by the bracket member 1410) and the depth sensor module 1414. The frame member 1408 may be configured to fix the relative positions of the camera modules and the depth sensor module 1414 in one or more directions. For example, the relative positions and/or orientations of the camera modules 1402, 1404, 1406 and the depth sensor module 1414 may be important to ensure proper operation of the features and/or functions of the camera modules 1402, 1404, 1406 and the depth sensor module 1414. In some cases it is necessary or desirable for the optical axes of one or more of the camera modules 1402, 1404, 1406 and the depth sensor module 1414 to be parallel or to converge at a predetermined distance away from the device 1400. As another example, it may be necessary or desirable for the offset between one or more of the camera modules 1402, 1404, 1406 and the depth sensor module 1414 (e.g., the offset along the optical axes) to be fixed at a predetermined distance. Such alignment and positioning may be necessary or desirable to provide functions such as camera focus assistance, depth mapping, image processing, or the like, and employing a common structure (such as the frame member 1408) to which both the depth sensor module 1414 and the camera modules 1402, 1404, 1406 (via the bracket member 1410) may be coupled may help establish and maintain the desired alignment and positioning. Notably, the frame member 1408 may establish and maintain any desired alignment, positioning, orientation, offset, or other spatial parameter, that results in the proper functioning of the optical systems. In some cases, the frame member 1408 is used to align the camera modules 1402, 1404, 1406 and the depth sensor module 1414 in the plane parallel to the interior surface 1436 of the rear cover 1432, while out-of-plane alignment (e.g., in the up and down direction, as oriented in FIGS. 14C-14D) is provided by the interior surface 1436 of the rear cover 1432. In some cases, the frame member 1408 is not used as an alignment datum or reference for the depth sensor module 1414, such as when the depth sensor module 1414 is adhered or otherwise attached to the interior surface 1436 of the rear cover 1432 and the sides of the depth sensor module 1414 are not in intimate contact with the wall structure 1407 of the frame member 1408.

In some cases, the frame member 1408 is not used as a datum for aligning the depth sensor module 1414. For example, in some cases the frame member 1408 does not define a mounting surface (e.g., a surface parallel to or in contact with an interior surface of the rear cover 1432) in the container region where the depth sensor module 1414 is positioned. In such cases, the wall structure of the frame member 1408 may extend partially or completely around an open-bottomed container region in which the depth sensor module 1414 is positioned. Accordingly, in this configuration the depth sensor module 1414 is able to be coupled to the interior surface of the rear cover 1432, such that the interior surface of the rear cover 1432 defines the datum surface for aligning and securing the depth sensor module 1414.

The frame member 1408 may be coupled to other housing components or structures of the device 1400, such as a rear cover (e.g., the rear cover 372, FIG. 3, the rear cover 572, FIG. 5, or any other suitable rear cover described herein). The frame member 1408 may be used as a datum or reference surface for the bracket member 1410 and/or the depth sensor module 1414.

Figure 14B:
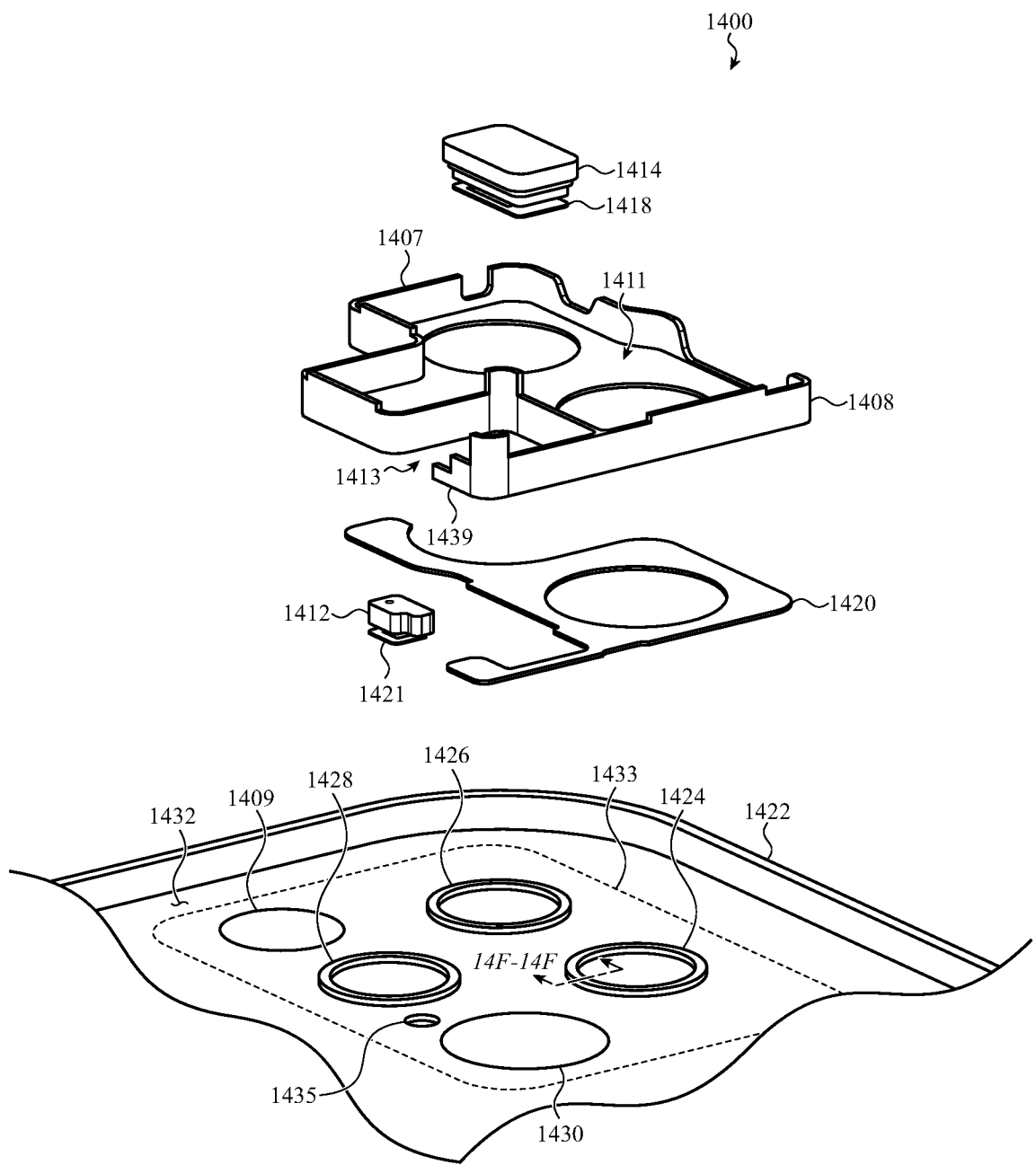
FIG. 14B depicts an exploded view of a camera portion of an example electronic device.

FIG. 14B is a partial exploded view of the device 1400, illustrating details of the frame member 1408, the depth sensor module 1414, the microphone module 1412, and a housing 1422. The housing 1422 may include a rear cover 1432, which may be formed from glass, glass ceramic, ceramic, sapphire, or other suitable material. The rear cover 1432 may define a sensor array region 1433, which may correspond to the size, shape, and location of the protrusion along the rear surface of the rear cover (e.g., the protrusions 137, 151, FIGS. 1B, 1D).

The rear cover 1432 may define or include camera windows 1424, 1426, 1428, 1430, and 1409 in the sensor array region 1433. The camera windows 1424, 1426, 1428, 1430, and 1409 may be at least partially transparent (or may include or surround covers that are at least partially transparent) to allow the first, second, and third camera modules 1402, 1404, 1406, the depth sensor module 1414, and a flash suitable optical access through the rear cover 1432. The camera windows 1424, 1426, 1428, 1430, and 1409 may be unitary with the rear cover 1432 (e.g., transparent regions of the same piece of material as the rest of the rear cover 1432), or they may include or be defined by transparent covers, inserts, lenses, or other components or structures. In some cases, some of the windows are unitary with the rear cover 1432, while others include or are defined by separate components or structures.

The rear cover 1432 may also define a microphone hole 1435 in the sensor array region 1433. The microphone hole 1435 may extend through the rear cover 1432 to provide acoustic access to the external environment for the microphone module 1412. In some cases, waterproof membranes and/or mesh materials (e.g., a screen) may be positioned in or otherwise cover the microphone hole 1435 to prevent ingress of liquids and/or other contaminants.

The frame member 1408 may be coupled to the rear cover 1432 along an internal surface of the rear cover and in the sensor array region 1433. For example, the frame member 1408 may be attached to the internal surface of the rear cover 1432 via an adhesive 1420. In some cases, as described herein, the frame member 1408 may be welded to camera trim structures that are coupled to the rear cover 1432. The microphone module 1412 may also be attached to the rear cover 1432 via an adhesive 1421. The depth sensor module 1414 may also be attached to the rear cover 1432 (e.g., the internal surface of the rear cover 1432) via an adhesive 1418. In some cases, as described with respect to FIGS. 14C-14D, the position of the depth sensor module 1414 in the device 1400 may be defined by the interface between the depth sensor module 1414 and the rear cover 1432. The adhesives 1418, 1420, 1421 may be any suitable adhesive, such as a pressure sensitive adhesive (PSA), heat sensitive adhesive (HSA), adhesive film, epoxy, or the like.

Figure 14C:
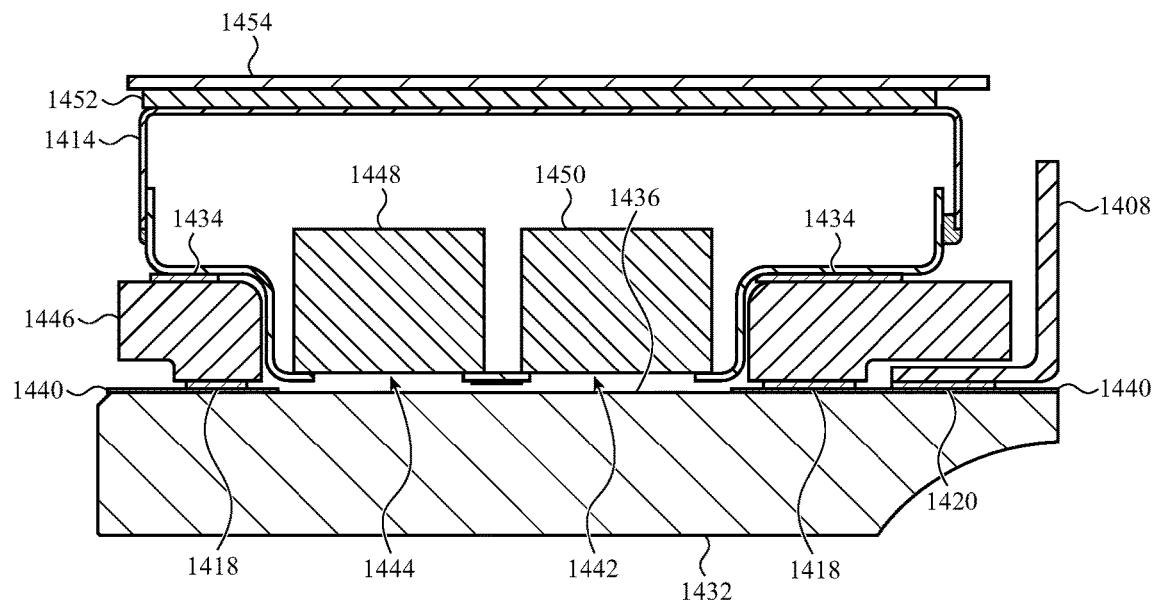
FIGS. 14C-14D depict partial cross-sectional views of depth sensor modules of an example electronic device.

FIG. 14C is a partial cross-sectional view of the device 1400, viewed along line 14C-14C in FIG. 14A, illustrating an example attachment and alignment configuration of the depth sensor module 1414 in the device 1400. As shown in FIG. 14C, the device 1400 includes a depth sensor module bracket 1446. The depth sensor module 1414 may be attached to the depth sensor module bracket 1446 via an adhesive 1434 (e.g., a PSA, HSA, adhesive film, epoxy, or the like), and the depth sensor module bracket 1446 may be attached to an interior surface 1436 of the rear cover 1432 via the adhesive 1418.

Figure 14D:
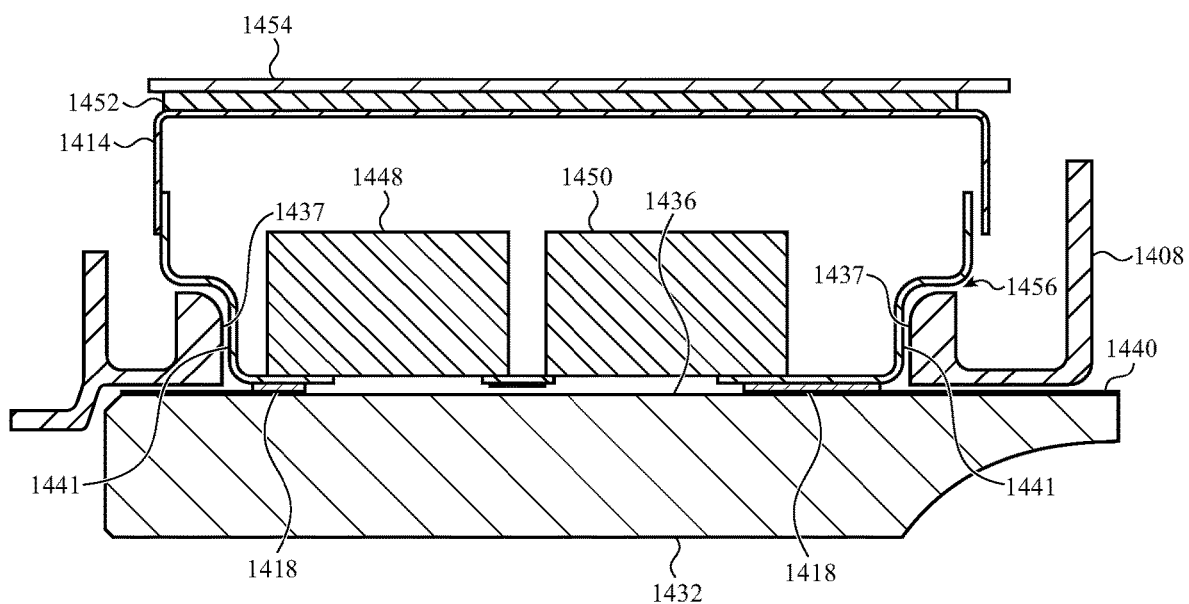

FIG. 14D is a partial cross-sectional view of the device 1400, viewed along line 14C-14C in FIG. 14A, illustrating another example attachment and alignment configuration of the depth sensor module 1414 in the device 1400. In this example, the depth sensor module bracket 1446 may be omitted, and a surface of the housing of the depth sensor module 1414 itself may be attached to the interior surface 1436 of the rear cover 1432 via the adhesive 1418.

Notably, in the configurations shown in FIGS. 14C-14D, the position of the depth sensor module 1414 is fixed based on its attachment to the interior surface 1436 of the rear cover 1432. Stated another way, the interior surface 1436 may act as a datum surface for positioning the depth sensor module 1414. The interior surface 1436 may also ultimately act as a datum surface for the camera modules 1402, 1404, 1406. Using a common datum surface for such optical components may help ensure accurate alignment and/or positioning of the optical components, which may improve or facilitate the operation of optical techniques such as depth-mapping or sensing, autofocus, or the like. In some cases, the depth sensor module 1414 does not contact and/or is not affixed to the frame member 1408. In some cases, a foam or other compressible or compliant material may be positioned and/or compressed between portions of the depth sensor module 1414 and the frame member 1408.

As described above, the depth sensor module 1414 may include an optical emitter 1448 and an optical sensor 1450. The optical emitter may be adapted to emit one or more beams of light, which may be coherent light beams having a substantially uniform wavelength and/or frequency. In some cases, the light beam(s) may be laser beams. Using a coherent light source may facilitate depth measurements using a time of flight, phase shift, or other optical effect(s). The optical sensor 1450 may detect portions of the coherent light beams that are reflected by objects external to the device 1400. Thus, for example, the optical emitter 1448 may project a pattern of dots onto the environment, and the optical sensor 1450 may capture an image of the environment. Using the reflections in the image of the pattern of dots, the device 1400 may calculate the distance between the device 1400 and objects in the environment. The device 1400 may then generate a depth map or rendering of the environment. The device 1400 may use the depth map or rendering for various purposes, such as for image processing, autofocus or other image capture features, augmented reality applications, measurements, or the like. The depth sensor module 1414 may be a lidar scanner.

Light may reach the optical emitter 1448 and the optical sensor 1450 through holes 1444 and 1442, respectively, of the depth sensor module 1414. In some cases, the device 1400 may include a mask 1440 positioned on the interior surface 1436 of the rear cover 1432. The mask 1440 may be opaque and may define one or more openings. The openings in the mask 1440 may coincide with the optical path to and from the optical emitter and sensor 1448, 1450. The mask 1440 may provide an optical shielding function for the depth sensor module 1414 (and other components in the device 1400, such as the camera modules), and may occlude, cover, or otherwise limit visibility of other internal components of the device 1400 from the outside. The mask 1440 may be formed from any suitable material, such as an ink, dye, foil, film, coating (e.g., formed by plasma vapor deposition (PVD), chemical vapor deposition (CVD), or any other suitable coating process), or the like.

Figure 14E:
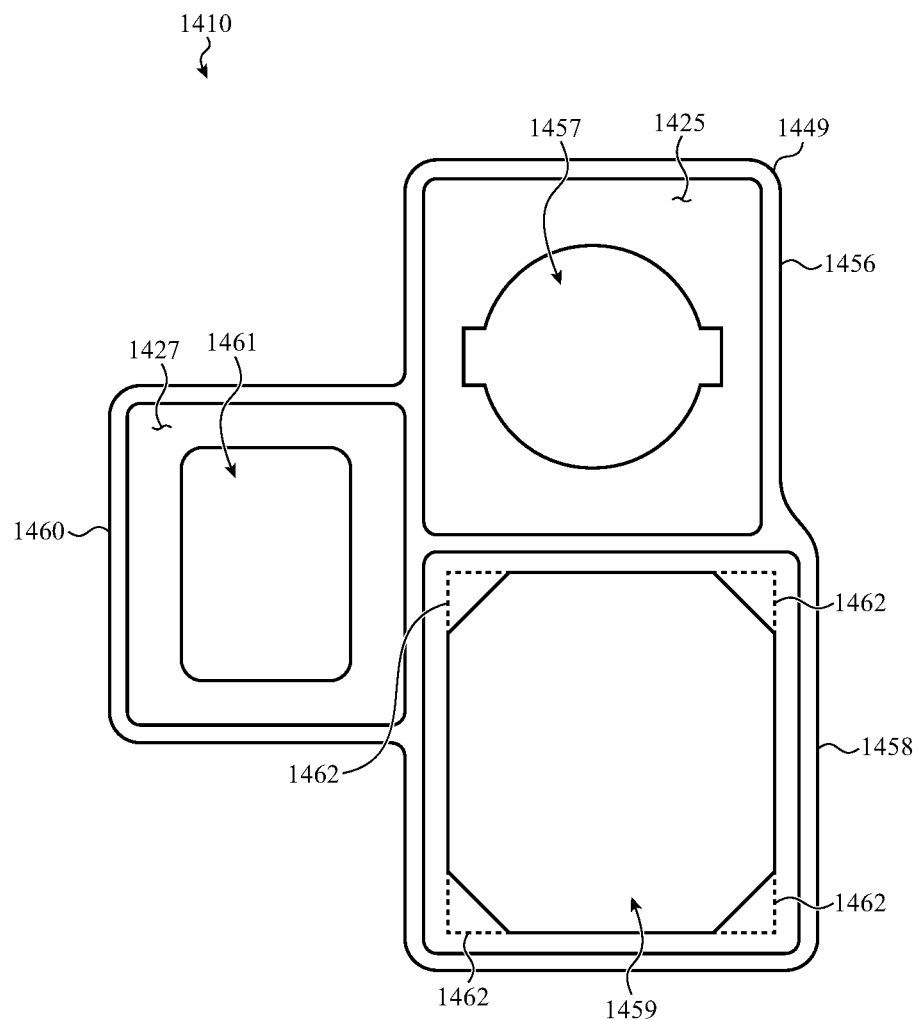
FIG. 14E depicts a bracket member for camera modules of an electronic device.

FIG. 14E illustrates a top view of the bracket member 1410 with the camera modules removed. The bracket member 1410 may include a wall structure 1449 that defines three separate receptacles for three separate camera modules, and each receptacle may be defined by or include a bottom wall that defines a mounting surface to which a camera module may be attached, and a hole to allow the camera module to receive light. For example, the bracket member 1410, and more particularly a wall portion of the wall structure 1449, may extend around a least a portion of a periphery of a mounting surface 1425 with a first hole 1457 and define a first receptacle 1456 configured to receive a first camera module. Another wall portion of the wall structure 1449 may extend around at least a portion of a periphery of a mounting surface (e.g., ledges 1462) with a second hole 1459 and define a second receptacle 1458 configured to receive a second camera module. Another wall portion of the wall structure 1449 may extend around at least a portion of a periphery of a mounting surface 1427 with a third hole 1461 and define a third receptacle 1460 configured to receive a third camera module. The bottom wall of the second receptacle 1458 may define ledges 1462 on which the second camera module may be positioned and optionally adhered. The ledges 1462 may be positioned at the corners of the hole 1459, and may also act as a datum surface to align and/or position the second camera module. The ledges may be used in place of a larger bottom wall (and correspondingly smaller hole) to help remove material from the bracket member 1410, which may make the device lighter and reduce the overall thickness of the device. Camera modules may be positioned within the receptacles 1456, 1458, 1460 defined by the bracket member 1410, and mounted to the mounting surfaces defined by the bracket member 1410 (e.g., the mounting surfaces 1425, 1427, and ledges 1462).

The walls of the bracket member 1410, including the bottom wall (e.g., the mounting surfaces of the bracket member 1410) and the wall structure that defines the side walls of the receptacles, may be used to align the camera modules to one another. For example, one or more of the side walls or the bottom wall of the receptacles may be used as a datum surface against which a camera module is positioned, adhered, fastened, secured, or otherwise interfaced. By interfacing all of the camera modules to the bracket member 1410, which may be a structurally stable component such as a single piece of metal or another suitable material, all of the cameras can be aligned to a single, common structure, thereby improving the alignment and the overall durability and/or stability of the positioning.

Figure 14F:
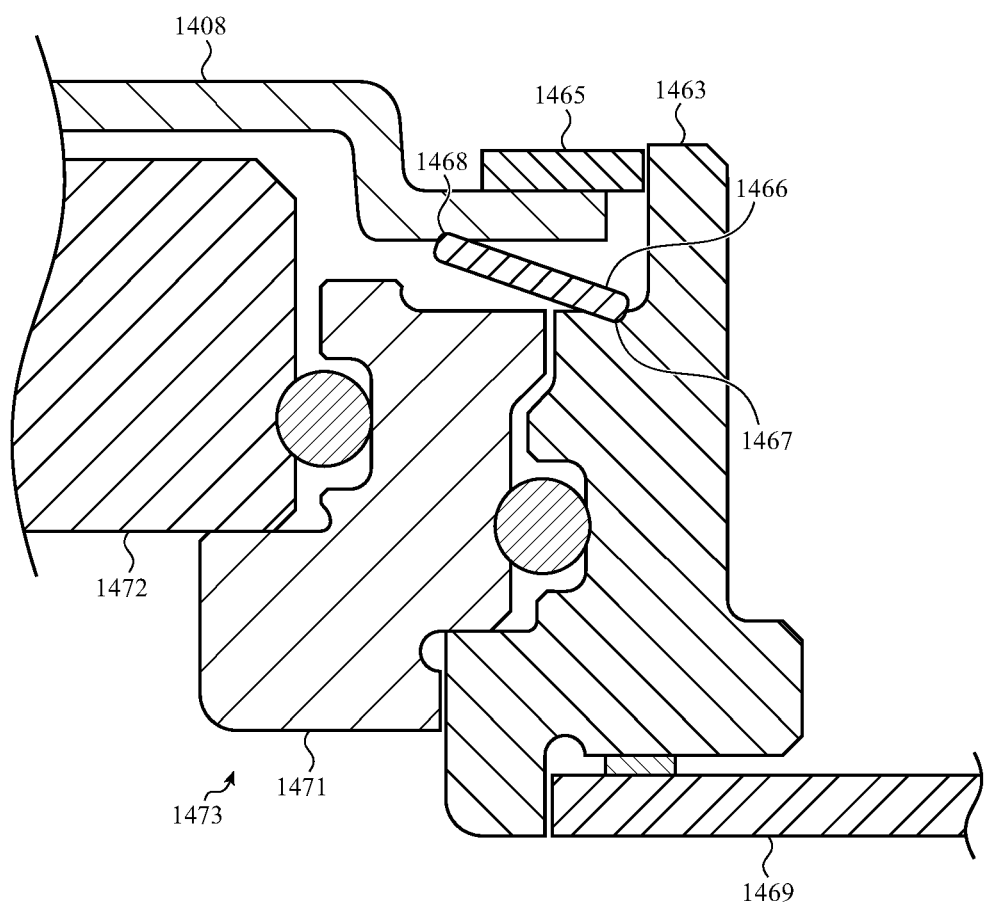
FIG. 14F depicts a partial cross-sectional view of an example electronic device, illustrating aspects of a camera trim structure.

FIG. 14F is a partial cross-sectional view of the device, viewed along line 14F-14F in FIG. 14B, illustrating aspects of a camera trim structure 1473 and its integration with a rear cover of the device 1400 and a frame member (e.g., the frame member 1408). The camera trim structure 1473 may be a circular or other shaped structure that is positioned in an opening in a rear cover 1472 (and optionally secured to the rear cover 1472) and may define a raised border structure on the exterior of the device. The camera trim structure 1473 may be configured to receive and/or support a camera cover 1469, which may be a piece of glass, sapphire, crystal, polymer, or any other suitable transparent or light transmissive material for covering a lens of a camera. A portion of a camera module (e.g., a camera lens) may extend into the camera trim structure 1473. The camera trim structure 1473 may include an inner ring structure 1463 and an outer ring structure 1471, which may be secured to one another via adhesive, threads, fusion bonds (e.g., welding, brazing, soldering), or any other suitable technique. The inner and/or outer ring structures 1463, 1471 may be formed of metal (e.g., steel, aluminum, stainless steel, or the like).

A frame member (in this case, the frame member 1408) may be positioned over at least a portion of the camera trim structure 1473. The frame member 1408 may help secure the camera trim structure 1473 to the rear cover 1472, and may define a mounting surface to which other components may be attached. The frame member 1408 may be secured to the inner ring structure 1463 via a weld plate 1465, which may resemble a flat washer. The weld plate 1465 may be welded (or otherwise fusion bonded) to the frame member 1408 and to the inner ring structure 1463. In some cases, the weld plate 1465 may be omitted (and the frame member 1408 may be fusion bonded directly to the inner and/or outer ring structures), or it may be welded to the outer ring structure 1471 instead of or in addition to the inner ring structure 1463.

During the process of fusion bonding (e.g., welding) the weld plate 1465 to the frame member 1408 and the camera trim structure 1473, molten metal or other contaminants may be ejected downwards, towards the camera trim structure 1473. Accordingly, a conical washer 1466 (which may be or may be similar to a Belleville washer) may be positioned between and in contact with the frame member 1408 and the camera trim structure 1473. The conical washer 1466 may contact the frame member 1408 at interface 1468 and contact the inner ring structure 1463 at interface 1468. The conical washer 1466 may be subjected to sufficient force by the frame member 1408 and interface 1468 that a biasing force is present at the interfaces 1467, 1468, thereby establishing a seal or at least maintaining positive contact at the interfaces. In this way, the conical washer 1466 may form a seal between the area that is being welded and the rear cover 1472, thereby blocking molten metal or other contaminants that may be ejected during the fusion bonding process from contacting the rear cover 1472 or other components of the device.

Figure 14G:
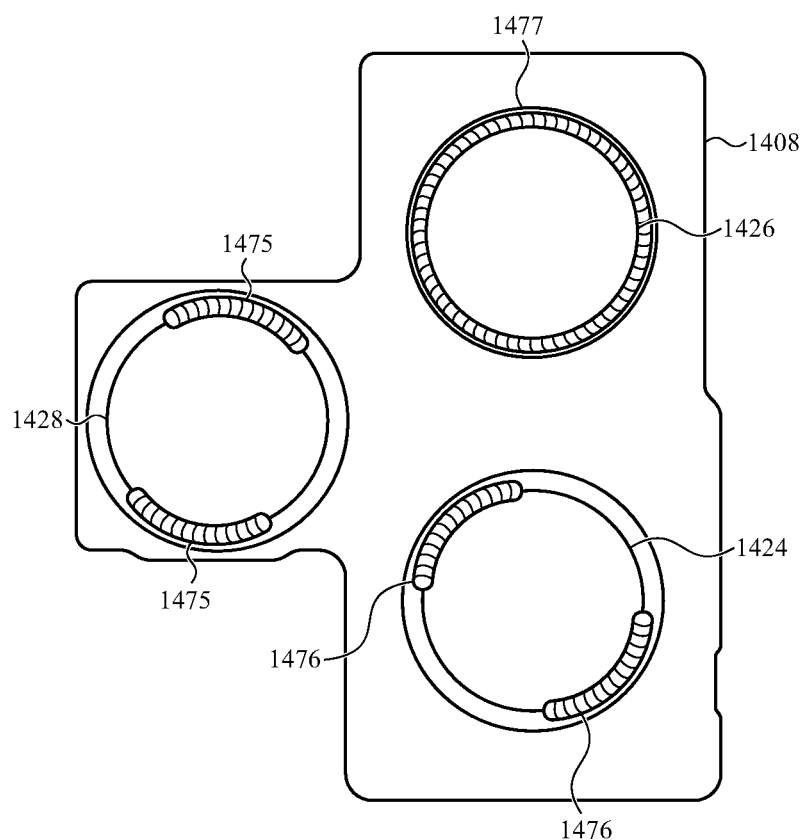
FIG. 14G depicts a portion of an electronic device with a frame member attached to a housing.

FIG. 14G illustrates a portion of the device 1400 with the bracket member 1410 removed, showing the frame member 1408 attached to a housing or enclosure. The frame member 1408 may define holes that coincide with camera windows 1424, 1426, 1428 (which may include or be defined by camera covers, as described herein). The frame member 1408 may be fusion bonded to the trim structures around the camera covers. The fusion bonds may be formed by a blue light laser (e.g., using light having a wavelength of around 450 nm), or by other suitable laser welding or other fusion bonding processes. By using a blue light laser, spatter may be reduced or eliminated as compared to other types of welding processes (e.g., arc welding, laser welding using lasers other than blue light lasers, etc.). Reducing or eliminating spatter may help prevent or inhibit molten metal or other contaminants from contacting the rear cover 1472 or other components of the device 1400. Laser welding with a blue light laser may be used in addition to or instead of a conical washer as described with respect to FIG. 14F.

The frame member 1408 may be fusion bonded to the trim structures by one or more beads (e.g., weld beads) around all or part of a perimeter of the camera windows. For example, as shown in FIG. 14G, two beads 1475 may each extend around a portion (in this case, less than half) of the perimeter of the camera window 1428, and two beads 1476 each extend around a portion (less than half) of the perimeter of the camera window 1424. In some cases, more discrete beads may be used around a camera window, such as three, four, five, or more beads, each separated from adjacent beads by a gap. FIG. 14G also shows a bead 1477 that extends around an entire perimeter of the camera window 1426. In some cases, a single bead that extends around less than the full perimeter may also be used. In a given device, different types of weld beads may be used around different camera windows (e.g., a first camera window may have a single full perimeter bead while another may have multiple partial-perimeter beads), or the same type of bead may be used around all of the camera windows.

Figure 14H:
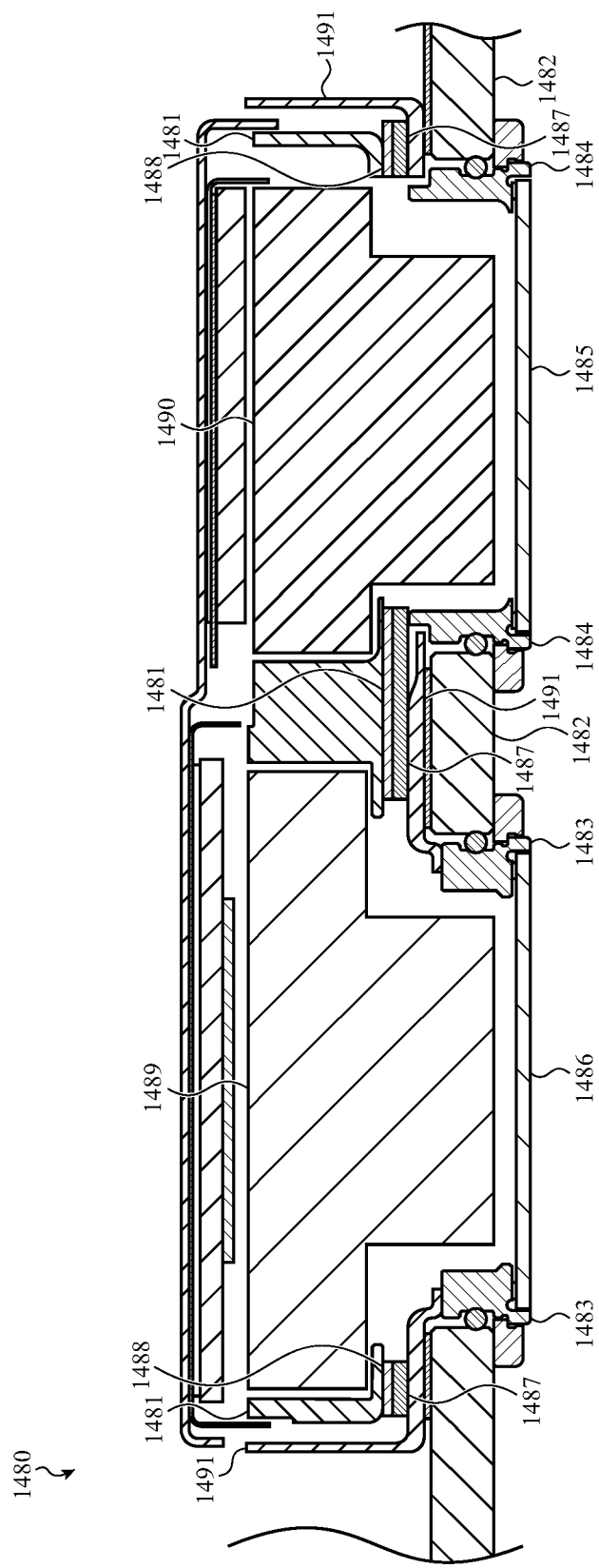
FIG. 14H depicts a partial cross-sectional view of camera modules of an example electronic device.

FIG. 14H is a partial cross-sectional view of a device that includes two rear-facing cameras, such as the device 200 in FIG. 2, viewed along line 14H-14H in FIG. 2, for example. The cameras of mobile phones may be relatively delicate components due to the precision optics and sensors that they use. Accordingly, protecting them from extreme forces due to drops or other types of potentially damaging events may help prevent them from damage and generally improve the durability of the cameras.

FIG. 14H shows how multiple different compliant members, each with different properties, may be positioned between camera modules and their mounting structures to help insulate the camera modules from potentially damaging forces or motions. For example, camera modules 1489, 1490 may be coupled to a bracket member 1481 (which may be similar to the bracket member 1410, but configured for only two camera modules), and the bracket member 1481 may be coupled to a frame member 1491 (which may be similar to the frame member 1408, but configured for two camera modules). The frame member 1491 may be coupled to trim structures 1483 and 1484 (e.g., via fusion bonds, as described above), and may be attached to a rear cover 1482 (e.g., a glass member) via an adhesive. Camera covers 1486, 1485 may be coupled to the trim structures or otherwise configured to cover the holes through which the camera modules receive light.

A multi-layer compliant structure may be positioned between (and in contact with) the bracket member 1481 and the frame member 1491 (or otherwise between the camera modules and a housing component or structure). The multi-layer compliant structure may include a first compliant member 1487 having first physical properties, and a second compliant member 1488 having second physical properties. The difference in physical properties between the first and second compliant members 1487, 1488 may help isolate the camera modules from different types of forces and/or motions. The first and second compliant members 1487, 1488 may differ in stiffness, compliance, Young's modulus, density, thickness, cell type (e.g., open cell, closed cell), or the like. For example, the first compliant member 1487 may have a lower stiffness (e.g., a lower Young's modulus) than the second compliant member 1488. The first compliant member 1487 may be a polypropylene foam, and the second compliant member 1488 may be a polyurethane foam. The second compliant member 1488 may be adhered (or otherwise attached) to the bracket member 1481 and the first compliant member 1487 may be adhered (or otherwise attached) to the second compliant member 1488 prior to the bracket member 1481 being assembled with the frame member 1491. Curable liquid adhesives, adhesive tapes or films, or other types of adhesives may be used to adhere the first compliant member 1487 to the frame member 1491, to adhere the first compliant member to the second compliant member 1488, and/or to adhere the second compliant member 1488 to the bracket member 1481.

The relatively lower stiffness of the first compliant member 1487 may also form an environmental seal (e.g., air and/or water tight) against the frame member 1487. The bracket member 1481 may be secured to the device such that the first and second compliant members 1487, 1488 are maintained in a compressed state. While FIG. 14H shows a particular structural configuration that includes both a bracket member 1481 and a frame member 1491, the multi-layer compliant structure may be used with other types of structural configurations as well, such as configurations that omit the bracket member 1481 (or part of the bracket member 1481), and mount a camera module to the frame member 1491 or another housing member or structure (and thus position the multi-layer compliant structure between the camera module and the frame member 1491 or the other housing member or structure).

Figure 14I:
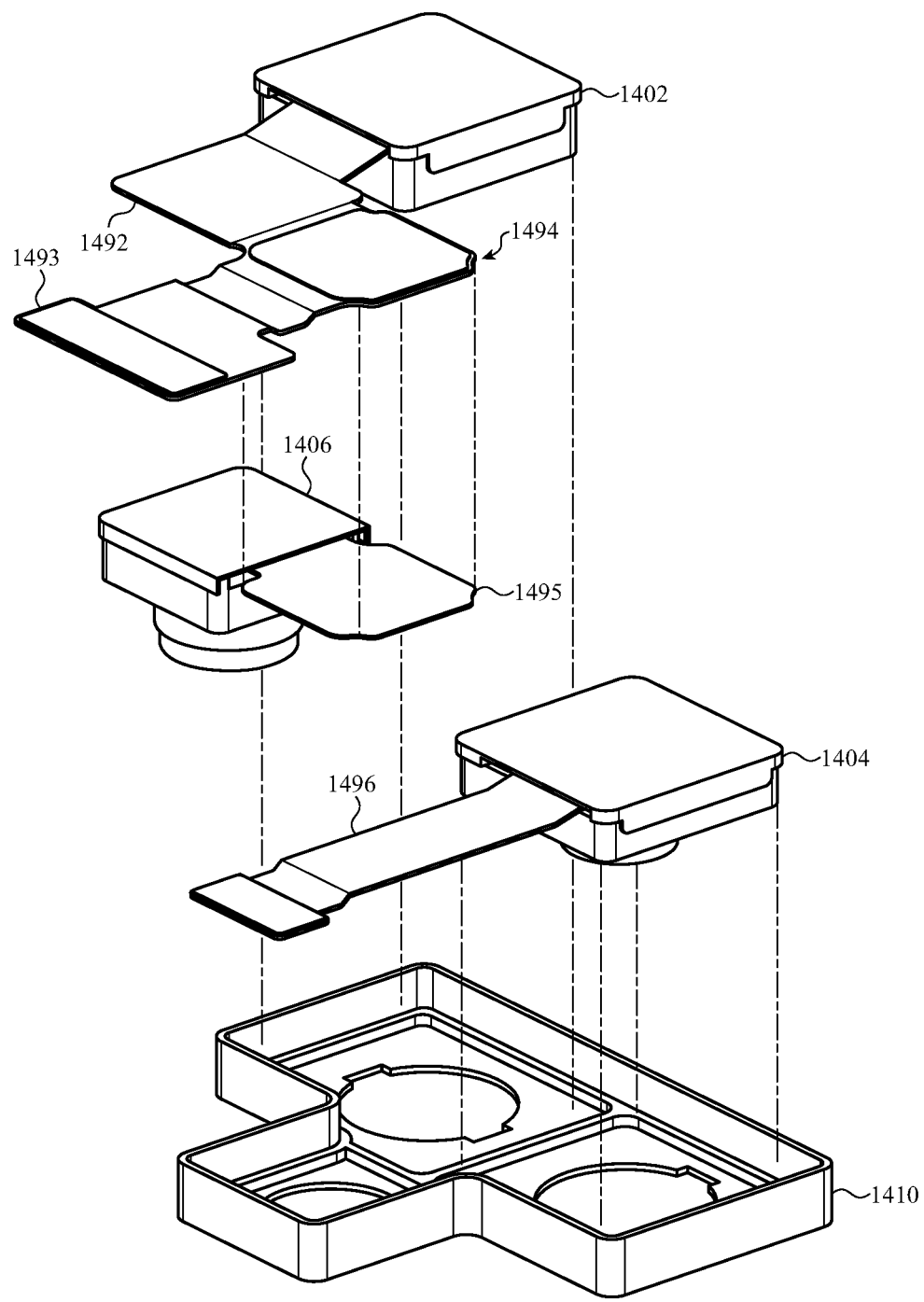
FIG. 14I depicts an exploded view of camera components of an example electronic device.

As the number of cameras integrated with a device increase, the overall complexity and number of electrical interconnections that must be made between the cameras and other circuitry in the device. FIG. 14I illustrates how the multiple camera modules may share a common connector by conductively coupling flexible circuit elements from two different camera modules. For example, the first camera module 1402 may include (or be coupled to) a first flexible circuit element 1492 that includes a connector 1493. Conductive traces in the first flexible circuit element 1492 conductively couple components of the first camera module 1402 to the connector 1493 (and therefore to other components of the device). The third camera module 1406 may also include (or be coupled to) a second flexible circuit element 1495. The second flexible circuit element 1495 may lack a connector, and instead may be conductively coupled to an interconnect area 1494 of the first flexible circuit element 1495. Conductive traces in the first flexible circuit element 1492 may then conductively couple the connector 1493 to the traces in the second flexible circuit element 1495 and, ultimately, conductively couple electrical components of the second camera module to other components of the device (e.g., processors, circuitry, memory, power, etc.). As shown in FIG. 14I, the second camera module 1404 may include (or be coupled to) a third flexible circuit element 1496 that includes its own connector.

Figure 14J:
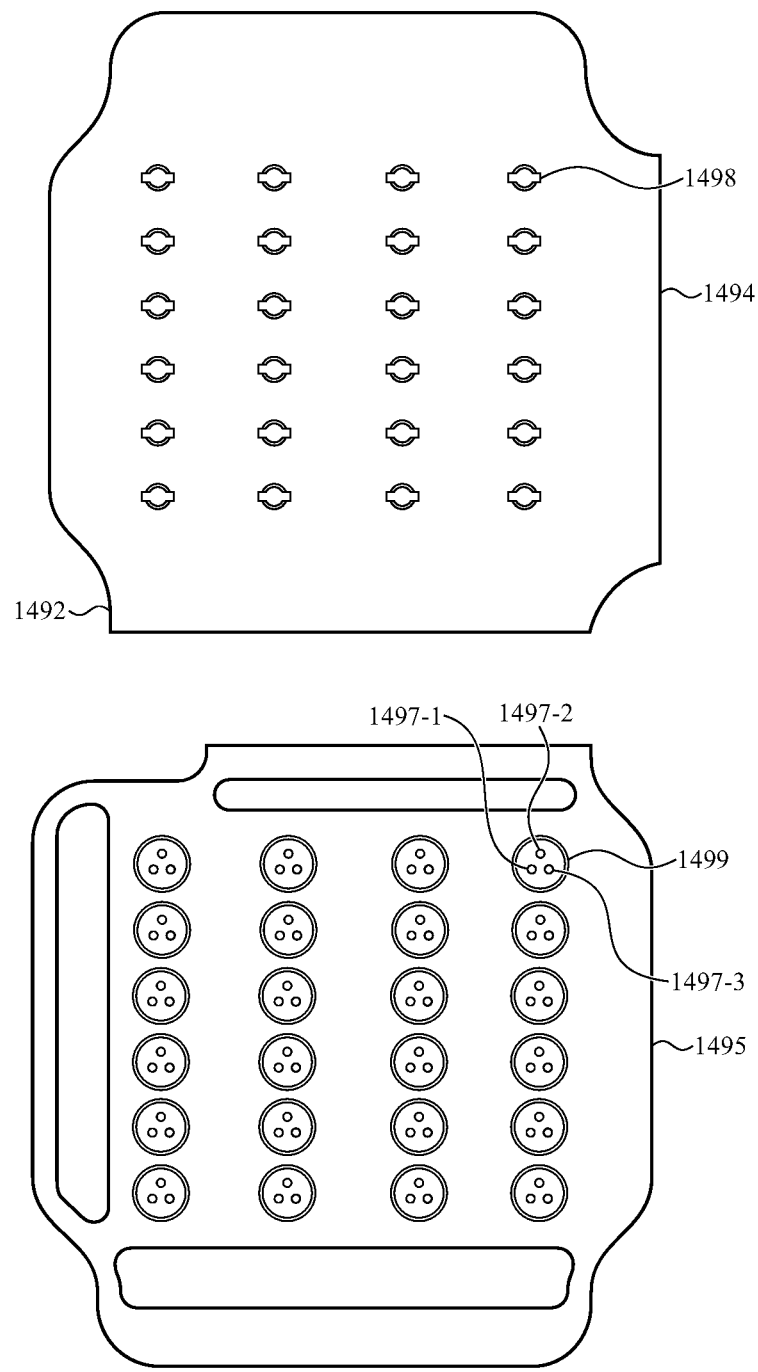
FIG. 14J depicts flexible circuit elements for conductively coupling components of an example electronic device.

FIG. 14J shows the interconnect area 1494 of the first flexible circuit element 1492, and a corresponding interconnect area of the second flexible circuit element 1495. The first flexible circuit element 1492 includes a plurality of first solder pads 1498, and the second flexible circuit element 1495 includes a plurality of second solder pads 1499 that are configured to be soldered to corresponding ones of the first solder pads 1498. The first and second solder pads may be arranged in any suitable pattern, such as a grid pattern (as shown). The first and second solder pads may have different sizes to accommodate slight misalignments between the interconnect areas when the camera modules are assembled together. More particularly, as noted above, the alignment of the camera modules within the overall system and relative to one another may be important for providing a target performance level of the cameras and/or other optical functionalities. Accordingly, the solder pads, and the interconnect areas more generally, may be configured so that the conductive connections can be formed despite misalignments of the interconnect areas (which may result during the physical alignment processes for the camera modules). This may include configuring one of the groups of solder pads to have a larger size than the other. For example, as shown, the second solder pads 1499 are larger than the first solder pads 1498. Accordingly, even if the first and second solder pads do not line up perfectly with one another (e.g., so each first solder pad is centered over the corresponding second solder pad), a positive conductive coupling is still formed. Further, the larger solder pads (the second solder pads 1499 in this case) may include a plurality of vias 1497-1, 1497-2, 1497-3, which are configured to draw in or otherwise accept excess solder that may be present during the soldering of the first and second solder pads together. The multiple vias 1497 on each second solder pad 1499 may aid in the misalignment tolerance of the solder pads (as compared to solder pads with single vias, for example), because the solder connection between the solder pads will always be proximate to at least one of the multiple vias, even to the extent that the solder pads are not perfectly centered with respect to one another.

While FIGS. 14A-14J illustrate example devices that include three camera modules, this is merely one example implementation, and similar structures, features, techniques, and concepts may be applied to devices with other numbers of camera modules as well (e.g., one, two, four, five, or more camera modules). As one example, a device with two rear-facing cameras (e.g., the devices 100, 200, 400) may include a bracket member similar to the bracket member 1410, but with only two receptacles (e.g., one receptacle for each rear-facing camera module). As another example, a frame member similar to the frame member 1408 (in FIG. 14G) but with only two holes for cameras may be welded to the device in the same manner shown and described with respect to FIG. 14G. Similar adaptations may be made to other structures or architectures.

Figure 15A:
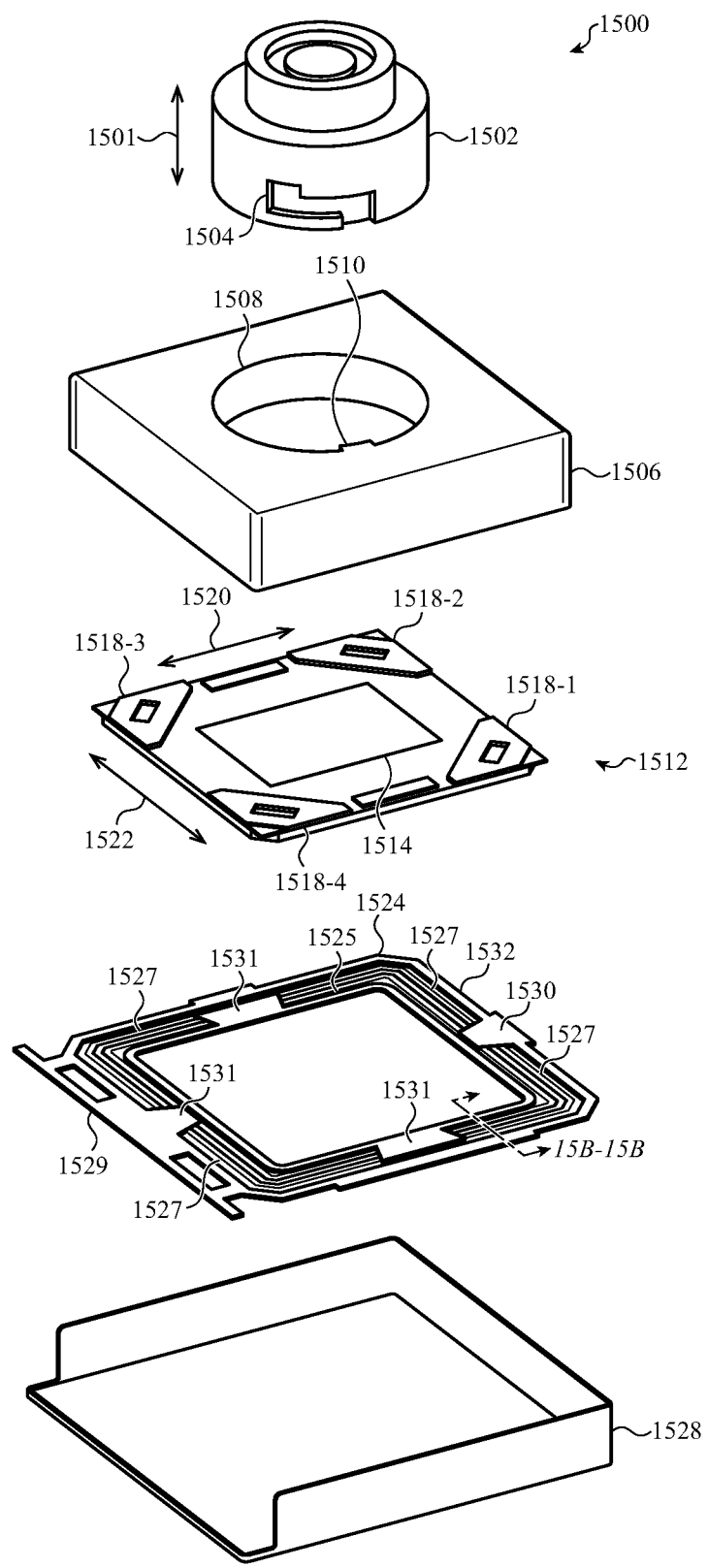
FIG. 15A depicts an exploded view of an example camera of an electronic device.

FIG. 15A illustrates an example camera 1500 with an image stabilization system. The camera 1500 may correspond to the second camera 1404 in FIG. 14 (which may, for example, have a 12 megapixel image sensor and a super-wide angle lens (120° FOV) with an aperture number of f/2.4).

The camera 1500 includes a lens assembly 1502. The lens assembly 1502 may include one or more lens elements in a lens housing. The lens element(s) may define a lens with a 120° FOV and an aperture number of f/2.4. The lens housing may define a first retention feature 1504 configured to engage with a complementary feature of another component of the camera to retain the lens assembly with the camera 1500. For example, the camera 1500 may include a first housing member 1506 that defines an opening 1508 that receives the lens assembly 1502. The first housing member 1506 may further define a second retention feature 1510 that is configured to engage the first retention feature 1504 to retain the lens assembly 1502 to the first housing member 1506. The camera 1500 may further include a second housing member 1528 that attaches to the first housing member 1506. The first and second housing members 1506, 1528 may define an interior volume for holding components of the camera, and together they may at least partially enclose those components. The camera 1500 may also include a sensor (e.g., a 12 megapixel image sensor) on a circuit board 1512.

As noted above, the camera 1500 may provide image stabilization functionality. Image stabilization may be performed along multiple axes. The camera 1500, for example, provides image stabilization along three axes. For example, image stabilization along an axis 1501 may be provided by a first actuation system within the lens assembly 1502. The first actuation system may include, for example, motors, actuators, and/or other components. When a movement of the device that has a component along the first axis 1501 is detected, the camera 1500 may cause one or more lens elements to move along the first axis 1501. This movement may be configured to at least partially compensate for the movement of the device to attempt to maintain a sharp, in-focus image.

Image stabilization along second and third axes 1520, 1522 may be provided by a second actuation system that moves the sensor 1514 relative to the lens assembly 1502. Motion of the sensor may be provided by the second actuation system, which may use electromagnetic actuators to produce the motion. The second actuation system may include electromagnetic coils, magnets, armature coils, and/or other suitable components. In some cases, the elements 1518-1, 1518-2, 1518-3, and 1518-4 may be armature elements, which may each include an armature coil (and optionally a ferritic or other material core about which the armature coil may be wound) that is configured to be selectively energized to produce a force that will move the circuit board 1512 (which is one example of an image sensor carrier on which the image sensor may be attached) along one or both axes 1520, 1522. In other cases the elements 1518-1, 1518-2, 1518-3, and 1518-4 may be magnets, and a coil (e.g., a coil mounted to a flexible connector 1524, the housing member 1506, the second housing member 1528, or another structure) may cause the elements 1518-1, 1518-2, 1518-3, and 1518-4 to move the circuit board 1512 along one or both axes 1520, 1522.

In order to provide image stabilization functionality using the moving circuit board system, when a movement of the device that has a component along the second axis 1520 and/or the third axis 1522 is detected, the camera 1500 may cause the circuit board 1512 to move along the second axis 1520 and/or the third axis 1522 in a manner that at least partially compensates for the movement of the device. By moving the lens assembly along the first axis 1501 and the circuit board 1512 (and sensor 1514) along the second and third axes 1520, 1522, three-axis image stabilization may be provided by the camera 1500. In some cases, image stabilization functionality may be provided by moving the lens assembly 1502 along two or three (or more) axes (instead of the one shown in FIG. 15A), and by moving the circuit board 1512 (and sensor 1514) along three (or more or fewer) axes.

In order to allow the circuit board 1512 to move relative to structural components of the camera 1500 (e.g., the housing member 1506 and the second housing member 1528) while also allowing electrical interconnection from the circuit board 1512 to other components of a device (e.g., processors, memory, power circuitry, etc.), the camera 1500 may include a flexible connector 1524 that conductively couples to the circuit board 1512 via conductive pads (e.g., solder pads) on an inner segment 1525, and to other components of the device (e.g., a processor, memory, power circuitry, etc.) via conductive pads on a connector portion 1529 of an outer segment 1532. The inner segment 1525 may be conductively yet flexibly coupled to the outer segment 1532 via flexible support members 1527. The flexible support members 1527 may be formed by cutting slits or otherwise removing material from the flexible connector 1524 to form a plurality of strips that connect to the inner and outer segments 1525, 1532. The strips of the flexible support members 1527 may include conductive traces (e.g., metal, indium tin oxide, etc.) to conductively couple the inner and outer segments 1525, 1532.

The flexible support members 1527 may be conductively and physically coupled to the outer segment 1532 at outer connection regions 1530, and to the inner segment 1525 at inner connection regions 1531. The inner connection regions 1531 may be positioned on opposite sides of the flexible connector 1524, and the outer connection regions 1530 may also be positioned on opposite sides of the flexible connector 1524 (and on adjacent sides relative to the inner connection regions 1531. Accordingly, each flexible support member may extend around a corner of the flexible connector 1524, thereby providing a suitable length of the flexible connector material to allow the inner segment 1525 to move relative to the outer segment 1532 while maintaining conductive coupling therebetween.

Figure 15B:
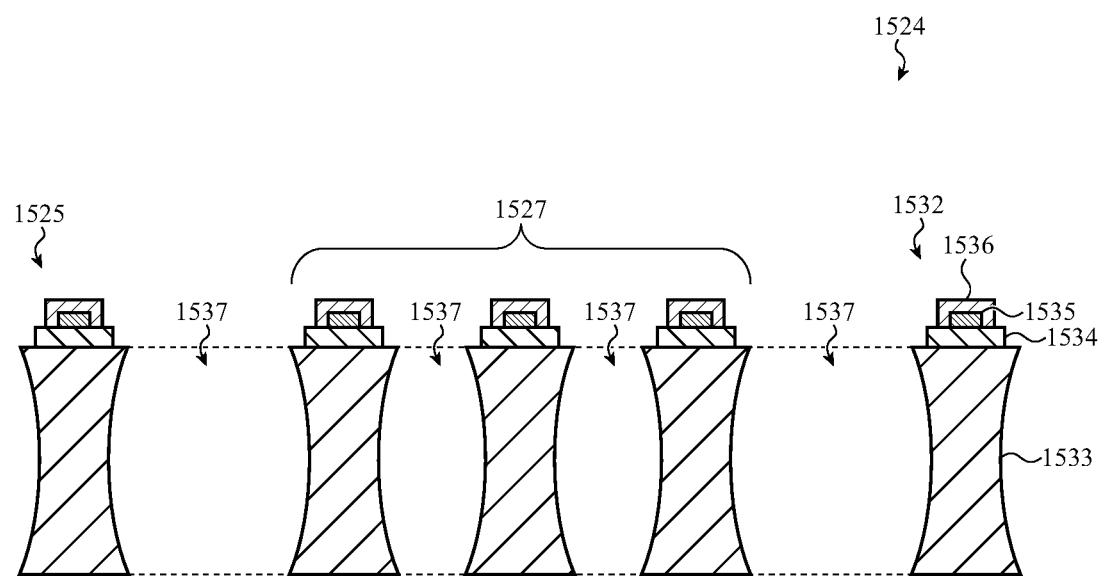
FIG. 15B depicts a cross-sectional view of a component of the camera of FIG. 15A.

FIG. 15B is a partial cross-sectional view of the flexible connector 1524, viewed along line 15B-15B in FIG. 15A. The flexible connector 1524 may be formed of multiple layers. For example, a base layer 1533 may be a metal layer (e.g., formed from or comprising a metal such as a copper titanium alloy) having a thickness of between about 100 and about 140 microns. A base dielectric layer 1534 (e.g., a polyimide layer) having a thickness of between about 8 and about 12 microns may be positioned on the base layer 1533. A conductive layer 1535 (e.g., copper traces having a thickness between about 10 and about 40 microns), which may include the conductive pads and the conductive traces that extend along the strips of the flexible support members 1527, may be positioned on the base dielectric layer 1534. A cover layer 1536 (e.g., a covercoat having a thickness of between about 3 and about 8 microns) may be positioned on the conductive layer 1535. While the dielectric layer 1534, conductive layer 1535, and cover layer 1536 are labelled only on the outer segment 1532, the same layers may be present on the inner segment 1525 and flexible support members 1527, as shown in FIG. 15B.

In some cases, the flexible connector 1524 may be formed by applying and/or depositing the dielectric layer 1534, conductive layer 1535, and cover layer 1536 on a sheet of material (e.g., the base layer material). The material may lack the slots 1537 (also referred to as gaps) between the flexible support members 1527 and the inner and outer segments 1525, 1532, and may resemble a continuous sheet or layer (as indicated by the dotted horizontal lines in FIG. 15B). The base layer material may then be etched or cut to form the slots 1537, thereby defining the distinct flexible support members 1527 and the inner and outer segments 1525, 1532. The base layer 1533 may be etched or cut using any suitable process, including laser etching or cutting, plasma etching or cutting, machining, chemical etching, or the like.

As noted above, the devices described herein may include a flash that is configured to illuminate a scene to facilitate capturing images with one or more cameras of the electronic device. The flash, also referred to as a flash module, may include one or more light emitting diodes (LEDs) that produce the light to illuminate the scene. The flash module may be part of or positioned proximate a sensor array to facilitate illumination of scenes for flash photography.

Figure 16A:
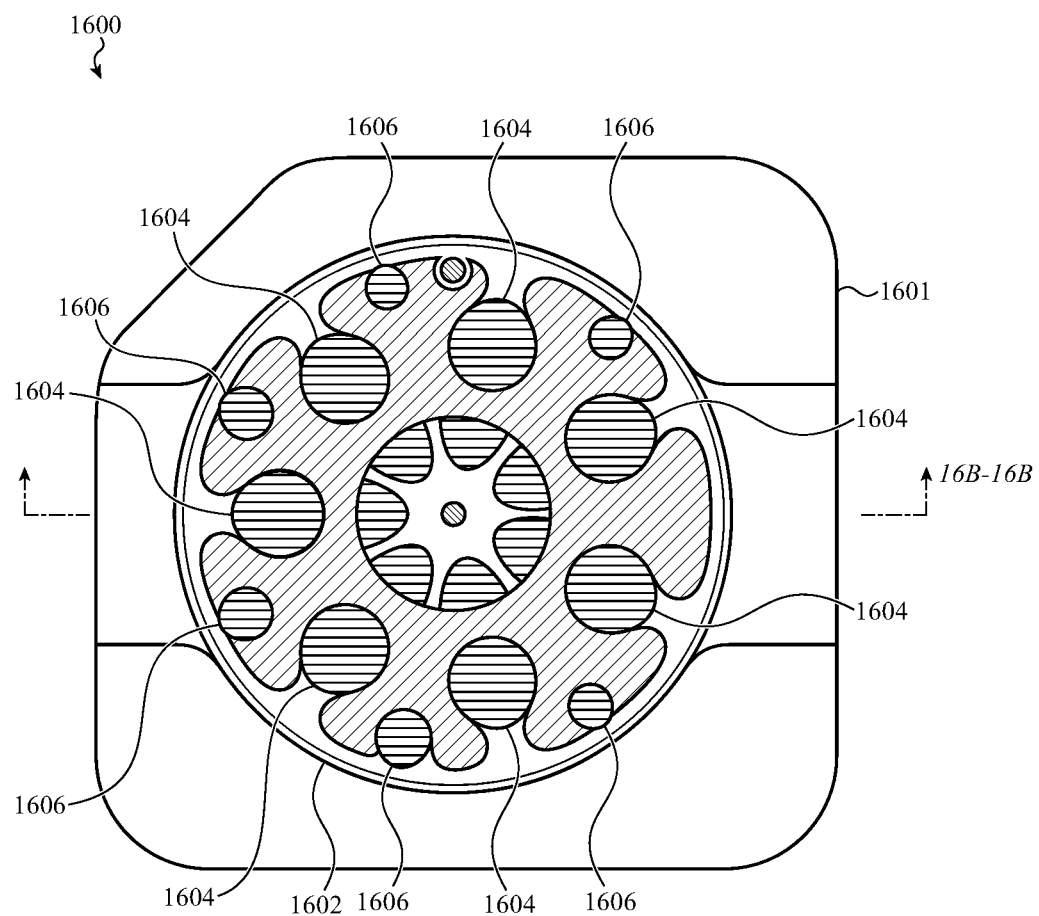
FIG. 16A depicts a flash module of an example electronic device.

FIG. 16A illustrates a back view of a flash module 1600 (e.g., the side of the flash module that faces the interior of the device) that may be used with the devices described herein. For example, the flash module may be aligned with a flash window 1409 (FIGS. 14A, 14B). The flash module 1600 may include a carrier 1601 and a circuit board 1602. The circuit board 1602 may be attached to the carrier 1601, and the carrier 1601 may be secured to the device (e.g., in an opening or proximate a window in a rear cover of the device).

The circuit board 1602 may include electrical contact pads 1604 and 1606 arranged in a generally circular arrangement. For example, the circuit board 1602 may include a set of first contact pads 1604 arranged in a first generally circular arrangement (e.g., along a circle having a first diameter), and a set of second contact pads 1606 arranged in a second generally circular arrangement (e.g., along a circle having a second diameter that is larger than the first diameter) and around the set of first contact pads 1604. The set of first contact pads 1604 and/or the set of second contact pads 1606 may be spaced evenly about their respective circles (e.g., having a same distance between any two adjacent contact pads).

The set of first contact pads 1604 may be used to conductively couple the LEDs (and/or other circuitry, processors, or other electrical components) of the flash module 1600 to other circuitry and/or components of a device. Thus, wires, traces, leads, or other conductive elements may be soldered, welded, or otherwise conductively coupled to the set of first contact pads 1604. The set of second contact pads 1606 may also be conductively coupled to the LEDs (and/or other circuitry, processors, or other electrical components) of the flash module 1600, and may be provided to facilitate testing of the flash module without having to make physical contact with the set of first contact pads 1604, thereby avoiding potential damage or contamination of the set of first contact pads 1604.

Figure 16B:
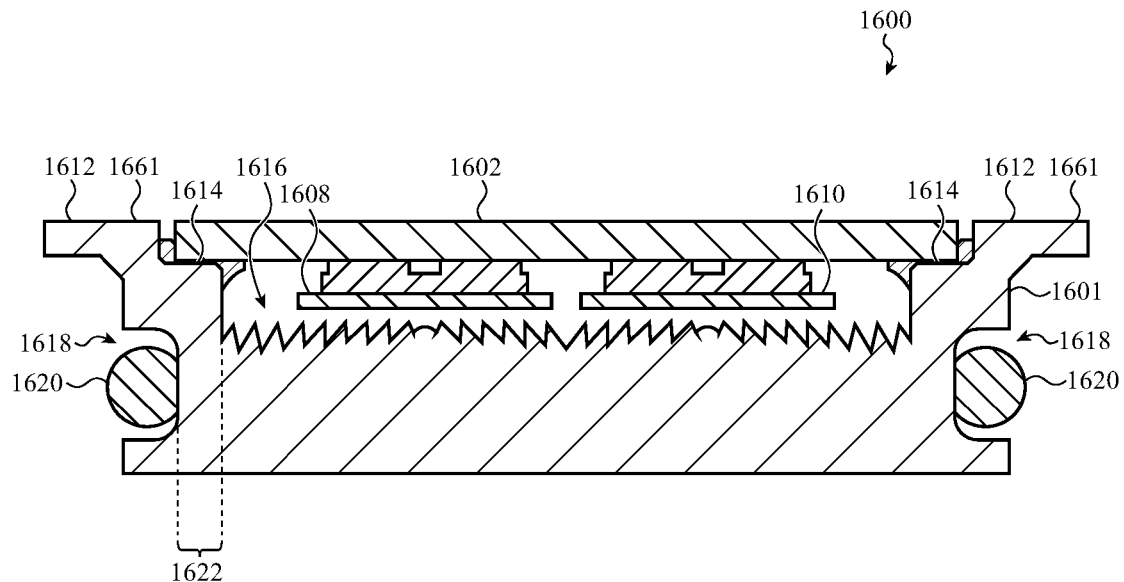
FIG. 16B depicts a partial cross-sectional view of the flash module of FIG. 16A.

FIG. 16B is a partial cross-sectional view of the flash module 1600, viewed along line 16B-16B in FIG. 16A, showing an example integration of the circuit board 1602 with the carrier 1601. The carrier 1601 may be a single unitary piece of light transmissive material, such as glass, a light-transmissive polymer, sapphire, or the like.

The carrier 1601 may define a ledge 1614, which may define a recess in which the circuit board 1602 is positioned. For example, the ledge 1614 may be recessed relative to a back surface 1612 of the carrier 1601. The ledge 1614 may be recessed from the back surface 1612 a distance that is substantially equal to the thickness of the circuit board 1602 or is otherwise configured based on a dimension of the circuit board 1602 such that the back of the circuit board 1602 is flush with or recessed relative to the back surface 1612 of the carrier 1601. The circuit board 1602 may be attached to the carrier 1601 via an adhesive (e.g., between the ledge 1614 and the circuit board 1602).

In some cases, a coating 1661, such as an ink, mask, dye, paint, film, a vapor deposition coating (e.g., chemical or plasma vapor deposition), or the like, may be applied to the back surface 1612. In some cases, the coating 1661 is an opaque white coating. In other cases, the coating 1661 is a mirror-like reflective coating (e.g., a silver PVD or CVD coating). The coating 1661 may prevent or limit the visibility of internal components of a device through the material of the carrier 1601, and may help avoid the presence of a black or dark ring-like appearance around the perimeter of the flash module 1600 (e.g., when the external-facing surface of the flash module 1600 is viewed when the flash module 1600 is integrated with a device).

FIG. 16B also shows light emitting elements 1608 and 1610 (e.g., LEDs) attached to the circuit board 1602 and configured to emit light downward, towards a lens portion 1616 of the carrier 1601. The lens portion 1616 may be or define a Fresnel lens (or other type of lens) that focuses, diffuses, or otherwise changes the light to produce a desired spread or illumination angle. The lens portion 1616 may be integrally formed into the carrier 1601 (e.g., the material of the carrier 1601 may define the lens portion 1616). In some cases, the lens portion 1616 may be a separate element that is attached to the carrier 1601.

The carrier 1601 may also define a recess 1618 in a sidewall to receive a compliant member 1620. The compliant member 1620 may be an o-ring (or other suitable compliant member) and may be configured to form an environmental seal between the carrier 1601 and part of the housing of the device in which it is integrated (e.g., the surfaces of a hole or recess in a rear cover of a device).

Figure 16C:
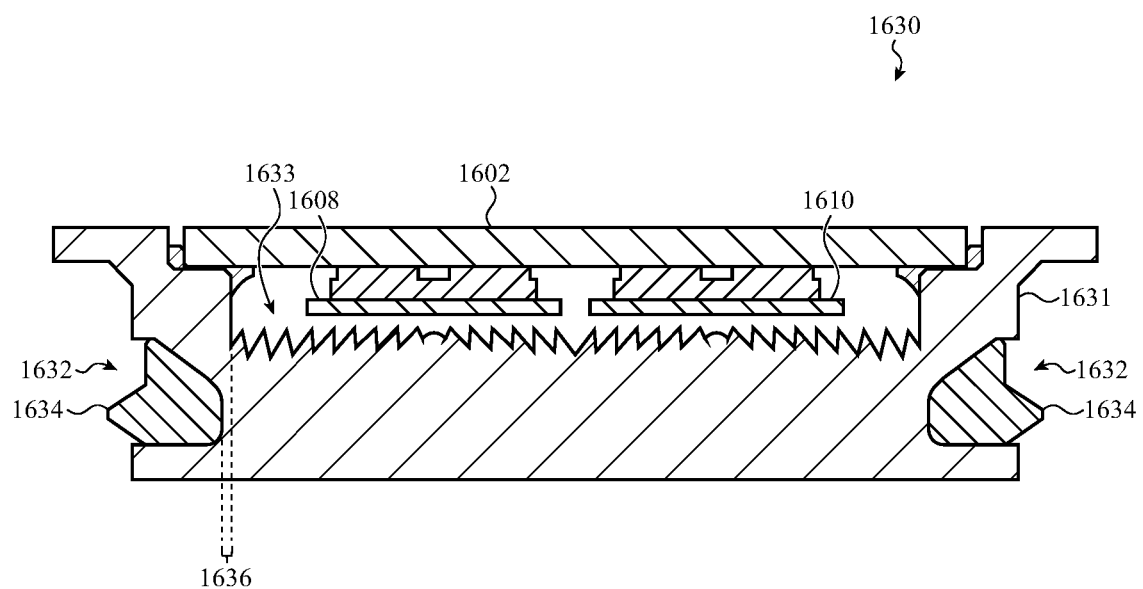
FIG. 16C depicts a partial cross-sectional view of another example flash module.

FIG. 16C is a partial cross-sectional view of a flash module 1630, showing a view similar to that of FIG. 16B. The flash module 1630 includes a differently configured carrier 1631 and compliant member 1634. In particular, the carrier 1631 may define a shaped recess 1632 in a sidewall, and the shaped recess 1632 is configured to receive a shaped compliant member 1634. The shaped compliant member 1634 may be molded in place in the recess 1632. For example, a flowable material, such as a polymer material, may be introduced into the shaped recess 1632 and allowed to at least partially cure to form the compliant member 1634. An external mold or other tool may surround the carrier 1631 during the polymer introduction and/or injection process to form the shape of the exterior surfaces of the compliant member 1634.

The shaped compliant member 1634 (and the shaped recess 1632) may extend further into the sidewall of the carrier 1631 than the compliant member 1620 and the recess 1618 in FIG. 16B. This configuration may allow the compliant member 1634, which may be opaque, to occlude or otherwise block the appearance of the internal components of the flash module 1630 and the internal components of a device more generally. For example, the shaped compliant member 1634 extends into the sidewall of the carrier 1631 such that there is a distance 1636 between the end of the shaped compliant member 1634 and the outer perimeter of the lens portion 1633 of the carrier 1631. By contrast, as shown in FIG. 16B, the compliant member 1620 may extend a shorter distance into the sidewall, resulting in a distance 1622 (which is greater than the distance 1636), thereby potentially allowing more visibility into the internals of the flash module and the device. The greater depth of the shaped recess 1632 and the increased size and the contoured shape of the compliant member 1634 may also result in a more dimensionally stable compliant member 1634 that can stay in a desired position through greater forces and deflections, as compared to an o-ring for example.

As with the carrier 1601, the carrier 1631 may be a single unitary piece of light transmissive material, such as glass, a light-transmissive polymer, sapphire, or the like. The flash module 1630 may also include the circuit board 1602 and the light emitting elements 1608 and 1610 (e.g., LEDs), and the circuit board 1602 may be attached to the carrier 1631 in the same or similar manner as the flash module 1630.

Figure 16D:
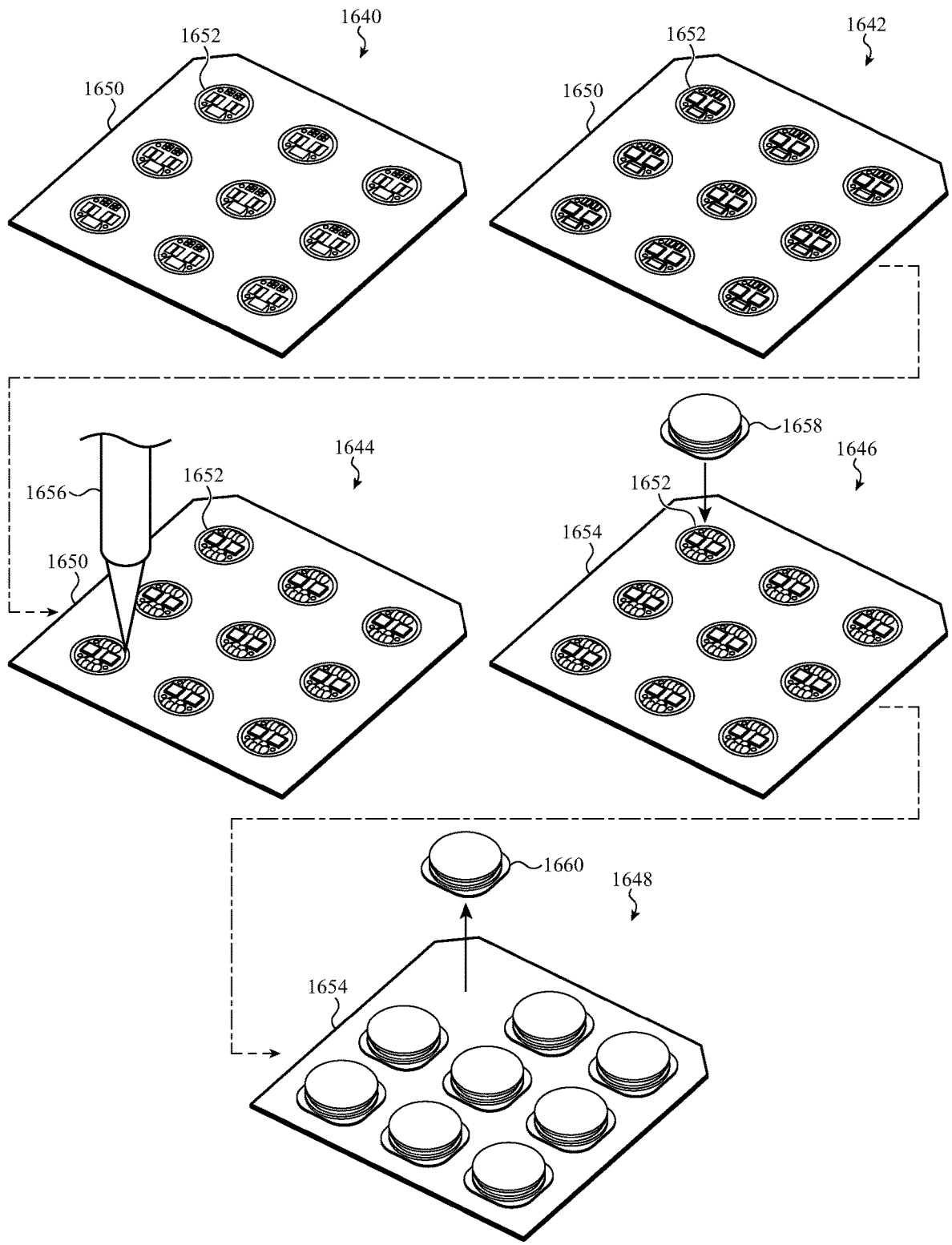
FIG. 16D depicts a process of assembling flash modules.

Flash modules may be manufactured by an assembly process in which the circuit boards are singulated from a base sheet and then attached to an adhesive sheet in an array for further assembly. FIG. 16D illustrates portions of the assembly process for the flash modules described herein. At state 1640, individual circuit boards 1652 for flash modules may be fabricated on a substrate 1650. The substrate 1650 may be a circuit board (e.g., a mother sheet), and the circuit boards 1652 may include traces, contact pads, and/or other conductive elements to facilitate electrical interconnection of the flash module's components.

At state 1642, electrical components of the flash module have been applied to the circuit boards 1652. The electrical components may be applied using surface mount technology (SMT) assembly processes, or any other suitable process. The electrical components may include, for example, processors, LEDs, integrated circuits, and/or other electrical components of the flash module.

At state 1644, the individual circuit boards 1652 are singulated from the substrate 1650 (e.g., with a cutter 1656, which may be a knife, laser, or the like) so that they can be applied to a temporary adhesive substrate 1654, as shown at state 1646. While on the temporary adhesive substrate 1654 (e.g., a silicone tape), carriers 1658 are attached to the circuit board 1652 (e.g., via an adhesive, as described above). State 1648 shows a completed flash module 1660 (which includes a circuit board, carrier, LEDs, and other components of a flash module) being removed from the temporary adhesive substrate 1654. The completed flash module 1660 may be subjected to further processing (e.g., applying mask layers, adhesives, etc.) and then assembled into a device such as a mobile phone.

By applying singulated circuit boards to the temporary adhesive substrate 1654 (e.g., in an array or grid pattern) as described in FIG. 16D, the process of attaching the carriers to the circuit boards may be performed using pick-and-place machinery, SMT machinery, and/or other automated machinery and assembly processes that may be faster and/or more efficient than other types of assembly processes (e.g., attaching carriers to singulated circuit boards that are free from one another).

The display in a device such as a mobile phone provides a large degree of the functionality of the device, but can also present challenges. For example, unwanted light leaks from the display may produce distracting and unattractive visual phenomenon. Accordingly, devices may include features and configurations to reduce or eliminate light leaks and/or the appearance of light leaks.

Figure 17A:
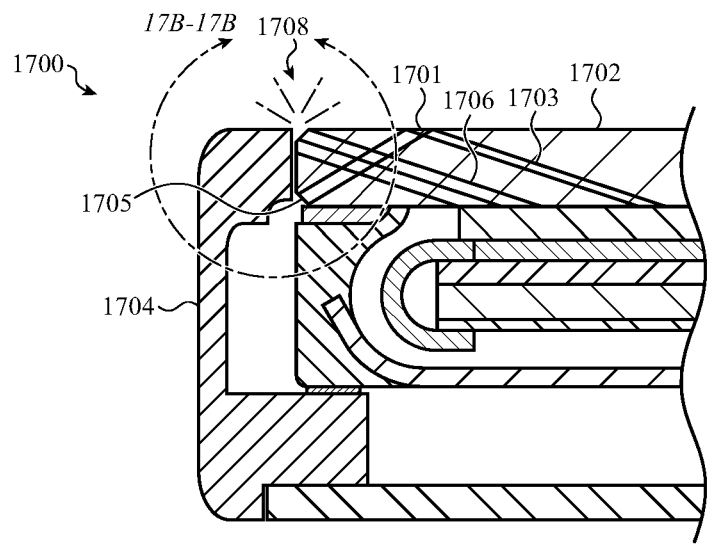
FIG. 17A depicts a partial cross-sectional view of an example electronic device.

FIG. 17A illustrates a partial cross-sectional view of a device 1700, which may be an embodiment of the device 600 or any other device described herein. Details of those devices may be equally applicable to the device 1700, and will not be repeated here for brevity. The device 1700 includes a cover 1702 and a housing member 1704, which may be embodiments of other covers and housing members described herein, and details of those components will not be repeated here for brevity. As noted above, some light that is emitted from a display during normal use of the display may propagate through the cover 1702 and exit the cover from a side, edge, or corner of the cover 1702. For example, FIG. 17A illustrates example light rays 1706 (which may ultimately originate from a display) that propagate towards the perimeter of the cover 1702 and ultimately exit from the cover 1702 to produce a light leak 1708. The light that exits the cover 1702 may exit the cover 1702 at various angles, such that a portion of the light 1706 reflects off of the housing member 1704 while another portion does not. Whereas the light rays 1706 are shown incident on a top or outer edge, light rays 1703, which may come from the display, may be incident on an inner or bottom edge 1705 of the cover 1702. The light rays 1703 may be reflected off of the edge 1705 (or otherwise illuminate the edge 1705) and may be visible through the cover 1702.

The portions of the housing members that are near the light leak areas (e.g., edges of the cover, which extend around the perimeter of the cover) may have shapes, textures, coatings, and/or other treatments or features that are configured to reduce or eliminate the amount and/or appearance of light leaks from a device. For example, FIGS. 17B-17G illustrate various examples of such configurations.

Figure 17B:
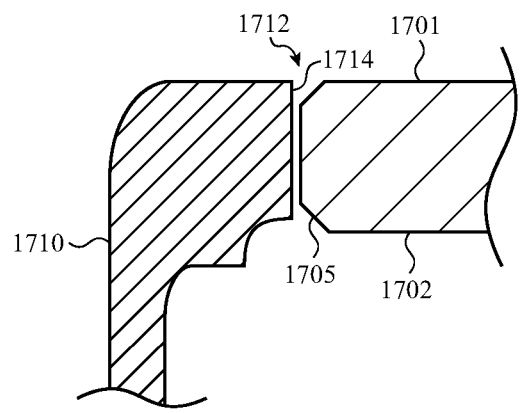
FIGS. 17B-17G depict partial cross-sectional views of housing members and cover configurations for electronic devices.

FIG. 17B, which may correspond generally to the area 17B-17B in FIG. 17A, illustrates an example housing member 1710 (which may be an embodiment of the housing member 1704 or any other housing member described herein) and the cover 1702. A corner region 1712 of the housing member 1710 may define a cover-facing surface 1714 that is substantially vertical (relative to the orientation shown in FIG. 17B), and/or is substantially perpendicular to a front exterior surface 1701 (also referred to as a top surface) of the cover 1702. As used herein, a cover-facing surface may refer to a surface of a housing member on which light that exits from a side or edge of the cover is incident or otherwise reflects off of.

A coating may be applied to all or some of the cover-facing surface 1714 to absorb, diffuse, or deflect light, or otherwise reduce the amount or visibility of light that is leaked from the cover 1702 onto the housing member 1704. For example, one or more layers of ink, dye, film, paint, deposited material (e.g., PVD or CVD layer), or other material may be adhered to, bonded to, formed on, or otherwise applied to all or some of the cover-facing surface 1714. As one specific example, a black coating on the cover-facing surface 1714 may absorb at least a portion of incident light from the cover 1702. In some cases, a coating may also or instead be applied to the edge 1705 (which may be a chamfered edge). The coating may include a black, opaque ink (one or more layers), which may be positioned on the bottom (or interior) surface of the cover 1702, the chamfered edge 1705, and a side surface (e.g., between the top and bottom chamfered edges of the cover 1702). Additional details of the coating on the cover 1702 are described with respect to FIGS. 17H-17I.

In some cases, instead of or in addition to a coating on the cover-facing surface 1714, the cover-facing surface 1714 may have a surface texture that is configured to absorb, diffusely reflect, or otherwise reduce the visibility of light leaked from the cover 1702. For example, the cover-facing surface 1714 may have a surface texture with a root mean square (RMS) height from about 0.1 microns to about 2.5 microns, from about 0.25 microns to about 2 microns, or from about 0.5 microns to about 2 microns. The surface texture may differ from the surface texture of other portions of the housing member, which may be smoother (e.g., have a lower RMS height, average roughness, or other surface parameter) than the textured portion of the cover-facing surface 1714. The surface texture may be formed in various ways, such as via machining, abrasive blasting, chemical etching, laser etching, or the like.

Other types of surface treatments may also be used. For example, a laser may be used to change the appearance of the cover-facing surface 1714, such as by darkening the surface, changing a color of the surface, or the like. Other types of treatments that may be used include anodizing, plating (e.g., electroplating), grinding, machining, abrasive blasting, oxidizing, or the like.

Figure 17C:
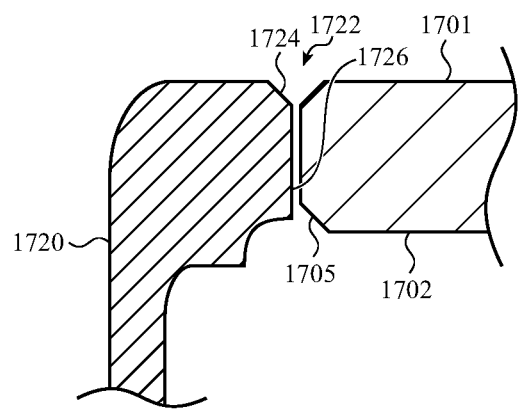

FIG. 17C, which may correspond generally to the area 17B-17B in FIG. 17A, illustrates an example housing member 1720 (which may be an embodiment of the housing member 1704 or any other housing member described herein) and the cover 1702. A corner region 1722 of the housing member 1720 may define a chamfer surface 1724 (which may be considered a cover-facing surface). For example, the chamfer surface 1724 may be non-perpendicular and non-parallel to a front exterior surface 1701 of the cover 1702. The chamfer surface 1724 may extend at an internal angle of about 135 degrees, relative to a cover-facing surface 1726 (which may be substantially perpendicular to the front exterior surface 1701 of the cover 1702), or at another suitable angle (e.g., as shown in FIGS. 17E and 17F). The angle of the chamfer surface 1724 may result in a more diffuse reflection or otherwise produce a less noticeable appearance of light leaked from the cover 1702. One or both of the chamfer surface 1724 and the cover-facing surface 1726 may include a coating, texture, and/or be subjected to other surface treatments, as described above with respect to FIG. 17B. In some cases, the surfaces may have different combinations of coating, texture, and/or surface treatments (e.g., one surface may have a different combination of coatings, textures, and/or surface treatments than another surface). In some cases, a coating may also or instead by applied to the edge 1705, as described herein.

Figure 17D:
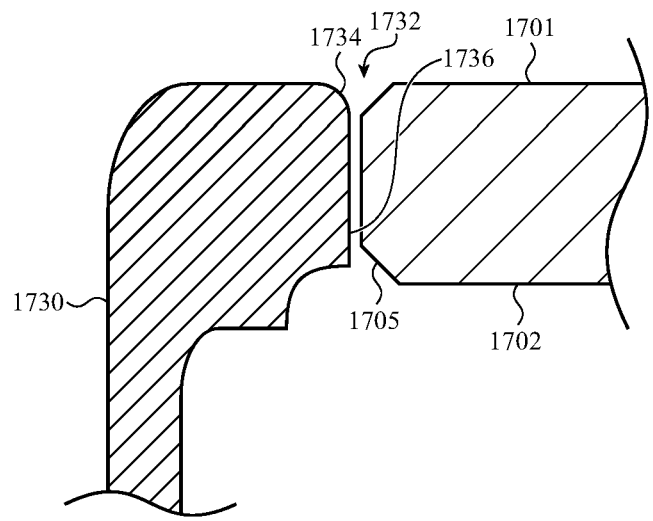
Figure 17E:
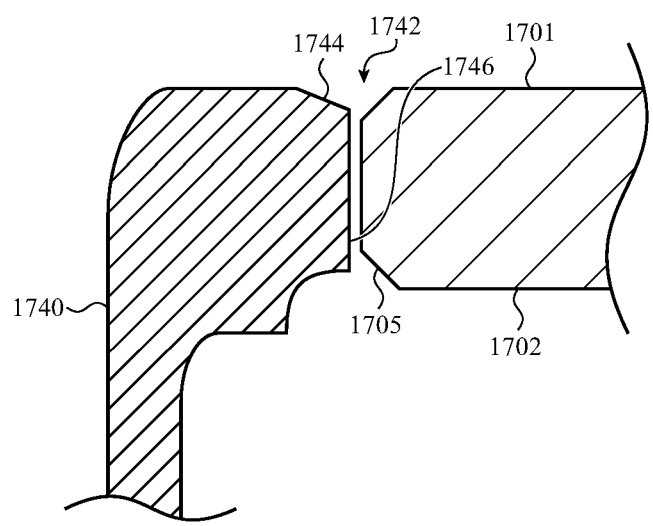
Figure 17F:
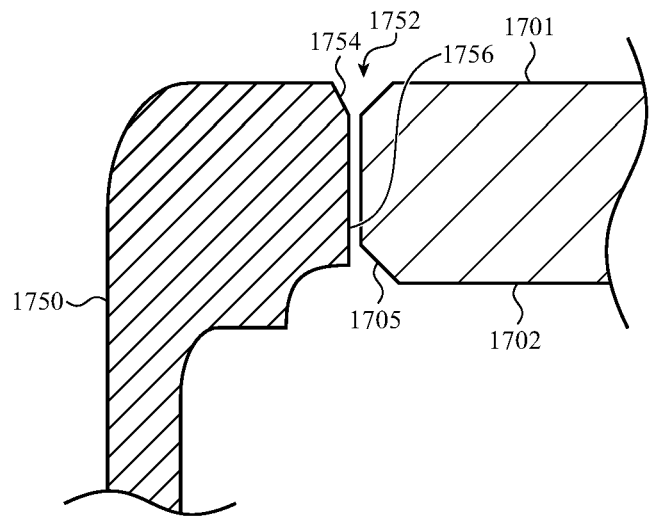

FIG. 17D, which may correspond generally to the area 17B-17B in FIG. 17A, illustrates an example housing member 1730 (which may be an embodiment of the housing member 1704 or any other housing member described herein) and the cover 1702. A corner region 1732 of the housing member 1730 may define a curved surface 1734 (which may be considered a cover-facing surface). For example, the curved surface 1734 may have a partially cylindrical shape, or have any other curved shape (e.g., a spline). In some implementations, the curved surface 1734 has a radius of curvature between about 5 microns and about 100 microns, between about 5 microns and about 75 microns, or between about 5 microns and about 50 microns. The curvature and/or shape of the curved surface 1734 may reduce the presence and/or appearance of light leaked from the cover 1702 and incident on the curved surface 1734. For example, a curved surface 1734 with a radius of curvature of about 100 microns or less (or about 50 microns or less) limits the surface area that could reflect light that is leaked from the cover 1702.

One or both of the curved surface 1734 and a cover-facing surface 1736 (which may be substantially perpendicular to the front exterior surface 1701 of the cover 1702) may include a coating, texture, and/or be subjected to other surface treatments, as described above with respect to FIG. 17B. In some cases, the surfaces may have different combinations of coating, texture, and/or surface treatments (e.g., one surface may have a different combination of coatings, textures, and/or surface treatments than another surface). In some cases, a coating may also or instead by applied to the edge 1705, as described herein.

While FIG. 17C illustrates a chamfer surface with an internal angle of about 135 degrees (e.g., a 45 degree chamfer), other angles may also be used. For example, FIG. 17E, which may correspond generally to the area 17B-17B in FIG. 17A, illustrates an example housing member 1740 (which may be an embodiment of the housing member 1704 or any other housing member described herein) and the cover 1702. A corner region 1742 of the housing member 1740 may define a chamfer surface 1744 (which may be considered a cover-facing surface). The chamfer surface 1744 may be non-perpendicular and non-parallel to a front exterior surface 1701 of the cover 1702. The chamfer surface 1744 may extend at a different angle from a cover-facing surface 1746 (which may be substantially perpendicular to the front exterior surface 1701 of the cover 1702) as compared to the chamfer surface 1724 in FIG. 17C. For example, the internal angle between the chamfer surface 1744 and the cover-facing surface 1746 may be between about 135 degrees and about 90 degrees. The angle of the chamfer surface 1744 may result in a more diffuse reflection or otherwise produce a less noticeable appearance of light leaked from the cover 1702. One or both of the chamfer surface 1744 and the cover-facing surface 1746 may include a coating, texture, and/or be subjected to other surface treatments, as described above with respect to FIG. 17B. In some cases, the surfaces may have different combinations of coating, texture, and/or surface treatments (e.g., one surface may have a different combination of coatings, textures, and/or surface treatments than another surface). In some cases, a coating may also or instead by applied to the edge 1705, as described herein.

FIG. 17F, which may correspond generally to the area 17B-17B in FIG. 17A, illustrates an example housing member 1750 (which may be an embodiment of the housing member 1704 or any other housing member described herein) and the cover 1702. A corner region 1752 of the housing member 1750 may define a chamfer surface 1754 (which may be considered a cover-facing surface). The chamfer surface 1754 may be non-perpendicular and non-parallel to a front exterior surface 1701 of the cover 1702. The chamfer surface 1754 may extend at a different angle from a cover-facing surface 1756 (which may be substantially perpendicular to the front exterior surface 1701 of the cover 1702) as compared to the chamfer surface 1724 in FIG. 17C. For example, the internal angle between the chamfer surface 1754 and the cover-facing surface 1756 may be between about 135 degrees and about 180 degrees. The angle of the chamfer surface 1754 may result in a more diffuse reflection or otherwise produce a less noticeable appearance of light leaked from the cover 1702. One or both of the chamfer surface 1754 and the cover-facing surface 1756 may include a coating, texture, and/or be subjected to other surface treatments, as described above with respect to FIG. 17B. In some cases, the surfaces may have different combinations of coating, texture, and/or surface treatments (e.g., one surface may have a different combination of coatings, textures, and/or surface treatments than another surface). In some cases, a coating may also or instead be applied to the edge 1705, as described herein.

Figure 17G:
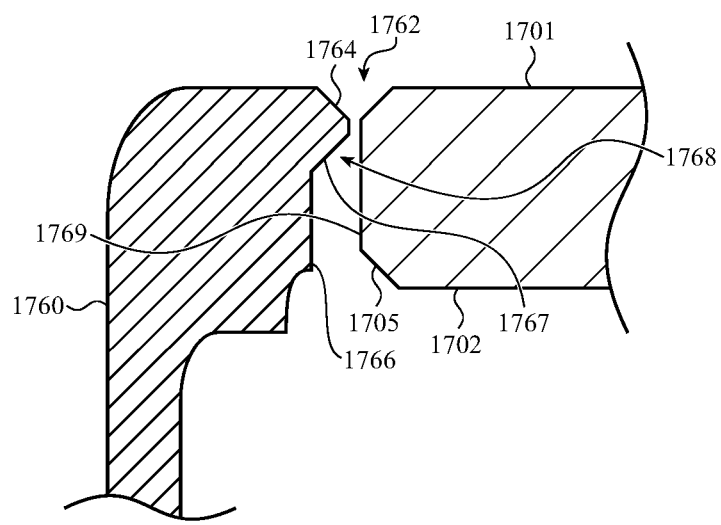

FIG. 17G, which may correspond generally to the area 17B-17B in FIG. 17A, illustrates an example housing member 1760 (which may be an embodiment of the housing member 1704 or any other housing member described herein) and the cover 1702. A corner region 1762 of the housing member 1760 may define a chamfer surface 1764 (which may be considered a cover-facing surface). The chamfer surface 1764 may be non-perpendicular and non-parallel to a front exterior surface 1701 of the cover 1702. The chamfer surface 1764 may extend at any suitable angle (e.g., with an internal angle between about 90 degrees and about 180 degrees) from a cover-facing surface 1766 (which may be substantially perpendicular to the front exterior surface 1701 of the cover 1702). The housing member 1760 may also define an undercut region 1768. The undercut region 1768 may be below the corner region 1762 (e.g., further towards the interior of the device as compared to the corner region 1762), and may include an additional chamfer surface 1767 (which may have any suitable angle). The undercut region 1768 may help absorb, reflect, and/or deflect light that exits the cover 1702 from a side surface 1769 of the cover 1702. For example, the undercut region 1768 may reflect leaked light inwardly (e.g., generally towards the interior of the device), thereby reducing the amount and/or intensity of leaked light that is visible to the user. One or more of the chamfer surface 1764, the additional chamfer surface 1767, and a cover-facing surface 1766 may include a coating, texture, and/or be subjected to other surface treatments, as described above with respect to FIG. 17B. In some cases, the surfaces may have different combinations of coating, texture, and/or surface treatments (e.g., one surface may have a different combination of coatings, textures, and/or surface treatments than another surface). In some cases, a coating may also or instead by applied to the edge 1705, as described herein.

Figure 17H:
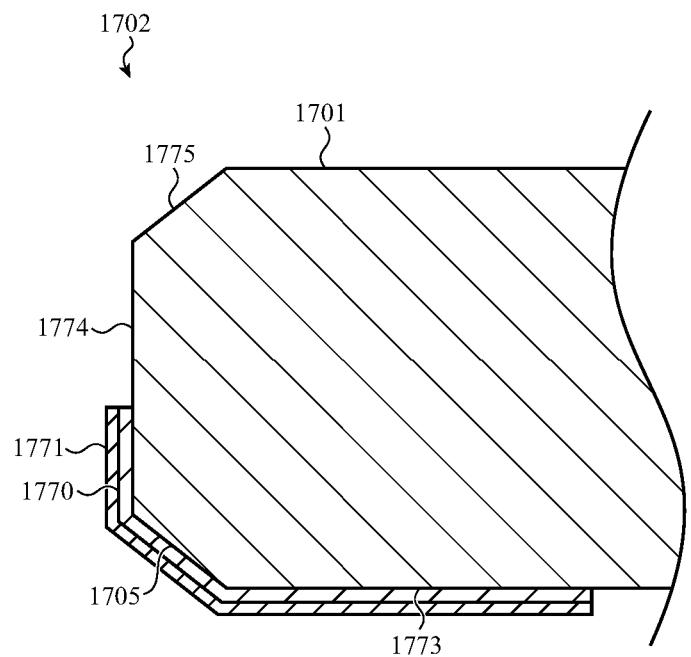
FIGS. 17H-17I depict partial cross-sectional views of covers for electronic devices.

FIG. 17H illustrates a partial cross-sectional view of the cover 1702, illustrating an example configuration for the edges of the cover 1702 and a coating to prevent light leaks through the cover 1702. The cover 1702 may define a front surface 1701, which may also be referred to as a top surface of the cover 1702, that defines a portion of the exterior front surface of a device. The cover 1702 may also define a bottom surface 1773 that is opposite the front surface 1701. The cover 1702 may also define a peripheral side surface 1774. The cover 1702 may also define a first chamfered edge 1705 extending from the bottom surface 1773 to the peripheral side surface 1774, and a second chamfered edge 1775 extending from the top surface 1701 to the peripheral side surface 1774.

A coating 1770, such as an opaque coating, may be positioned on a portion of the bottom surface 1773, the first chamfered edge 1705, and at least a portion of the peripheral side surface 1774 (and optionally all of the peripheral side surface). The coating 1770 may be configured to absorb light emitted by the display stack and incident on the chamfered edge 1705 (and/or the apexes where the chamfered edge 1705 meets the peripheral side surface 1774 and the bottom surface 1773). The coating 1770 may include a layer of ink, such as an opaque, black ink, having an average thickness of about 5 microns. The coating 1770 may have a minimum thickness between about 1.5 microns and about 10 microns. In some cases, the coating 1770 includes multiple layers of ink. The coating 1770 may also include films, sheets, dyes, deposited coatings (e.g., plasma vapor deposition, chemical vapor deposition), or the like.

A cover layer 1771 may cover at least a portion of the coating 1770 along the bottom surface 1773, chamfered edge 1705, and peripheral side surface 1774. The cover layer 1771 may protect the coating 1770 from damage or wear during handling, assembly, and manufacturing. The cover layer 1771 may be a transparent coating, an opaque coating, or the like. The cover layer 1771 may be an acrylic resin, an epoxy, a film, a sheet, or any other suitable material. The cover layer 1771 may have a higher ductility than the coating 1770, and as such may be more resistant to damage than the coating 1770 itself.

Figure 17I:
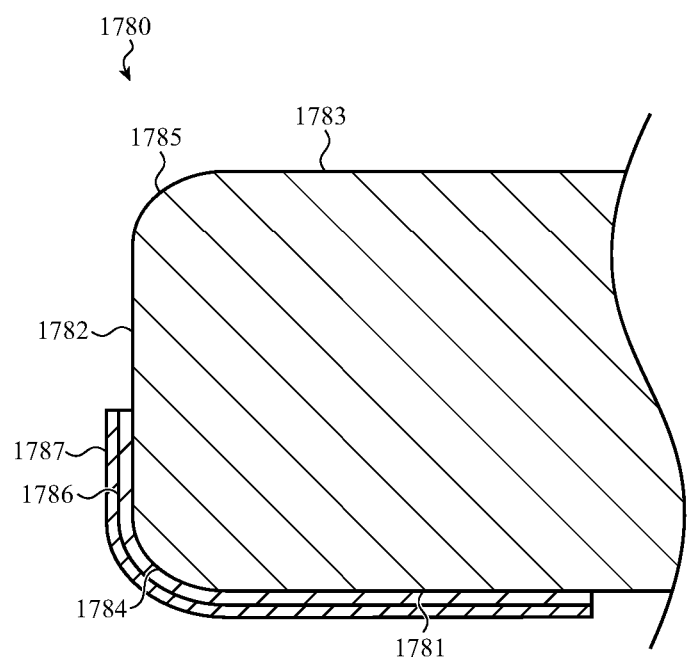

FIG. 17I illustrates a partial cross-sectional view of a cover 1780, which is similar to the cover 1702 in FIG. 17H but includes rounded chamfered edges 1784, 1785. The cover 1780 also defines a front surface 1783, which may also be referred to as a top surface of the cover 1780, that defines a portion of the exterior front surface of a device. The cover 1780 may also define a bottom surface 1781 that is opposite the front surface 1783. The cover 1780 may also define a peripheral side surface 1782. A coating 1786 may be positioned on a portion of the bottom surface 1781, a portion of the peripheral side surface 1782, and the rounded chamfered edge 1784, and a cover layer 1787 may be positioned on the coating 1786. The coating 1786 and the cover layer 1787 may be embodiments of the coating 1770 and the cover layer 1771, and the details of the coating 1770 and the cover layer 1771 will not be repeated here for brevity.

The rounded chamfers 1784 and 1785 may have a non-circular shape. For example, the rounded chamfers 1784 and 1785 may be defined by a spline defined by a varying (e.g., non-constant) radii of curvature. In some cases, the rounded chamfers 1784 and 1785 are mirror images of one another and are formed simultaneously (e.g., by a grinding operation).

Devices as described herein may include speakers to produce audio output that may be perceived by a user. Such audio output may include, for example, music, notifications (e.g., ringtones, incoming message notification sounds, etc.), voice communications, audio content of videos, etc. Because speakers need to be acoustically and/or fluidly coupled to the external environment, the physical interface between an internal speaker module and the external environment may require adequate sealing in order to prevent ingress of water, sweat, dust, and/or other contaminants into the device. Further, speaker modules may need to be replaced and/or repaired periodically, and as such it may be advantageous to physically integrate speaker modules into the device in a manner that facilitates access and removal operations.

As noted above, devices such as the mobile phones described herein may include haptic actuators that produce haptic outputs. A haptic actuator may include a movable mass and an actuation system that is configured to move the mass to produce the haptic output. The moveable mass must therefore have enough mass (relative to the device in which it is integrated) and must move enough distance to produce a suitably noticeable haptic output (e.g., one that a user can physically detect, optionally while in a pocket or in a purse). These operational constraints thus limit the extent to which the size of the actuator can be reduced, as it may not be feasible or preferable to have a movable mass that is less than a certain threshold mass or to reduce the distance that the mass is able to move. However, space inside modern electronic devices, such as smartphones, is at a premium. Accordingly, techniques for reducing the size of a haptic actuator without reducing its effectiveness may be particularly useful in reducing the overall sizes of devices and/or for fitting more features or components into devices of the same size.

Figure 18:
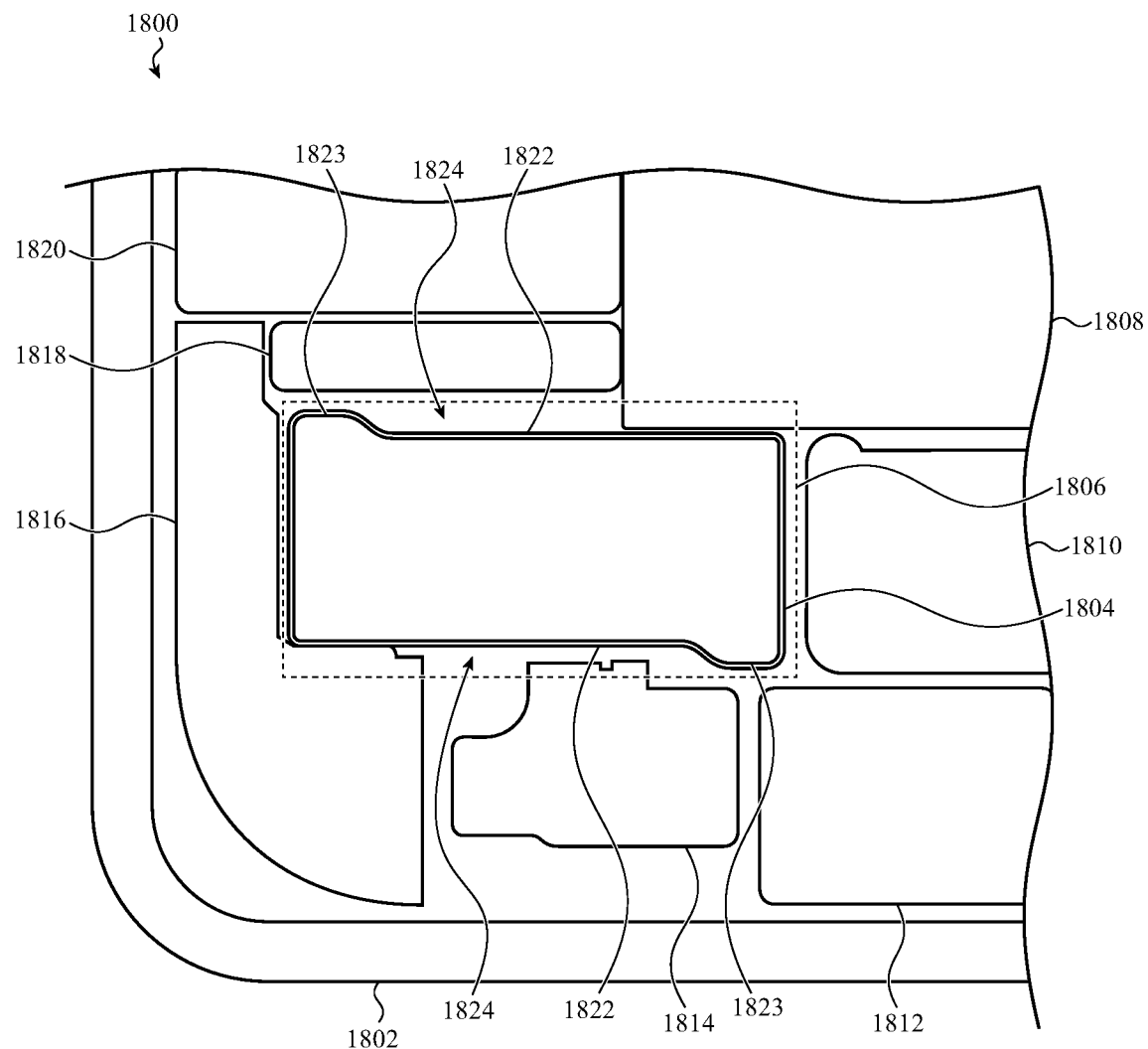
FIG. 18 depicts a partial view of an interior of an example electronic device.

FIG. 18 illustrates an example arrangement of components in a device 1800. FIG. 18 may correspond to a corner of a device (e.g., the device 300), viewed with the cover and display removed to show the arrangement of various example internal components. The device 1800 may include a housing 1802 at least partially defining an interior volume. The device 1800 may also include a haptic actuator 1804, a battery 1808, a speaker module 1810, a first component 1812, a second component 1814, a third component 1816, a fourth component 1818, and a fifth component 1820. The first through fifth components may be any suitable electrical and/or structural components, systems, circuit elements (e.g., circuit boards), or the like. For example, the first component 1812 may be a circuit board or part of a circuit board that includes circuitry for a charging port of the device 1800 (and/or other suitable components). The second component 1814 may be a circuit board or part of a circuit board that includes a pressure sensor and a microphone (and/or other suitable components). In some cases, the second component 1814 may also include a water-resistant air-permeable membrane that is positioned over an opening in the housing 1802 to allow air to pass into and out of the device 1800, while preventing water and other liquids or contaminants into the device 1800.

The third component 1816 may be a circuit board or part of a circuit board that includes communications components, such as antennas, processors, memory, analog-to-digital converters, filters, amplifiers, power control circuitry, or the like. In some cases, the communications components may be configured to facilitate WiFi communications (or other communication protocols).

The fourth component 1818 may be a circuit board or part of a circuit board, or another component. In some cases, the fourth component 1818 is a shield, cowling, board-to-board connector, a structural component (e.g., a mounting member or flange, an alignment spring), or the like.

The fifth component 1820 may be a portion of a logic board. The logic board may include a substrate, and processors, memory, and other circuit elements coupled to the substrate. Where the fifth component 1820 is a logic board, it may include multiple circuit substrates that are stacked and coupled together. The fifth component 1820 may include provisions for a subscriber identity module (SIM). The fifth component 1820 may include electrical contacts and/or a SIM tray assembly for receiving a physical SIM card and/or the fifth component 1820 may include provisions for an electronic SIM.

In order to reduce the amount of space required for the haptic actuator 1804 while also maintaining its effectiveness in producing haptic outputs, the haptic actuator 1804 may include an outer housing with a non-rectangular shape. For example, instead of a rectangular shape (as shown by the dotted box 1806), the haptic actuator 1804 may include a peripheral side member with protruding portions 1823 and recessed portions 1822. The protruding portions of the peripheral side member define recessed regions 1824, which may be occupied by other components of the device 1800. For example, as shown, the recessed regions 1824 allow components such as the battery 1808, the second component 1814, and the third component 1816 to be larger and/or positioned more compactly arranged than would be possible if the haptic actuator 1804 had a parallelogram shape (as illustrated by the box 1806). As described with respect to FIG. 19A, the protruding portions 1823 may provide a space for springs of the haptic actuator to extend into, thus allowing the recessed portions 1822 to be positioned closer to the movable mass, thereby reducing the amount of empty space within the haptic actuator 1804.

Figure 19A:
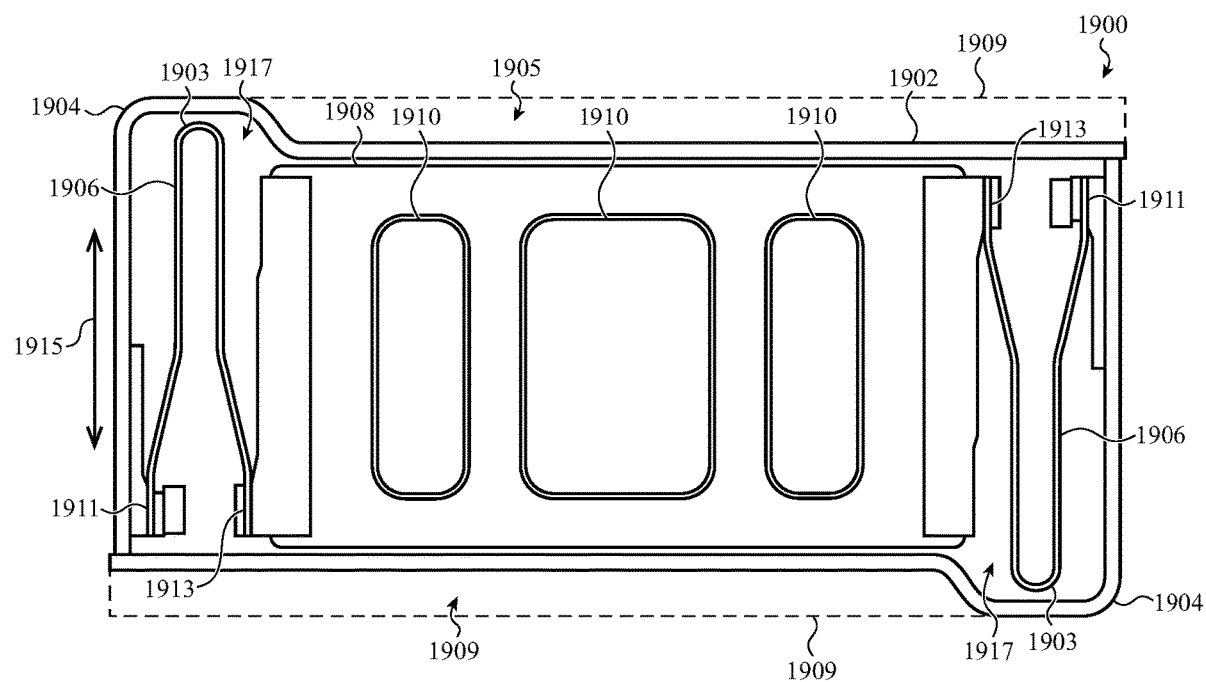
FIG. 19A depicts an example haptic actuator for an example electronic device.

FIG. 19A illustrates a portion of a haptic actuator 1900, which may be or may be an embodiment of the haptic actuator 1804 in FIG. 18. The haptic actuator 1900 is shown without a top member or cover to reveal internal components of the haptic actuator 1900.

The haptic actuator 1900 includes a housing 1902 (of which a peripheral side member is shown), which may be formed of metal, polymer, or any other suitable material. The haptic actuator also includes a movable mass 1908. The movable mass 1908 may include one or more magnets 1910 coupled thereto. The magnets 1910 may produce a magnetic field, and the haptic actuator 1900 may also include coils (e.g., coupled to the top member or cover of the haptic actuator 1900). The coils and the magnets 1910 may interact with one another to produce a force on the movable mass 1908 to cause the movable mass to move (e.g., along a left-right direction, as oriented in FIG. 19A) to produce a haptic output. In some cases, the haptic actuator 1900 is a Lorentz force actuator.

The haptic actuator 1900 also includes springs 1906. The springs 1906 may be formed from metal, a polymer, or another suitably compliant material. The springs 1906 may provide a return force to the movable mass 1908 during actuation (e.g., left-right movement) of the movable mass 1908. Due to the physical attachment between the movable mass 1908 and the housing 1902, the springs 1906 may impart the force or impulse of the movable mass 1908 to the housing 1902, which in turn results in the force or impulse being imparted to the device more generally to produce the desired haptic output.

The springs 1906 may also physically maintain the movable mass 1908 in a central or rest position when the movable mass 1908 is not being moved to produce a haptic output. The springs 1906 may provide structural support in the direction into and out of the page (e.g., the z-direction), such that the movable mass 1908 does not rest or slide against top and bottom members or covers of the haptic actuator 1900. The springs 1906 may be secured to the housing 1902 and to the movable mass 1908. For example, the first ends of the springs 1906 may be secured to first locations 1911 on an interior of the housing 1902, and the second ends of the springs 1906 may be secured to second locations 1913 on the movable mass 1908.

The performance of the springs 1906, including parameters such as spring constant, cycle limit, or the like, may depend at least in part on the size and shape of the springs 1906. In some cases, for example, shortening the springs 1906 along the height direction 1915, for example, may change the spring rate or reduce the cycle limit of the springs 1906. Accordingly, simply shortening the springs 1906 to allow the housing 1902 to be reduced in size may result in unsatisfactory operation and/or lifespan of the haptic actuator 1900. In order to reduce the footprint of the haptic actuator 1900 while providing for springs that are longer in the height direction 1915, the housing 1902 includes outwardly protruding features 1904. The protruding features 1904 define internal areas or recesses 1917 into which a portion of the springs 1906 extend. As shown, bend portions 1903 of the springs 1906 extend into the recesses 1917, though other spring designs may have other portions of the springs extending into the recesses 1917. As described above with respect to FIG. 18, by including the protruding features 1904 in the peripheral side member of the housing 1902, another portion of the peripheral side member may define recessed portions 1905 of the housing 1902. Stated another way, the protruding portions 1904 and recessed portions 1905 may generally conform to or follow the contour of the outer perimeter of the internal components of the haptic actuator 1900. A distance between the inner surface of the recessed portions of the peripheral side member of the housing 1902 and the movable mass 1908 may be less than about 1.0 mm, less than about 0.8 mm, less than about 0.5 mm, or less than about 0.3 mm.

The recessed portions 1905 result in a haptic actuator that occupies less space than one in which a housing is formed as a rectangle (or otherwise does not have the protruding and recessed portions). For example, lines 1909 show an example location of the peripheral side member of a housing that lacks the protruding and recessed portions of the haptic actuator 1900. In that case, the housing would enclose empty space that could otherwise be used for other components of the device (e.g., allowing increased battery size or the like).

Figure 19B:
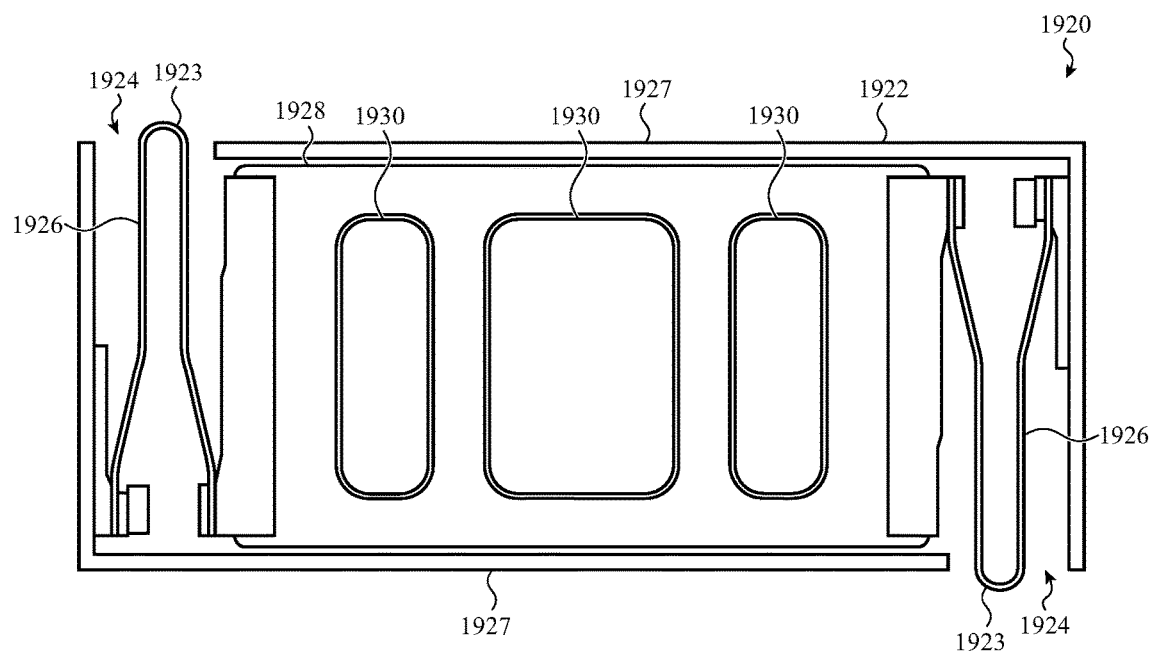
FIG. 19B depicts another example haptic actuator for an example electronic device.

FIG. 19B illustrates another example haptic actuator 1920 that minimizes or reduces the amount of empty space enclosed by the peripheral side member of the actuator housing. The haptic actuator 1920 includes a housing 1922, which may be formed of metal, polymer, or any other suitable material. The haptic actuator also includes a movable mass 1928 which may include magnets 1930. The movable mass 1928 and magnets 1930 may be the same as or similar to the movable mass 1908 and magnets 1910 of FIG. 19A, and the details of these components will not be repeated here for brevity. The haptic actuator 1920 also includes springs 1926. The springs 1926 may be formed from metal, a polymer, or another suitably compliant material. The springs 1926 may be the same as or similar to the springs 1906 of FIG. 19A, and the details of these components will not be repeated here for brevity.

Whereas the housing 1902 in FIG. 19A defines protruding portions (and associated recessed portions) to provide space for the springs while also reducing the amount of unused space inside the actuator, the housing 1922 in FIG. 19B defines openings 1924 to accommodate the bend portions 1923 of the springs 1926. In particular, the portions of the springs 1926 that extend past the movable mass 1928 extend through the openings 1924. This allows the peripheral side member 1927 to conform to the shape of the movable mass 1928. A distance between the inner surface of the peripheral side member 1927 and the movable mass 1928 may be less than about 1.0 mm, less than about 0.8 mm, less than about 0.5 mm, or less than about 0.3 mm.

Covers may be attached to the housing 1922 over the openings 1924. The covers may enclose or seal the housing 1922, for example, to prevent ingress of contaminants into the haptic actuator 1920. The covers may be flexible components, such as flexible films, fabrics, polymers, or the like, and may be configured to conform to and/or contact the bend portions 1923 of the springs.

Figure 20A:
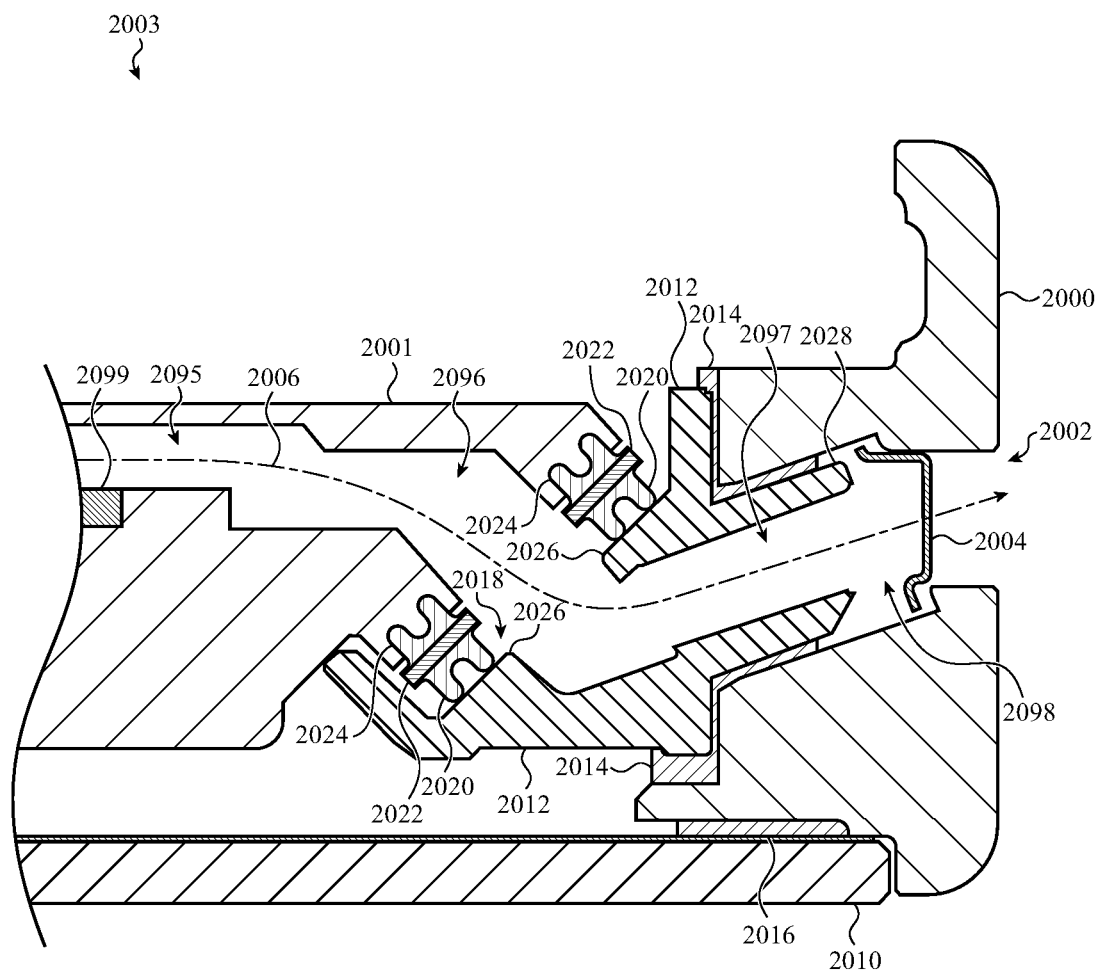
FIG. 20A depicts a partial cross-sectional view of a speaker portion of an example electronic device.

FIG. 20A is a partial cross-sectional view of a device 2003, which may be an embodiment of the device 700 in FIG. 7. Accordingly, FIG. 20A illustrates the device 2003 viewed along a line analogous to line 20-20 in FIG. 7. The device 2003 includes a housing member 2000, which may be an embodiment of the housing member 705 in FIG. 7. The housing member 2000 may be coupled to a rear cover 2010 via an adhesive 2016, as described herein. The housing member 2000 may define a speaker hole 2002 (which may correspond to or be analogous to the speaker holes 751, FIG. 7) that extends through the housing member 2000. The speaker hole 2002 may be fluidly coupled to a speaker module 2001 to allow sound (e.g., propagating pressure waves in air) from the speaker module 2001 to exit the device. The speaker module 2001 may correspond to or be an embodiment of a speaker module 752, FIG. 7). The housing member 2000 may define a plurality of speaker holes (as shown in FIG. 7), or a single speaker hole. A speaker hole cover 2004 may be positioned in, may cover, or may otherwise shield the speaker hole 2002. The speaker hole cover 2004 may inhibit ingress of water, dust, and/or other debris or contaminants, while still allowing sound to exit the device 2003 through the speaker hole 2002. The speaker hole cover 2004 may include a mesh screen, a semi-permeable membrane, and/or other suitable components. The speaker hole cover 2004 (and/or the device 2003 more generally) may also include springs, brackets, clips, and/or other features or components to secure the speaker hole cover 2004 to the housing member 2000.

The device 2003 may include a speaker module bracket 2012 (also referred to simply as a bracket 2012) coupled to the housing member 2000. The bracket 2012 may be coupled to the housing member 2000 via an adhesive 2014 (e.g., a PSA, HSA, adhesive film, epoxy, or the like). The bracket 2012 may define a protruding portion 2028 that extends at least partially into the speaker hole 2002 to facilitate a rigid and secure coupling between the bracket 2012 and the housing member 2000.

The device 2003 may also include a speaker module 2001 that is coupled to the device housing and produces sound. The speaker module 2001 may include a speaker driver 2099 that produces the sound. The speaker module 2001 may be secured to the housing via screws, bolts, clips, adhesives, and/or other fasteners.

The speaker driver 2099 may be configured to output sound in a direction transverse to the main plane of the device 2003 (e.g., towards the front or rear covers, or upward or downward in the orientation shown in FIG. 20A). The direction of sound output may also be described as being parallel to a side exterior surface defined by the housing member 2000. The sound waves may be redirected through a channel and towards the speaker hole 2002 along the path 2006. For example, the housing member 2000 may define a first channel portion 2098, the bracket 2012 may define a second channel portion 2097, and the speaker module 2001 may define a third channel portion 2096 and a fourth channel portion 2095. The first channel portion 2098 may extend along a first direction that is oblique (e.g., not parallel to and not perpendicular to) the exterior side surface defined by the housing member 2000. The second channel portion 2097 may extend along substantially the same direction as the first channel portion 2098. The third channel portion 2096 may extend along a second direction that is different from the first direction, and the fourth channel portion 2095 may extend along a third direction that is different from the first and second directions. The serpentine-like path 2006 that is defined by the various channel portions may facilitate the porting of sound from the speaker driver 2099 (which may be perpendicular to the front cover of the device) to the speaker hole 2002, which is positioned at a middle of a side surface of the housing member 2000 (which is perpendicular to the front cover of the device).

The device 2003 may also include a sealing assembly 2018 that contacts the speaker module 2001 and a sealing interface surface 2026 of the bracket 2012 to produce a seal between the speaker module 2001 and the bracket 2012. This may perform several functions. For example, the seal provided by the sealing assembly 2018 may produce an acoustic seal along the sound path 2006 (e.g., the channel or chamber through which sound passes when travelling from the speaker module 2001 to the speaker hole 2002). The acoustic seal may prevent or limit air from escaping the sound path 2006 and entering the interior of the device, as such escaping air may negatively impact the efficiency, acoustic quality, or other property of the speaker module 2001. The seal provided by the sealing assembly 2018 may also help inhibit any liquid, debris, or other contaminant that may reach the sound path 2006 from escaping into other internal areas of the device 2003.

The sealing assembly 2018 may include a carrier 2022, a first compliant portion 2020, and a second compliant portion 2024. The carrier 2022 may be a stiff material or combination of materials (relative to the compliant portions 2020, 2024, for example). For example, the carrier 2022 may be formed from a polycarbonate material, a metal sheet, or the like. The first and second compliant portions 2020, 2024 may be formed from or include a foam, elastomer, rubber, or other material that can conform to and/or seal against the sealing surface 2026 and a surface of the speaker module 2001. The first and second compliant portions 2020, 2024 may be co-molded with the carrier 2022 to secure the compliant portions 2020, 2024 to the carrier 2022 and produce a single assembly that can be attached to or otherwise assembled with the device 2003. The first and second compliant portions 2020, 2024 may also or instead be secured to the carrier 2022 with adhesives or other fastening components. The compliant portions 2020, 2024 may be a monolithic structure (e.g., they may be different portions of a single compliant material structure), or they may be separate components (e.g., two separate pieces of compliant material each attached to the carrier 2022).

The sealing assembly 2018 may be attached to the speaker module 2001 (e.g., via adhesive, mechanical fasteners, etc.), or it may be held in place by force (e.g., by being compressed between the speaker module 2001 and the bracket 2012). In either configuration, the sealing assembly 2018 may be forced into contact with the speaker module 2001 and the sealing surface 2026 in order to at least partially deform the material of the compliant portions 2020, 2024 and conform them to the speaker module 2001 and the sealing surface 2026. More particularly, when the speaker module 2001 is fastened to the device 2003 and fixed in position, the distance between the speaker module 2001 and the sealing surface 2026 may be smaller than the associated dimension of the sealing assembly 2018. Accordingly, the sealing assembly 2018 is ultimately compressed between the sealing surface 2026 and the speaker module 2001, thereby forming the desired seal between the components.

As noted above, the speaker module 2001 may be removable from the device 2003 to facilitate repair and/or replacement operations. Further, the speaker module 2001 may be assembled by positioning the speaker module 2001 in place in the device housing and securing the speaker module 2001 to the device 2003. It may therefore be advantageous to configure the speaker module 2001 and the device 2003 more generally so that the speaker module 2001 may be installed and/or removed simply and without interfering with other components. Accordingly, the speaker module 2001 and the bracket 2012 are configured so that the speaker module 2001 can be removed by lifting the speaker module 2001 vertically out of the device 2003, and without requiring significant horizontal movement. In particular, the sealing surface 2026 of the bracket 2012 and a bracket interface portion 2030 of the speaker module 2001 (see FIG. 20B) are angled such that the speaker module 2001 may be attached and/or detached from the device 2003 using a vertical movement of the speaker module 2001. For example, the sealing surface 2026 may define a plane that is non-parallel and non-perpendicular to a plane defined by the exterior surface of the rear cover 2010. In some cases the plane defined by the sealing surface 2026 may be angled at about 45 degrees relative to the exterior surface of the rear cover 2010. The oblique angle of the sealing surface 2026 (and thus of the interface between the sealing surface 2026 and the bracket interface portion 2030 of the speaker module 2001) may facilitate vertical installation and removal operations, while also providing a relatively unobstructed sound path 2006. By contrast, if the angle were perpendicular to the exterior surface of the rear cover, installation and removal of the speaker module may require a horizontal movement component (or a greater horizontal movement component), making installation and removal of the speaker module 2001 more difficult and inconvenient, and if the angle were parallel to the exterior surface of the rear cover, the sound path 2006 may require sharper corners, angles, and/or turns, which may negatively impact acoustic performance.

Figure 20B:
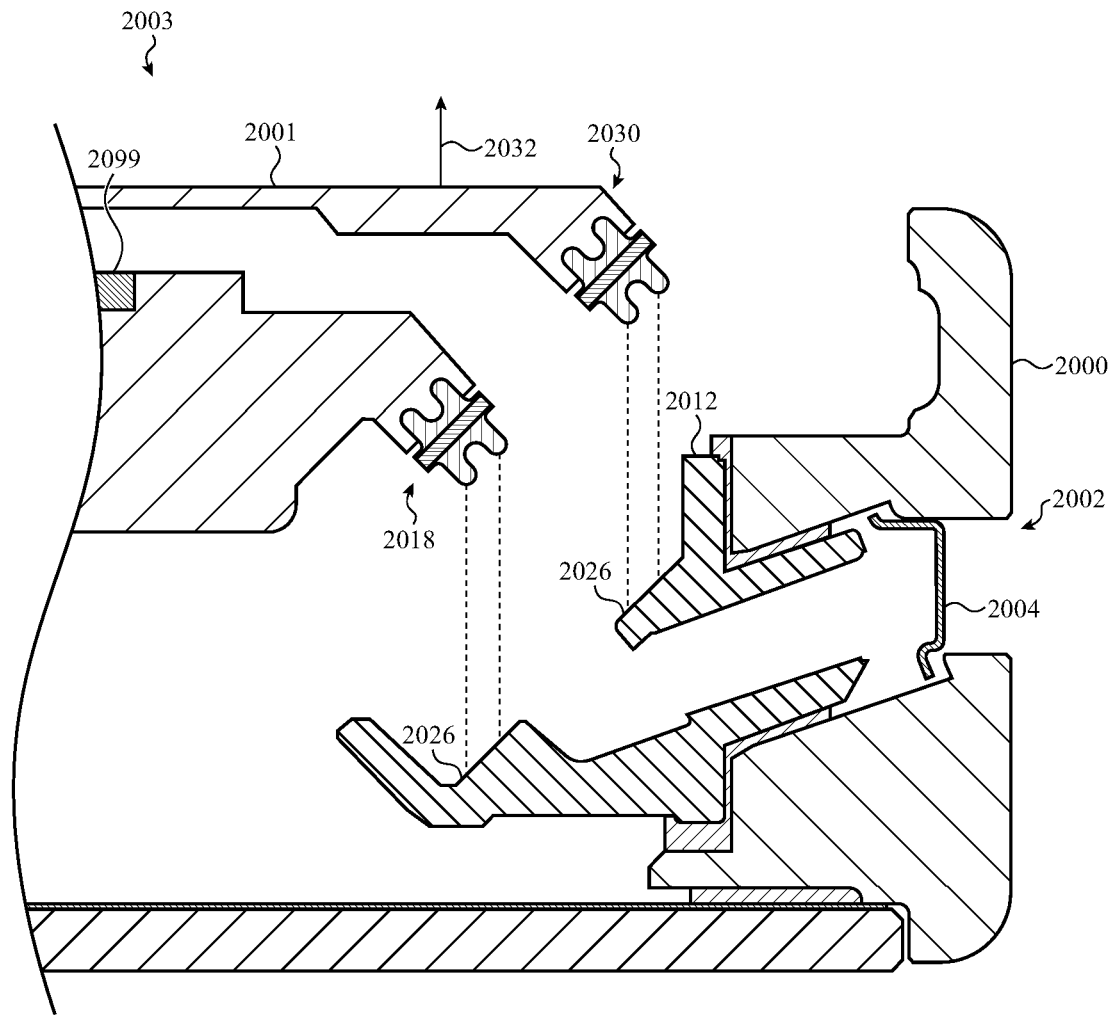
FIG. 20B depicts an exploded view of the electronic device of FIG. 20A.

The angled interface, as well as the configuration of the sound path 2006, as shown in FIG. 20B may be selected so that the speaker hole 2002 is positioned at a central position (vertically) in the housing member 2000. By positioning the speaker hole 2002 in or near the vertical middle of the housing member 2000, the housing member 2000 may have more uniform structural properties (e.g., strength, stiffness, etc.) than would be the case if the speaker hole 2002 were offset vertically towards the top or bottom of the housing member 2000 (e.g., because the amount of material above and below the speaker hole 2002 would not be the same).

FIG. 20B illustrates the speaker module 2001 removed from the device 2003. In particular, the speaker module 2001 has been translated along a vertical path 2032 (relative to the orientation shown in FIG. 20B). FIG. 20B illustrates how the oblique angle of the sealing surface 2026 facilitates a removal direction (and thus also an installation direction) that requires little or no horizontal motion of the speaker module 2001. In some cases, the speaker module 2001 can be placed in contact with the sealing surface 2026 (and/or against the sealing assembly 2018) with less than about 2.0 mm, about 1.5 mm, about 1.0 mm, about 0.5 mm, or about 0.25 mm of horizontal movement (relative to the orientation shown in FIG. 20B).

Figure 20C:
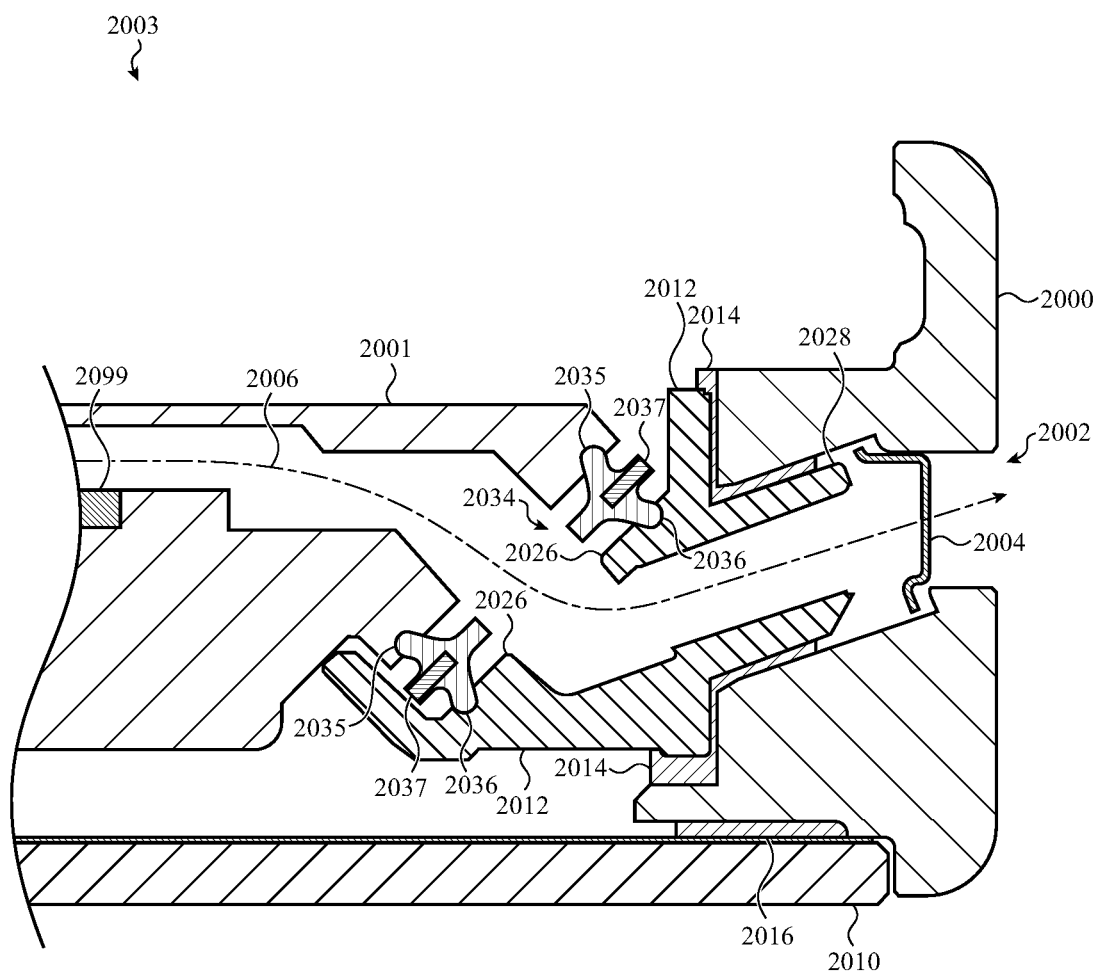
FIG. 20C depicts a partial cross-sectional view of a speaker portion of an example electronic device.

FIG. 20C illustrates the device 2003 with another example sealing assembly 2034. The sealing assembly 2034 may operate in a similar manner to the sealing assembly 2018. The sealing assembly 2034 may include a carrier 2037 and a compliant material that defines a first compliant portion 2035 and a second compliant portion 2036. The carrier 2037 may be a stiff material or combination of materials (relative to the compliant portions 2035, 2036, for example). For example, the carrier 2037 may be formed from a polycarbonate material, a metal sheet, or the like. The first and second compliant portions 2035, 2036 may be formed from or include a foam, elastomer, rubber, or other material that can conform to and/or seal against the sealing surface 2026 of the bracket 2012 and a surface of the speaker module 2001. The material that defines first and second compliant portions 2035, 2036 may be co-molded with the carrier 2037 to secure the compliant material to the carrier 2037 and produce a single assembly that can be attached to or otherwise assembled with the device 2003. The compliant material that defines the first and second compliant portions 2035, 2036 may also or instead be secured to the carrier 2037 with adhesives or other fastening components. The compliant portions 2035, 2036 may be a monolithic structure (e.g., they may be different portions of a single compliant material structure), as shown in FIG. 20C.

Figure 20D:
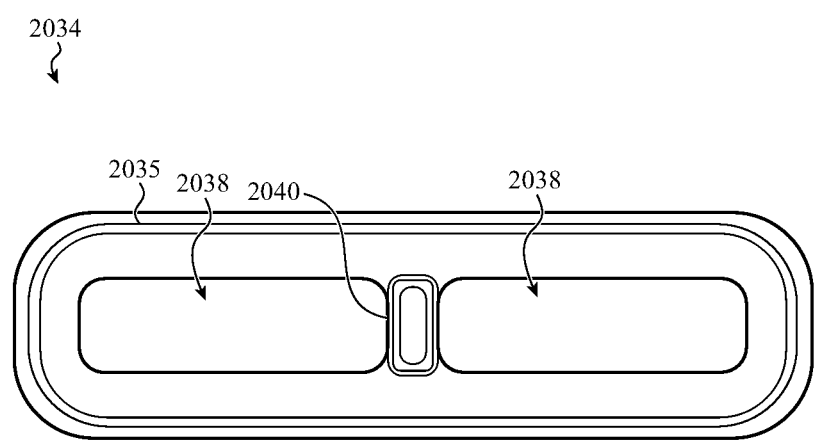
FIG. 20D depicts an example sealing assembly for a speaker of an example electronic device.

FIG. 20D is a top view of the sealing assembly 2034. The sealing assembly 2034 defines two openings 2038, separated by a bridge portion 2040. The carrier 2037 may define a ring-like structure and also include a bridge structure within the bridge portion 2040, and the compliant material may at least partially encapsulate the carrier 2037, including the ring-like structure and the bridge structure. The compliant material may also define a protrusion or bump along the bridge portion 2040, which may increase the stiffness or structural rigidity of the bridge portion 2040, while the bridge portion 2040 helps maintain the shape of the sealing assembly 2034 (e.g., resist deformation) when the sealing assembly 2034 is compressed between the speaker module 2001 and the bracket 2012.

As described above, devices described herein may include numerous front-facing input and/or output devices, such as one or more front-facing cameras, ambient light sensors, speakers, depth sensors, light projectors, light sensors, and the like. Such devices may also include front-fired antennas that are front-facing or otherwise positioned along a front of the device (e.g., the front-fired millimeter-wave antenna 730, FIG. 7). Such components may need to have substantially unobstructed access (e.g., optical and/or electromagnetic) to the exterior environment. In order to minimize or reduce the amount of front-facing area that must be devoted to such devices (and therefore to maximize or increase the amount of front-facing area that can be devoted to a display), multiple of such devices may be positioned in a single area along the front of the device. For example, a portion of the display may be cut away or otherwise shaped to define an area where such devices may be positioned.

Figure 21A:
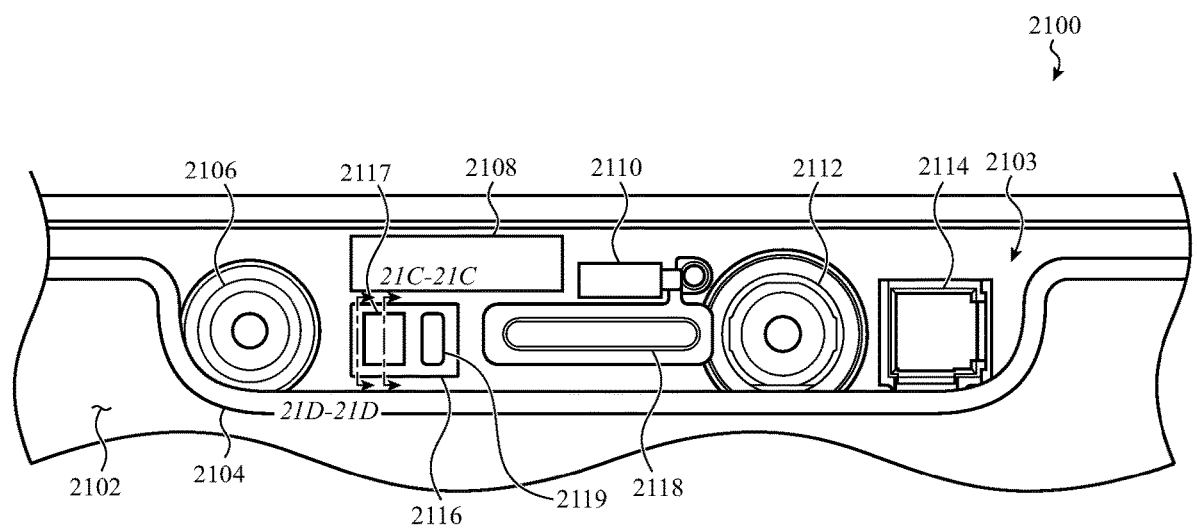
FIG. 21A depicts an example component assembly positioned along an upper region of a display.

FIG. 21A illustrates a portion of an example device 2100. The portion illustrated in FIG. 21 may correspond to an area 21-21 in FIG. 1A, though the same or a similar area may be found on other example devices described herein.

The device 2100 may include a display 2102, which may be an embodiment of or otherwise represent other displays described herein, such as the display 103, 203, 303, 403, or 503. The display 2102 may define a recess 2104 along an edge of the display 2102, thereby defining an area 2103 below a cover of the device 2100 (e.g., analogous to the cover 202) where input/output devices, antennas, and other components may be positioned without being placed under the display (and thus having to transmit/receive signals, sound, light, etc., through the display 2102).

The device 2100 may include, in the area 2103, a front-facing camera 2112, a speaker 2118, a flood illuminator and proximity sensor module 2116, an ambient light sensor 2110, an infrared light projector 2114, an infrared image capture device 2106, and a front-fired antenna 2108, some or all of which may be attached to a frame member or other structural component of the device 2100. The speaker 2118 may be configured to be positioned next to or proximate a user's ear when the device 2100 is held to the user's face during a telephone call. Accordingly, the speaker 2118 may be aligned with an opening in the cover of the device 2100 or otherwise configured to emit sound through the cover.

The front-facing camera 2112 may include an optical lens, image sensor, and any other associated components, and may be configured to capture images. Images from the front-facing camera 2112 (e.g., still and/or video images captured by the user) may be stored in a memory of the device 2100.

The device 2100 may also include an infrared light projector 2114 and an infrared image capture device 2106, which may be components of a facial recognition sensor (e.g., the facial recognition sensors 252, 352, 452, 552). The infrared image capture device 2106 may include an optical lens, an infrared light sensor, and any other associated components to facilitate the sensing of an infrared image (e.g., an image of a real-world object, such as user's face, that is illuminated at least partially with infrared light). The infrared light projector 2114 may be configured to emit a pattern or array of infrared dots onto an object (e.g., a user's face), and the infrared image capture device 2106 may be configured to capture an image of the illuminated object. The captured image may include data corresponding to an array of depth points along the face of a user. The device 2100 may use the captured array of depth points to identify the user and/or authorize functionality on the device (e.g., unlocking the device, authorizing payments, etc.). More particularly, the device 2100 may compare the array of depth points to a key, and if the array of depth points matches the key (or satisfies a similarity threshold), the device 2100 may authenticate the user.

The device 2100 may also include an ambient light sensor 2110. The ambient light sensor may determine properties of the ambient light conditions surrounding the device 2100. The ambient light sensor 2110 may include a photosensitive element and a light guide configured to direct light onto the photosensitive element. The device 2100 may use information from the ambient light sensor to change, modify, adjust, or otherwise control the display 2102 (e.g., by changing a hue, brightness, saturation, or other optical aspect of the display based on information from the ambient light sensor).

The device 2100 may also include a flood illuminator and proximity sensor module 2116. The flood illuminator and proximity sensor module 2116 may include a flood illuminator subsystem 2117, which emits infrared light towards an object (e.g., the user's face). The flood illuminator subsystem 2117 may emit a substantially even and/or homogenous illumination pattern (as contrasted to the infrared light projector 2114 that may emit an array of discrete infrared dots). The flood illuminator subsystem 2117 is further described with respect to FIGS. 21C-21D. The flood illuminator and proximity sensor module 2116 may also include a proximity sensor subsystem 2119 that may be configured to determine or estimate a distance between the device 2100 and an object (e.g., the user's face). Such information may be used, for example, to determine a parameter of the illumination from the flood illuminator and/or the infrared light projector 2114 (e.g., the amount, intensity, or other parameter of the infrared light emitted by such devices).

The device 2100 may also include in the area 2103 a front-fired antenna 2108, which may be or may be an embodiment of the front-fired millimeter wave antenna 734. The front-fired antenna 2108 may be configured to send and/or receive electromagnetic signals through the material of the cover (e.g., through the glass, ceramic, glass-ceramic, or polymer material of the cover). Accordingly, the thickness of the cover in the region over the front-fired antenna 2108 may be configured to reduce or limit attenuation of electromagnetic signals emitted and received by the front-fired antenna 2108. In some cases, the thickness depends at least in part on the particular material of the cover.

Figure 21B:
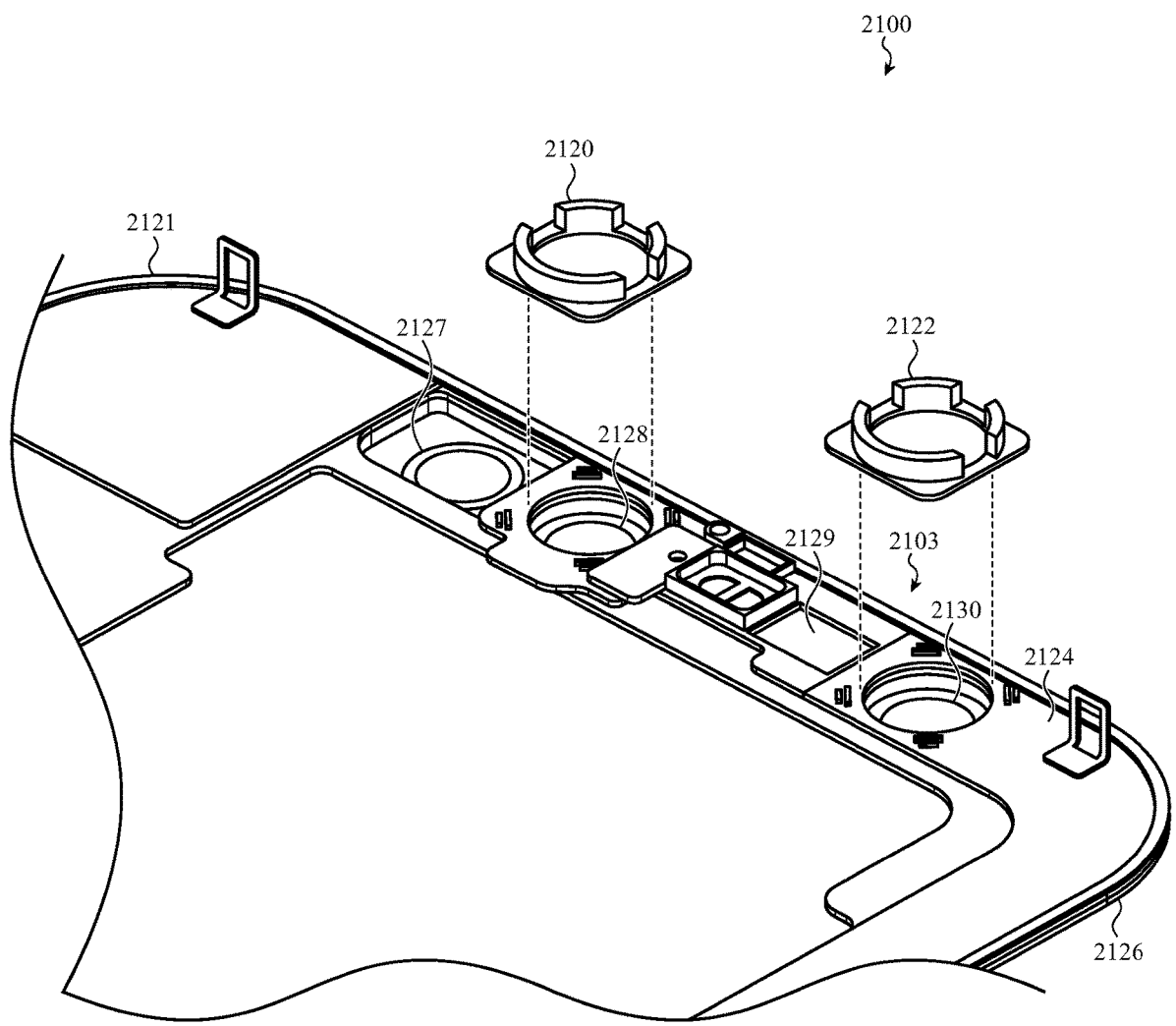
FIG. 21B depicts a partial exploded view of the component assembly of FIG. 21A.

FIG. 21B shows a rear view of a top module 2121 of the device 2100, including the area 2103. The top module 2121 may be an embodiment of the top module 201, 301, 401, and 501, described above with respect to FIGS. 2-5. The top module 2121 includes a cover 2126 (which may be an embodiment of the cover 102 or other front-facing covers described herein) and additional components coupled to the cover 2126. The additional components may include a back panel 2124 and a display (e.g., the display 2102 in FIG. 21A) between the back panel 2124 and the cover 2126. Openings may be defined through components of the top module 2121 such that the cover 2126 is accessible from the back side of the top module 2121. For example, the top module 2121 may include holes that reveal optical window portions 2127, 2128, 2129, and 2130 of the cover 2126, through which cameras, projectors, imaging devices, lenses, and/or other optical components may transmit and/or receive light.

The device 2100 may include brackets 2120, 2122, which may be affixed to the top module 2121 (e.g., via welding, adhesive, brackets, fasteners, mechanical interlocking structures, or the like). A lens, optical sensor, and/or other component of the infrared image capture device 2106 may be mounted in and affixed to the bracket 2122, and the front-facing camera 2112 may be mounted in and affixed to the bracket 2120. The brackets 2120, 2122 may be used to ensure proper alignment of the optical components that are mounted to them. Further, the brackets 2120, 2122 may be rigidly coupled to the back panel 2124 (e.g., the brackets may be formed of or include metal and may be welded to a metal portion of the back panel 2124). Accordingly, the brackets 2120, 2122 may provide a dimensionally stable mounting structure for the optical components mounted thereto, thereby inhibiting motion of the optical components during use of the device or as a result of potentially damaging events such as drops or impacts.

Figure 21C:
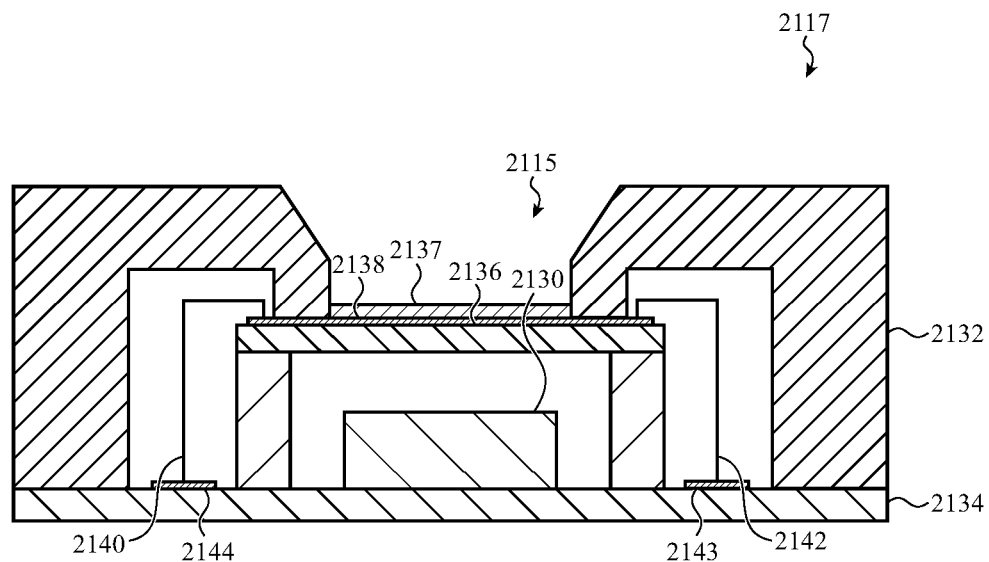
FIG. 21C depicts a partial cross-sectional view of a flood illuminator.

FIG. 21C is a partial cross-sectional view of the flood illuminator and proximity sensor module 2116 (also referred to as a flood/prox module 2116), viewed along line 21C-21C in FIG. 21A, showing an example configuration of the flood illuminator subsystem 2117. The flood/prox module 2116 includes a cover structure 2132 that may cover and at least partially enclose the components of the flood illuminator subsystem 2117. The cover structure 2132 may define an opening 2115 that allows light (e.g., infrared light) out of the cover structure 2132. The flood illuminator subsystem 2117 may also include a light emitter 2130, which may include a laser that produces infrared light to illuminate an object (e.g., a user's face) with a substantially even and/or homogenous illumination pattern of infrared light. The cover structure 2132 and the light emitter 2130 may be attached to a substrate or base 2134.

The flood illuminator subsystem 2117 may also include a light transmissive component 2136 (also referred to as a diffuser) positioned above the light emitter 2130. The light transmissive component may be formed from glass, polymer, sapphire, or another light transmissive material. The light transmissive component 2136 may include additional layers and/or components. For example, the light transmissive component 2136 may include filter layers, coatings, diffraction layers, circuit layers, mask layers, and the like.

The light transmissive component 2136 and the cover structure 2132 may be configured to prevent unfiltered and/or uncontrolled laser light (which may be emitted from the light emitter 2130) from exiting a device in which the flood illuminator subsystem 2117 is integrated. Accordingly, the device may monitor the flood illuminator subsystem 2117 to ensure that the light transmissive component 2136 and the cover structure 2132 are in place and have not been removed, moved out of position, damaged, or otherwise unable to adequately perform their functions (e.g., of blocking, filtering, attenuating, or otherwise affecting light emitted from the light emitter 2130).

A device may monitor the status of the light transmissive component 2136 and the cover structure 2132 by monitoring the status of conductive paths that extend through the light transmissive component 2136 and the cover structure 2132. For example, as shown in FIG. 21C, a conductive trace layer 2138 may be adhered or otherwise secured to the light transmissive component 2136. The conductive trace layer 2138 may include a conductive trace, which may define a serpentine or other suitable pattern over the surface of the conductive trace layer 2138 and over the light transmissive component 2136 more generally. The conductive trace layer 2138 may include a metallic trace layer (e.g., copper, silver nanowire), indium tin oxide (ITO), or another suitable conductive material. A first wire 2140 may be conductively coupled to a first end of the conductive trace layer 2138, and a second wire 2142 may be conductively coupled to a second end of the conductive trace layer 2138, and the first and second wires 2140, 2142 may be conductively coupled to contact pads 2144, 2143, respectively. The contact pads 2144, 2143, the wires 2140, 2142, and the conductive trace of the conductive trace layer 2138 may define a conductive path that may be monitored by the device. If the conductive path is severed, damaged, or otherwise physically affected (e.g., if the device detects an open circuit, short circuit, a change in resistance, or the like), the device may shut off the light emitter 2130, as this condition may indicate that the light transmissive component 2136 has been broken, shifted, moved, damaged, or otherwise rendered less effective or ineffective. In some cases, the conductive path is part of a hardwired or dedicated failsafe circuit, such that if the conductive path is broken or otherwise negatively affected, the light emitter 2130 ceases operation (e.g., a power supply to the light emitter 2130 is terminated).

The flood/prox module 2116 may optionally include a coating 2137 positioned on the light transmissive component 2136 and on the conductive trace layer 2138. The coating 2137 may be configured to protect the conductive trace layer 2138 from damage due to electrostatic discharge. For example, an electrostatic discharge that arcs to the conductive trace layer 2138 may damage the conductive trace layer 2138, leading to the flood/prox module 2116 detecting a fault and/or ceasing operation. The coating 2137 may absorb or otherwise prevent energy from the electrostatic discharge from damaging the conductive trace layer 2138. The coating 2137 may be any suitable coating, such as a conductive coating, an antireflective coating, or the like. The coating 2137 may include metals, transparent conductive oxides, or the like. The coating 2137 may be transparent, at least to spectra that are utilized by the flood/prox module 2116 and are transmitted through the light transmissive component 2136.

Figure 21D:
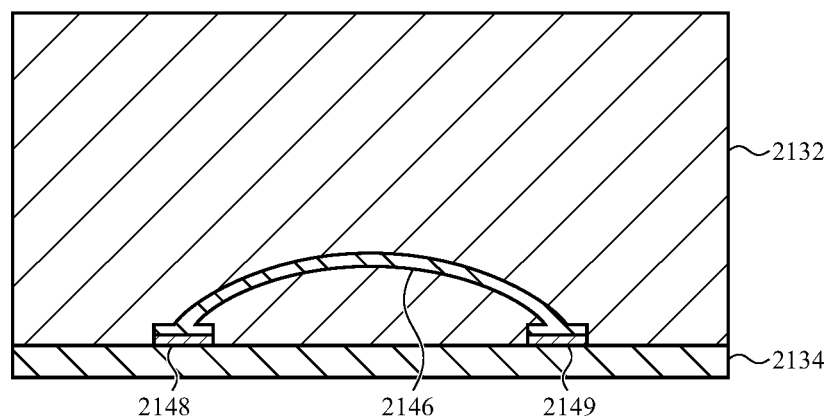
FIG. 21D depicts another partial cross-sectional view of the flood illuminator.

The cover structure 2132 may also be monitored or otherwise integrated with a failsafe circuit so that movement, breakage, removal, or other damage to the cover structure 2132 may cause the light emitter 2130 to cease operations. For example, as shown in FIG. 21D, which is a partial cross-sectional view of the flood illuminator subsystem 2117 viewed along line 21D-21D in FIG. 21A, the cover structure 2132 may have a conductor 2146 at least partially embedded in the material of the cover structure 2132 (which may be a polymer material) or otherwise attached to the cover structure 2132. The conductor 2146 may be conductively coupled to contact pads 2148 and 2149, thereby defining a conductive path that may be monitored by the device. If the conductive path is severed, damaged, or otherwise physically affected (e.g., if the device detects an open circuit, short circuit, a change in resistance, or the like), the device may shut off the light emitter 2130, as this condition may indicate that the cover structure 2132 has been broken, shifted, moved, damaged, or otherwise rendered less effective or ineffective. In some cases, the conductive path through the conductor 2146 is part of a hardwired or dedicated failsafe circuit, such that if the conductive path is broken or otherwise negatively affected, the light emitter 2130 ceases operation (e.g., a power supply to the light emitter 2130 is terminated).

Figure 21E:
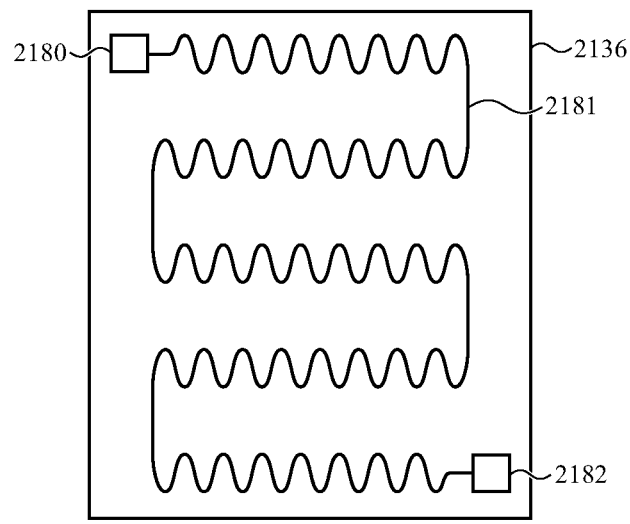
FIG. 21E depicts an example light transmissive component for a flood illuminator.

FIG. 21E is a top view of the light transmissive component 2136 of the flood/prox module 2116, showing an example configuration of a conductive trace 2181 of the conductive trace layer 2138. The conductive trace 2181 may define a serpentine pattern along the light transmissive component 2136. The serpentine pattern ensures that the conductive trace 2181 extends over much of the area of the light transmissive component 2136 so that a break or crack in the light transmissive component 2136 is likely to sever the conductive trace 2181 so that the crack or break can be detected (e.g., due to loss of continuity through the conductive trace 2181). The conductive trace 2181 may be conductively coupled to contacts 2180, 2182, which may be solder pads (e.g., copper, gold, or other the like). The wires 2140, 2142 (FIG. 21C) may be conductively coupled (e.g., soldered) to the contacts 2180, 2182, thereby conductively coupling the wires 2140, 2142 to the conductive trace 2181.

Figure 21F:
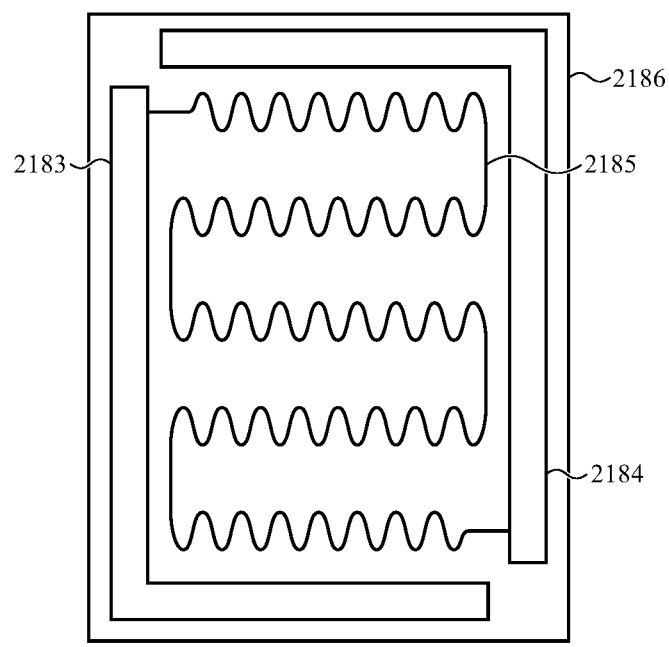
FIG. 21F depicts another example light transmissive component for a flood illuminator.

FIG. 21F is a top view of another example light transmissive component 2186 for the flood/prox module 2116, showing an example configuration of a conductive trace 2185. The conductive trace 2185 may have substantially the same shape and configuration as the conductive trace 2181.

The conductive trace 2185 may be conductively coupled to contacts 2183, 2184, which may be solder pads (e.g., copper, gold, or other the like). The wires 2140, 2142 (FIG. 21C) may be conductively coupled (e.g., soldered) to the contacts 2183, 2184, thereby conductively coupling the wires 2140, 2142 to the conductive trace 2185. The contacts 2183, 2184 may each extend along two sides of the light transmissive component 2186, as shown in FIG. 21F, and may serve as electrostatic discharge collectors. For example, electrostatic discharges proximate the light transmissive component 2186 may be attracted to the contacts 2183, 2184, such that the arc may tend to contact the contacts 2183, 2184 rather than the more delicate conductive trace 2185. The relatively larger surface of the contacts 2183, 2184, as well as the shape whereby the contacts extend together almost entirely around the periphery of the light transmissive component 2186, increase the likelihood that an arc will be drawn to the contacts 2183, 2184, and help dissipate the energy from the discharge, thereby reducing the likelihood of damage to the conductive trace 2185.

Figure 21G:
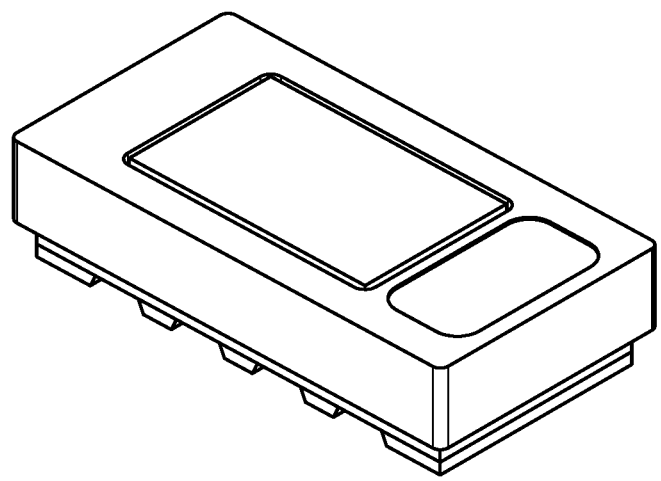
FIG. 21G depicts an ambient light sensor.
Figure 21H:
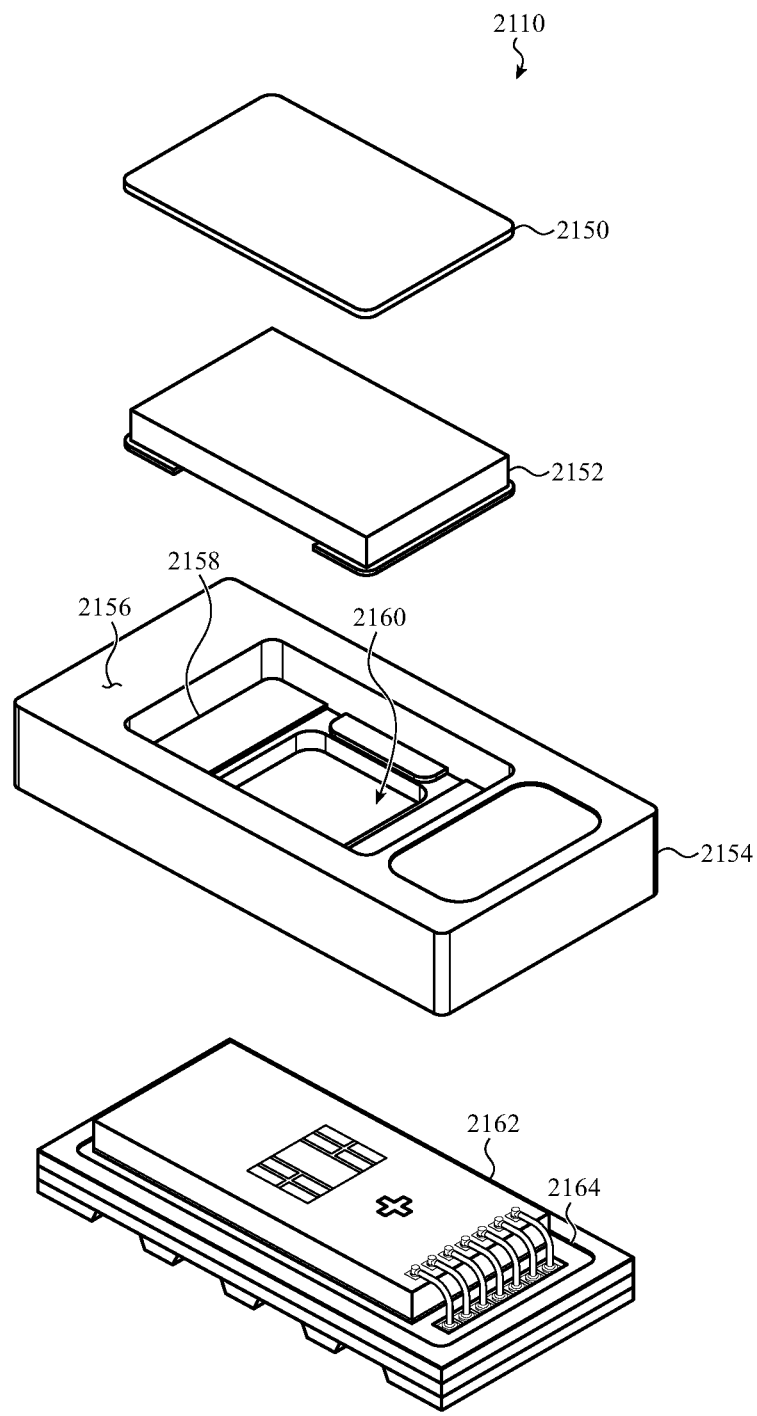
FIG. 21H depicts an exploded view of the ambient light sensor of FIG. 21G.

FIG. 21G illustrates the ambient light sensor 2110, decoupled from a frame or other structural member of the device 2100, and FIG. 21H illustrates an exploded view of the ambient light sensor 2110. As noted above, the ambient light sensor may determine properties of the ambient light conditions surrounding the device 2100, and the device 2100 may use information from the ambient light sensor to change, modify, adjust, or otherwise control the display of the device (e.g., by changing a hue, brightness, saturation, or other optical aspect of the display based on information from the ambient light sensor), or perform other actions (e.g., change notification settings based on an inferred condition, such as that the device is in a pocket or purse).

The ambient light sensor 2110 may include a frame member 2154. A filter 2152 may be positioned in a recess defined by the frame member 2154, and may cover an opening 2160 in the frame member. For example, the frame member 2154 may define a ledge 2158 (which may be recessed relative to a top surface 2156 of the frame member 2154), and the filter 2152 may be positioned on and optionally attached to (e.g., via an adhesive) to the ledge 2158. The filter 2152 may be configured to filter out light in a particular wavelength range. For example, the filter 2152 may be an infrared cut filter, and may filter and/or attenuate light in an infrared range (and optionally in an ultraviolet range). The filter 2152 may be or may include a blue glass and/or other suitable material(s). A diffuser 2150 may be positioned on a surface of the filter 2152. The diffuser 2150 may be a translucent material that diffuses incoming light or otherwise produces a more homogenous pattern of light, which may improve the operation of the ambient light sensor 2110 and provide for more even distribution of light on the photosensitive sensor of the ambient light sensor 2110. In some cases, the functions of the filter 2152 and the diffuser 2150 may be performed by a single unitary component, such as a single piece of glass, plastic, ceramic, sapphire, or the like.

As noted above, the frame member 2154 may define an opening 2160 through which light may pass so as to fall on the sensor 2162. The sensor 2162 may be coupled to a circuit board 2164, which may include components such as an application specific integrated circuit (ASIC). Together, the sensor 2162 and the circuit board 2164 (which may include the ASIC and/or other electronic components) may be able to detect ambient light levels of the environment surrounding the device 2100.

The ambient light sensor 2110 may be attached to a front cover of an electronic device. For example, an adhesive (e.g., an optically clear adhesive) may be positioned between and may adhere the top surface 2156 of the frame member 2154 and a portion of the front cover of a device.

Figure 21I:
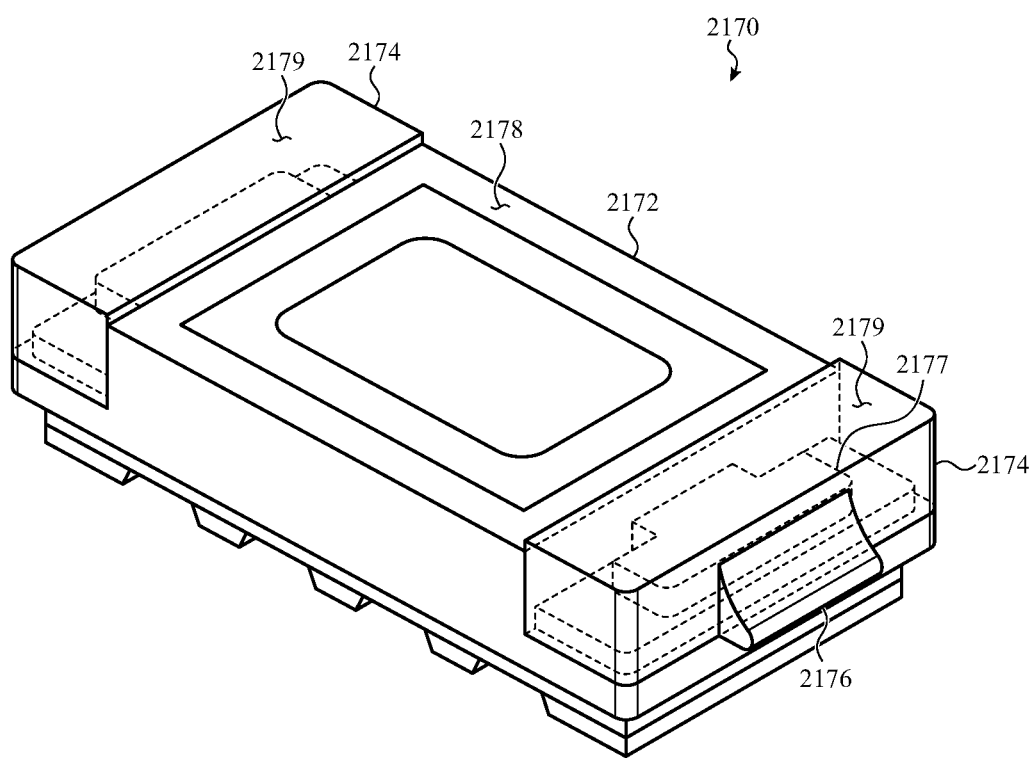
FIG. 21I depicts another example ambient light sensor.

FIG. 21I illustrates another example ambient light sensor 2170. The ambient light sensor 2170 is the same as the ambient light sensor 2110, except that the ambient light sensor 2170 includes polymer structures 2174 along an outer portion of a frame member 2172. The polymer structures 2174 may be molded to the frame member 2172, or attached in another way (e.g., via an adhesive, ultrasonic weld, etc.). The polymer structures may be formed of or include a material having a Shore A durometer of between about 85 and about 95. The polymer structures may be formed from a one-part silicone, a two-part silicone, or another elastomeric material. The frame member 2172 may be formed from a glass-filled nylon, a polycarbonate, or another suitable polymer material.

The polymer structures 2174 may be more compliant and/or flexible than the frame member 2172, and may be configured to form a light seal between the ambient light sensor and surrounding components. The polymer structures 2174 may also define mechanical interlock features, such as a lip 2176 (a same or similar lip may protrude from the opposite side of the ambient light sensor 2170, or the lip 2176 may be the only lip). The mechanical interlock features of the polymer structures 2174 may be configured to mechanically interlock or otherwise engage with a frame member or other structure of the device 2100 to help retain the ambient light sensor 2170 in place during manufacturing and/or use of the device.

The top surfaces 2179 of the polymer structures 2174 may be higher than the top surface 2178 of the frame member 2172. In some cases, the top surfaces 2179 of the polymer structures 2174 may contact the bottom surface of a front cover of a device. Accordingly, the top surfaces 2179 may act as bumpers that interface with the front cover. In some cases, the top surfaces 2179 of the polymer structures 2174 are softer than the frame member 2172, and may help prevent scratching or damage to the front cover and/or coatings or masks on the front cover. They may also reduce the shock loading on the ambient light sensor 2170 and/or the front cover in the event of an impact or drop event.

The frame member 2172 may define interlock structures 2177 that the polymer structures 2174 engage to retain the polymer structures 2174 to the frame member 2172. The polymer structures 2174 may be molded onto the frame member 2172 so that they form the corresponding interlock with the interlock structures 2177. For example, a polymer material in a moldable state may be applied to the frame member 2172, then a mold, having a cavity in the shape of the polymer structures 2174, may be applied to the moldable polymer material. The moldable polymer material may thus engage the interlock structures 2177 and take on the shape of the mold cavity.

As described above, the mobile devices described herein may use batteries, such as lithium ion (e.g., lithium-ion polymer) batteries, to provide power to the electrical systems of the device. Such batteries may include power-producing components (e.g., electrodes and an electrolyte) contained inside a pouch. The pouch may be sealed or otherwise closed to enclose the one or more power-producing components. The pouch may include a metal portion, such as a metal foil layer. Accordingly, exposed edges of the pouch, such as where the pouch opening has been closed, may pose a shorting risk within the device.

Figure 22A:
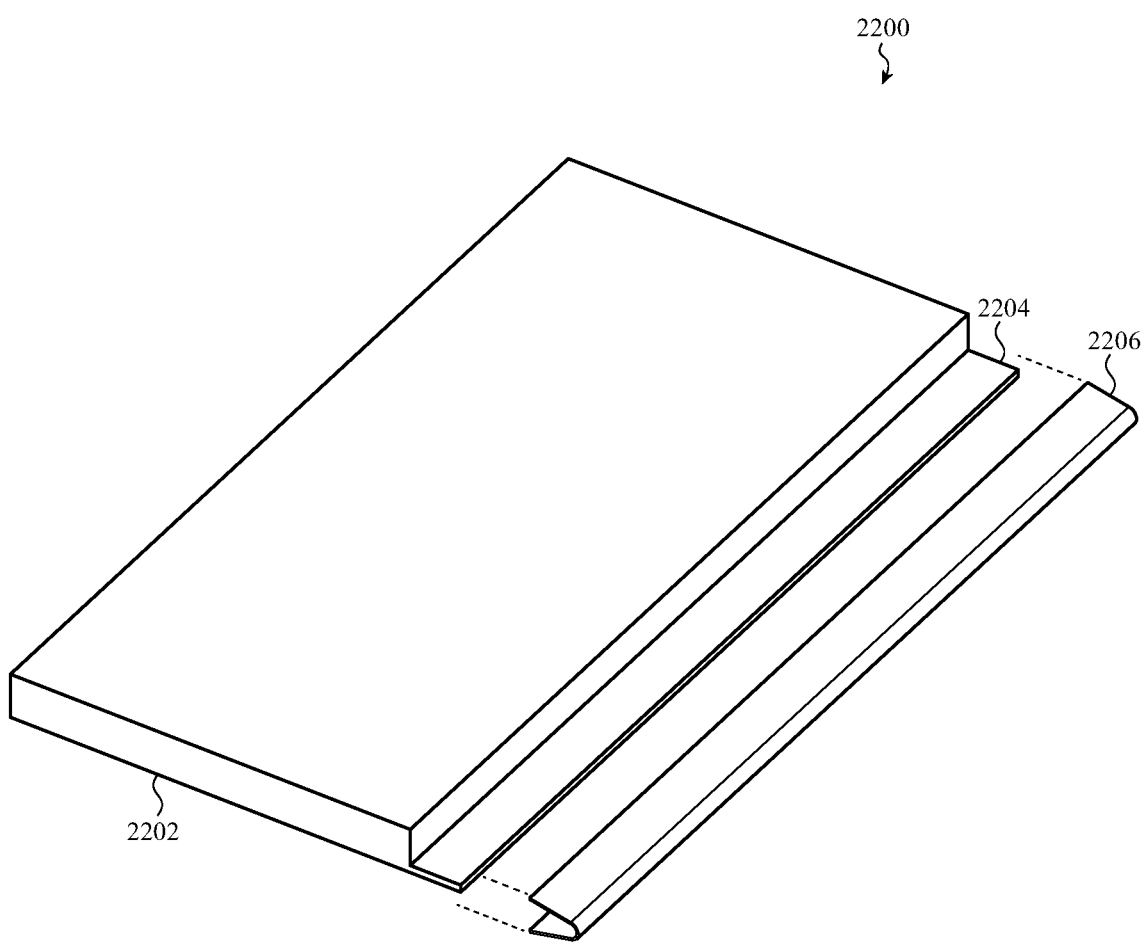
FIGS. 22A-22C depict an example battery for an electronic device.

FIGS. 22A-22E illustrate example batteries in which edges of a pouch flap are covered and the flap is secured to the side of the battery, thereby helping to prevent or inhibit accidental shorts or other damage within the device due to exposed metal (e.g., conductive) material. FIG. 22A shows an example battery 2200 (which may be an embodiment of the battery 230 or any other battery described herein). The battery 2200 includes a pouch 2202 in which the power-producing components may be positioned. The pouch 2202 may include a flap 2204 that extends from a main portion of the battery 2200. The flap 2204 may correspond to the opening of the pouch 2202 through which the internal components of the battery (e.g., electrodes and an electrolyte) are inserted into the pouch 2202. In order to cover the exposed edges of the pouch material along the flap 2204, a film 2206 (e.g., an adhesive tape) may be applied to the flap 2204. The film 2206 may extend over the top and bottom surfaces of the flap 2204 and around the free end of the flap 2204, thereby sealing the pouch closed (optionally in addition to an adhesive between the internal surfaces of the flap 2204) and covering the exposed edges of the pouch material. The film 2206 may be a nonconductive material.

Figure 22B:
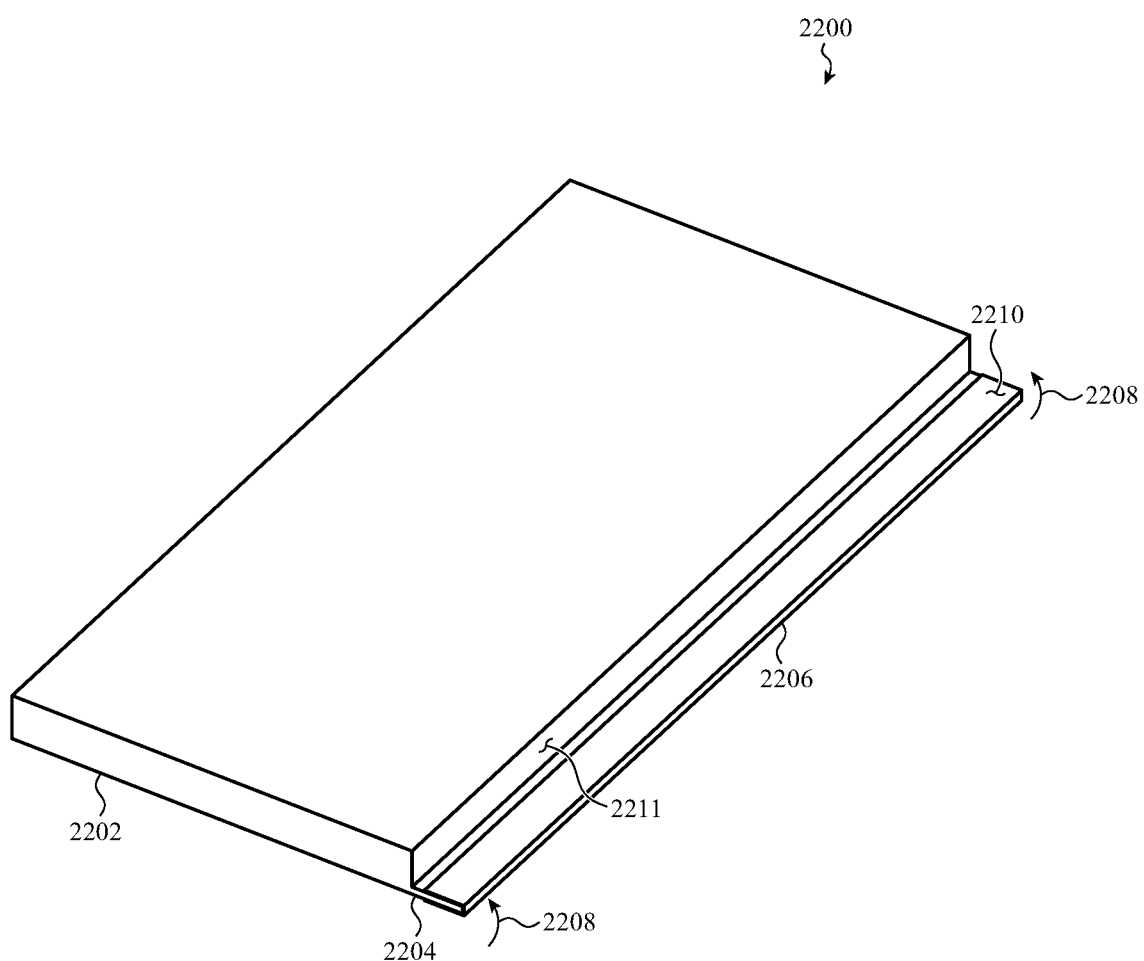
Figure 22C:
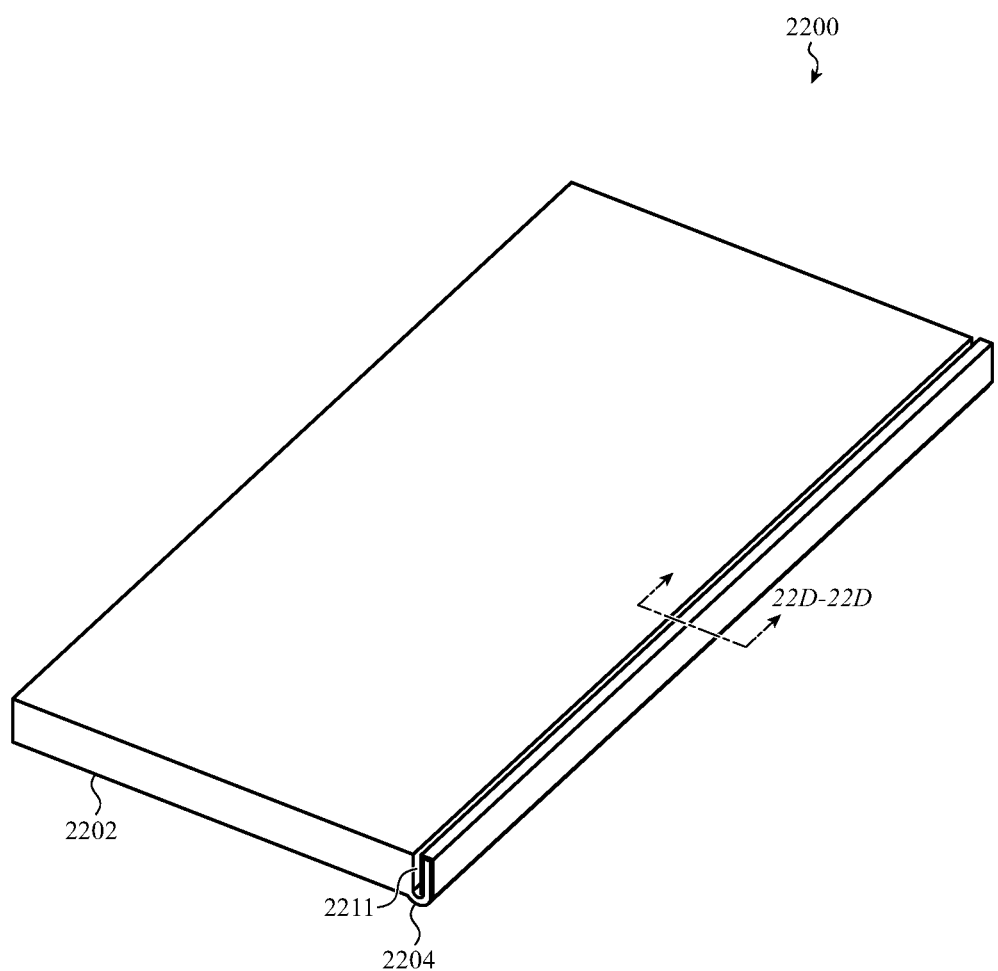

FIG. 22B shows the battery 2200 with the film 2206 applied to the flap 2204. An adhesive may be applied to a surface 2210 of the film 2206 and/or a side surface 2211 of the pouch 2202, and the flap 2204 may be folded up against the side surface 2211 of the pouch 2202 (as indicated by arrows 2208). FIG. 22C shows the battery 2200 with the flap 2204 folded against and adhered to the side surface 2211 of the pouch 2202.

Figure 22D:
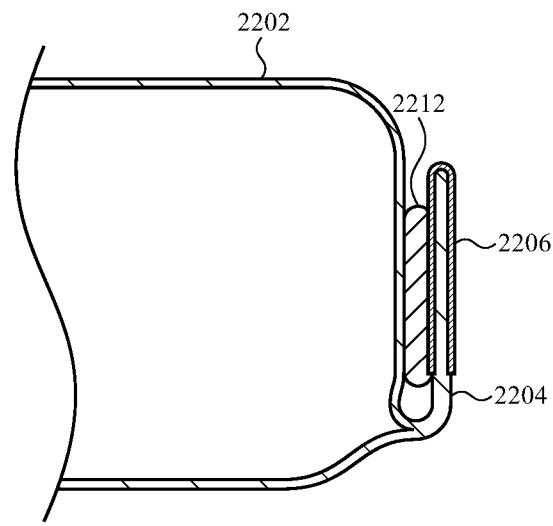
FIGS. 22D-22E depict partial cross-sectional views of example batteries.

FIG. 22D shows a partial cross-sectional view of the pouch 2202, viewed along line 22D-22D in FIG. 22C. FIG. 22D shows an adhesive 2212 between the flap 2204 and the pouch 2202 and adhering the flap 2204 to the pouch 2202. In this case, the adhesive 2212 contacts the side surface of the pouch 2202 (e.g., contacting the material of the pouch) and a surface of the film 2206 that covers the flap 2204. (In some cases, the adhesive 2212 does not contact the actual portion of the pouch material that forms the flap 2204, and only contacts the film 2206, as shown in FIG. 22D.)

Figure 22E:
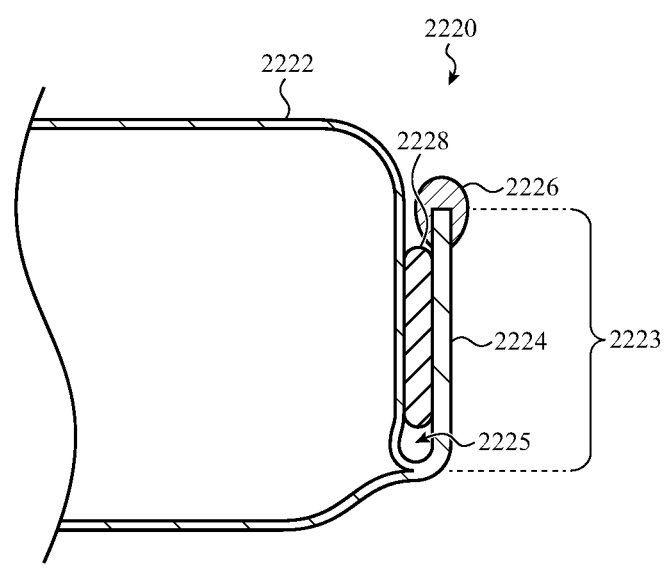

FIG. 22E is a partial cross-sectional view of another example battery 2220, showing a view similar to that in FIG. 22D. In this case, a polymer bead 2226 is applied along an edge of a flap 2224. The polymer bead 2226 may be an epoxy or other material that may be applied in a flowable state and then allowed to cure or otherwise harden on the edge of the flap 2224. The polymer bead 2226 may cover the edge of the flap 2224, but may extend along less than the full length 2223 of the sides of the flap 2224. For example, the polymer bead 2226 may extend along less than about 50%, less than about 40%, less than about 30%, less than about 20%, or less than about 10% of the length 2223 of the sides of the flap 2224. Because the polymer bead 2226 does not cover the entirety of the sides of the flap 2224 (and in particular of the side of the flap 2224 facing the pouch 2222), the adhesive 2228 may contact the side of the pouch 2222 as well as the surface of the pouch material that forms the flap 2224 (e.g., instead of contacting a film, tape, or other layer that has been applied to the flap 2224). This may help reduce the dimensions of the battery and/or allow a larger internal pouch size for the same outer dimension of the battery.

Further, in both the battery 2200 and the battery 2220, the flaps are not folded or rolled multiple times. Accordingly, the flaps 2204, 2224 may each be defined by two layers of the pouch material, rather than, for example four layers (which would be the case if the neck of the pouch were folded or rolled twice so that the edge of the flap doubled back and was facing and/or adjacent a fold region 2225). By avoiding the multiple folds or rolls, the outer dimensions of the batteries may be minimized or reduced.

Figure 23A:
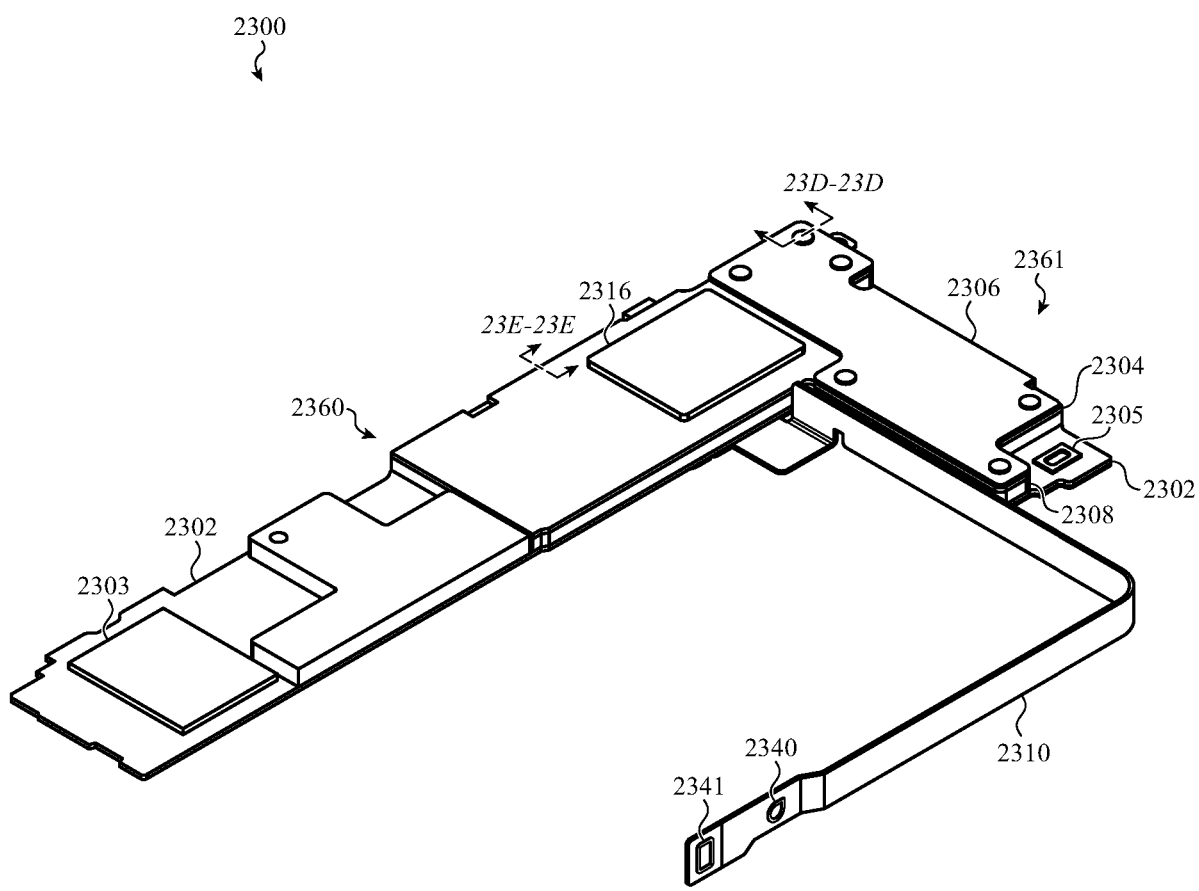
FIG. 23A depicts an example logic board for an electronic device.

FIG. 23A illustrates an example logic board 2300 (which is an example of a circuit board assembly) that may be used in electronic devices as described herein. The logic board 2300 may be an embodiment of any of the logic boards described herein, such as the logic boards 220, 320, 420, 520. The logic board 2300 may include one or more substrates, and processors, memory, and other circuit elements coupled to the substrate(s). The logic board 2300 may include provisions for a subscriber identity module (SIM). The logic board 2300 may include electrical contacts and/or a SIM tray assembly for receiving a physical SIM card and/or the logic board 2300 may include provisions for an electronic SIM. The logic board 2300 may be wholly or partially encapsulated to reduce the chance of damage due to an ingress of water or other fluid. The logic board 2300 may have a generally "L-shaped" configuration, in which a first portion 2360 extends along a first side of a battery (e.g., the batteries 230, 330, 430, 530) and a second portion 2361 extends along a second side of the battery. By extending along two sides of the battery, greater packing efficiency may be obtained and the logic board 2300 may be able to accommodate more components than a simple rectangular logic board, for example.

Figure 23B:
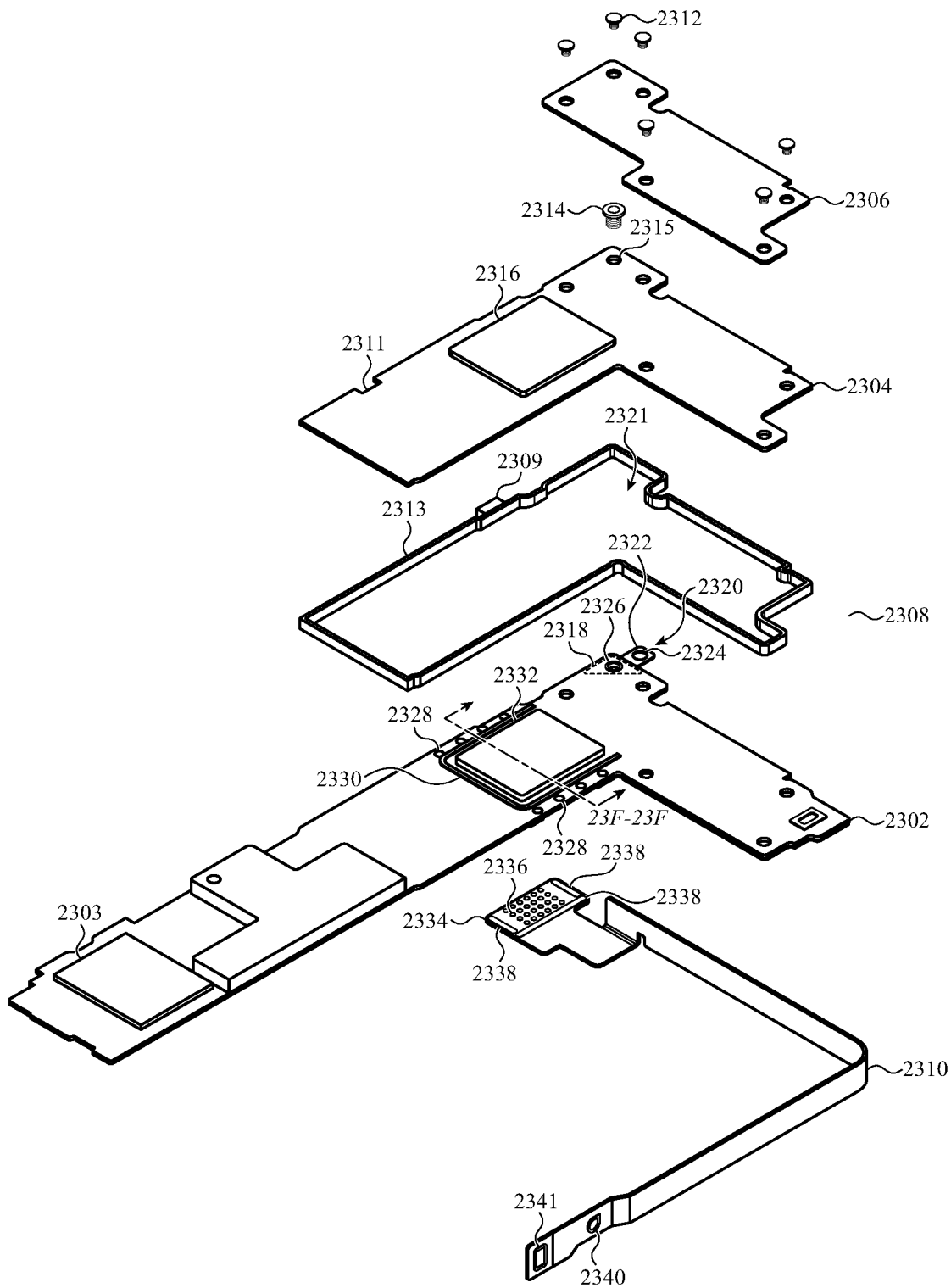
FIG. 23B depicts an exploded view of the logic board of FIG. 23A.

The logic board 2300 may include multiple substrates (e.g., circuit boards) that are stacked and coupled together in order to maximize the area available for electronic components and circuitry in a compact form factor. For example, the logic board 2300 may include a first substrate 2302 and a second substrate 2304 supported above the first substrate 2302. The first and second substrates 2302, 2304 may also be referred to as circuit boards. Electrical components and/or circuit elements such as processors, memory, antenna circuitry, and the like, may be coupled to the first and/or the second substrates 2302, 2304. For example, FIG. 23A shows a memory module 2316 (e.g., a NAND memory device) coupled to an exterior top surface of the second substrate 2304 and another component 2303 (e.g., a circuit element) coupled to the top surface of the first substrate 2302, and FIG. 23B shows a processor 2332 coupled to the top surface of the first substrate 2302. In some implementations, other or different circuit elements are coupled to the top surfaces of the first and/or second substrates.

The first and second substrates 2302, 2304 may be connected to one another via a wall structure 2308 (which supports the second substrate 2304 above the first substrate 2302). As described herein the first and second substrates 2302, 2304 may be soldered to conductive members (e.g., vias) in the wall structure 2308, thereby allowing components on the first and second substrates 2302, 2304 to be conductively coupled to one another via the wall structure 2308. For example, the memory module 2316 (or any other component on the second substrate 2304) may be conductively coupled to the processor via the vias in the wall structure 2308. The wall structure 2308 may also surround electrical components (e.g., a processor 2332, FIG. 23B) and, along with the first and second substrates 2302, 2304, define a substantially enclosed and optionally sealed internal volume (e.g., 2321) in which the processor (and/or other components) may be protected.

The first substrate 2302 may be soldered to the wall structure 2308 using a first solder having a first melting temperature, while the second substrate 2304 may be soldered to the wall structure 2308 using a second solder having a second melting temperature. For example, the second melting temperature may be lower than the first melting temperature (e.g., between about 20 degrees Celsius and about 30 degrees Celsius lower than the first melting temperature). In some cases, the first solder is a high-temperature solder, and the second solder is a medium-temperature solder.

The logic board 2300 may also include a shroud 2306, which may act as a shield (e.g., an EMI shield) and/or protective cover for the logic board 2300. The shroud 2306 may also help maintain the physical connections of board-to-board connectors, which are used to interconnect components to or on the logic board 2300. For example, the shroud 2306 may be secured to the logic board 2300 in a manner that presses on the board-to-board connectors to prevent them from becoming disconnected. The shroud 2306 may be attached to the logic board 2300 via screws or other fasteners.

The logic board 2300 may also include or be coupled to a flexible circuit element 2310, which may conductively couple an antenna module (e.g., the antenna array 926 of the side-fired antenna 734) to electrical components attached to the logic board 2300. The flexible circuit element 2310 may include an electrical connector 2341 (which may correspond to or be an embodiment of the electrical connector 940, FIG. 9B), which may connect with a corresponding electrical connector of the antenna array 926. The flexible circuit element 2310 may also include a grounding and attachment lug 2340, which may correspond to or be an embodiment of the grounding and attachment lug 938, FIG. 9B).

A front-fired antenna array (e.g., the antenna array of the front-fired antenna 730 or any other front-fired antenna system described herein) may be conductively coupled to the logic board 2300 via an electrical connector 2305. More particularly, the electrical connector 2305 may connect with a corresponding electrical connector on a flexible circuit element to which the front-fired antenna array is coupled (e.g., the circuit board 740, FIGS. 7 and 10A).

The electrical connector 2305 may be coupled to the first substrate 2302 in an area of the first substrate 2302 that is not enclosed or surrounded by the wall structure 2308 or covered by the second substrate 2304. The front- and side-fired antenna arrays that are coupled to the logic board 2300 via the connectors 2305, 2341, may be millimeter-wave antenna arrays. Further, the rear-fired antenna array 2363 (FIG. 23C) coupled to the bottom side of the first substrate 2302 may also be a millimeter-wave antenna array.

The logic board 2300 may also include one or more films, foils, coatings, platings, layers, or other materials or components that provide EMI shielding functionality. For example, a metallic film (e.g., a conductive film with an adhesive) may be applied to the shroud 2306 and/or any other shrouds or surfaces of the logic board 2300. The metallic film may include a nickel-iron ferromagnetic alloy, or any other suitable metal or conductive material. The metallic film may have a thickness between about 5 microns to about 20 microns, and may comprise a substrate layer (e.g., a polymer and/or adhesive layer) and a metallic layer laminated with the substrate layer. The metallic layer may be a different metal or composition than the shroud 2306, which may be stainless steel. The substrate layer of the metallic film may be or may include a conductive adhesive to conductively couple the metallic layer to the shroud 2306.

As another example, the shroud 2306 (and/or other shrouds of the logic board 2300) may be plated with a metallic plating. The plated shroud 2306 may therefore include a metal substrate (e.g., the shroud structure, which may be stainless steel) plated with a metal plating, where the plating may be a different metal or composition than the metal substrate. The metal substrate may have a thickness between about 150 microns and about 250 microns, and the metal plating may have a thickness between about 1 micron to about 5 microns. The metallic film and the metallic plating described above may increase the effectiveness of the EMI shielding of the shroud 2306, as compared to a shroud without the metallic film or metallic plating.

FIG. 23B shows an exploded view if the logic board 2300. As noted above, the first substrate 2302 may include conductive pads 2328 which may be soldered to corresponding conductive components (e.g., vias) in the wall structure 2308. For example, the conductive components may be at least partially encapsulated in a matrix material of the wall structure (e.g., a polymer, fiber-reinforced composite, etc.). The second substrate 2304 may also include conductive pads, like the conductive pads 2328, that are soldered to the conductive components in the wall structure 2308. The conductive path through the conductive pads and the wall structure 2308 may allow electrical interconnection between components such as the memory module 2316 and the processor 2332.

The processor 2332 may be soldered to the first substrate 2302. In some cases, a curable adhesive (e.g., an epoxy) or other curable material may be introduced between the processor 2332 and the top surface of the first substrate 2302 after the processor 2332 is soldered to the first substrate 2302. The curable material may be configured to cure (e.g., harden) to reinforce the solder joints between the processor 2332 and the first substrate 2302, and optionally to bond to both the processor 2332 and the first substrate 2302 (and thereby bonding the processor 2332 and the first substrate 2302 to one another). In order to retain the curable material in place, and prevent it from flowing or wicking along to other areas of the logic board 2300 where the curable material is not intended to be, a barrier 2330 (or dam) may be applied to the top surface of the first substrate 2302. The barrier 2330 may extend partially or fully around the processor 2332, such that when the curable material is flowed into the area between the first substrate 2302 and the processor 2332, it is prevented from flowing outside of the barrier 2330. As shown, the barrier 2330 extends along three out of four sides of the processor 2332. In other cases, the barrier extends along one, two, or four sides of the processor 2332.

The barrier 2330 may be a bead of solder that is deposited on the first substrate 2302. The barrier 2330 may have a height between about 0.05 mm to about 0.07 mm, and may be set apart from the sides of the processor 2332 by a distance between about 0.10 mm to 0.15 mm. The barrier 2330 may have a width between about 0.15 mm and 0.20 mm. In some cases, an inner surface of the wall structure may be set apart from a side of the processor 2332 by a distance between about 0.2 mm and about 0.4 mm, or a distance between about 0.25 mm and about 0.35 mm.

The barrier 2330 may be applied after the wall structure 2308 is attached to the first substrate 2302, and may abut or contact the wall structure 2308. By forming the barrier 2330 from a bead of solder, the wall structure 2308 may be positioned closer to the barrier 2330 than might be possible if other components (e.g., sacrificial or non-functional electrical components) were used to define a barrier or dam-type structure. Accordingly, using the solder bead for the barrier 2330 may allow the first substrate 2302 (and the logic board 2300 more generally) to be smaller (at least relative to logic boards with other dam or barrier configurations).

In some cases, a curable material may be introduced between the wall structure 2308 and the top surface of the first substrate 2302, and between the wall structure 2308 and the bottom surface of the second substrate 2304. The curable material may be used to reinforce the solder joints between the wall structure 2308 and the first and second substrates 2302, 2304. To assist in the introduction of the curable material into the space between the wall structure 2308 and the surfaces of the first and second substrates 2302, 2304 to which the wall structure 2308 is soldered, the logic board 2300 may include features to facilitate the deposition, injection, and/or introduction of the curable material into the space between the substrates and the wall structure. For example, the second substrate 2304 may include a cutout region 2311 that exposes at least part of the top surface 2313 of the wall structure 2308. As another example, the wall structure 2308 may include a ledge feature 2309 that is exposed even after the second substrate 2304 is soldered or otherwise secured to the wall structure 2308. After the second substrate 2304 is soldered to the wall structure 2308, a curable material may be introduced into the gap between the surface 2313 of the wall structure 2308 and the bottom surface of the second substrate 2304 by placing the curable material on the surface 2313 in the area of the recess 2311, and/or on the ledge 2309. The curable material, which may be in a flowable state, may be wicked or otherwise drawn into the gap between the second substrate 2304 and the wall structure 2308 (e.g., via capillary action), thereby delivering the curable material to the target locations and/or positions between the components. The curable material may flow around solder joints and into gaps between discrete solder joints along the wall-substrate interface. The curable material may then be allowed to cure (e.g., harden), thereby reinforcing the solder joints and adhering the second substrate 2304 to the wall structure 2308.

While FIG. 23B shows one example of each type of feature, it will be understood that a logic board may include multiple instances of these features, including combinations of recesses and ledges, to facilitate the introduction of the curable material into the desired locations. Further, FIG. 23B shows features positioned to facilitate introduction (e.g., via wicking) of the curable material into a space between the wall structure 2308 and the second substrate 2304, though it will be understood that the same or similar features may be implemented on the first substrate 2302 or otherwise configured to facilitate wicking of the curable material into the gap between the top surface of the first substrate 2302 and the bottom surface of the wall structure 2308.

The flexible circuit element 2310 may be soldered to a bottom surface of the first substrate 2302. In particular, the flexible circuit element 2310 may include an attachment portion 2334 with a plurality of solder points or vias (e.g., vias 2336) that are soldered to corresponding solder pads on the bottom of the first substrate 2302 (e.g., solder pads 2345, FIG. 23C). The flexible circuit element 2310 may include a liquid crystal polymer substrate, and the vias (e.g., the vias 2336) may be solid metal (e.g., copper). By providing solid metal vias, the physical connection between the vias and the logic board may be stronger than with other types of conductive vias. Adhesive 2338 may also be used to bond the flexible circuit element 2310 to the bottom surface of the first substrate 2302. By using the adhesive 2338, the physical coupling between the flexible circuit element 2310 and the first substrate 2302 may be stronger than with the solder alone.

The logic board 2300 may be coupled to another component of a device via one or more fasteners, such as screws. Due in part to the relative importance of the logic board to the operation of the device, it is advantageous to provide high strength connections to ensure that the logic board 2300 remains structurally coupled to the device even through drops or other potentially damaging events. In some areas of the logic board 2300, fasteners, such as screws, may extend through holes in the first and/or the second substrates 2302, 2304 and be secured to another component of the device (e.g., a housing or enclosure structure, a frame, etc.). In some cases, the logic board 2300 may include an attachment feature 2320 that is securely attached to the logic board 2300 and includes an attachment tab 2322 with a hole 2324 to accept a fastener (e.g., a screw) to secure the logic board 2300 to the device.

Figure 23C:
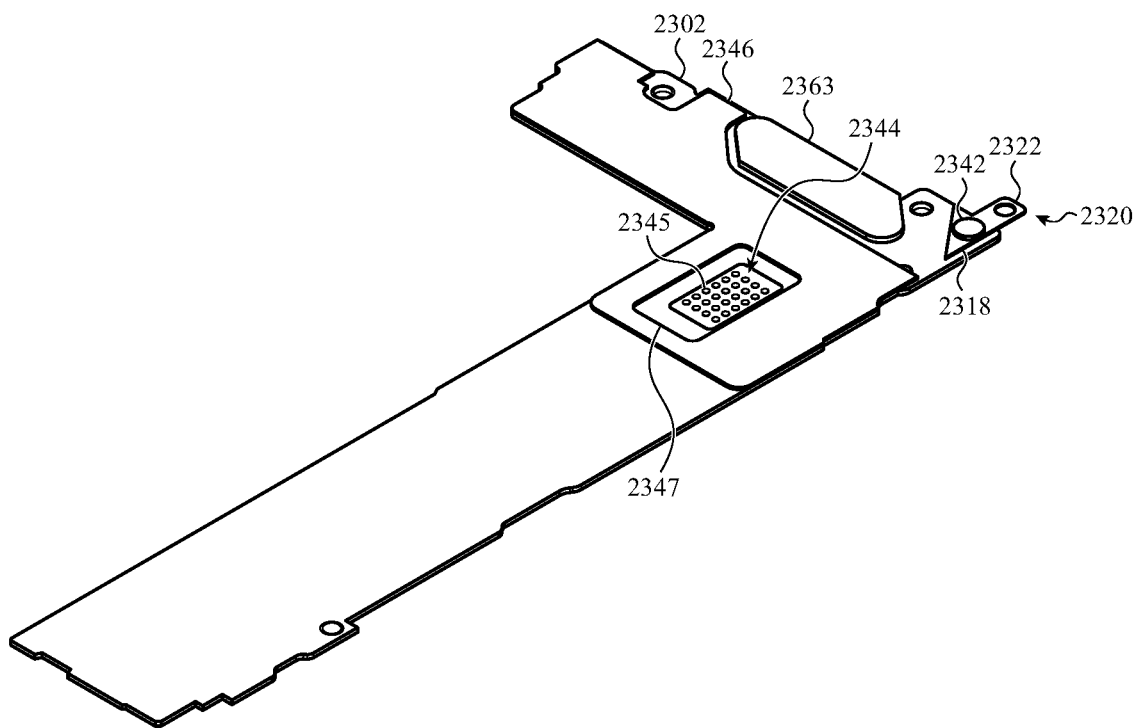
FIG. 23C depicts a back view of the logic board of FIG. 23A.

FIG. 23C shows the bottom surface of the logic board 2300. As shown, the attachment feature 2320 includes a mounting portion 2318 that is attached to the bottom surface of the logic board 2300. For example, the attachment feature 2320 may be soldered to the bottom surface of the first substrate 2302. In some cases, the entire area of the mounting portion 2318 (e.g., the triangular portion of the attachment feature 2320) may be soldered to a metal portion on the bottom surface of the logic board 2300. The attachment feature 2320 may also be secured to the first substrate 2302 via a fastener assembly, which includes a socket portion 2342.

Figure 23D:
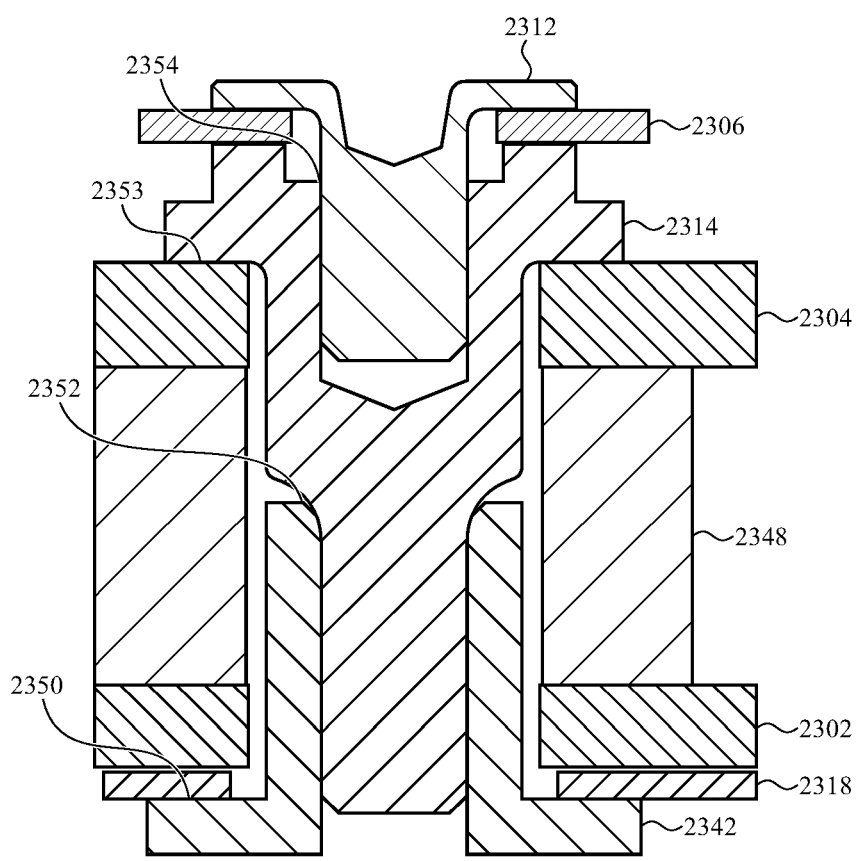
FIG. 23D depicts a partial cross-sectional view of a portion of the logic board of FIG. 23A.

FIG. 23D is a partial cross-sectional view of the logic board 2300, viewed along line 23D-23D in FIG. 23A, illustrating a fastener assembly that is configured to secure the attachment feature 2320 to the logic board 2300, as well as help retain the first and second substrates of the logic board 2300 together, and providing an attachment feature for the shroud 2306. For example, a socket portion 2342 may extend through a hole in the mounting portion 2318 of the attachment feature and through a hole in the first substrate 2302. A bolt portion 2314 may extend through a hole in the second substrate 2304. The socket portion 2342 may define a flange portion 2350 that contacts the mounting portion 2318 (and is optionally soldered, adhered, welded, or otherwise attached to the mounting portion 2318), and the bolt portion 2314 may define a flange portion 2353 that contacts the second substrate 2304. The bolt portion 2314 may be threaded into a threaded hole 2352 of the socket portion 2342, thereby clamping the first and second substrates 2302, 2304 and the mounting portion 2318 between the flange portions 2350, 2353. As shown in FIG. 23D, an intermediate structure 2348 may be positioned between the first and second substrates 2302, 2304. The intermediate structure 2348 may be a portion of the wall structure 2308, or it may be a separate component such as a spacer, washer, ferrule, or the like. In some cases, the socket portion 2342 and the bolt portion 2314 may be configured to seat or bottom-out against one another (e.g., to define a predetermined distance between the flange portions 2353 and 2350 when the socket and bolt portions are fully threaded together) to mitigate the possibility of over-tightening the fastener assembly, which could crush or otherwise damage the substrates 2302, 2304 and/or the intermediate structure 2348.

As shown in FIG. 23D, the bolt portion 2314 may also define a hole 2354 (e.g., a threaded hole) that is configured to receive screw 2312. The screw 2312 may be configured to clamp the shroud 2306 between a surface of the screw 2312 and a surface of the bolt portion 2314.

With reference to FIG. 23C, the logic board 2300 may also include a stiffener or reinforcement plate 2346 attached to the bottom surface of the first substrate 2302. The stiffener plate 2346 may be attached to the first substrate 2302 via an adhesive, solder, fasteners, and/or other suitable attachment techniques. The stiffener plate 2346 may be formed from metal, carbon fiber, a polymer, or any other suitable material. The stiffener plate 2346 may reinforce the first substrate 2302 (and the attachment region 2344 more specifically) to increase the overall stiffness of the first substrate 2302. For example, twisting or other distortion of the first substrate 2302 in the vicinity of the attachment region 2344 may result in the solder joints between the first substrate 2302 and the flexible circuit element 2310 breaking. The stiffener plate 2346 may increase the resistance of the first substrate 2302 to flexing, twisting, or other distortions or deformations, thereby improving the durability and/or reliability of the conductive coupling between the flexible circuit element 2310 and the first substrate 2302.

The stiffener plate 2346 may define an opening 2347 that exposes an attachment region 2344 where the flexible circuit element 2310 is attached to the first substrate 2302. The opening 2347 may extend around the outer periphery of the attachment region 2344 (e.g., along four sides of the attachment region 2344). As noted above, solder pads 2345 may be positioned in the attachment region 2344 to facilitate a conductive coupling with the flexible circuit element 2310. The logic board 2300 may also include a rear-fired antenna array 2363, which may be conductively coupled to the first substrate 2302 via one or more solder connections as well. The rear-fired antenna array 2363 may correspond to the rear-fired antenna array 732, or any other rear-fired antenna array described herein.

Figure 23E:
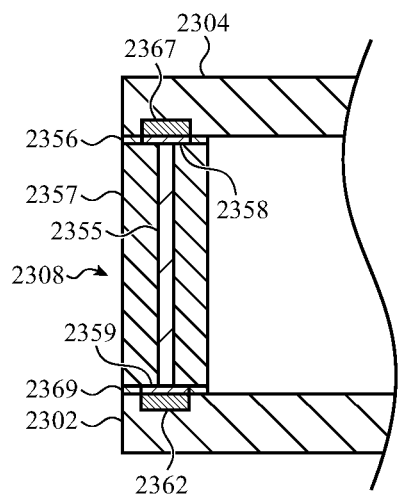
FIG. 23E depicts a partial cross-sectional view of another portion of the logic board of FIG. 23A.

FIG. 23E is a partial cross-sectional view of the logic board 2300, viewed along line 23E-23E in FIG. 23A, illustrating the interfaces between the first and second substrates 2302, 2304 and the wall structure 2308. As noted above, the wall structure 2308 may include conductive vias, such as the conductive via 2355, within a matrix material 2357. The matrix material may be a polymer, fiber-reinforced polymer, or the like, and the conductive via 2355 may be a metal, such as copper, gold, or any other suitable conductor. The first substrate 2302 may include solder pads, such as the solder pad 2362, and the second substrate may include solder pads, such as the solder pad 2361. The solder pads 2361, 2362 may be conductively coupled to other components that are attached to the first and second substrates 2302, 2304, such as a processor, memory module, or any other suitable component. The conductive via 2355 may be soldered to the solder pad 2362 via a first solder material 2359 having a first melting temperature, and to the solder pad 2361 via a second solder material 2358 having a second melting temperature that is lower than the first melting temperature. For example, the second melting temperature may be between about 20 degrees Celsius and about 30 degrees Celsius lower than the first melting temperature. In some cases, the first solder material 2359 is a high-temperature solder, and the second solder material 2358 is a medium-temperature solder. The first solder material and the second solder material may both exhibit a ductile failure mode (as opposed to a brittle failure mode) at strain rates of about $100\ s^{-1}$. For example, when subjected to strain rates of about $100\ s^{-1}$, both the first solder material and the second solder material may exhibit plastic deformation after a yield point, such that a stress-strain curve for the first and second solder materials includes at least one region, after a yield point, of at least relatively constant stress across an increasing range of strains.

As noted above, a curable material 2369 may be introduced between the wall structure 2308 and the top surface of the first substrate 2302, and a curable material 2356 may be introduced between the wall structure 2308 and the bottom surface of the second substrate 2304. As shown, the curable materials 2360, 2356 may flow or otherwise extend around the solder materials 2358, 2359, and may adhere to the surfaces of the wall structure 2308 and substrates 2302, 2304. The curable materials 2360, 2356 may be the same or different materials, and may be an epoxy, adhesive, or other curable material.

Figure 23F:
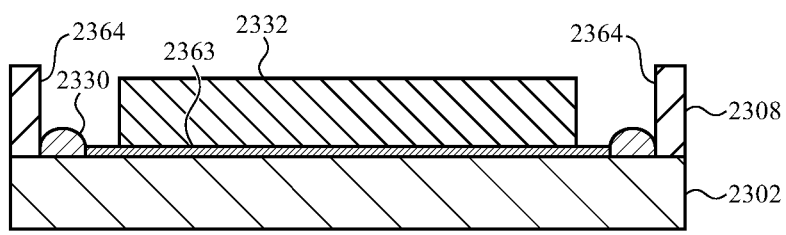
FIG. 23F depicts a partial cross-sectional view of another portion of the logic board of FIG. 23A.

FIG. 23F is a partial cross-sectional view of the logic board 2300, viewed along line 23F-23F in FIG. 23B. FIG. 23F illustrates an example configuration of the barrier 2330 or dam that is positioned on the first substrate 2302 and extending at least partially around an outer periphery of a circuit element such as the processor 2332. As noted above, the barrier 2330 may be formed of a solder material, such as a high-temperature solder. The barrier 2330 may have a height (e.g., along the vertical direction as shown in FIG. 23F) between about 0.05 mm and about 0.07 mm. In some cases, the barrier 2230 has a height between about 0.04 mm and about 0.1 mm.

In some cases, the wall structure 2308 contacts a side of the barrier 2330. For example, the barrier 2330 may be deposited onto the first substrate 2302 after the wall structure 2308 is attached to the first substrate 2302, and the barrier 2330 may abut or flow against the wall structure 2308. An inner surface 2364 of the wall structure 2308 may be set apart from a side of the circuit element (e.g., the processor 2332) by a distance between about 0.2 mm and 0.4 mm. In some cases, the inner surface 2364 of the wall structure 2308 is set apart from a side of the circuit element (e.g., the processor 2332) by a distance less than about 1.0 mm.

The barrier 2330 may be configured to limit a spread of a liquid adhesive along the first substrate 2302. For example, a curable liquid adhesive (e.g., an epoxy) may be flowed between the circuit element (e.g., the processor 2332) and the surface of the first substrate 2302. Once cured, the adhesive may reinforce the solder joints between the circuit element and the first substrate 2302, and may increase the strength of the mechanical attachment between the circuit element and the first substrate 2302. The barrier 2330 is configured to limit a spread of a liquid adhesive along the first circuit board as it is flowed between the circuit element and the surface of the first substrate 2302. For example, the barrier 2330 may help contain the liquid adhesive below the circuit element, such that it does not flow away and become too thin or distributed to successfully reinforce the solder joints, and also help prevent the liquid adhesive from flowing onto surfaces or components that are not intended to be contacted by the adhesive.

Figure 24A:
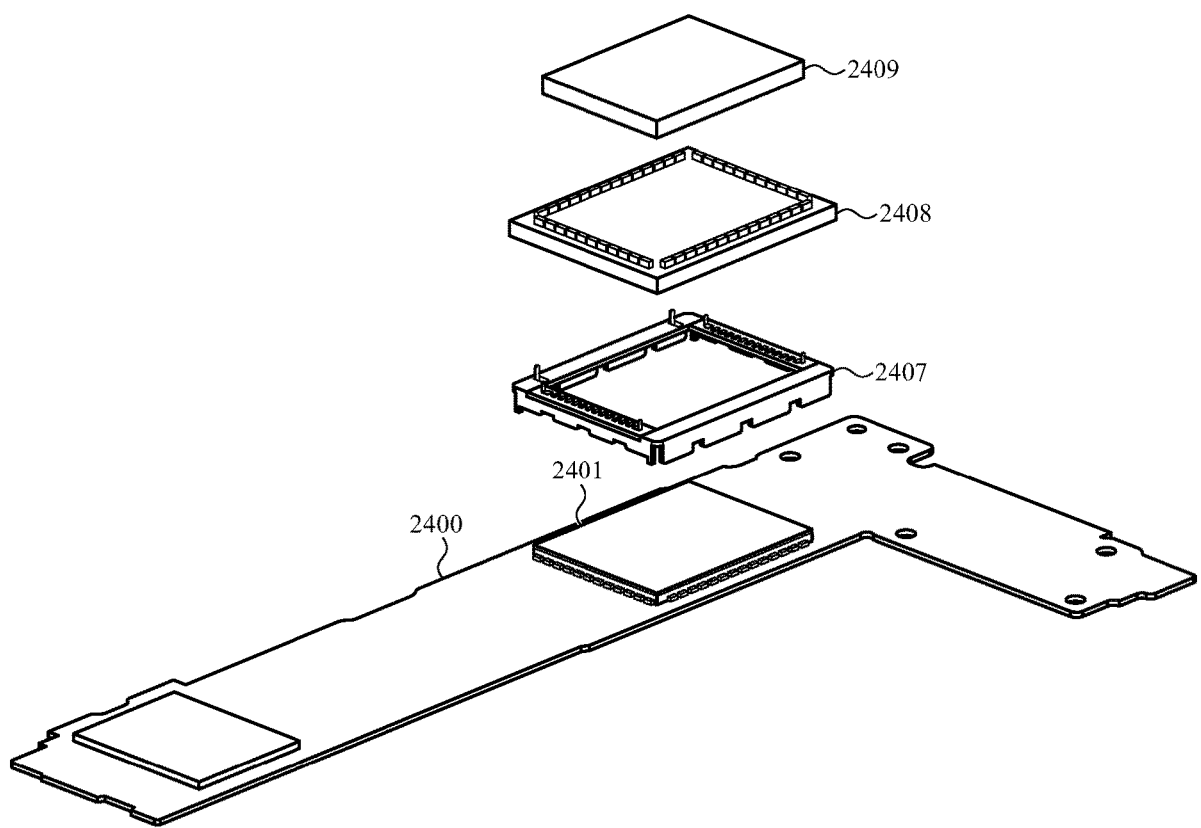
FIGS. 24A-24C depict exploded views of example multi-layer configurations for electronic components of an electronic device.
Figure 24B:
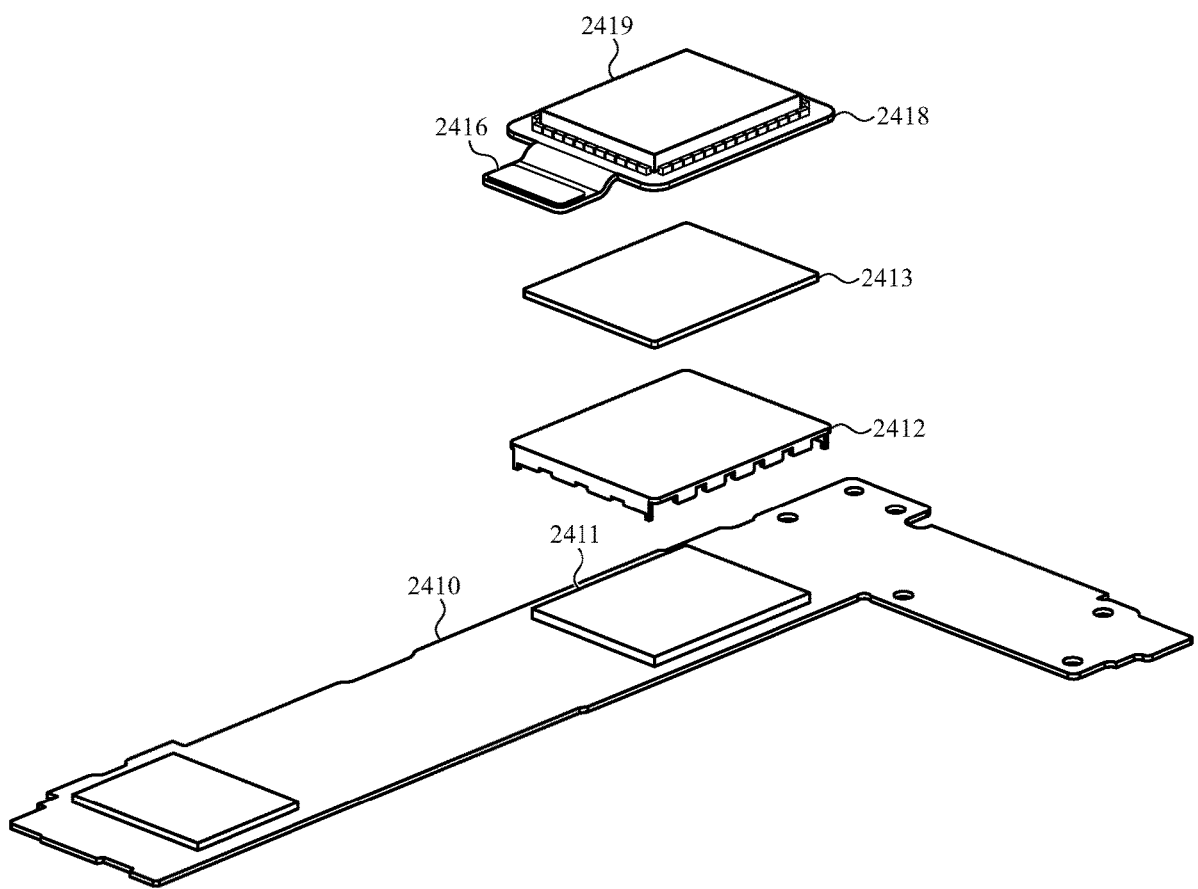
Figure 24C:
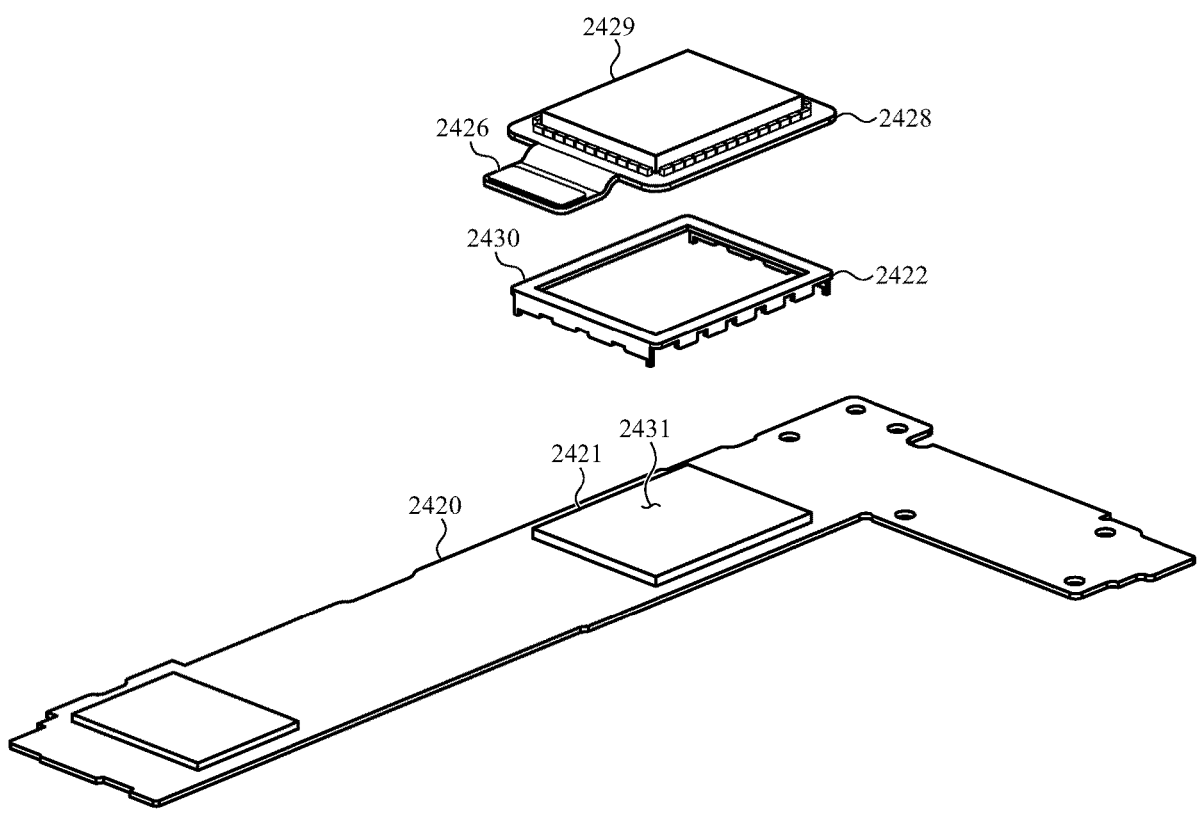

The logic board 2300 in FIGS. 23A-23B illustrates one example technique for forming a multi-level component, where some electrical components (e.g., the memory module 2316) is positioned on a substrate above other electrical components (e.g., the processor 2332). This configuration may help reduce the footprint of the logic board 2300 by stacking components rather than requiring them to be positioned next to each other on the same substrate. FIGS. 24A-24C illustrate other example structures whereby components may be stacked to help reduce the overall footprint of a logic board or circuit board, and/or to otherwise simplify or improve the operation or manufacturing of the device.

FIG. 24A, for example, shows an exploded view of a portion of a logic board, showing an example lofting or two-level configuration for electrical components. In particular, FIG. 24A shows a first substrate 2400 (e.g., a circuit board) with a processor 2401 positioned on the surface of the first substrate 2400. The processor 2401 may be an embodiment of the processor 2332, and the first substrate 2400 may be an embodiment of the first substrate 2302. A frame member 2407 may be attached to the first substrate 2400 and may extend around a perimeter of the processor 2401 (e.g., side walls of the frame member may extend around a perimeter of the processor 2401). The frame member 2407 may be soldered to the first substrate 2400, and may include vias or other conductive paths to conductively couple the frame member 2407 and any circuit boards and/or electrical components (e.g., a memory module 2409) to the first substrate 2400.

A second substrate 2408 may be attached to the frame member 2407. For example, the second substrate 2408 may be soldered to the frame member 2407. The solder connections between the frame member 2407 and the first and second substrates 2400, 2408 may structurally and conductively couple the frame member 2407 and the first and second substrates 2400, 2408 together. In some cases, after the frame member 2407 is attached to the first substrate 2400 and before the second substrate 2408 is attached to the frame member 2407, a thermal paste, gel, or other material may be applied to the processor 2401 to aid in conducting heat away from the processor 2401. In such cases, the thermal material may be dispensed through the opening in the frame member 2407.

The frame member 2407 and the first and second substrates 2400, 2408 may define a physical and EMI shield around the processor 2401. For example, the conductive materials (e.g., vias, traces, etc.) in the first and second substrates 2400, 2408, as well as the metal material of the frame member 2407, may be conductively coupled together, thereby forming a structure that can prevent or inhibit the passage of electromagnetic signals or other interference either from or to the processor 2401 (or any electrical component(s) within the area defined by the frame member 2407 and the first and second substrates 2400, 2408.

FIG. 24B illustrates another example configuration of a multi-level circuit element arrangement. In particular, FIG. 24B shows a first substrate 2410 (e.g., a circuit board) with a processor 2411 positioned on the surface of the first substrate 2410. The processor 2411 may be an embodiment of the processor 2332, and the first substrate 2410 may be an embodiment of the first substrate 2402. A shield member 2412 may be attached to the first substrate 2410 and may extend around a perimeter of the processor 2411 and over a top of the processor 2411 (e.g., the shield member 2412 defines side walls and a top wall that substantially enclose the processor 2411). The shield member 2412 may be soldered or otherwise secured to the first substrate 2410 (e.g., via fasteners, adhesives, etc.). The shield member 2412 may be formed of or include metal or another conductive material, thereby providing EMI shielding properties.

A second substrate 2418, such as a flexible circuit board, may have a memory module 2419 conductively coupled thereto, and the second substrate 2418 may be attached to the top wall of the shield member 2412. For example, the second substrate 2418 may be adhered to the top of the shield member 2412 via an adhesive 2413 (which may be a conductive adhesive). The second substrate 2418 may also include a connector 2416, which may conductively couple the memory module 2419 (or any electrical component on the second substrate 2418) to the first substrate 2410 and thereby to any of the electrical components on the first substrate 2410 (e.g., the processor 2411). Because the second substrate 2418 includes the connector 2416, the shield member 2412 does not need to provide vias, traces, or other conductive paths to conductively couple the electrical components of the first and second substrates 2410, 2418 (though such conductive paths may be provided if desired, and the second substrate 2418 may be conductively coupled to the shield member 2412 via a conductive adhesive 2413 such as to provide a common electrical ground between the shield member 2412 and conductive materials in the second substrate 2418).

As noted above, a thermal gel, paste, or other material may be applied to the processor 2411 to aid in conducting heat away from the processor 2411. However, thermal gels, pastes, or other materials may be sensitive to heat (e.g., it may degrade the material, cause it to flow away from its intended location, or the like). Because the shield member 2412 does not have an opening in the top wall, the thermal material may be dispensed onto the processor 2411 prior to the shield member 2412 being attached to the first substrate 2410. Accordingly, the shield member 2412 may be secured to the first substrate 2410 using a medium or low temperature solder operation, thereby helping to limit the amount of heat that the thermal gel is exposed to. Additionally, because the second substrate 2418 is attached via an adhesive, there is no additional soldering operation required to secure the second substrate 2418 to the shield member 2412, thereby further limiting the exposure of the thermal gel to heat.

FIG. 24C illustrates another example configuration of a multi-level circuit element arrangement. In particular, FIG. 24C shows a first substrate 2420 (e.g., a circuit board) with a processor 2421 positioned on the surface of the first substrate 2420. The processor 2421 may be an embodiment of the processor 2332, and the first substrate 2420 may be an embodiment of the first substrate 2402. A frame member 2422 may be attached to the first substrate 2420 and may extend around a perimeter of the processor 2421. The frame member 2422 may be similar to the shield member 2412, except that the frame member 2422 may define an opening along the top of the frame member 2422 (e.g., similar to the configuration in FIG. 24A). The frame member 2422 may be soldered or otherwise secured to the first substrate 2420 (e.g., via fasteners, adhesives, etc.). The opening along the top of the frame member 2422 may allow a curable material to be introduced between the processor 2421 and the first substrate 2420 (as described above with respect to FIG. 23B) after the frame member 2422 is attached to the first substrate 2420.

A second substrate 2428, such as a flexible circuit board, may have a memory module 2429 conductively coupled thereto, and the second substrate 2428 may be attached to the top wall of the frame member 2422. For example, the second substrate 2428 may be adhered to the top of the frame member 2422 via an adhesive (which may be a conductive adhesive), by soldering, with fasteners, or the like. The second substrate 2428 may also include a connector 2426, which may conductively couple the memory module 2429 (or any electrical component on the second substrate 2428) to the first substrate 2420 and thereby to any of the electrical components on the first substrate 2420 (e.g., the processor 2421). Because the second substrate 2428 includes the connector 2426, the frame member 2422 does not need to provide vias, traces, or other conductive paths to conductively couple the electrical components of the first and second substrates 2420, 2428. In some cases, however, the frame member 2422, which may be formed of or include metal or another conductive material, may conductively couple to conductive materials in the second substrate 2428 so that the frame member 2422 and the second substrate 2428 can cooperate to provide EMI shielding functionality. For example, the frame member 2422 may be conductively coupled to the second substrate 2428 (e.g., via solder, conductive adhesive, etc.) to provide a common electrical ground to the frame member 2422 and the second substrate 2428, thereby facilitating EMI shielding functionality.

As noted above, a thermal gel, paste, or other material may be applied to the processor 2421 to aid in conducting heat away from the processor 2421. Because the frame member 2422 has an opening in the top wall, the thermal material may be dispensed onto the processor 2421 after the frame member 2422 is attached to the first substrate 2420.

In some cases, the height of a top surface 2430 of the frame member 2422, when the frame member 2422 and the processor 2421 are attached to the first substrate 2420, is substantially flush with or recessed relative to a top surface 2431 of the processor 2421. In such cases, the bottom surface of the second substrate 2428 may be in contact with or only a small distance (e.g., around 50 microns, around 100 microns, or the like) above the top surface 2431 of the processor 2421. In cases where the top surface 2430 is recessed relative to (e.g., below) the top surface 2431 of the processor 2421, an adhesive on the top surface 2430 may adhere the second substrate 2428 to the frame member 2422, and also increase the effective height of the frame member 2422 such that the bottom surface of the second substrate 2428 is contacting or above the top surface 2431 of the processor 2421 (despite the top surface 2430 being recessed relative to the top surface 2431 of the processor 2421).

While FIGS. 24A-24C illustrate a processor and a memory module, these are merely example electrical components that may be coupled to a logic board using the configurations shown. In other cases, the position of the processor and the memory module may be reversed, and/or other types of electrical component(s) may be used, such as integrated circuits, ASICs, analog chips, or any other suitable electrical component.

Figure 25:
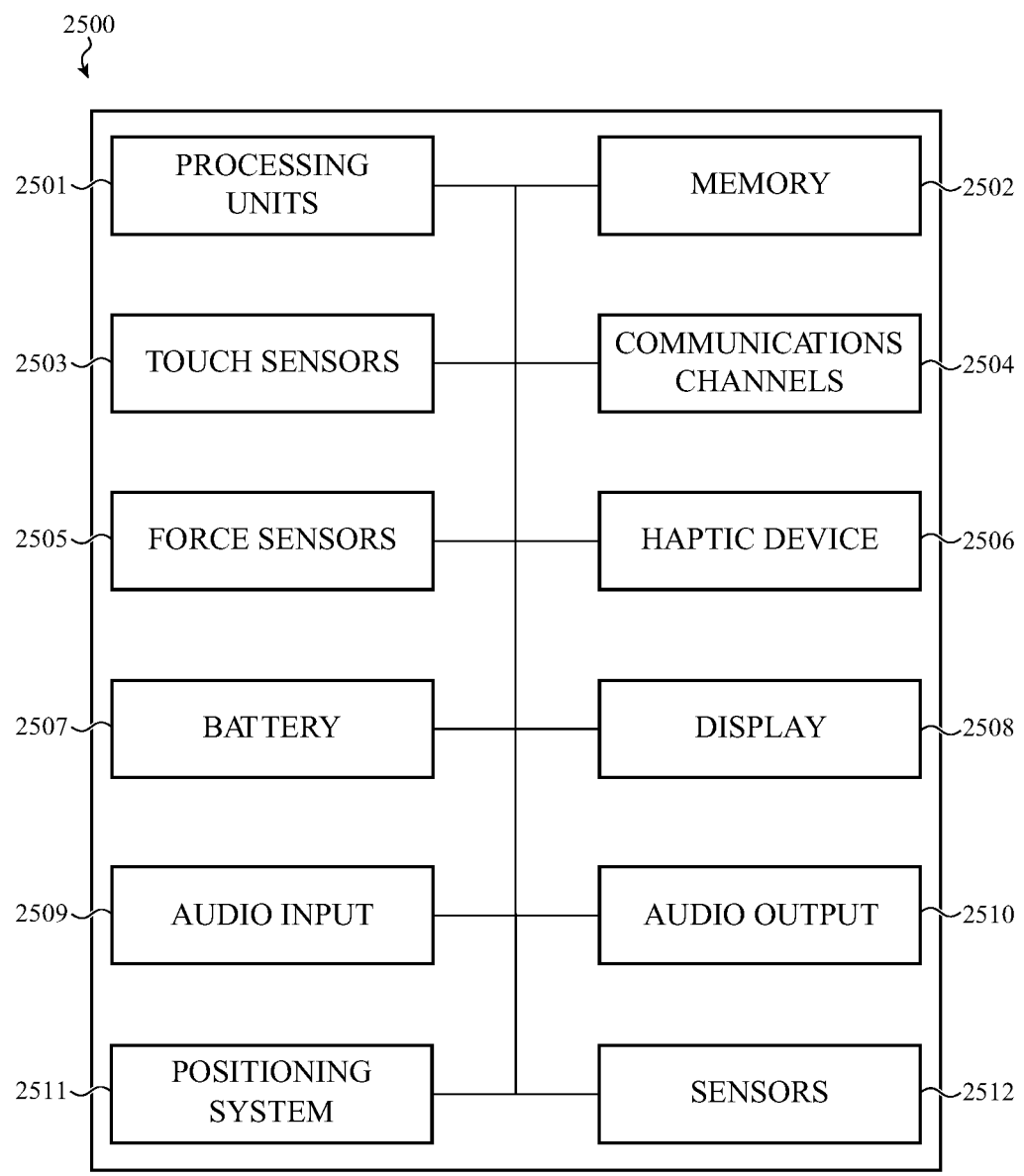
FIG. 25 depicts a schematic diagram of an example electronic device.

FIG. 25 depicts an example schematic diagram of an electronic device 2500. The electronic device 2500 may be an embodiment of or otherwise represent the device 100 (or other devices described herein, such as the devices 140, 200, 300, 400, 500, 600, 700, or the like). The device 2500 includes one or more processing units 2501 that are configured to access a memory 2502 having instructions stored thereon. The instructions or computer programs may be configured to perform one or more of the operations or functions described with respect to the electronic devices described herein. For example, the instructions may be configured to control or coordinate the operation of one or more displays 2508, one or more touch sensors 2503, one or more force sensors 2505, one or more communication channels 2504, one or more audio input systems 2509, one or more audio output systems 2510, one or more positioning systems 2511, one or more sensors 2512, and/or one or more haptic feedback devices 2506.

The processing units 2501 of FIG. 25 may be implemented as any electronic device capable of processing, receiving, or transmitting data or instructions. For example, the processing units 2501 may include one or more of: a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements. The processing units 2501 may be coupled to a logic board, such as the logic boards 220, 320, 420, 520, of FIG. 2-5, or 2300 of FIGS. 23A-23C.

The memory 2502 can store electronic data that can be used by the device 2500. For example, a memory can store electrical data or content such as, for example, audio and video files, images, documents and applications, device settings and user preferences, programs, instructions, timing and control signals or data for the various modules, data structures or databases, and so on. The memory 2502 can be configured as any type of memory. By way of example only, the memory can be implemented as random access memory, read-only memory, Flash memory, removable memory, or other types of storage elements, or combinations of such devices. The memory 2502 may be coupled to a logic board, such as the logic boards 220, 320, 420, 520, of FIG. 2-5, or 2300 of FIGS. 23A-23C.

The touch sensors 2503 may detect various types of touch-based inputs and generate signals or data that are able to be accessed using processor instructions. The touch sensors 2503 may use any suitable components and may rely on any suitable phenomena to detect physical inputs. For example, the touch sensors 2503 may be capacitive touch sensors, resistive touch sensors, acoustic wave sensors, or the like. The touch sensors 2503 may include any suitable components for detecting touch-based inputs and generating signals or data that are able to be accessed using processor instructions, including electrodes (e.g., electrode layers), physical components (e.g., substrates, spacing layers, structural supports, compressible elements, etc.) processors, circuitry, firmware, and the like. The touch sensors 2503 may be integrated with or otherwise configured to detect touch inputs applied to any portion of the device 2500. For example, the touch sensors 2503 may be configured to detect touch inputs applied to any portion of the device 2500 that includes a display (and may be integrated with a display). The touch sensors 2503 may operate in conjunction with the force sensors 2505 to generate signals or data in response to touch inputs. A touch sensor or force sensor that is positioned over a display surface or otherwise integrated with a display may be referred to herein as a touch-sensitive display, force-sensitive display, or touchscreen.

The force sensors 2505 may detect various types of force-based inputs and generate signals or data that are able to be accessed using processor instructions. The force sensors 2505 may use any suitable components and may rely on any suitable phenomena to detect physical inputs. For example, the force sensors 2505 may be strain-based sensors, piezoelectric-based sensors, piezoresistive-based sensors, capacitive sensors, resistive sensors, or the like. The force sensors 2505 may include any suitable components for detecting force-based inputs and generating signals or data that are able to be accessed using processor instructions, including electrodes (e.g., electrode layers), physical components (e.g., substrates, spacing layers, structural supports, compressible elements, etc.) processors, circuitry, firmware, and the like. The force sensors 2505 may be used in conjunction with various input mechanisms to detect various types of inputs. For example, the force sensors 2505 may be used to detect presses or other force inputs that satisfy a force threshold (which may represent a more forceful input than is typical for a standard "touch" input) Like the touch sensors 2503, the force sensors 2505 may be integrated with or otherwise configured to detect force inputs applied to any portion of the device 2500. For example, the force sensors 2505 may be configured to detect force inputs applied to any portion of the device 2500 that includes a display (and may be integrated with a display). The force sensors 2505 may operate in conjunction with the touch sensors 2503 to generate signals or data in response to touch- and/or force-based inputs.

The device 2500 may also include one or more haptic devices 2506 (e.g., the haptic actuator 222, 322, 422, 522 of FIG. 2-5 or 1804, 1900, 1920 of FIGS. 18-19B). The haptic device 2506 may include one or more of a variety of haptic technologies such as, but not necessarily limited to, rotational haptic devices, linear actuators, piezoelectric devices, vibration elements, and so on. In general, the haptic device 2506 may be configured to provide punctuated and distinct feedback to a user of the device. More particularly, the haptic device 2506 may be adapted to produce a knock or tap sensation and/or a vibration sensation. Such haptic outputs may be provided in response to detection of touch and/or force inputs, and may be imparted to a user through the exterior surface of the device 2500 (e.g., via a glass or other surface that acts as a touch- and/or force-sensitive display or surface).

The one or more communication channels 2504 may include one or more wireless interface(s) that are adapted to provide communication between the processing unit(s) 2501 and an external device. The one or more communication channels 2504 may include antennas (e.g., antennas that include or use the housing members of the housing 104 as radiating members), communications circuitry, firmware, software, or any other components or systems that facilitate wireless communications with other devices. In general, the one or more communication channels 2504 may be configured to transmit and receive data and/or signals that may be interpreted by instructions executed on the processing units 2501. In some cases, the external device is part of an external communication network that is configured to exchange data with wireless devices. Generally, the wireless interface may communicate via, without limitation, radio frequency, optical, acoustic, and/or magnetic signals and may be configured to operate over a wireless interface or protocol. Example wireless interfaces include radio frequency cellular interfaces (e.g., 2G, 3G, 4G, 4G long-term evolution (LTE), 5G, GSM, CDMA, or the like), fiber optic interfaces, acoustic interfaces, Bluetooth interfaces, infrared interfaces, USB interfaces, Wi-Fi interfaces, TCP/IP interfaces, network communications interfaces, or any conventional communication interfaces. The one or more communications channels 2504 may also include ultra-wideband interfaces, which may include any appropriate communications circuitry, instructions, and number and position of suitable UWB antennas.

As shown in FIG. 25, the device 2500 may include a battery 2507 that is used to store and provide power to the other components of the device 2500. The battery 2507 may be a rechargeable power supply that is configured to provide power to the device 2500. The battery 2507 may be coupled to charging systems (e.g., wired and/or wireless charging systems) and/or other circuitry to control the electrical power provided to the battery 2507 and to control the electrical power provided from the battery 2507 to the device 2500.

The device 2500 may also include one or more displays 2508 configured to display graphical outputs. The displays 2508 may use any suitable display technology, including liquid crystal displays (LCD), organic light emitting diodes (OLED), active-matrix organic light-emitting diode displays (AMOLED), or the like. The displays 2508 may display graphical user interfaces, images, icons, or any other suitable graphical outputs. The display 2508 may correspond to a display 203, 303, 403, 503 of FIGS. 2-5.

The device 2500 may also provide audio input functionality via one or more audio input systems 2509. The audio input systems 2509 may include microphones, transducers, or other devices that capture sound for voice calls, video calls, audio recordings, video recordings, voice commands, and the like.

The device 2500 may also provide audio output functionality via one or more audio output systems (e.g., speakers) 2510, such as the speaker systems 224, 324, 424, 524 of FIGS. 2-5. The audio output systems 2510 may produce sound from voice calls, video calls, streaming or local audio content, streaming or local video content, or the like.

The device 2500 may also include a positioning system 2511. The positioning system 2511 may be configured to determine the location of the device 2500. For example, the positioning system 2511 may include magnetometers, gyroscopes, accelerometers, optical sensors, cameras, global positioning system (GPS) receivers, inertial positioning systems, or the like. The positioning system 2511 may be used to determine spatial parameters of the device 2500, such as the location of the device 2500 (e.g., geographical coordinates of the device), measurements or estimates of physical movement of the device 2500, an orientation of the device 2500, or the like.

The device 2500 may also include one or more additional sensors 2512 to receive inputs (e.g., from a user or another computer, device, system, network, etc.) or to detect any suitable property or parameter of the device, the environment surrounding the device, people or things interacting with the device (or nearby the device), or the like. For example, a device may include temperature sensors, biometric sensors (e.g., fingerprint sensors, photoplethysmographs, blood-oxygen sensors, blood sugar sensors, or the like), eye-tracking sensors, retinal scanners, humidity sensors, buttons, switches, lid-closure sensors, or the like.

To the extent that multiple functionalities, operations, and structures described with reference to FIG. 25 are disclosed as being part of, incorporated into, or performed by the device 2500, it should be understood that various embodiments may omit any or all such described functionalities, operations, and structures. Thus, different embodiments of the device 2500 may have some, none, or all of the various capabilities, apparatuses, physical features, modes, and operating parameters discussed herein. Further, the systems included in the device 2500 are not exclusive, and the device 2500 may include alternative or additional systems, components, modules, programs, instructions, or the like, that may be necessary or useful to perform the functions described herein.

As described above, one aspect of the present technology is the gathering and use of data available from various sources to improve the usefulness and functionality of devices such as mobile phones. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to locate devices, deliver targeted content that is of greater interest to the user, or the like. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings. Also, when used herein to refer to positions of components, the terms above, below, over, under, left, or right (or other similar relative position terms), do not necessarily refer to an absolute position relative to an external reference, but instead refer to the relative position of components within the figure being referred to. Similarly, horizontal and vertical orientations may be understood as relative to the orientation of the components within the figure being referred to, unless an absolute horizontal or vertical orientation is indicated.

What is claimed is:

1. A portable electronic device comprising:
    a front cover;
    a rear cover; and
    a housing structure between and coupled to the front cover and the rear cover, the housing structure comprising:
        a first housing member defining:
            a first exterior side;
            a first interior side opposite the first exterior side;
            a first end surface extending between the first exterior side and the first interior side;
            a first interlock feature comprising a recess formed along the first end surface; and
            a second interlock feature extending from the first interior side;
        a second housing member defining:
            a second exterior side;
            a second interior side opposite the second exterior side;
            a second end surface extending between the second exterior side and the second interior side;
            a third interlock feature comprising a protrusion formed along the second end surface; and
            a fourth interlock feature extending from the second interior side; and
        a nonconductive joining element engaged with the first interlock feature, the second interlock feature, the third interlock feature, and the fourth interlock feature, thereby structurally coupling the first housing member to the second housing member.

2. The portable electronic device of claim 1, wherein the first interlock feature is a recess having a depth between about 100 microns and about 1000 microns.

3. The portable electronic device of claim 1, wherein the first interlock feature is an elongate recess having a width between about 100 microns and about 500 microns, and having a length between about 750 microns and about 3000 microns.

4. The portable electronic device of claim 1, wherein the first interlock feature is a recess having a width greater than about 100 microns and a length greater than about 1000 microns.

5. The portable electronic device of claim 1, wherein:
    the first housing member defines a flange extending from the second interlock feature and positioned along a peripheral side of the front cover;
    the flange defines a portion of the first end surface; and
    the first interlock feature is formed in the portion of the first end surface defined by the flange.

6. The portable electronic device of claim 5, wherein:
    the flange extends from the second interlock feature along a direction; and
    the first interlock feature defines an elongate recess defined in part by a longitudinal axis extending along the direction.

7. A portable electronic device comprising:
    a front cover;
    a rear cover; and
    a housing structure between and coupled to the front cover and the rear cover, the housing structure comprising:
        a first housing member defining:
            a first portion of an exterior surface of the housing structure; and
            a first interlock feature;
        a second housing member defining:
            a second portion of the exterior surface of the housing structure; and
            a second interlock feature, the second housing member set apart from the first housing member by a channel defining:
                a first region extending inwardly from the exterior surface of the housing structure along a first direction; and
                a second region extending inwardly from the first region along a second direction that is not parallel to the first direction; and
        a nonconductive joining element at least partially filling the channel and engaged with the first interlock feature and the second interlock feature, thereby structurally coupling the first housing member to the second housing member and defining a third portion of the exterior surface of the housing structure.

8. The portable electronic device of claim 7, wherein the second region of the channel is at least partially defined by the first interlock feature and the second interlock feature.

9. The portable electronic device of claim 7, wherein:
    the first interlock feature defines a first end surface defining a first wall of the second region of the channel; and
    the second interlock feature defines a second end surface defining a second wall of the second region of the channel.

10. The portable electronic device of claim 9, wherein the first end surface is parallel to the second end surface.

11. The portable electronic device of claim 7, wherein:
the first interlock feature defines a first lug;
the second interlock feature defines a second lug; and
a connector assembly is conductively coupled to the first interlock feature via the first lug and conductively coupled to the second interlock feature via the second lug.

12. The portable electronic device of claim 11, wherein:
the connector assembly is conductively coupled to the first interlock feature via a first threaded fastener; and
the connector assembly is conductively coupled to the second interlock feature via a second threaded fastener.

13. The portable electronic device of claim 12, wherein:
the connector assembly conductively couples the first housing member to first antenna circuitry; and
the connector assembly conductively couples the second housing member to second antenna circuitry.

14. The portable electronic device of claim 13, wherein the connector assembly comprises:
a first conductor configured to conductively couple the first housing member to the first antenna circuitry;
a second conductor configured to conductively couple the second housing member to the second antenna circuitry; and
a polymer material at least partially encapsulating the first conductor and the second conductor.

15. A portable electronic device comprising:
a front cover;
a rear cover; and
a housing structure between and coupled to the front cover and the rear cover, the housing structure comprising:
a first housing member defining:
a first sidewall defining:
a first portion of an exterior surface of the portable electronic device; and
a first end surface; and
a first interlock feature extending from the first sidewall and defining a second end surface extending at a first angle from the first end surface;
a second housing member defining:
a second sidewall defining:
a second portion of the exterior surface of the portable electronic device; and
a third end surface; and
a second interlock feature extending from the second sidewall and defining a fourth end surface extending at a second angle from the third end surface; and
a nonconductive joining element at least partially filling a channel defined by the first end surface, the second end surface, the third end surface, and the fourth end surface, and engaged with the first interlock feature and the second interlock feature, thereby structurally coupling the first housing member to the second housing member.

16. The portable electronic device of claim 15, wherein:
the first end surface is parallel to the third end surface; and
the second end surface is parallel to the fourth end surface.

17. The portable electronic device of claim 15, further comprising:
a connector assembly conductively coupled to the first interlock feature and the second interlock feature; and
a flexible circuit element conductively coupled to the connector assembly.

18. The portable electronic device of claim 17, wherein:
the first housing member is conductively coupled to first antenna circuitry via the connector assembly and the flexible circuit element; and
the second housing member is conductively coupled to second antenna circuitry via the connector assembly and the flexible circuit element.

19. The portable electronic device of claim 18, wherein:
the portable electronic device further comprises a frame member coupled to the rear cover and configured to receive a camera module; and
the flexible circuit element is positioned in a gap defined by the frame member and the first housing member.

20. A portable electronic device comprising:
a front cover;
a rear cover; and
a housing structure between and coupled to the front cover and the rear cover, the housing structure comprising:
a first housing member defining:
a first exterior side;
a first interior side opposite the first exterior side;
a first end surface extending between the first exterior side and the first interior side;
a first interlock feature comprising a first protrusion formed along the first end surface; and
a second interlock feature extending from the first interior side;
a second housing member defining:
a second exterior side;
a second interior side opposite the second exterior side;
a second end surface extending between the second exterior side and the second interior side;
a third interlock feature comprising a second protrusion formed along the second end surface; and
a fourth interlock feature extending from the second interior side; and
a nonconductive joining element engaged with the first interlock feature, the second interlock feature, the third interlock feature, and the fourth interlock feature, thereby structurally coupling the first housing member to the second housing member.

21. The portable electronic device of claim 20, wherein the second housing member is set apart from the first housing member by a channel defining:
a first region extending inwardly from the first exterior side of the first housing member along a first direction; and
a second region extending inwardly from the first region along a second direction that is not parallel to the first direction.

22. The portable electronic device of claim 21, wherein the second region of the channel is at least partially defined by the second interlock feature and the fourth interlock feature.

23. A portable electronic device comprising:
a front cover;
a rear cover; and
a housing structure between and coupled to the front cover and the rear cover, the housing structure comprising:
a first housing member defining:
a first exterior side;
a first interior side opposite the first exterior side;

a first end surface extending between the first exterior side and the first interior side;

a first interlock feature extending from the first interior side;

a flange extending from the first interlock feature and positioned along a peripheral side of the front cover, the flange defining a portion of the first end surface; and a second interlock feature positioned along the portion of the first end surface defined by the flange;

a second housing member defining:

a second exterior side;

a second interior side opposite the second exterior side;

a second end surface extending between the second exterior side and the second interior side;

a third interlock feature formed along the second end surface; and a fourth interlock feature extending from the second interior side; and a nonconductive joining element engaged with the first interlock feature, the second interlock feature, the third interlock feature, and the fourth interlock feature, thereby structurally coupling the first housing member to the second housing member.

24. The portable electronic device of claim 23, wherein:

the flange extends from the first interlock feature along a direction; and the second interlock feature defines an elongate recess defined in part by a longitudinal axis extending along the direction.

25. The portable electronic device of claim 23, wherein the second housing member is set apart from the first housing member by a channel defining:

a first region extending inwardly from the first exterior side of the first housing member along a first direction; and a second region extending inwardly from the first region along a second direction that is not parallel to the first direction.

* * * * *